US005946247A

United States Patent [19]

Osawa et al.

[11] Patent Number: 5,946,247

[45] Date of Patent: Aug. 31, 1999

[54] SEMICONDUCTOR MEMORY TESTING DEVICE

[75] Inventors: Tokuya Osawa; Hideshi Maeno, both of Itami, Japan

[73] Assignee: Mitsubishi Denki Kabushiki Kaisha, Tokyo, Japan

[21] Appl. No.: 09/013,062

[22] Filed: Jan. 26, 1998

Related U.S. Application Data

[60] Division of application No. 08/434,999, May 4, 1995, Pat. No. 5,815,512, which is a continuation-in-part of application No. 08/316,485, Sep. 30, 1994, abandoned.

[30] Foreign Application Priority Data

| | | | |
|---|---|---|---|
| May 26, 1994 | [JP] | Japan | 6-112638 |
| Jun. 29, 1994 | [JP] | Japan | 6-147450 |
| Jul. 25, 1994 | [JP] | Japan | 6-172348 |
| Nov. 21, 1994 | [JP] | Japan | 6-286631 |

[51] Int. Cl.[6] .................... G11C 7/00

[52] U.S. Cl. .................... 365/201; 365/200; 371/10.2

[58] Field of Search .................... 365/201, 200; 371/10.2, 21.1

[56] References Cited

U.S. PATENT DOCUMENTS

| | | | |
|---|---|---|---|
| 4,051,352 | 9/1977 | Eichelberger et al. . | |
| 4,415,984 | 11/1983 | Gryger et al. . | |
| 4,769,817 | 9/1988 | Krohn et al. . | |
| 4,807,229 | 2/1989 | Tada . | |
| 4,813,043 | 3/1989 | Maeno et al. . | |
| 4,835,774 | 5/1989 | Ooshima et al. . | |
| 4,860,290 | 8/1989 | Daniels et al. . | |
| 4,926,424 | 5/1990 | Maeno . | |
| 4,969,126 | 11/1990 | Maeno . | |
| 4,974,226 | 11/1990 | Fujimori et al. . | |
| 5,036,473 | 7/1991 | Butts et al. . | |
| 5,062,109 | 10/1991 | Ohshima et al. . | |
| 5,134,585 | 7/1992 | Murakami et al. . | |
| 5,173,906 | 12/1992 | Dreibelbis et al. . | |
| 5,260,949 | 11/1993 | Hashizume et al. . | |
| 5,265,102 | 11/1993 | Saito . | |
| 5,297,094 | 3/1994 | Rastegar | 365/200 X |
| 5,353,253 | 10/1994 | Nakajima . | |
| 5,383,195 | 1/1995 | Spence et al. . | |

FOREIGN PATENT DOCUMENTS

| | | |
|---|---|---|
| 52-103933 | 8/1977 | Japan . |
| 53-62953 | 6/1978 | Japan . |
| 59-94086 | 5/1984 | Japan . |
| 60-120269 | 6/1985 | Japan . |
| 61-61300 | 3/1986 | Japan . |
| 62-282280 | 12/1987 | Japan . |
| 63-134970 | 6/1988 | Japan . |
| 1-73267 | 3/1989 | Japan . |
| 2-67976 | 3/1990 | Japan . |
| 2-210280 | 8/1990 | Japan . |
| 2-278173 | 11/1990 | Japan . |
| 3-29872 | 2/1991 | Japan . |
| 4-145380 | 5/1992 | Japan . |
| 4-270976 | 9/1992 | Japan . |

OTHER PUBLICATIONS

International Test Conference, pp. 608–614, Sep. 20–24, 1992, H. Maeno, et al., "LSSD Compatiable and Concurrently Testable Ram".

International Test Conference, pp. 120–125, 1992, Sybille Hellebrand, et al., "Generation of Vector Patterns Through Reseeding of Multiple–Polynomial Linear Feedback Shift Registers".

*Primary Examiner*—Huan Hoang
*Attorney, Agent, or Firm*—Oblon, Spivak, McClelland, Maier & Neustadt, P.C.

[57] ABSTRACT

In a small-size device, one input terminals of a plurality of AND circuits are connected in series. The other terminals of the plurality of AND circuits receive failure information held by a register circuit. Among the AND circuits, by changing values at the AND circuits which are connected in an output direction (i.e., most significant bit side) of an AND circuit receiving a failure bit and values at the AND circuits which are connected in an input direction (i.e., least significant bit side) of the AND circuit receiving the failure bit, a signal line associated with the failure bit is disconnected and signal lines are re-connected to adjacent signal lines including an extra line by selectors. Hence, a failure bit is compensated in a very simple structure.

8 Claims, 141 Drawing Sheets

F I G. 4
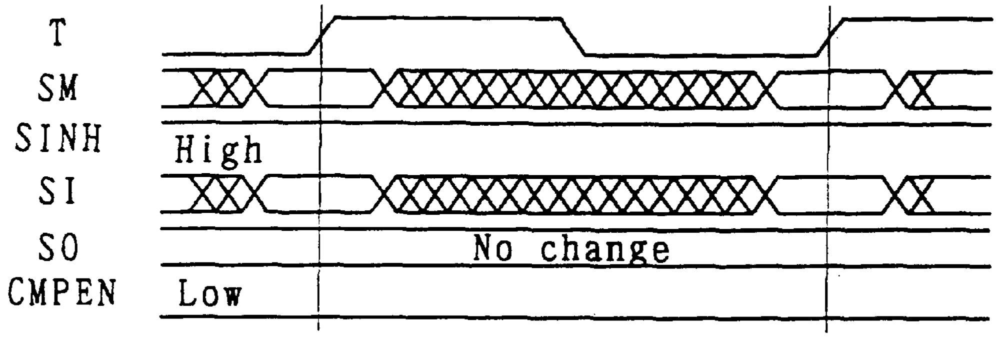
F I G. 5
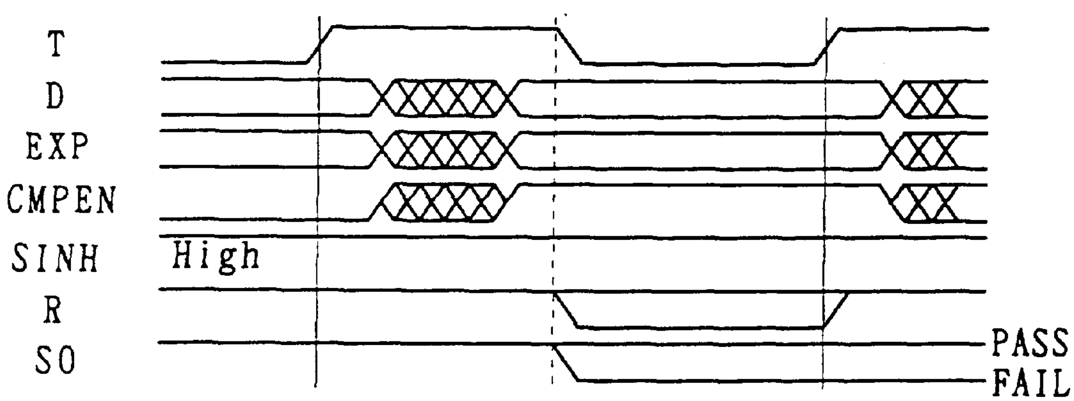

F I G. 1 4
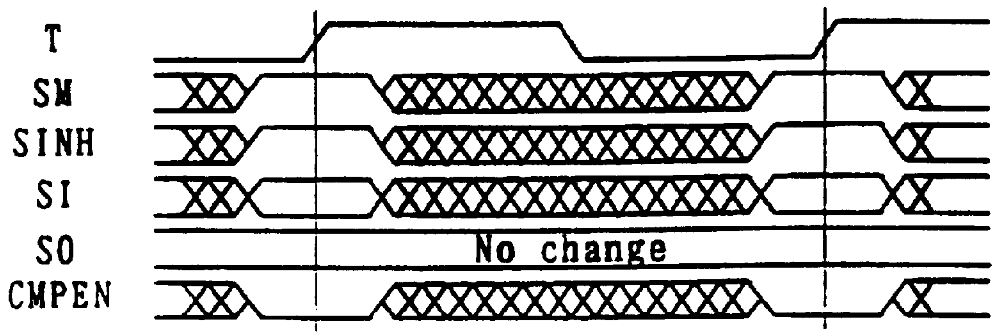
F I G. 1 5
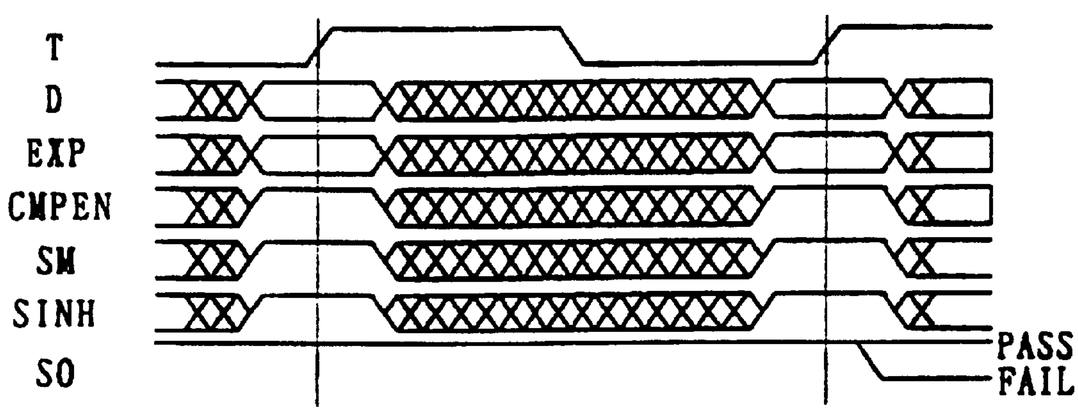

F I G. 3 3
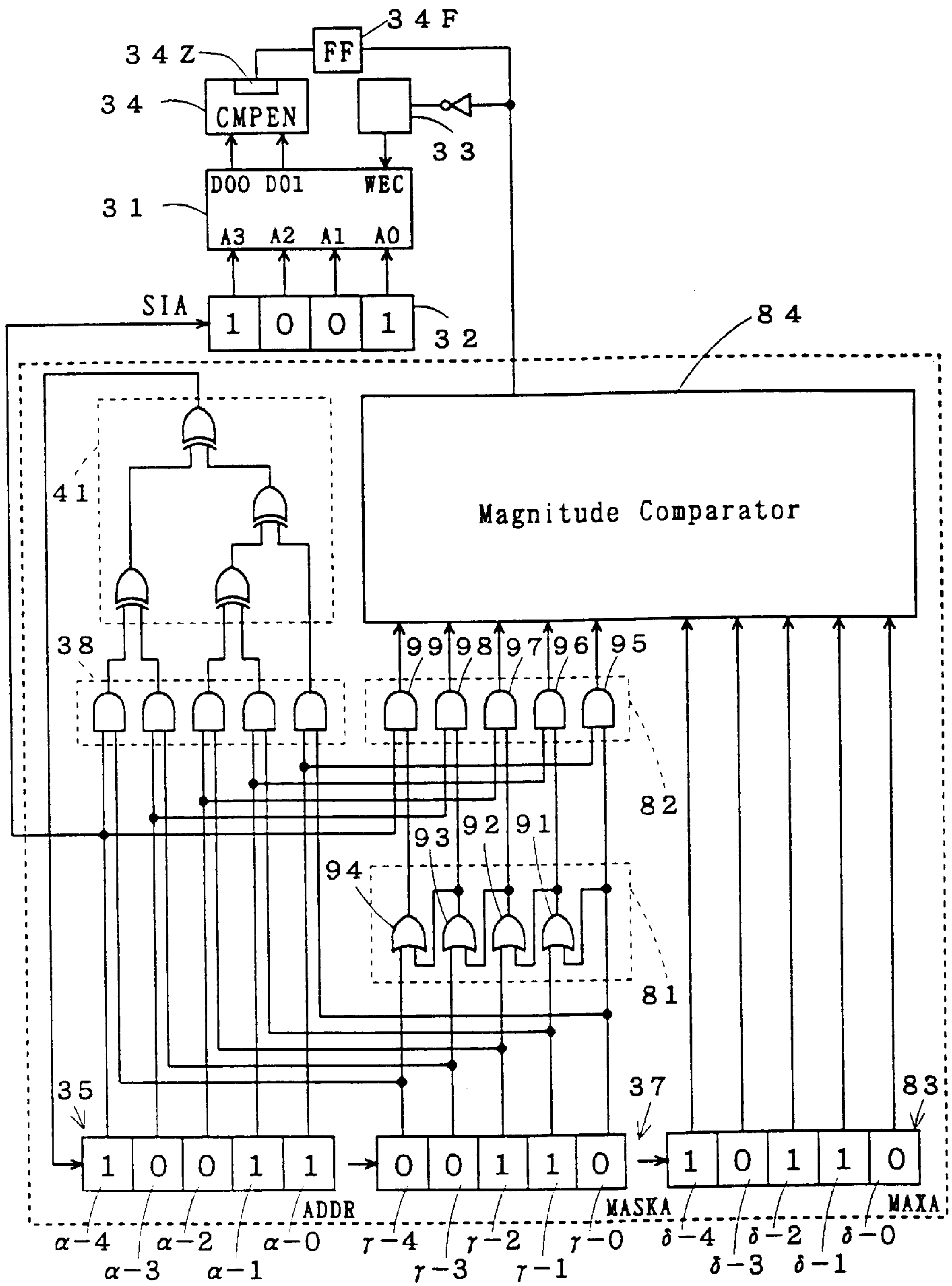

F I G. 3 4
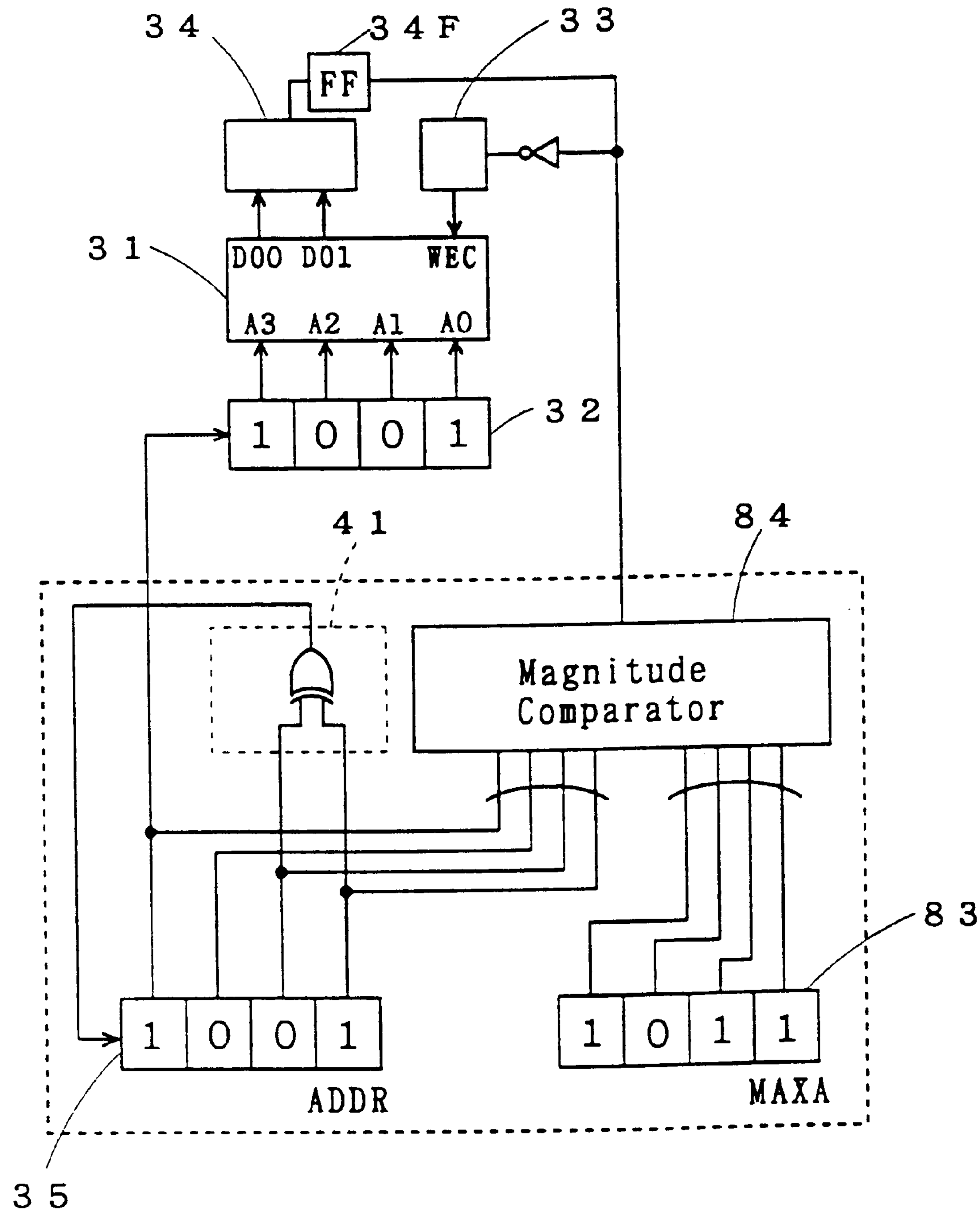

FIG. 51

| pin | Burn-In mode | | BIST mode | |
|---|---|---|---|---|
| | set | run | init | run |
| BurnIn | 0 | 1 | 0 | 0 |
| Sinh-MX | DC | DC | 0 | 1 |
| Sinh-LX | DC | DC | 0 | 0 |
| LFSRX | DC | DC | 0 | 1 |

FIG. 61

| | | BIST | SI | SINH0 | SINH1 |
|---|---|---|---|---|---|
| Normal | | 0 | Don't Care | Don't Care | Don't Care |
| BIST | INIT. | 1 | DATA SHIFT IN | 0 | 0 |
| | RUN | 1 | Don't Care | 0 | 1 |

F I G. 67
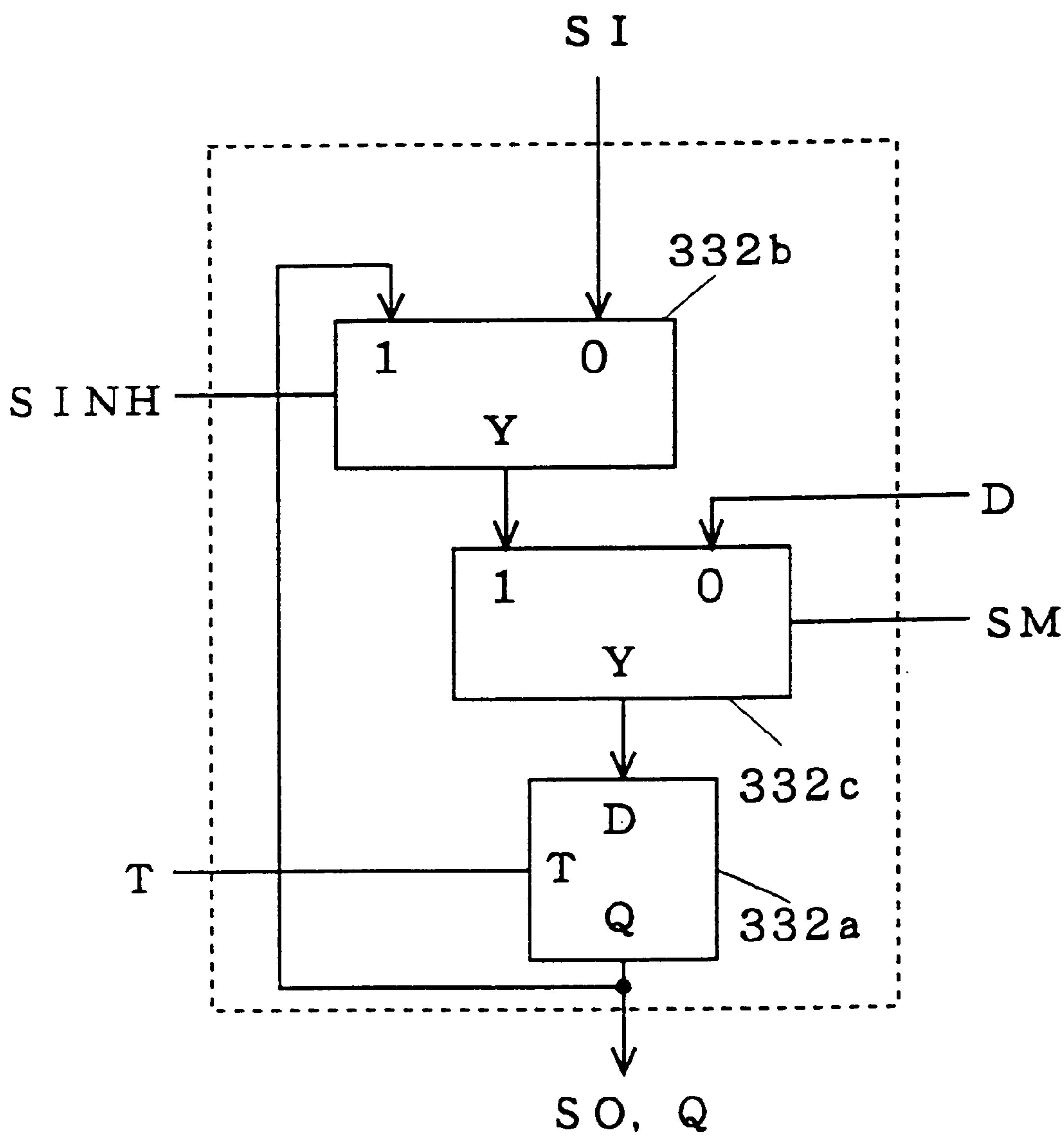

| | BIST | SI |
|---|---|---|
| Normal | 0 | Don't Care |
| BIST |  | DATA SHIFT IN |

FIG. 76

| PIN NAME | OPERATION MODE | | | | |
|---|---|---|---|---|---|
| | NORMAL | SHIFT-SI | SHIFT-SIM | CAPTURE | RAM-TEST |
| CHDIR | 0 | 0 | 0 | 0 | 0/1 |
| CMPEN | 0 | 0 | 0 | 0 | 0/1 |
| EXP | 0 | 0 | 1 | 0 | 0/1 |
| EXXY | 0 | 0 | 0 | 0 | 0/1 |
| INSFF | 0 | 1 | 1 | 1 | 1 |
| MEMTST | 0 | 0 | 0 | 0 | 1 |
| SI | – | test Data | – | – | – |
| SIA | – | – | – | – | 0/1 |
| SIC | – | – | – | – | 0/1 |
| SID | – | – | – | – | 0/1 |
| SIM | – | – | test Data | – | – |
| SINHA0X | 0 | 0 | 0 | 0 | 0/1 |
| SINHA0Y | 0 | 0 | 0 | 0 | 0/1 |
| SINHA1X | 0 | 0 | 0 | 0 | 0/1 |
| SINHA1Y | 0 | 0 | 0 | 0 | 0/1 |
| SINHA2X | 0 | 0 | 0 | 0 | 0/1 |
| SINHA2Y | 0 | 0 | 0 | 0 | 0/1 |
| SINHDI | 0 | 0 | 0 | 0 | 0/1 |
| SINHDO | 0 | 0 | 0 | 0 | 1 |
| SIW0 | – | – | – | – | 0/1 |
| SIW1 | – | – | – | – | 0/1 |
| SM | 0 | 1 | 1 | 0 | 1 |
| SOM | × | Test Result | Test Result | × | × |
| WINH | 0 | 1 | 1 | 1 | 0 |

FIG. 79

| | SINH 1 |
|---|---|
| INIT. | 1010··· |
| RUN | 1 |

FIG. 81

| | | INIT | RUN | INIT | RUN |
|---|---|---|---|---|---|
| SI | | 0101 | 1111 | 0100 | 1111 |
| SIN-FF | U | 0101 | 0101 | 0101 | 0101 |
| RUNBIST | U | 0000 | 1111 | 0000 | 1111 |
| SINHO | U | 1010 | 0000 | 1010 | 0000 |
| SNH1I | U | 1010 | 1111 | 1010 | 1111 |

FIG. 83

| | BIST | SI |
|---|---|---|
| Normal | 0 | Don't Care |
| BIST | 1 | DATA SHIFT IN |

FIG. 85

| | RESET | INIT | RUN | INIT | RUN |
|---|---|---|---|---|---|
| SI | 11 | 0101 | 1111 | 0100 | 1111 |
| SIN-FF | UUUU | 0101 | 0101 | 0101 | 0101 |
| RUNBIST | UUUU | 0000 | 1111 | 0000 | 1111 |
| SINH0 | UUUU | 1010 | 0000 | 1010 | 0000 |
| SINH1 | UUUU | 1010 | 1111 | 1010 | 1111 |

FIG. 86

| | SINH 1 |
|---|---|
| INIT. | 1010··· |
| RUN | 1 |

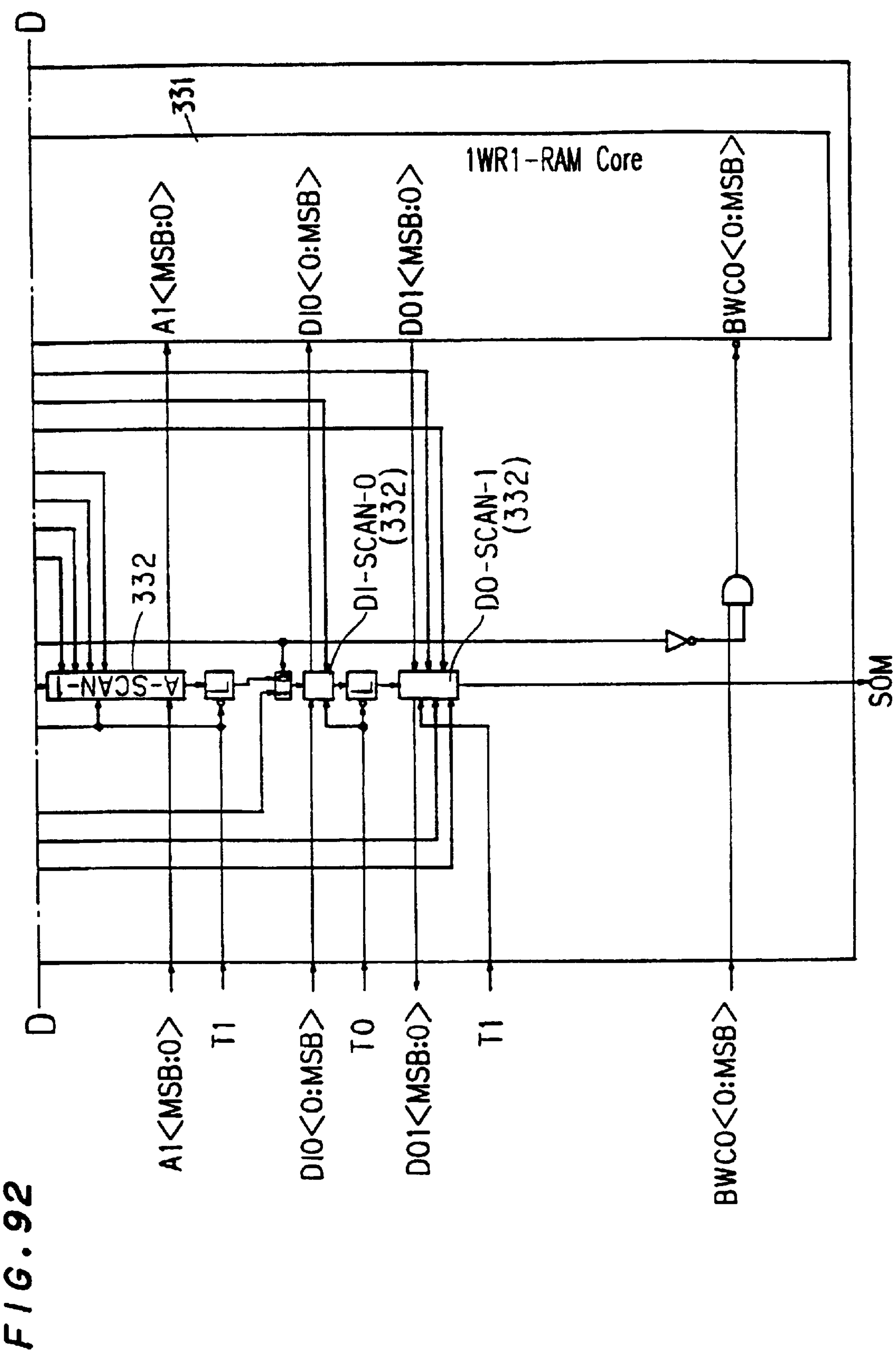
F I G. 92

SEMICONDUCTOR MEMORY TESTING DEVICE

This application is a division of application Ser. No. 08/434,999, filed on May 4, 1995, now U.S. Pat. No. 5,815,512, which is a continuation-in-part of application Ser. No. 08/316,485, filed on Sep. 30, 1994, now abandoned.

BACKGROUND OF THE INVENTION

1. Field of the Invention

The present invention relates to a testing device for making a functional test on a semiconductor memory which is a logic integrated circuit including a plurality of RAMs, a plurality of ROMS and the like.

2. Background of the Invention

{First Prior Art}

FIG. 22 is a circuit diagram showing a scan register 414*a* of a two-phase clock system semiconductor memory testing device according to first prior art which is disclosed in U.S. Pat. No. 4,926,424, for example. Referring to FIG. 22, numerals 401*a* and 401*b* denote latch circuits, numeral 402 denotes a selector circuit, numeral 408 denotes a selector control terminal, numeral 409 denotes a serial input terminal, numeral 410 denotes a parallel input terminal, numeral 411 denotes a parallel output terminal, and numeral 412 denotes a serial output terminal. Numerals 415 and 416 denote two-phase clock system clock terminals, numeral 419 denotes an exclusive NOR circuit (hereinafter referred to as an Ex.NOR circuit), numeral 420 denotes a NOR circuit, numeral 421 denotes an OR circuit, and numeral 422 denotes a test clock terminal.

The operation is now described. When the test clock terminal 422 is fixed at a high level, an output of the NOR circuit 420 goes low and hence the OR circuit 421 transmits the level of the clock terminal 415 to an enable terminal EN of the latch circuit 401*a* as such. In this case, therefore, it is possible to transmit data supplied to the serial input terminal 409 or the parallel input terminal 410 to the serial and parallel output terminals 412 and 411 by supplying two-phase clock signals to the clock terminals 415 and 416.

In a read test of a tested circuit such as a RAM, on the other hand, expected data are set in the latch circuits 401*a* and 401*b* and a clock signal is supplied to the test clock terminal 422 in this state, so that data of the parallel input terminal 410 is latched by the latch circuit 401*a* and the content of the latch circuit 401*a* is inverted only when the data of the parallel input terminal 410 is different from the expected data.

Namely, when data which is different from the expected data is read from the tested circuit such as a RAM and applied to the parallel input terminal 410, the latch circuit 401*a* latches the data which is different from the expected data, whereby it is possible to recognize that the tested circuit such as a RAM is abnormal from the data latched in the latch circuit 401*a*.

FIG. 23 is a block diagram showing a scan path which is formed by the scan registers 414*a* shown in FIG. 23.

{Second Prior Art}

FIG. 57 shows a semiconductor memory testing device according to second prior art (refer to Japanese Patent Laying-Open No. 62-195572 (1987) and U.S. Pat. No. 4,813,043). The second prior art employs a pseudo-random number (pseudo-random series) generating algorithmic pattern generation circuit (linear feedback shift register circuit: hereinafter referred to as an LFSR circuit) as such a testing device. Referring to FIG. 57, numeral 501 denotes a base data register for storing reference data, numeral 502 denotes a constant register for supplying constants for making constant operations, numeral 503 denotes an arithmetic and logic unit (ALU) provided with a shift-in function for carrying out various arithmetic and logic operations, numeral 504 denotes a selector for selecting the input of the ALU 503, numeral 505 denotes an ALU output register for holding the operation results of the ALU 503, numeral 506 denotes a bit selection register, numeral 507 denotes an AND operation circuit, and numeral 508 denotes a parity detector.

FIG. 58 is a logic circuit diaoram showing an exemplary 4-bit LFSR circuit. Referring to FIG. 58, numeral 509 denotes an exclusive OR (Ex.OR) circuit, numerals 510, 511, 512 and 513 denote flip-flop circuits, and symbol CLK denotes a clock signal input terminal respectively. The exclusive OR circuit 509 corresponds to the parity detector 508 shown in FIG. 57, while the flip-flop circuits 510, 511, 512 and 513 correspond to the ALU output register 505 shown in FIG. 57. Referring to FIG. 58, two flip-flops 510 and 513 make inputs in the exclusive OR circuit 509, in correspondence to selection of 1001 (binary system) with respect to the bit selection register 506 shown in FIG. 57.

In the LFSR circuit according to the second prior art having the aforementioned structure, parity detection is made with respect to an arbitrary bit group of the ALU output register 505 so that the result of the detection is shifted in the ALU 503 simultaneously with an operation in the ALU 503 to update the ALU output register 505, thereby generating a complicated pattern of pseudo-random numbers at a high speed. The LFSR circuit of the second prior art generates $2^n$ pseudo-random numbers (pseudo-random series) as an algorithmic pattern for a functional test.

Description is made on an operation in a case of employing the LFSR circuit of the second prior art as an address generation circuit with employment of full cyclic system test data for addressing a plurality of RAMs with reference to FIG. 59. FIG. 59 illustrates an address input system. Referring to FIG. 59, numerals 521*a* to 521*c* denote RAMs numerals 522*a* to 522*c* denote shift registers for selecting addresses of the respective RAMs 521*a* to 521*c* in a functional test of the RAMs 521*a* to 521*c*, numeral 523 denotes a test pattern generation circuit including the LFSR circuit (address generation circuit) of the second prior art, and symbol SIA denotes a common wire for transmitting addressing data to all shift registers 522*a* to 522*c*. As shown in FIG. 59, the plurality of RAMs 521*a* to 521*c* are connected to the single test pattern generation circuit 523. Symbols A0 to A4 denote address input terminals of the RAMs 521*a* to 521*c*, which have four, five and four input terminals respectively.

In a functional test of the RAMs 521*a* to 521*c*, the test pattern generation circuit 523 first outputs addressing data to the common wire SIA. The shift registers 522*a* to 522*c* which are connected to the common wire SIA in common are shifted in by the addressing data as transmitted, to select addresses of the RAMs 521*a* to 521*c*.

The test pattern generation circuit 523 generates quaternary full cyclic series for the RAMs 521*a* and 521*c* each having four address input terminals A0 to A3, thereby addressing the RAMs 521*a* and 521*c* on the basis thereof. Similarly, the test pattern generation circuit 523 generates quintic full cyclic series for the RAM 521*b* having five address input terminals A0 to A4, thereby addressing the RAM 521*b* on the basis thereof.

{Third Prior Art}

A semiconductor memory testing device according to third prior art is adapted to increment or decrement addresses by an address generation circuit. As shown in FIG. 59, a general counter serving as a separate member is connected to a test pattern generation circuit (LFSR circuit) 523 which is similar to that of the second prior art, to cancel redundant bits by linkage operations of the counter and the LFSR circuit 523.

{Fourth Prior Art}

FIG. 132 shows a semiconductor memory testing device according to fourth prior art. Semiconductor memories (RAM 1, RAM 2 and RAM 3) shown in FIG. 132 have data output scan paths DO (scan FFs provided with data compression functions) respectively, so that an output from the scan path DO of a preceding semiconductor memory is inputted in that of a subsequent semiconductor memory. Test results are made by shift operations of the respective scan paths DO. In order to compress data for testing with respect to the respective semiconductor memories, SINH signals (shift inhibiting signals) are inputted to inhibit shift operations of the scan paths DO.

{Fifth Prior Art}

FIGS. 157 and 158 show a conventional redundancy circuit. The redundancy circuit has a plurality of signal lines L1 to L4 which are connected to a plurality of memory cells C, a decoder (not shown) which is connected to the signal lines L1 to L4, and at least one extra signal line L5 which is connected to the memory cells C. In FIGS. 157 and 158, indicated generally at D1 to D4 are driver circuits which are connected to the decoder.

Indicated generally at S is a switch part, and switching elements disposed in the switch part are indicated at S1 to S4. Transistors are typically used as the switching elements S1 to S4. When there is a failure in the first signal line L1 of the signal lines L1 to L4, the first switching element S1 disconnects the driver circuit D1 from the first signal line L1 and connects the driver circuit D1, which is originally connected to the first signal line L1, to the second signal line L2. When there is a failure in the second signal line L2 of the signal lines L1 to L4, the second switching element S2 disconnects the driver circuit D2 from the second signal line L2 and connects the driver circuit D2, which is originally connected to the second signal line L2, to the third signal line L3. Similarly, when there is a failure in the third signal line L3 of the signal lines L1 to L4, the third switching element S3 disconnects the driver circuit D3 from the third signal line L3 and connects the driver circuit D3, which is originally connected to the third signal line L3, to the fourth signal line L4. Further, the Fourth switching element connects the driver circuit D4 to the extra signal line L5.

In the conventional redundancy circuit constructed as above, any one of the signal lines L1 to L4 including a failure is disconnected by reconnecting the signal lines in such a manner that the driver circuits are connected respectively to the next signal lines including the extra signal line L5.

{Problem of First Prior Art}

In the two-phase clock system semiconductor memory testing device according to the first prior art having the aforementioned structure, it is necessary to supply the pair of clock terminals 415 and 416 with two-phase clock signals. Thus, this device disadvantageously requires a clock driver circuit which is capable of making complicated driving for supplying the pair of clock terminals 415 and 416 with high-speed two-phase clock signals, in order to test a tested circuit such as a RAM at a high speed.

{Problem of Second Prior Art}

In general, a functional test employed for testing RAMs or the like includes a march test, for example. This test is adapted to update initially stored data ("0", for example) which are initial states, to novel storage data ("1") as to all addressing data for all RAMs. In such a march test, it is necessary to specify addresses of RAMs which are objects of data renewal. While the second prior art generate $2^n$ full cyclic series of pseudo-random numbers by the LFSR circuit of the test pattern generation circuit 523 for addressing the RAMs as hereinabove described, address numbers n of actual RAMs depend on the types of the RAMs such that the RAMs 521*a* and 521*b* shown in FIG. 59 have four and five addresses respectively, for example. Thus, word numbers $2^n$ which are decided by combinations of binary numbers ("0" and "1") of the address numbers n also depend on the types of the RAMs. If the number of $2^n$-order full cyclic series generated in the LFSR circuit is smaller than an actual word number of RAMs, therefore, there are inevitably generated words which cannot be subjected to the functional test. If the number of the $2^n$-order full cyclic series generated in the LFSR circuit is larger than the actual word number of the RAMs, on the other hand, partial data may be forced out from the shift registers, leading to recognition of erroneous addresses. In the second prior art, therefore, the number $2^n$ of the full cyclic series generated in the LFSR circuit must completely match with the word number of the RAMs, and hence the degree of freedom of the RAMs subjected to the functional test is limited.

Further, it is necessary to make a burn-in test (dynamic burn-in test) while moving all addresses, bits etc., in order to carry out a functional test of RAMs. When the RAMs to be subjected to the functional test are connected in a large number, however, initialization of a necessary bit line selection register etc. cannot be made in advance of formation of a test pattern since a burn-in tester cannot generate complicated control signals in general.

{Problem of Third Prior Art}

It is possible to solve the problem of mismatching of bit numbers in the second prior art by canceling, redundant bits by linkage operations of the counter and the LFSR circuit 523 in the structure of the third prior art. However, a general counter has a larger area scale as compared with the LFSR circuit 523 such that it is difficult to integrate the same in a single integrated circuit. Therefore, an address bus is drawn out to the exterior to externally mount the counter. Thus, the third prior art requires an additional area for the counter as well as a wiring mechanism for the address bus etc., leading to remarkable reduction of area efficiency.

{Problem of Fourth Prior Art}

The device according to the fourth prior art is so wired that the same SINH signal is supplied to a plurality of scan paths DO, and hence the SINH signal is regularly supplied to a plurality of semiconductor memories. Thus, it is impossible to carry out a high-speed operation by unavailable capacitances, and hence improvement in test efficiency is limited.

{Problem of Fifth Prior Art}

In the circuit of the fourth prior art, when a failure is found in the signal lines L1 to L4, the switching elements S1 to S4 are disconnected with a laser device or the like to disconnect the drivers from connection for writing or other purposes. Since a disconnecting device is large which increases a cost.

SUMMARY OF THE INVENTION

According to a first aspect of the present invention, a semiconductor memory testing device comprises a plurality of scan registers which are connected in series with each other for forming a scan path, and each scan register comprises a comparison circuit for comparing an external expected data signal with an external data input signal on the basis of an external comparison enable signal, selector means for selecting and outputting at least a desired external signal and the data input signal on the basis of an external shift mode control signal, a flip-flop circuit for incorporating output data from the selector means at prescribed timing on the basis of a signal from the comparison circuit only when the expected data signal is equal to the data input signal, and data holding means for allowing the data incorporation of the flip-flop circuit in accordance with the prescribed timing which is based on an external cyclic clock signal when no shift inhibiting signal is received from the exterior while holding data of the flip-flop circuit when the shift inhibiting signal is received from the exterior.

Preferably, the data holding means includes a timing stopping circuit for stopping a timing signal defining the prescribed timing in the flip-flop circuit when the shift inhibiting signal is received, whether the clock signal is inputted or not.

Preferably, the selector means and the data holding means comprise a first selector circuit having an output terminal, a control input terminal, and a pair of signal input terminals, and a second selector circuit having an output terminal, a control input terminal, and a pair of signal input terminals so that the output terminal is connected to one of the signal input terminals of the first selector circuit. The selector means comprises a first input terminal which is connected to one signal input terminal of the second selector circuit for receiving the desired external signal, a second input terminal which is connected to the other signal input terminal of the first selector circuit for receiving the data input signal, and a third input terminal which is connected to the control input terminal of the first selector circuit for receiving the shift mode control signal, while the data holding means comprises a data feedback loop wire which is connected to the other signal input terminal of the second selector circuit to be connected to a data output terminal of the flip-flop circuit, and a fourth input terminal which is connected to the control input terminal of the second selector circuit for receiving the shift inhibiting signal.

Preferably, the data holding means comprises a data feedback loop wire which is connected to a data output terminal of the flip-flop circuit, and a data selection circuit for selecting the output data from the flip-flop circuit which is transmitted by the loop wire in place of the output data from the selector means upon receiving the shift inhibiting signal, for outputting the same to the flip-flop circuit.

Preferably, a reset signal from the comparison circuit is supplied to a reset input terminal of the flip-flop circuit when the expected data signal is different from the data input signal.

Preferably, the loop wire is connected with a feed inhibiting element for inhibiting the output feedback of the flip-flop circuit on the basis of a reset signal from the comparison circuit which is outputted when the expected data signal is different from the data input signal.

According to a second aspect of the present invention, a semiconductor memory testing device comprises an arithmetic and logic part having an address generation part for generating a prescribed bit number of addresses for a semiconductor memory for storing a test pattern on the basis of a prescribed arithmetic expression and an effective address number storage part for storing an effective address number of the semiconductor memory, an address input shift register for bitwisely receiving and storing the prescribed bit number of addresses which are generated from the address generation part while specifying an address for writing the test pattern in the semiconductor memory, address change means receiving the prescribed bit number of addresses and the effective address number of the effective address number storage part for bitwisely incrementing or decrementing the prescribed bit number of addresses every shift operation of the address input shift register in a number of times corresponding to the effective address number of the effective address number storage part thereby changing the prescribed bit number of addresses of the address generation part, and a write control command part for inhibiting writing of the test pattern in the semiconductor memory except immediately after shifting of the address input shift register by the number of times corresponding to the effective address number upon receiving the effective address number from the effective address number storage part.

Preferably, the semiconductor memory testing device further comprises a switch for switching the operation of incrementing or decrementing the addresses in the address change means and the operation of generating the prescribed bit number of addresses for the semiconductor memory for storing the test pattern.

Preferably, the semiconductor memory testing device further comprises an expected value generation circuit for generating an expected value for an output of the semiconductor memory, a comparison circuit for comparing the output of the semiconductor memory with the expected value and making a correct/error determination, and comparison inhibiting means for inhibiting the correct/error determination in the comparison circuit except immediately after shifting of the address input shift register by the number of times corresponding to the effective address number upon receiving the effective address number from the effective address number storage part.

Preferably, the address change means comprises a storage element bitwisely receiving the addresses for storing bit values corresponding to received bits, an adder element bitwisely receiving the bit values which are stored in the storage element and the addresses from the address generation part and adding a prescribed addition reference value thereto for changing corresponding bit values of subsequently generated addresses and outputting only one bit to the address generation part as subsequently generated address data, and an AND circuit bitwisely receiving the values which are stored in the storage element and the addresses from the address generation part for operating values of logical products thereof and storing the results in the storage element as bit values of a digit higher than that of the subsequently generated address data as the prescribed addition reference value.

According to a third aspect of the present invention, a semiconductor memory testing device comprises an arithmetic and logic part for generating a prescribed bit number of pseudo-random address for a semiconductor memory for storing a test pattern, an address input shift register for receiving the pseudo-random address for the semiconductor memory which is generated in the arithmetic and logic part and storing the same while specifying the pseudo-random address for writing the test pattern in the semiconductor memory, a maximum address value storage register for previously storing a maximum address value as a comparison reference value, a comparison circuit for comparing the maximum address value which is stored in the maximum address value storage register with the pseudo-random address which is generated in the arithmetic and logic part, and a write control command part for inhibiting writing of the test pattern in the semiconductor memory when the comparison circuit determines that the pseudo-random address is greater than the maximum address value.

Preferably, the semiconductor memory testing device according to the second aspect of the present invention further comprises a maximum address value storage register for previously storing a maximum address value as a comparison reference value, and a comparison circuit for comparing the maximum address value which is stored in the maximum address value storage register with a pseudo-random address which is generated in the arithmetic and logic part, while the write control command part is provided with a function of inhibiting writing of the test pattern in the semiconductor memory when the comparison circuit determines that the pseudo-random address is greater than the maximum address value.

Preferably, the arithmetic and logic part of the semiconductor memory testing device according to the third aspect of the present invention is provided with a dissimilar value bit data generation circuit for generating bit data which are different in value from bit data of the generated pseudo-random address of the semiconductor memory when all bit data are at the same value for making the same included in a subsequently generated pseudo-random address of the semiconductor memory.

Preferably, the comparison circuit is formed to make comparison only with respect to specific upper bits while omitting comparison of lower bits which are capable of allowing two different values.

In the semiconductor memory testing device according to the second aspect of the present invention, the arithmetic and logic part is preferably provided with a two-dimensional pattern storage part for storing the pseudo-random address for storing the test pattern as two-dimensional data by a virtual vertical axis storage bit group storing virtual vertical axis addresses and a horizontal axis storage bit group storing virtual horizontal axis addresses.

Preferably, the arithmetic and logic part is further provided with an exclusive OR circuit having one input terminal which is connected to the vertical axis storage bit group of the two-dimensional pattern storage part, another input terminal which is connected to the horizontal axis storage bit group, and an output terminal which is connected to the write control command part.

Preferably, the arithmetic and logic part is further provided with two-dimensional pattern selection means for selecting the vertical and horizontal axis storage bit groups of the two-dimensional pattern storage part for connecting the same to the write control command part.

Preferably, the arithmetic and logic part is further provided with an exclusive OR circuit having one input terminal which is connected to the vertical axis storage bit group of the two-dimensional pattern storage part and another input terminal which is connected to the horizontal axis storage bit group, and two-dimensional pattern selection means for selecting the exclusive OR circuit and the vertical and horizontal axis storage bit groups of the two-dimensional pattern storage part for connecting the same to the write control command part.

According to a fourth aspect of the present invention, a semiconductor memory testing device comprises an arithmetic and logic part which is provided with a shift register storing a total address terminal number of a plurality of semiconductor memories for storing test patterns and a generating function of a bit number which is greater than the sum of the total control terminal number and an address generating part for generating the addresses of the semiconductor memories for storing the test patterns on the basis of the generating function of the shift register, an address input shift register for bitwisely receiving and storing the addresses which are generated in the address generating part and specifying the addresses for writing the test patterns in the semiconductor memories, and address change means for alternately generating two different types of data every shift operation of the address input shift register for alternately bitwisely inverting the addresses which are specified by the address input shift register.

According to the third aspect of the present invention, the semiconductor memory testing device preferably further comprises an external input wire for storing a specific address value in the maximum address value storage register in place of the maximum address value, and a detection circuit for detecting whether or not the specific address stored in the maximum address value storage register is equal to the address which is generated from the arithmetic and logic part. The write control command part is provided with a cancel function of receiving an output from the detection circuit for canceling inhibition of writing of the test pattern in the semiconductor memory when the detection circuit detects that the address is equal to the maximum address value.

According to a fifth aspect of the present invention, a semiconductor memory testing device including a memory core comprises a test circuit for inputting/outputting addresses or data in/from the memory core, a test pattern generation circuit having a plurality of shift registers for transmitting test data including a prescribed test pattern to the test circuit on the basis of an external data input signal, and inhibiting signal generation means for generating a plurality of shift inhibiting signals for inhibiting shift operations of the respective shift registers in the test pattern generation circuit on the basis of the data input signal and transmitting the same to the test pattern generation circuit, and the inhibiting signal generation means comprises a mode decision part detecting either an odd or even value of the data input signal for deciding an operation mode for driving the test pattern generation circuit, and a signal generation part for generating the shift inhibiting signals corresponding to the respective shift registers of the test pattern generation circuit on the basis of the decision at said mode decision part.

Preferably, the semiconductor memory testing device further comprises an indication terminal for inputting an indication signal for indicating generation of the shift inhibiting signals in the inhibiting signal generation means, mark detection means for detecting a mark included in the data input signal, and timing correction means for making indication timing of the indication signal match with a point of time of mark completion of the data input signal on the basis of a detection result of the mark detection circuit.

According to a sixth aspect of the present invention, a semiconductor memory testing device comprises a data input terminal for inputting input data in a serially connected body which is formed by a plurality of series-connected semiconductor memories having shift registers, a data output terminal for outputting output data from the serially connected body, and data compression means for compressing data in the serially connected body, and the data compression means comprises a pipeline which is formed by series-connected flip-flops corresponding to a single or a plurality of semiconductor memories of the serially connected body so that this pipeline is formed in parallel with the serially connected body, and a shift inhibiting signal input terminal for inputting shift inhibiting signals for inhibiting shift operations of the shift registers of the respective semiconductor memories from said pipeline, while output terminals of the flip-flops in said pipeline are connected to the shift register(s) of corresponding single or plurality of semiconductor memories, while the flip-flops of the pipeline are so connected that a signal transmission direction thereof is opposite to that of the serially connected body.

According to a seventh aspect of the present invention, a semiconductor memory testing device including a memory core comprises a test circuit having a scan path which is switchable between a shift mode and a multiple equal distribution mode for inputting/outputting addresses or data in/from the memory core, a test data generation circuit for transmitting an expected data signal for making a correct/error determination of data of the memory core to the test circuit in the multiple equal distribution mode of the scan path of the test circuit, a comparison circuit for making the correct/error determination in the memory core in the multiple equal distribution mode of the scan path in the test circuit on the basis of the expected data signal from the test data generation circuit, an expected data input terminal for inputting the expected data signal in the comparison circuit, a first input terminal for inputting first input data in the scan path in the shift mode of the scan path of the test circuit, a second input terminal for inputting second input data in the scan path in the shift mode of the scan path of the test circuit, and a selector for switching the first input data from the first input terminal and the second input data from the second input terminal by a switching signal from the test data generation circuit, and the same terminal as the expected data input terminal is employed as a terminal for inputting the switching signal for switching the selector.

According to an eighth aspect of the present invention, a semiconductor memory testing device including a memory core comprises a test circuit having an address input scan path which is switchable between a shift mode and a multiple input mode in a system for inputting an address signal in the memory core. The address input scan path of the test circuit comprises a plurality of flip-flops, a plurality of multiple terminals for inputting a plurality of bits of address signals for the plurality of flip-flops in a multiple manner, a shift-in terminal for bitwisely inputting address signals as to one of the plurality of flip-flops, a plurality of selectors which are connected to the flip-flops respectively for selectively switching input signals in the respective flip-flops, and a switching signal input terminal for inputting signals for switching the selectors. A selection input terminal of one of the selectors corresponding to one of the flip-flops most preceding in the shift mode is connected to the shift-in terminal, a selection input terminal of each of the selectors corresponding to those of the flip-flops other than the one most preceding in the shift mode is connected to another flip-flop preceding in the shift mode, and other selection input terminals of the selectors corresponding to the flip-flops are connected to the multiple terminal.

According to a ninth aspect of the present invention, a semiconductor memory testing device including a memory core comprises a test circuit having an address input scan path which is switchable between a shift mode and a multiple input mode in a system for inputting an address signal in the memory core. Addresses of the memory core include virtual vertical axis addresses and virtual horizontal axis addresses, and the address input scan path of the test circuit comprises a first scan path part for the virtual vertical axis addresses, a second scan path part for the virtual horizontal axis addresses, and a vertical/horizontal selector for selecting either one of the first and second scan path parts. At least one of the first and second scan path parts comprises a plurality of flip-flops, a plurality of multiple terminals for inputting a plurality of bits of address signals for the plurality of flip-flops in a multiple manner, a shift-in terminal for bitwisely inputting address signals in one of the plurality of flip-flops, a plurality of selectors which are connected to the respective flip-flops for selectively switching the input signals in the respective flip-flops, and a switching signal input terminal for inputting signals for switching the selectors. A selection input terminal of one of the selectors corresponding to one of the flip-flops most preceding in the shift mode is connected to the shift-in terminal, a selection input terminal of each of the selectors corresponding to those of the flip-flops other than the one most preceding in the shift mode is connected to another flip-flop preceding in the shift mode, and other selection input terminals of the selectors corresponding to the flip-flops are connected to the multiple terminal.

Preferably, the semiconductor memory testing device further comprises a first shift inhibiting signal input terminal for inputting a shift inhibiting signal for inhibiting a shift operation of the first scan path part, and a second shift inhibiting signal input terminal for inputting a shift inhibiting signal for inhibiting a shift operation of the second scan path part.

According to a tenth aspect of the present invention, a semiconductor memory testing device including a memory core comprises a test circuit for inputting/outputting addresses or data in/from the memory core, and the test circuit comprises a register for inputting data in respective addresses of the memory core, an individual data input terminal for inputting individual input signals for individually and selectively inputting data in the respective addresses of the memory core in a time other than a memory test time of the memory core, and individual input cancel means for canceling individual input by the individual data input signals in the memory test time of the memory core.

According to an eleventh aspect of the present invention, a semiconductor memory testing device including a memory core comprises a test circuit having a scan path for inputting/outputting addresses or data in/from the memory core, and a control signal generation circuit for generating a shift inhibiting signal for inhibiting a shift operation of the scan path of the test circuit, and the control signal generation circuit comprises at least one cyclic shift register for transmitting a control signal to the test circuit, and the cyclic shift register comprises at least first and second register parts. The first register part comprises a first flip-flop, and a first selector for selecting a signal to be inputted in the first flip-flop, so that one input terminal of the first selector receives a shift-in signal and another input terminal of the first selector receives an output signal from the first flip-flop, while the second register part comprises a second flip-flop, and a second selector for selecting a signal to be inputted in the second flip-flop, so that one input terminal of the second selector receives an output signal from the first flip-flop of the first register part, and another input terminal of the second selector receives an output signal from the second flip-flop.

According to a twelfth aspect of the present invention, a semiconductor memory testing device including a memory core comprises a test circuit having a scan path for inputting/outputting addresses or data in/from the memory core, and a control signal generation circuit for generating a shift inhibiting signal for inhibiting a shift operation of the scan path of the test circuit, and the control signal generation circuit comprises at least one cyclic shift register for transmitting a control signal to the test circuit. The cyclic shift register comprises first and second register parts, and a shift-in selector for selecting a shift-in signal to be inputted in the first register part. One input terminal of the shift-in selector receives a data input signal for the cyclic shift register, and another input terminal of the shift-in selector receives a data output signal which is outputted from the cyclic shift register.

Preferably, the semiconductor memory testing device according to the eleventh aspect of the present invention further comprises a shift-in selector for selecting the data input signal for the cyclic shift register and the data output signal which is outputted from the cyclic shift register as the shift-in signal of the cyclic shift register in the one input terminal of the first selector of the first register part.

Preferably, the cyclic shift register further comprises a control signal input terminal for simultaneously switching/controlling the first selector of the first register part and the second selector of the second register part.

Preferably, the cyclic shift register further comprises one control signal input terminal for simultaneously switching/controlling the first selector of the first register part and the second selector of the second register part, and another control signal input terminal for switching/controlling the shift-in selector.

A thirteenth aspect of the present invention relates to a semiconductor memory testing device comprising: a redundancy circuit for compensating incorrect data which is created when there is a failure in a semiconductor memory; and failure data digit designating means for designating a digit of a failure data which is related to said failure in said semiconductor memory, wherein said redundancy circuit includes: a plurality of signal lines which are connected in correspondense to data of a plurality of digits of said semiconductor memory; an extra line disposed adjacent to said signal lines; a binary signal designating part for supplying two values, said binary signal designating part supplying one of said two values to signal lines on one side to a signal line which is associated with a digit which is designated as a failure bit by said failure data digit designating means and supplying the other one of said two values to signal lines on the other side to said signal line which is associated with said digit which is designated as said failure bit; and a selector group for receiving a binary signal from said binary signal designating part, in response to said binary signal, said selector group disconnecting said signal line which is associated with said digit which is designated as said failure bit by said failure data digit designating means and for connecting an outer most signal line to said extra line and the remaining signal lines to respective next signal lines.

In a semiconductor memory testing device of a fourteenth aspect of the present invention, the failure data digit designating means is binary data holding means for holding one of the two values in correspondense to the digit of the failure data and holding the other one of the two values in correspondense to other digits. The binary signal designating part includes a plurality of AND circuits which correspond to data of the plurality of digits of the semiconductor memory. One input terminals of the plurality of AND circuits are connected respectively to digits which correspond to the binary data holding means, and the other input terminals of the plurality of AND circuits are each connected to an output terminal of an adjacent AND circuit on a larger digit side or a smaller digit side.

In a semiconductor memory testing device of a fifteenth aspect of the present invention, the failure data digit designating means is binary data holding means for holding one of the two values in correspondense to the digit of the failure data and holding the other one of the two values in correspondense to other digits, and the selector group includes: a plurality of primary selector parts for selecting mutually adjacent signal lines; and a plurality of secondary selector part for selecting output terminals of the plurality of primary selector parts. The binary signal designating part includes: a primary control circuit for switching the plurality of primary selector parts of the selector group; and a secondary control circuit for switching the plurality of secondary selector parts of the selector group. The primary control circuit includes a plurality of primary AND circuits which correspond to at least a portion of the plurality of digits of the semiconductor memory. One input terminals of the plurality of primary AND circuits are connected respectively to digits which correspond to the binary data holding means, and the other input terminals of the plurality of primary AND circuits are each connected to an output of an adjacent primary AND circuit on a larger digit side or a smaller digit side. The secondary control circuit includes a plurality of secondary AND circuits which correspond to at least a portion of the plurality of primary AND circuits. One input terminals of the plurality of secondary AND circuits are connected to the plurality of primary AND circuits, respectively, and the other input terminals of the plurality of secondary AND circuits are each connected to an output terminal of an adjacent secondary AND circuit on a larger digit side or a smaller digit side.

In a semiconductor memory testing device of a sixteenth aspect of the present invention, the failure data digit designating means is binary data holding means for holding one of the two values in correspondense to the digit of the failure data and holding the other one of the two values in correspondense to other digits, and the selector group includes: a plurality of first-layer selector parts for selecting mutually adjacent signal lines; and a second- to an N-th layer selector parts for selecting output terminals of the plurality of first-layer selector parts (where N is an integer not smaller than 2). The binary signal designating part includes a first- to an N-th layer control circuits for switching the first- to N-th layer selector parts of the selector group. The first-layer control circuit includes a plurality of first-layer AND circuits which correspond to at least a portion of said plurality of digits of the semiconductor memory. One input terminals of the plurality of first-layer AND circuits are respectively connected to digits which correspond to the binary data holding means, and the other terminals of the plurality of first-layer AND circuits are each connected to an output terminal of an adjacent first-layer AND circuit on a larger digit side or a smaller digit side. The second- to N-th layer control circuits each include at least: a plurality of control selectors for receiving signals from the first- to (N−1)-th layer AND circuits of the first- to (N−1)-th layer control circuits and disconnecting the binary data holding means adjacent to the failure data digit designating means; and a plurality of a second- to N-th layer AND circuits which correspond to the control selectors. One input terminals of the second to N-th layer AND circuits are connected to corresponding ones of the control selectors, and the other terminals of the second to N-th layer AND circuits are each connected to an output terminal of an adjacent-layer AND circuit on a larger digit side or a smaller digit side.

In a semiconductor memory testing device of a seventeenth aspect of the present invention, the binary data holding means is a register whose digit number corresponds to a data digit number of the semiconductor memory.

In a semiconductor memory testing device of an eighteenth aspect of the present invention, the binary data holding means is a register whose digit number corresponds to a data digit number of the semiconductor memory.

In a semiconductor memory testing device of a nineteenth aspect of the present invention, the binary data holding means is a plurality of flip-flops connected to the feedback loop wires.

In a semiconductor memory testing device of a twentieth aspect of the present invention, there are a plurality of ports disposed to correspond to the data digit number of the semiconductor memory, and the semiconductor memory testing device further comprising an AND circuit for calculating a logical product for each port and supplying the logical product to the binary data holding means.

When the semiconductor memory testing device according to the first aspect of the present invention is set in a test mode, the comparison circuit compares the data input signal with the expected data signal on the basis of the external comparison enable signal. Further, the selector means selects and outputs the external desired signal and the data input signal on the basis of the shift mode control signal. Only when the data input signal and the expected data signal are equal to each other, the output data from the selector means is incorporated in the flip-flop circuit. The data incorporation of the flip-flop circuit is allowed in accordance with prescribed timing based on the external cyclic clock signal when no shift inhibiting signal is inputted from the exterior, while data of the flip-flop circuit is held when the shift inhibiting signal is received from the exterior. Thus, it is possible to reload data in the flip-flop circuit in response to the result of comparison of expected value data and input data by simply employing a one-phase clock signal, whereby a test clock signal can be omitted with requirement for neither a complicated two-phase clock signal nor a complicated clock driver circuit for supplying the clock signal, dissimilarly to the first prior art.

In the semiconductor memory testing device according to the first aspect of the present invention, the timing signal is stopped when the shift inhibiting signal is inputted in the timing stop circuit whether the clock signal is inputted or not, whereby it is possible to reliably and readily hold the data of the flip-flop circuit in a simple structure.

In the semiconductor memory testing device according to the first aspect of the present invention, the second selector circuit of the data holding means selects the output data from the flip-flop circuit transmitted from the loop wire when the shift inhibiting signal is received, to feed back the output data to the flip-flop circuit through the first selector circuit. Namely, the data is fed back and held during this time even if the flip-flop circuit carries out a shift operation. Thus, the data can be reliably and readily held.

In the semiconductor memory testing device according to the first aspect of the present invention, the output data from the flip-flop circuit transmitted through the loop wire is selected in place of the output data from the selector means when the data selection circuit receives the shift inhibiting signal, so that the data is fed back to the flip-flop circuit. Namely, the data is fed back and held during this time even if the flip-flop circuit carries out a shift operation. Thus, the data can be reliably and readily held.

In the semiconductor memory testing device according to the first aspect of the present invention, the reset operation can be made on the basis of the reset signal from the comparison circuit, whereby the reset operation is facilitated in the aforementioned structure.

In the semiconductor memory testing device according to the first aspect of the present invention, the feedback inhibiting element is connected to the loop wire, whereby output feedback of the flip-flop circuit can be reliably and readily inhibited when the reset signal is outputted from the comparison circuit.

In the semiconductor memory testing device according to the second aspect of the present invention, the effective address number storage part first stores the effective address number of the semiconductor memory. The address generation part of the arithmetic and logic part generates addresses of the semiconductor memory for storing the test pattern on the basis of a prescribed arithmetic expression and transmits the same to the address input shift register, so that the test pattern is written in the semiconductor memory by this addressing. At this time, the address change means receives a prescribed bit number of addresses for bitwisely incrementing or decrementing the prescribed bit number of addresses every shift operation of the address input shift register in a number of times corresponding to the effective address number of the effective address number storage part, thereby changing the prescribed bit number of addresses in the address generation part. During the address change, the write control command part inhibits writing of the test pattern in the semiconductor memory.

In the semiconductor memory testing device according to the second aspect of the present invention, the address incrementing or decrementing operation of the address change means and the test pattern generating operation is switched by the switch, whereby it is possible to switch the type of the data stored in the registers of the arithmetic and logic part between those for the incrementing or decrementing operation and those for the test pattern generating operation in response to switching at any time. Namely, it is possible to change/store different types of data in the same registers through time difference, whereby the number of the registers can be reduced to reduce the circuit scale.

In the semiconductor memory testing device according to the second aspect of the present invention, it is possible to inhibit a correct/error decision on the output of the semiconductor memory by the comparison inhibiting means, in addition to the aforementioned writing inhibition in the write control command part.

In the semiconductor memory testing device according to the second aspect of the present invention, the address change means is formed by the adder element, the AND circuit and the storage element, whereby a counting operation can be implemented in an extremely simple structure as compared with a case of externally mounting a commercially available N-ary counter or the like. The address change means simply receives the prescribed bit number of addresses bitwisely for incrementing or decrementing the same, whereby the circuit scale can be so reduced that the overall area of the testing device can be remarkably reduced as compared with a case of connecting a commercially available counter to the exterior for incrementing or decrementing prescribed bits while counting the same.

In the semiconductor memory testing device according to the second or third aspect of the present invention, the maximum address value serving as a comparison reference value is previously stored in the maximum address value storage register. Then, the address generation part of the arithmetic and logic part generates the pseudo-random address of the semiconductor memory for storing the test pattern on the basis of a prescribed arithmetic expression, so that the test pattern is written in the address by the address input shift register. At this time, the maximum address value of the maximum address value storage register is compared with the address newly generated in the arithmetic and logic part, so that writing of the test pattern in the semiconductor memory is inhibited when the newly generated address is determined as being greater than the maximum address value. Thus, it is possible to freely cope with any value of the address number (word number) of the semiconductor memory by simply storing the address number in the maximum address value storage register.

In the semiconductor memory testing device according to the third aspect of the present invention, it is possible to generate bit data which are different in value from bit data of the pseudo-random address of the semiconductor memory even if all bit data are at the same value of "0000" or "1111" in the case of four bits, for example, by the dissimilar value bit data generation circuit to be contained in the subsequently generated address of the semiconductor memory, whereby a new pseudo-random address can be successively generated.

In the semiconductor memory testing device according to the third aspect of the present invention, comparison of lower bits which are capable of allowing two different types of values is omitted but only specific upper bits are employed for comparing the maximum address value of the maximum address value storage register and the address newly generated in the arithmetic and logic part by the comparison circuit. Thus, it is possible to simplify the comparing operation in the comparison circuit, as well as to reduce the comparison time. Further, the circuit scale can be reduced due to the circuit structure which is required for only comparison of the specific upper bits.

In the semiconductor memory testing device according to the second aspect of the present invention, the virtual vertical axis addresses and the virtual horizontal axis addresses are stored by the vertical axis storage bit group and the horizontal axis storage bit group of the two-dimensional pattern storage part respectively. The address input shift register writes the test pattern on the basis of combination of the virtual vertical and horizontal axis addresses. Thus, it is possible to employ a two-dimensional pattern storage part of a simple structure having an extremely small bit number for implementing a complicated test pattern. In particular, it is possible to implement a checker board pattern in a simple structure. Further, it is possible to select a column bar pattern and, a row bar pattern in a simple structure. In addition, it is possible to select a checker board pattern, a column bar pattern and a row bar pattern in a simple structure.

In the semiconductor memory testing device according to the fourth aspect of the present invention, the address output of the testing device requires a large word number in correspondence to the number of semiconductor memories in the case of a dynamic burn-in test with a number of semiconductor memories which are connected at the same time. In order to minimize the circuit scale in this case, the generating function is generated by the shift register and two types of different data are alternately generated by the address chance means on the basis of the generating function to alternately invert the test patterns written in the address input shift register. Thus, it is possible to input data inverted between odd and even periods in an extremely simple structure.

In the semiconductor memory testing device according to the third aspect of the present invention, the detection circuit detects whether the maximum address value of the maximum address value storage register and the address newly generated by the arithmetic and logic part are equal to each other. Inhibition of writing of the test pattern in the semiconductor memory is canceled when the detection circuit detects that the newly generated address is equal to the maximum address value by the cancel function of the write control command part. Thus, it is possible to specify specific addresses.

In the semiconductor memory testing device according to the fifth aspect of the present invention, either an odd or even value of the data input signal is detected by the mode decision part to decide an operation mode for driving the test pattern generation circuit when shift operations of the respective shift registers of the test pattern generation circuit are inhibited, so that the signal generation part generates the shift inhibiting signals corresponding to the respective shift registers of the test pattern generation circuit on the basis of the decision. Namely, it is possible to internally and automatically generate a plurality of shift inhibiting signals, thereby reducing connection terminals as compared with a case of supplying shift inhibiting signals from an external device.

In the semiconductor memory testing device according to the fifth aspect of the present invention, the indication signal is inputted in the indication terminal, to indicate generation of shift inhibiting signals to the inhibiting signal generation means. At this time, deviation may be caused between the indication timing of the indication signal and input start timing of the data input signal, leading to erroneous data recognition. Therefore, the mark detection means detects a mark included in the data input signal, so that the timing correction means makes the indication timing of the indication signal match with a point of time of mark completion of the data input signal on the basis of the detection result. Thus, it is possible to prevent erroneous data recognition.

In the semiconductor memory testing device according to the sixth aspect of the present invention, the shift inhibiting signals are inputted from the shift inhibiting signal input terminal on a side corresponding to the output side of the serially connected body when the shift inhibiting signals are supplied in a pipeline manner in data compression. Then, a plurality of semiconductor memories grouped every flip-flop of the pipeline are inhibited from shift operations successively from those of the output side group, whereby data compression can be automatically and readily carried out. Thus, it is possible to carry out data compression at an extremely high speed as compared with the fourth prior art regularly inhibiting operations of all semiconductor memories.

In the semiconductor memory testing device according to the seventh aspect of the present invention, the test data generation circuit transmits the expected data signal to the test circuit in a multiple equivalent distribution mode, so that the comparison circuit makes a correct/error decision on data in the memory core. In the shift mode, on the other hand, no correct/error decision is made by the comparison circuit and hence no influence is exerted on the operation in the test circuit whatever signal is inputted in the expected data input terminal. Thus, it is possible to input the switching signal for switching the selectors by the expected data input terminal. Namely, a terminal dedicated to the switching signal can be omitted, thereby reducing the total number of terminals.

In the semiconductor memory testing device according to the eighth or ninth aspect of the present invention, the selector is switched to one selection input terminal side by the signal from the switching signal input terminal for inputting address signals in a shift mode for a logic test or the like so that the address signals from the shift-in terminal are bitwisely inputted in the most preceding flip-flop in the address input scan path and shifted in the scan path. When the address signals are inputted in a multiple equivalent distribution (multiplexer) mode for a detailed test such as galloping, on the other hand, the selector is switched to another selection input terminal side by the signal from the switching signal input terminal so that a plurality of bits of address signals are inputted from the multiple terminal in the respective flip-flops in a multiple manner, so that the same are inputted in memory cells. Thus, it is possible to extremely readily switch the shift mode and the multiple equivalent distribution (multiplexer) mode. The selectors are inserted on the series path of the scan path, whereby no selector is present on the signal path for a normal operation. Thus, it is possible to prevent signal delay for the ordinary operation.

In the semiconductor memory testing device according to the ninth aspect of the present invention, the virtual vertical axis addresses and the virtual horizontal axis addresses are switched by the selector in the address input scan path for enabling a test in detail to some extent, whereby the mode can be freely and readily switched similarly to the device according to the eighth aspect.

In the semiconductor memory testing device according to the ninth aspect of the present invention, it is possible to accurately carry out the shift operations of the first and second scan path parts at different timings.

In the semiconductor memory testing device according to the tenth aspect of the present invention, input of the individual data input signals is stopped by the individual input cancel means in a memory test of the memory test so that writing can be performed in all bits, and all data are inputted from the respective input terminals. In a test other than the memory test of the memory core, on the other hand, the individual data input signals are inputted from the individual data input terminal so that the data are individually and selectively inputted in the respective addresses of the memory core, whereby data can be updated only in a specific port. Thus, it is possible to independently set addresses.

Further, test pins which are not employed in a normal operation are generally switched with unused pins by the selectors in test execution. However, it may be impossible to insert the selectors depending on the pins, due to a problem of timing deviation. Further, pins which cannot operate at the same frequency as the internal frequency cannot be employed as test pins. In the semiconductor memory testing device according to the eleventh aspect of the present invention, both of the first and second selectors are switched to other input terminals so that the output data are again inputted in the flip-flops of the respective register parts. In this case, the data are circulated in the interior of the respective register parts and again incorporated in the original flip-flops respectively even if the respective register parts are shifted, whereby a function substantially similar to that of stopping the shift operations can be attained thereby correcting the aforementioned timing deviation. Thus, it is possible to employ pins which cannot operate at the same frequency as the internal frequency as output pins for the test result.

In the semiconductor memory testing device according to the eleventh or twelfth aspect of the present invention, the shift-in selector is switched to select a data output signal outputted from a cyclic shift register when it is necessary to delay data in this cyclic register. In this case, the data are circulated in the interior of the respective register parts and incorporated in the first flip-flops respectively even if the respective register parts are shifted, whereby a function substantially similar to that of stopping shift operations can be attained, thereby correcting the aforementioned timing deviation.

In the semiconductor memory testing device according to the eleventh aspect of the present invention, only one control signal is inputted in the control signal input terminal for circulating the internal data of the cyclic shift register for simultaneously switching/controlling the first and second selectors. Thus, it is possible to regularly simultaneously control both selectors in an extremely simple structure.

In the semiconductor memory testing device according to the eleventh aspect of the present invention, only one control signal is inputted in only one control signal input terminal when data is circulated in the interior of each register part, for simultaneously switching/controlling the first and second selectors. When data is circulated in the unit of one cyclic shift register, on the other hand, the control signal is inputted in another control signal input terminal and the shift-in selector is switched to select the data output signal outputted from the cyclic shift register, so that the same is again incorporated in the first register part as a shift-in signal. Thus, it is possible to regularly simultaneously control both selectors in an extremely simple structure.

In the semiconductor memory testing device according to the thirteenth aspect of the present invention, the binary signal designating part supplies one of the two values to the signal lines on one side to the signal line which is associated with the digit which is designated as a failure bit by the failure data digit designating means and supplying the other one of the two values to the signal lines on the other side to the signal line which is associated with the digit which is designated as the failure bit. In response to said binary signal from said binary signal designating part, the selector group disconnects the signal line which is associated with the digit which is designated as the failure bit by the failure data digit designating means, and connects the outer most signal line to the extra line and the remaining signal lines to respective next signal lines. Hence, the incorrect data which is created by a failure in the semiconductor memory is compensated easily.

In the fourteenth aspect of the present invention, the failure data digit designating means (i.e., binary data holding means) holds one of the two values in correspondence to the digit of the failure data and the other one of the two values in correspondence to the other digits. The value held by the failure data digit designating means are then supplied to the one input terminals of the AND circuits. Since outputs of the AND circuits are supplied in series to the other input terminals of the adjacent AND circuits, outputs of the AND circuits which are connected in series in the output direction of the one of the values which corresponds to the failure data digit are different from outputs of the AND circuits which are connected in series in the input direction. In accordance with the outputs from the respective AND circuits, the selector group disconnects the signal line which corresponds to the digit which is designated as the failure bit by the failure data digit designating means, and connects the outer most signal line to the extra line and the remaining signal lines to respective next signal lines. Hence, with a very simple structure formed by the AND circuits it is possible to easily compensate the incorrect data which is created by a failure in the semiconductor memory.

In the fifteenth aspect of the present invention, it is possible to detect failure data in one direction using the primary control circuit of the binary signal designating part. By switching the primary selector parts of the selector group based on the detected failure data, the failure data of one digit is compensated. Next, failure data is detected in an opposite direction using the secondary control circuit of the binary signal designating part. By switching the secondary selector parts, the failure data of additional one digit is compensated. In total, failure data of two digits is compensated in a very simple structure.

In the sixteenth aspect of the present invention, the first-layer selector parts and the second- to N-th layer selector parts form a hierarchy structure. Since failure data of one digit is compensated at every layer of the hierarchy structure, failure data of multiple digits is compensated in a very simple structure.

In the seventeenth aspect of the present invention, the binary data holding means is a register whose digit number corresponds to a data digit number of the semiconductor memory. Hence, it is possible to hold binary data with a very simple structure.

In the eighteenth aspect of the present invention, the binary data holding means is a plurality of flip-flops connected to data feedback loop wires. Hence, it is possible to hold binary data with a very simple structure.

In the nineteenth aspect of the present invention, where there are a plurality of ports set with respect to the data digits within the semiconductor memory, a logical product at each port is calculated by the AND circuits and supplied to the binary data holding means. Hence, it is possible to compensate data associated with a digit of failure data which is created at any one of the ports.

According to the first aspect of the present invention, the data in the flip-flop circuit can be reloaded in response to the comparison result of the expected value data and the input data by simply employing a one-phase clock signal, whereby the test clock signal can be omitted with requirement for neither a complicated two-phase clock signal nor a complicated clock driver circuit for supplying the clock signal, dissimilarly to the first prior art.

According to the first aspect of the present invention, the timing signal for the flip-flop is stopped when the shift inhibiting signal is inputted in the timing stop circuit whether the clock signal is inputted or not, whereby the data of the flip-flop circuit can be reliably and readily held in a simple structure.

According to the first aspect of the present invention, the output data from the flip-flop circuit is fed back by the data holding means when the shift inhibiting signal is received, whereby the data can be reliably and readily held.

According to the first aspect of the present invention, the reset operation is made on the basis of the reset signal from the comparison circuit, whereby the reset operation is facilitated in the aforementioned structure.

According to the first aspect of the present invention, the feedback inhibiting element is connected to the loop wire, whereby output feedback of the flip-flop circuit can be reliably and readily inhibited when the reset signal is outputted from the comparison circuit.

According to the second aspect of the present invention, the write control command part inhibits writing of the test pattern in the RAM on the basis of the number of times corresponding to the effective address number of the effective address number storage part when the address change means increments or decrements the addresses, whereby it is possible to prevent the address input shift register from specifying addresses being changed, for preventing writing of the test pattern in the RAM and comparison with the expected value as to erroneous addresses.

According to the second aspect of the present invention, the address incrementing or decrementing operation in the 1-bit counter and the test pattern generating operation is switched by the switch, whereby it is possible to switch the type of data stored in the registers provided in the arithmetic and logic part between data for the incrementing or decrementing operation and data for the test pattern generating operation in correspondence to the switching. Namely, it is possible to change/store different types of data in the same registers through time difference, thereby reducing the number of registers as well as reducing the circuit scale.

According to the second aspect of the present invention, the expected value generation circuit, the comparison circuit and the comparison inhibition means are so provided that it is possible to inhibit the correct/error determination on the output of the semiconductor memory in the comparison inhibition means, in addition to writing inhibition in the write control command part.

According to the second aspect of the present invention, the address change means is formed by the adder element, the AND circuit and the storage element, whereby a count operation can be implemented in an extremely simple structure as compared with a case of externally mounting a commercially available N-ary counter or the like. The address change means simply bitwisely receives a prescribed bit number of addresses to increment or decrement the same, whereby the circuit scale can be so reduced that the area of the overall testing device can be extremely reduced as compared with a case of connecting a commercially available counter to the exterior and incrementing or decrementing prescribed bits with counting.

According to the second or third aspect of the present invention, the testing device comprises the comparison circuit for comparing the maximum address value of the maximum address value storage register and the address newly generated in the arithmetic and logic part and the write control command part for inhibiting writing of the test pattern in the semiconductor memory when the comparison circuit determines that the address newly generated in the comparison circuit is greater than the maximum address value, whereby it is possible to write the test pattern in the semiconductor memory only when the newly generated address is less than or equal to the maximum address value while inhibiting writing of the test pattern in the semiconductor memory when the former is greater than the latter regardless of the address number (word number) of the semiconductor memory when the pseudo-random address of the semiconductor memory is generated to write the test pattern. Thus, it is possible to freely make a functional test as to a semiconductor memory having an arbitrary number of addresses.

According to the third aspect of the present invention, it is possible to generate bit data which are different in value from data in the dissimilar value bit data generation circuit so that the same are included in the subsequent address of the semiconductor memory even if all bit data of the precedingly generated pseudo-random address of the semiconductor memory are at the same value of "0000" in the case of four bits, for example, whereby it is possible to successively venerate the new pseudo-random address.

According to the third aspect of the present invention, it is possible to make comparison between the maximum address of the maximum address value storage register and an address newly generated in the arithmetic and logic circuit in the comparison circuit through only specific upper bits while omitting comparison of lower bits which are capable of allowing two different types of values, thereby simplifying the comparing operation in the comparison circuit. Thus, it is possible to reduce the comparison time and the circuit structure can be simplified in response to comparison of the specific upper bits, whereby the circuit scale can be reduced.

According to the second aspect of the present invention, the two-dimensional pattern storage part having the vertical axis storage bit group and the horizontal axis storage bit group is so provided that the address input shift register can write the test pattern on the basis of combination of the virtual vertical axis addresses and the virtual horizontal axis addresses stored therein respectively. Thus, it is possible to employ the two-dimensional pattern storage part of a simple structure having an extremely small bit number for implementing a complicated test pattern. In particular, it is possible to implement a checker board pattern in a simple structure. Further, it is possible to select a column bar pattern and a row bar pattern in a simple structure. Further, it is possible to select a checker board pattern, a column bar pattern and a row bar pattern in a simple structure.

According to the fourth aspect of the present invention, it is possible to alternately invert the test pattern as written by the address input shift register by forming the generating function in the shift register and alternately generating two different types of data in the 1-bit counter. Thus, the circuit structure is small with an extremely simple structure also in a dynamic burn-in case, and inverted data can be inputted in odd and even cycles.

According to the third aspect of the present invention, the testing device further comprises the detection circuit for detecting whether or not the address value of the maximum address value storage register and the address newly generated in the arithmetic and logic part are equal to each other and the write control command part is provided with a cancel function of canceling inhibition of writing of the test pattern in the semiconductor memory when the detection circuit detects that the newly generated address is equal to the maximum address value, whereby only a specific address can be tested.

According to the fifth aspect of the present invention, the mode decision part detects either an odd or even data input signal when the shift operation of each shift register of the test pattern generation circuit is inhibited to make a decision of an operation mode for driving the test pattern generation circuit so that the signal generation part generates the shift inhibiting signal corresponding to each shift register of the test pattern generation circuit, whereby a plurality of shifting inhibiting signals can be internally and automatically generated so that connection terminals can be reduced as the case of supplying shifting inhibiting signals from an external device.

According to the fifth aspect of the present invention, the mark detection means detects the mark included in the data input signal so that the timing correction means makes indication timing of the indication signal match with the point of time after mark completion of the data input signal, whereby it is possible to prevent erroneous recognition of data even if deviation is caused between indication timing of the indication signal and input start timing of the data input signal in indication of generation of the shift inhibiting signal in the inhibiting signal generation means.

According to the sixth aspect of the present invention, the shift inhibiting signals are inputted from the shift inhibiting signal input terminal corresponding to an output side of the serially connected body, whereby shifting operations of the plurality of semiconductor memories grouped every flip-flop of the pipeline can be inhibited successively from those of the output side group when the shift inhibiting signals are supplied in a pipeline manner in data compression, so that data compression can be automatically and readily performed. Thus, it is possible to carry out data compression at an extremely high speed as compared with the fourth prior art regularly inhibiting operations of all semiconductor memories.

According to the seventh aspect of the present invention, the expected data signal is transmitted from the test data generation circuit to the test circuit so that the comparison circuit makes a correct/error decision on data in the memory core in the multiple equivalent distribution mode while no correct/error decision is made by the comparison circuit in the shift mode for eliminating influence on the test circuit for signal input in the expected data input terminal, whereby the switching signal for switching the selectors can be inputted by the expected data input terminal for omitting a terminal dedicated to the switching signal, thereby reducing the total number of terminals.

According to the eighth aspect of the present invention, the address input scan path of the test circuit comprises the plurality of flip-flops, the plurality of multiple terminals for inputting a plurality of bits of address signals in a multiple manner, the shift-in terminal for bitwisely inputting the address signals, the plurality of selectors which are connected to the respective flip-flops for selectively switching the input signals in the respective flip-flops and the switching signal input terminal for switching the selectors so that the selection input terminal of one of the selectors corresponding to the most preceding flip-flop in the shift mode is connected to the shift-in terminal, the selection input terminal of each selector corresponding to each flip-flop other than the most preceding one in the shift mode is connected to another preceding flip-flop in the shift mode and another selection input terminal of each selector corresponding to each flip-flop is connected to each multiple terminal, whereby it is possible to switch the selectors to one selection input terminal side by a signal from the switching signal input terminal for bitwisely inputting address signals from the shift-in terminal in the most preceding flip-flop in the address input scan path and shifting the same in the scan path in the case of inputting the address signals in the shift mode for a logic test, for example, or it is possible to switch the selectors to other selection input terminals by the signal from the switching signal input terminal for inputting the plurality of bits of address signals in the respective flip-flops from the multiple terminal in a multiple manner and inputting the same in memory cells for inputting address signals in the multiple equal distribution (multiplexer) mode for a detailed test such as galloping. Thus, it is possible to extremely simply switch the shift mode and the multiple equal distribution (multiplexer) mode. Since the selectors are inserted on a series path of the scan path, no selectors exist on a signal path in a normal operation. Thus, it is possible to prevent signal delay for the normal operation. When a detailed test of a certain degree is carried out, in particular, it is possible to switch the virtual vertical axis addresses and the vertical horizontal axis addresses in the address input scan path by the selectors thereby freely and readily switching the mode similarly to the testing device according to the eighth aspect of the present invention.

According to the ninth aspect of the present invention, the testing device comprises the first shift inhibiting signal input terminal for inputting the shift inhibiting signal for inhibiting the shift operation of the first scan path part and the second shift inhibiting signal input terminal for inputting the shift inhibiting signal for inhibiting the shift operation of the second scan path part, whereby the shift operations of the first and second scan path parts can be accurately performed at separate timings.

According to the tenth aspect of the present invention, the test circuit comprises the data input register, the individual data input terminal for inputting the individual data input signals for individually/selectively inputting data in the respective addresses of the memory core at a time other than a memory test time and the individual input cancel means for canceling the individual input by the individual data input signals in the memory test time, whereby it is possible to cancel input of the individual data input signals by the individual input cancel means in the memory test of the memory core so that writing can be performed in all bits for inputting all data from the respective input terminals while inputting the individual data input signals from the individual data input terminals for individually/selectively inputting the data in the respective addresses of the memory core at a time other than the memory test time for the memory core, thereby updating data of only a specific port. Thus, it is possible to independently set the addresses.

According to the eleventh aspect of the present invention, both the first and second selectors are switched to other input terminals so that output data thereof are again inputted in the flip-flops of the respective register parts, whereby the data are circulated in the interior of the respective register parts even if the respective register parts are shifted so that the same are again incorporated in the original flip-flops respectively, whereby it is possible to attain a function substantially similar to that of stopping the shift operations. Even if the timing deviates depending on the pin as employed, therefore, it is possible to correct such timing deviation. Thus, a pin which cannot operate at the same frequency as an internal frequency can be employed as an output pin of a test result.

According to the eleventh or twelfth aspect of the present invention, the shift-in selector is so switched that the data output signals outputted from the cyclic shift registers can be selected, whereby it is possible to attain a function substantially similar to that of stopping the shift operations by circulating the data in the interior of the respective register parts simultaneously with shifting of the respective register parts when it is necessary to delay the data in the cyclic shift registers for incorporating the data in the first flip-flops respectively. Thus, it is possible to correct the aforementioned timing deviation, thereby employing a pin which cannot operate at the same frequency as an internal frequency as an output pin of a test result.

According to the eleventh aspect of the present invention, only one control signal is inputted in the control signal input terminal so that the first and second selectors can be simultaneously switched/controlled, whereby it is possible to regularly simultaneously correct both selectors for circulating internal data of the cyclic shift registers in an extremely simple structure.

According to the eleventh aspect of the present invention, each cyclic shift register comprises one control signal input terminal for simultaneously switching/controlling the first and second selectors and another control signal input terminal for switching/controlling the shift-in selector, whereby it is possible to freely select the data circulation path for circulating the data in the interior of each register part or circulating the same in the unit of the cyclic shift register by inputting the control signal in any of the control signal input terminals.

According to the thirteenth aspect of the present invention, the binary signal designating part supplies one of the two values to the signal lines on one side to the signal line which is associated with the digit which is designated as a failure bit by the failure data digit designating means and supplying the other one of the two values to the signal lines on the other side to the signal line which is associated with the digit which is designated as the failure bit. In response to said binary signal from said binary signal designating part, the selector group disconnects the signal line which is associated with the digit which is designated as the failure bit by the failure data digit designating means, and connects the outer most signal line to the extra line and the remaining signal lines to respective next signal lines. Hence, the incorrect data which is created by a failure in the semiconductor memory is compensated easily.

According to the fourteenth aspect of the present invention, the one input terminals of the AND circuits of the binary signal designalting part are respectively connected to the digits corresponding to the binary data holding means, and the other input terminals of the AND circuits of the binary signal designalting part are serially connected in one direction on either the larger digit side or the smaller digit side. Hence, the selector group can disconnect the signal line which corresponds to the digit which is designated as the failure bit by the failure data digit designating means and connect the outer most signal line to the extra line and the remaining signal lines to respective next signal lines. Hence, with a very simple structure formed by the AND circuits, it is possible to easily compensate the incorrect data which is created by a failure in the semiconductor memory.

According to the fifteenth aspect of the present invention, it is possible to detect failure data in one direction using the primary control circuit of the binary signal designating part. By switching the primary selector parts of the selector group based on the detected failure data, the failure data of one digit is compensated. Next, failure data is detected in an opposite direction using the secondary control circuit of the binary signal designating part. By switching the secondary selector parts, the failure data of additional one digit is compensated. In total, failure data of two digits is compensated in a very simple structure.

According to the sixteenth aspect of the present invention, the first-layer selector parts and the second- to N-th layer selector parts form a hierarchy structure. Since failure data of one digit is compensated at every layer of the hierarchy structure, failure data of multiple digits is compensated in a very simple structure.

According to the seventeenth aspect of the present invention, the binary data holding means is a register whose digit number corresponds to a data digit number of the semiconductor memory. Hence, it is possible to hold binary data with a very simple structure.

According to the eighteenth aspect of the present invention, the binary data holding means is a plurality of flip-flops connected to data feedback loop wires. Hence, it is possible to hold binary data with a very simple structure.

According to the nineteenth aspect of the present invention, where there are a plurality of ports set with respect to the data digits within the semiconductor memory, a logical product at each port is calculated by the AND circuits and supplied to the binary data holding means. Hence, it is possible to compensate data associated with a digit of failure data which is created at any one of the ports.

Accordingly, an object of the present invention is to provide a semiconductor memory testing device which can be driven by a one-phase clock signal, with no requirement for a complicated clock driver circuit for supplying two-phase clock signals.

Another object of the present invention is to provide a semiconductor memory testing device which can test RAMs of arbitrary word numbers in a functional test of a plurality of RAMs.

Still another object of the present invention is to provide a semiconductor memory testing device which can initialize a necessary bit line selection register etc. in advance of formation of a test pattern.

A further object of the present invention is to provide a semiconductor memory testing device having a small area.

A further object of the present invention is to provide a semiconductor memory testing device which can test a built-in RAM core at a high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a timing chart showing a shift inhibiting operation of the flip-flop circuit provided in the semiconductor memory testing device according to the first embodiment of the present invention;

FIG. 5 is a timing chart showing a comparing operation of a comparison circuit provided in the semiconductor memory testing device according to the first embodiment of the present invention;

FIG. 14 is a timing chart showing a shift inhibiting operation of the flip-flop circuit provided in the semiconductor memory testing device according to the third embodiment of the present invention;

FIG. 15 is a timing chart showing a comparing operation of a comparison circuit provided in the semiconductor memory testing device according to the third embodiment of the present invention;

FIG. 33 is a circuit block diagram showing the logic structure of an arithmetic and logic part in the semiconductor memory testing device according to the fifth embodiment of the present invention;

FIG. 34 is a circuit block diagram showing an operation of the semiconductor memory testing device according to the fifth embodiment of the present invention;

FIG. 51 illustrates setting of respective input terminals in the semiconductor memory testing device according to the tenth embodiment of the present invention;

FIG. 61 illustrates an operation of the semiconductor memory testing device according to the proposed example;

FIG. 67 is a block diagram showing internal circuits of an address input scan path and the data input scan path provided in the semiconductor memory testing device according to the twelfth embodiment of the present invention;

FIG. 76 illustrates an operation of the semiconductor memory testing device according to the twelfth embodiment of the present invention;

FIG. 79 illustrates a state of an SINH1 signal in the semiconductor memory testing device according to the twelfth embodiment of the present invention;

FIG. 81 illustrates states of SINH-FF, RUNBIST, SINH0 and SINH1 signals with respect to the SI signal in the semiconductor memory testing device according to the twelfth embodiment of the present invention;

FIG. 83 illustrates states of BIST and SI signals in the semiconductor memory testing device according to the thirteenth embodiment of the present invention;

FIG. 85 illustrates states of SINH-FF, RUNBIST, SINH0 and SINH1 signals with respect to the SI signal in the semiconductor memory testing device according to the thirteenth embodiment of the present invention;

FIG. 86 illustrates a state of the SINH1 signal in the semiconductor memory testing device according to the thirteenth embodiment of the present invention;

FIG. 92 is a block diagram showing the RAM core and the test circuit in the semiconductor memory testing device according to the fifteenth embodiment of the present invention;

FIG. 120 is a block diagram showing the RAM core and the test circuit in the semiconductor memory testing device according to the twentieth modification of the present invention;

FIG. 121 is a block diagram showing a RAM core and a test circuit in a semiconductor memory testing device according to a sixteenth embodiment of the present invention;

FIG. 122 is a block diagram showing the RAM core and the test circuit in the semiconductor memory testing device according to the sixteenth embodiment of the present invention;

FIG. 123 is a block diagram showing a B-SCAN structure in the semiconductor memory testing device according to the sixteenth embodiment of the present invention;

FIG. 124 is a block diagram showing a B-SCAN structure in a semiconductor memory testing device according to a twenty-first modification of the present invention;

FIG. 125 is a block diagram showing a B-SCAN structure in a semiconductor memory testing device according to a twenty-second modification of the present invention;

FIG. 126 is a block diagram showing a RAM core and a test circuit in a semiconductor memory testing device according to a twenty-third modification of the present invention;

FIG. 127 is a block diagram showing the RAM core and the test circuit in the semiconductor memory testing device according to the twenty-third modification of the present invention;

FIG. 128 is a block diagram showing a RAM core and a test circuit in a semiconductor memory testing device according to a twenty-fourth modification of the present invention;

FIG. 129 is a block diagram showing the RAM core and the test circuit in the semiconductor memory testing device according to the twenty-fourth modification of the present invention;

FIG. 130 is a block diagram showing a RAM core and a test circuit in a semiconductor memory testing device according to a twenty-fifth modification of the present invention;

FIG. 131 is a block diagram showing the RAM core and the test circuit in the semiconductor memory testing device according to the twenty-fifth modification of the present invention;

Figure 132:
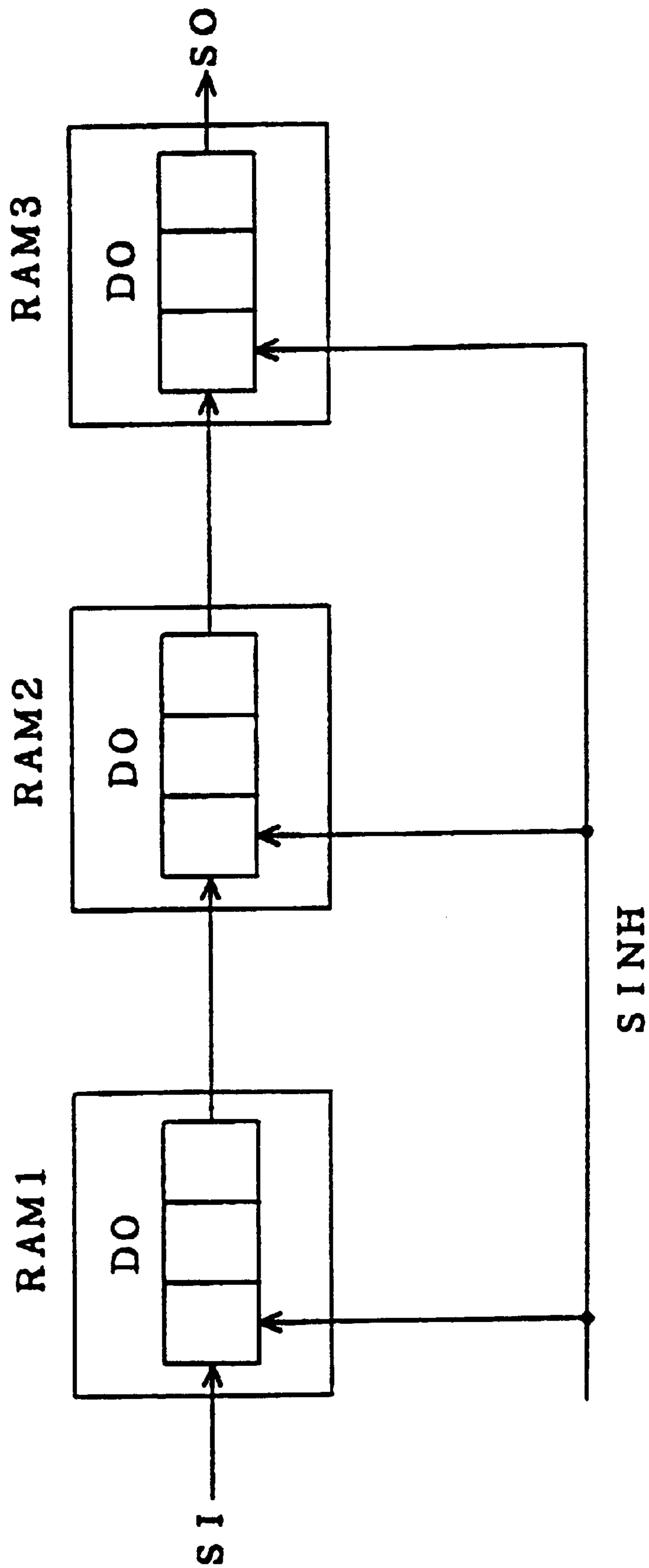
Figure 133:
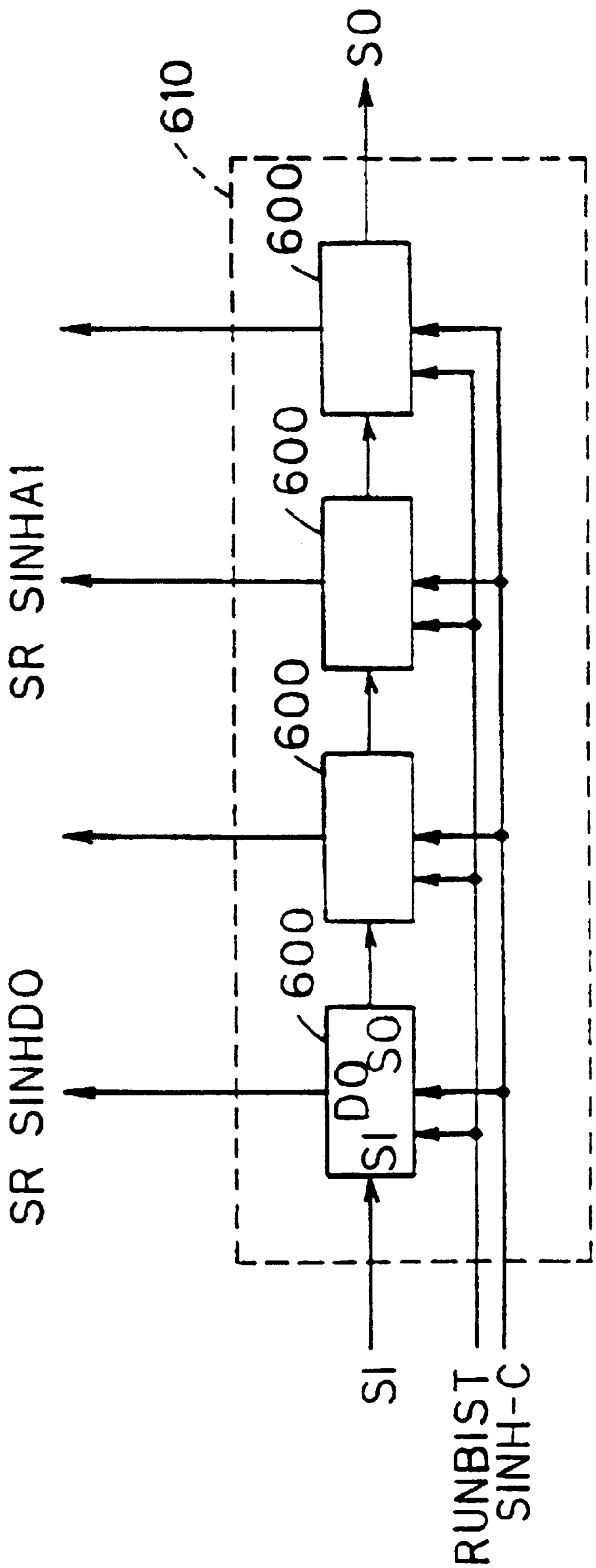
Figure 134:
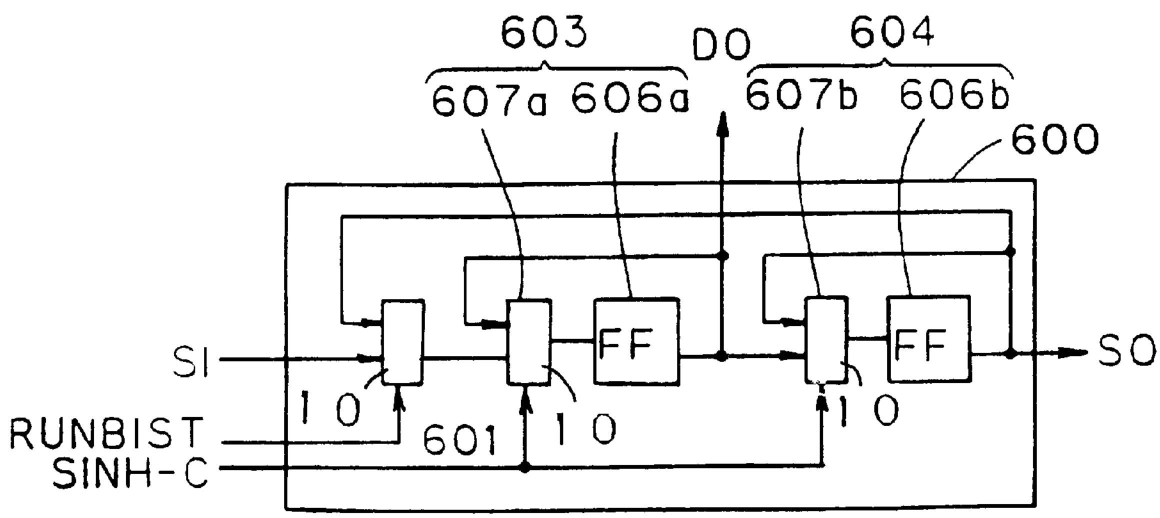
Figure 135:
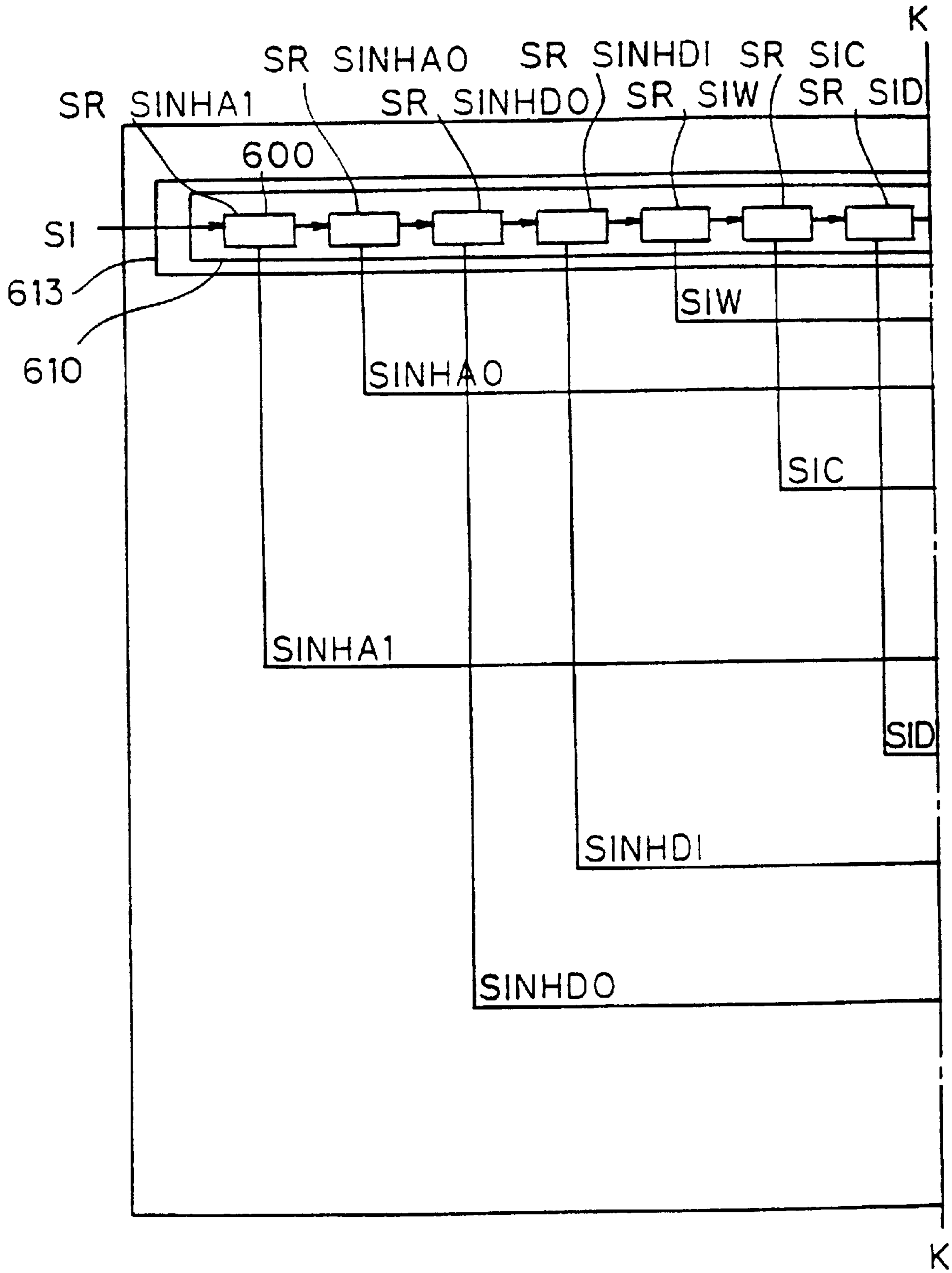
Figure 136:
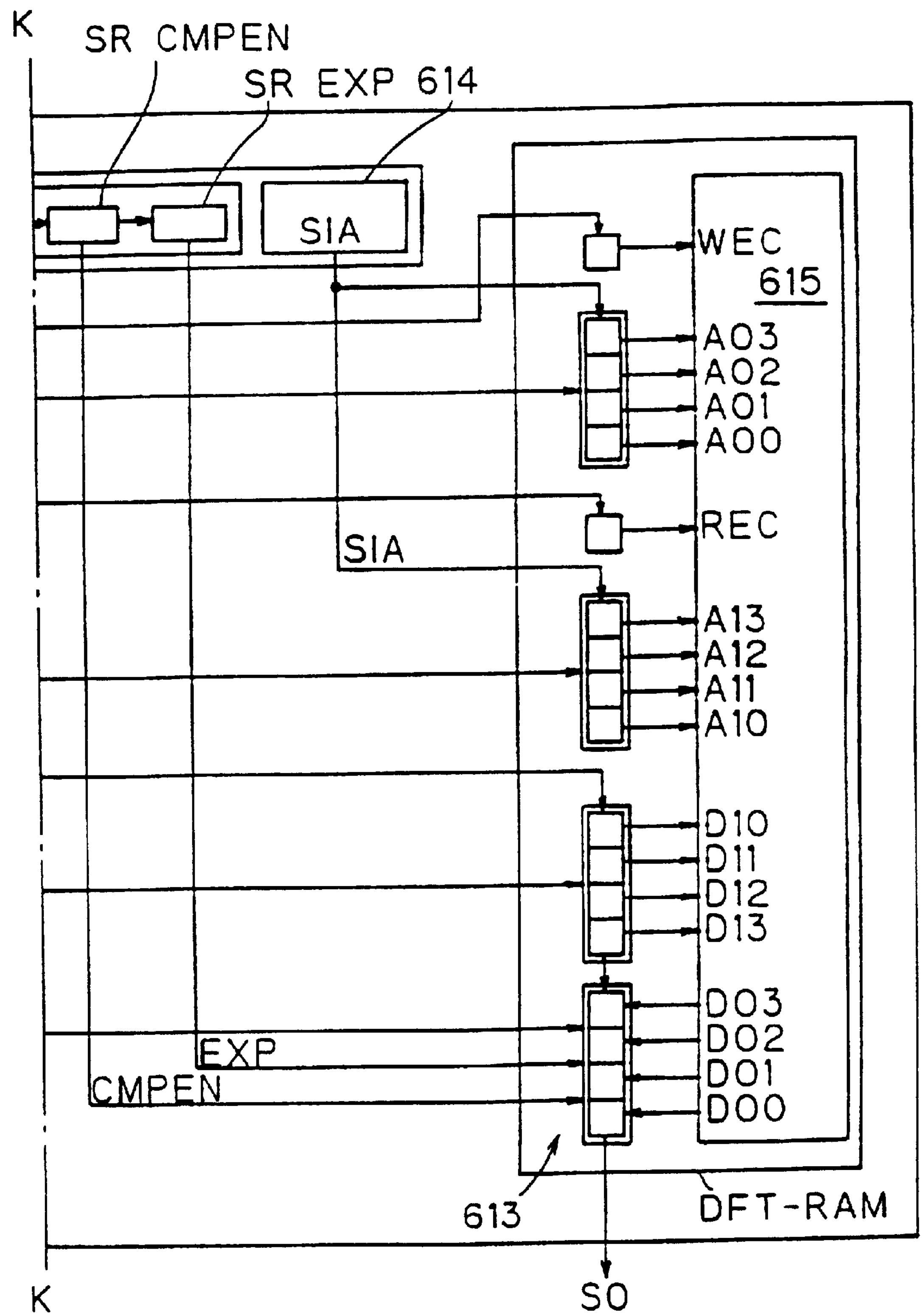
Figure 137:
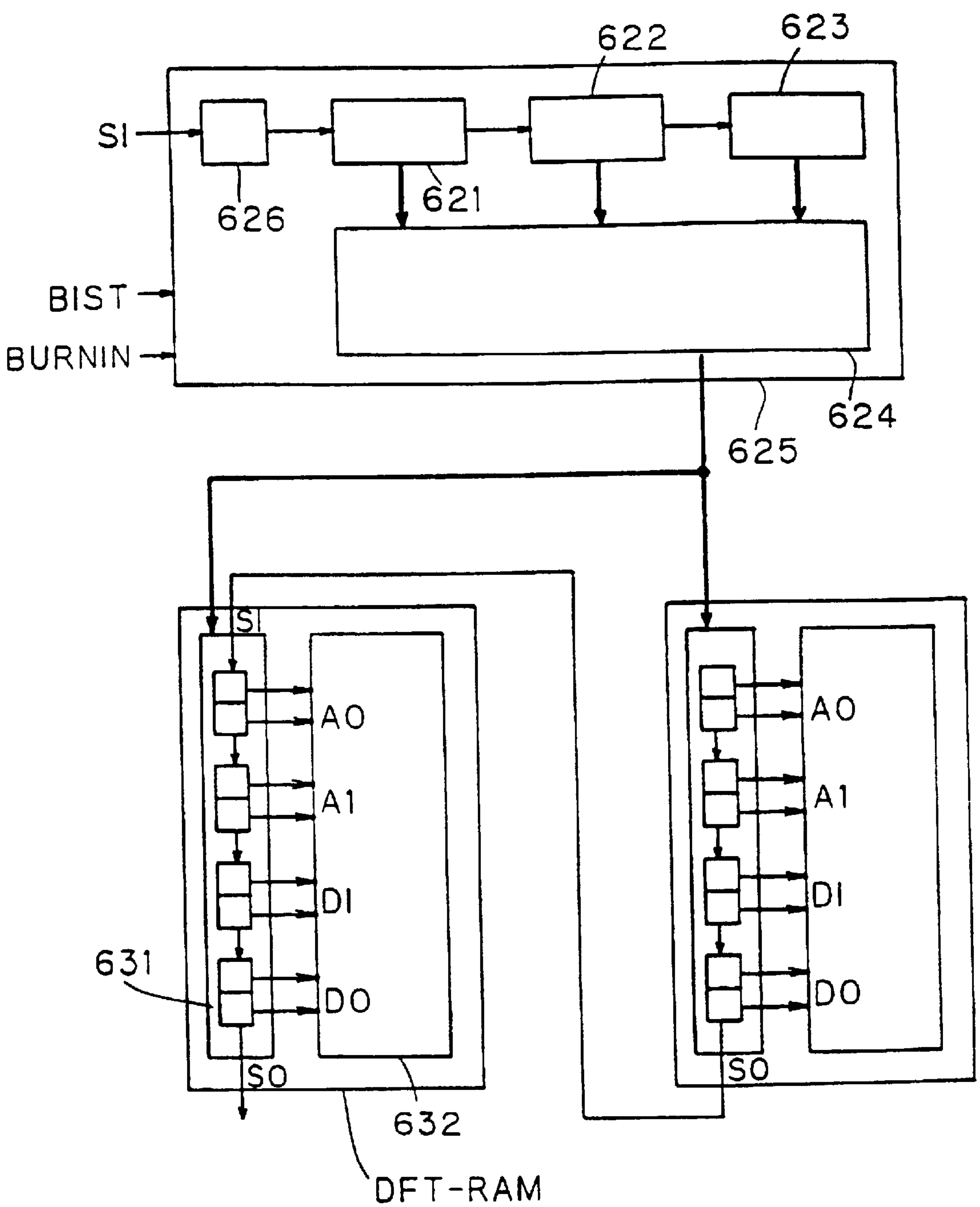
Figure 138:
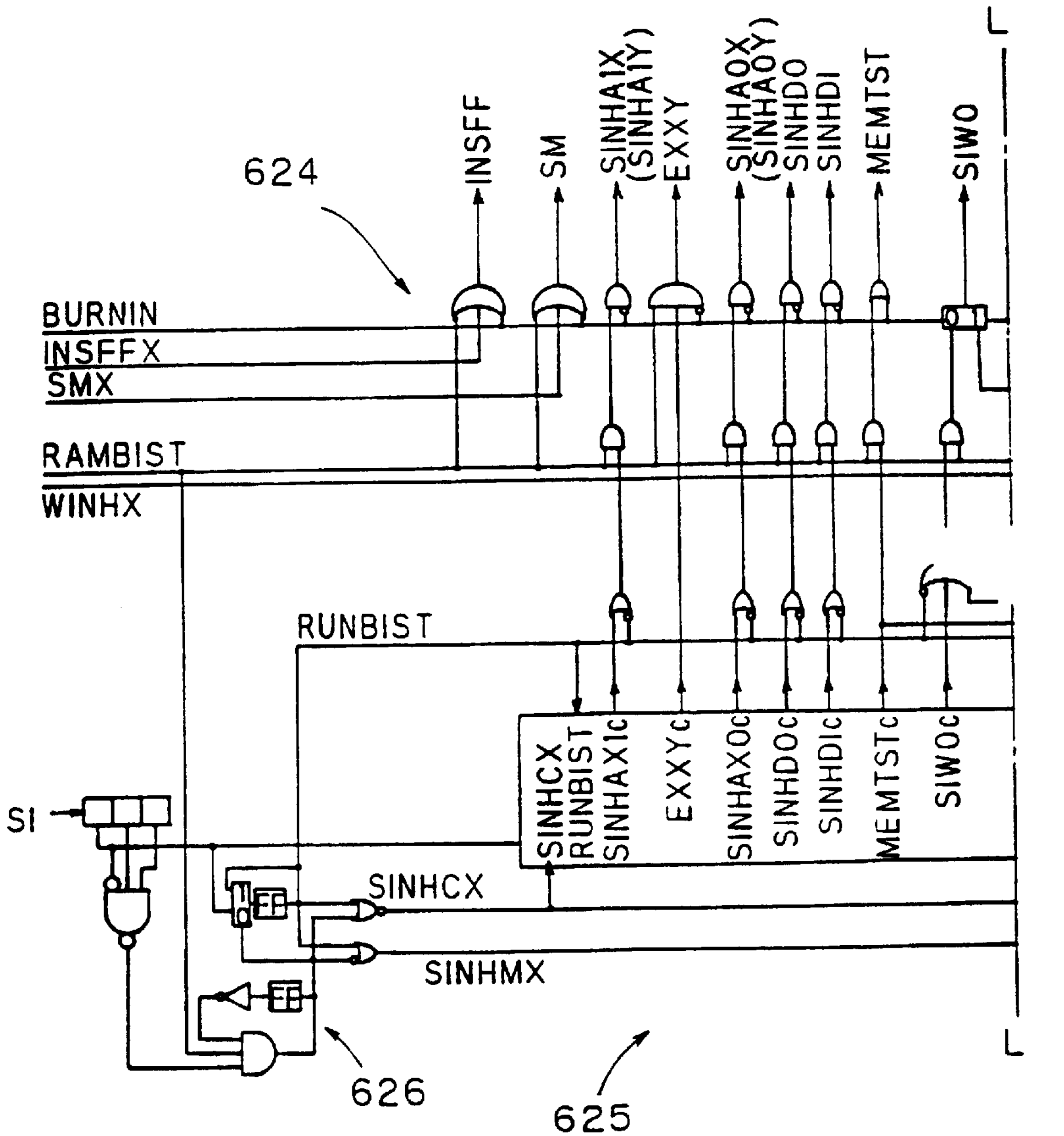
Figure 139:
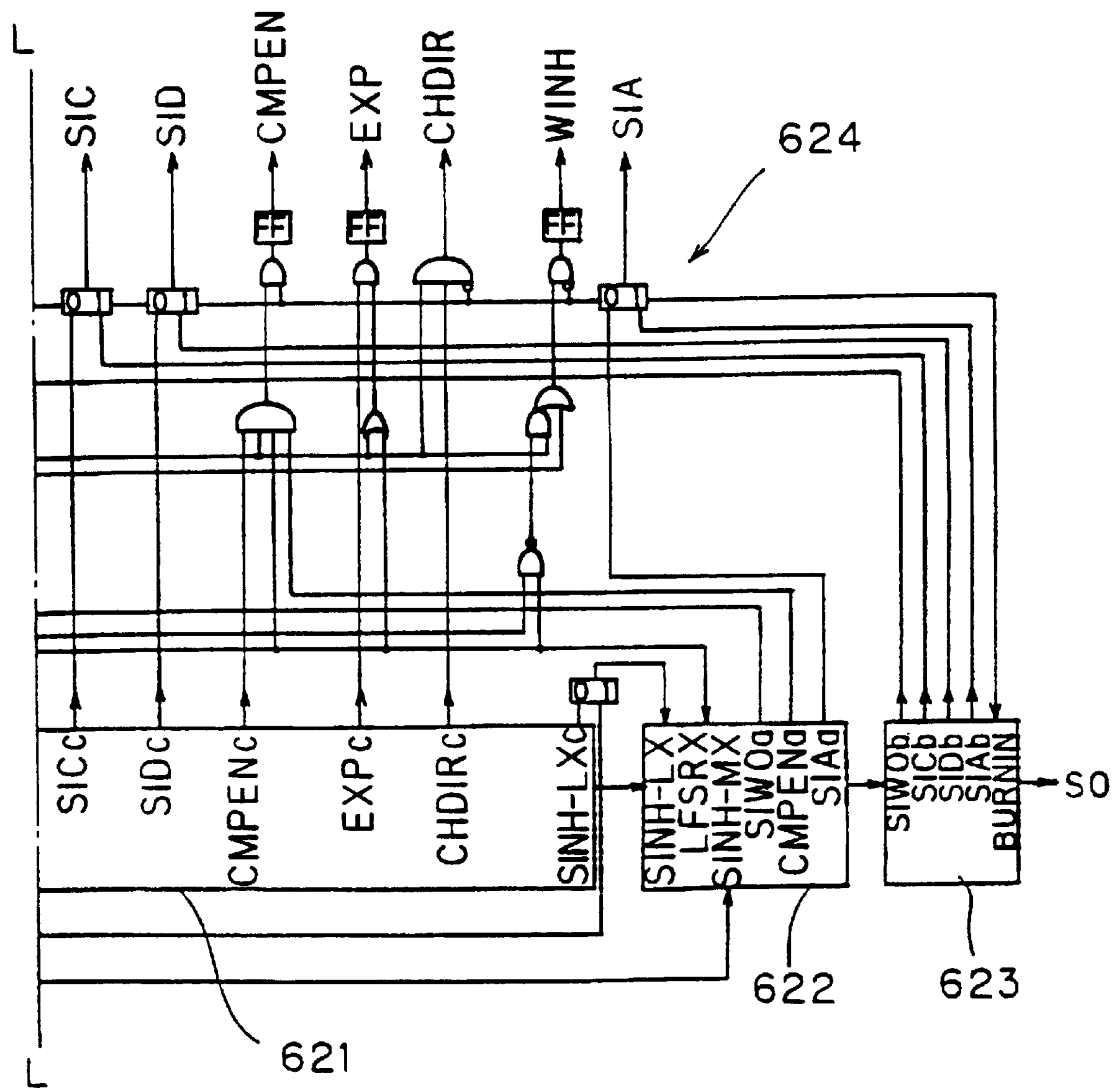
Figure 140:
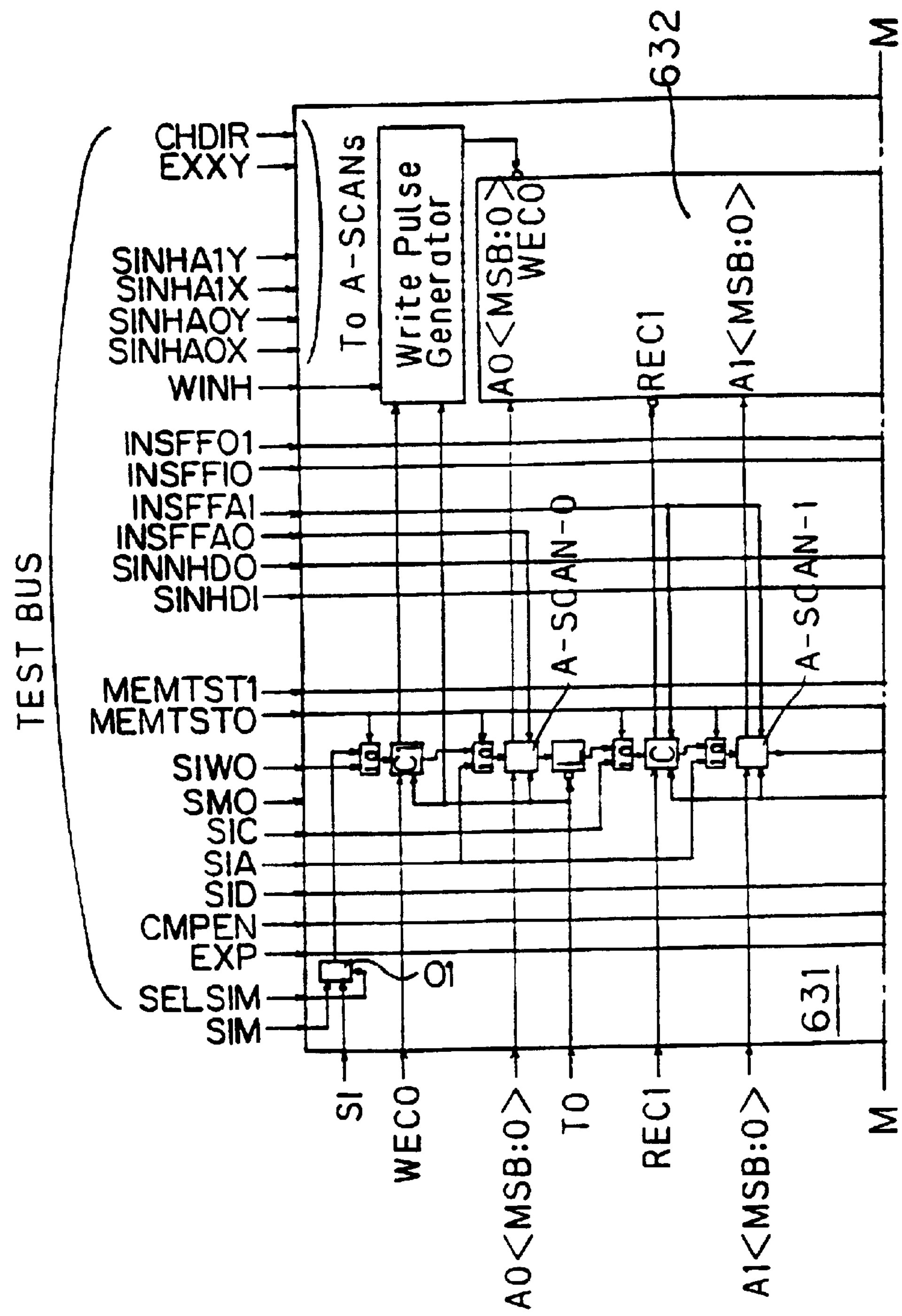
Figure 141:
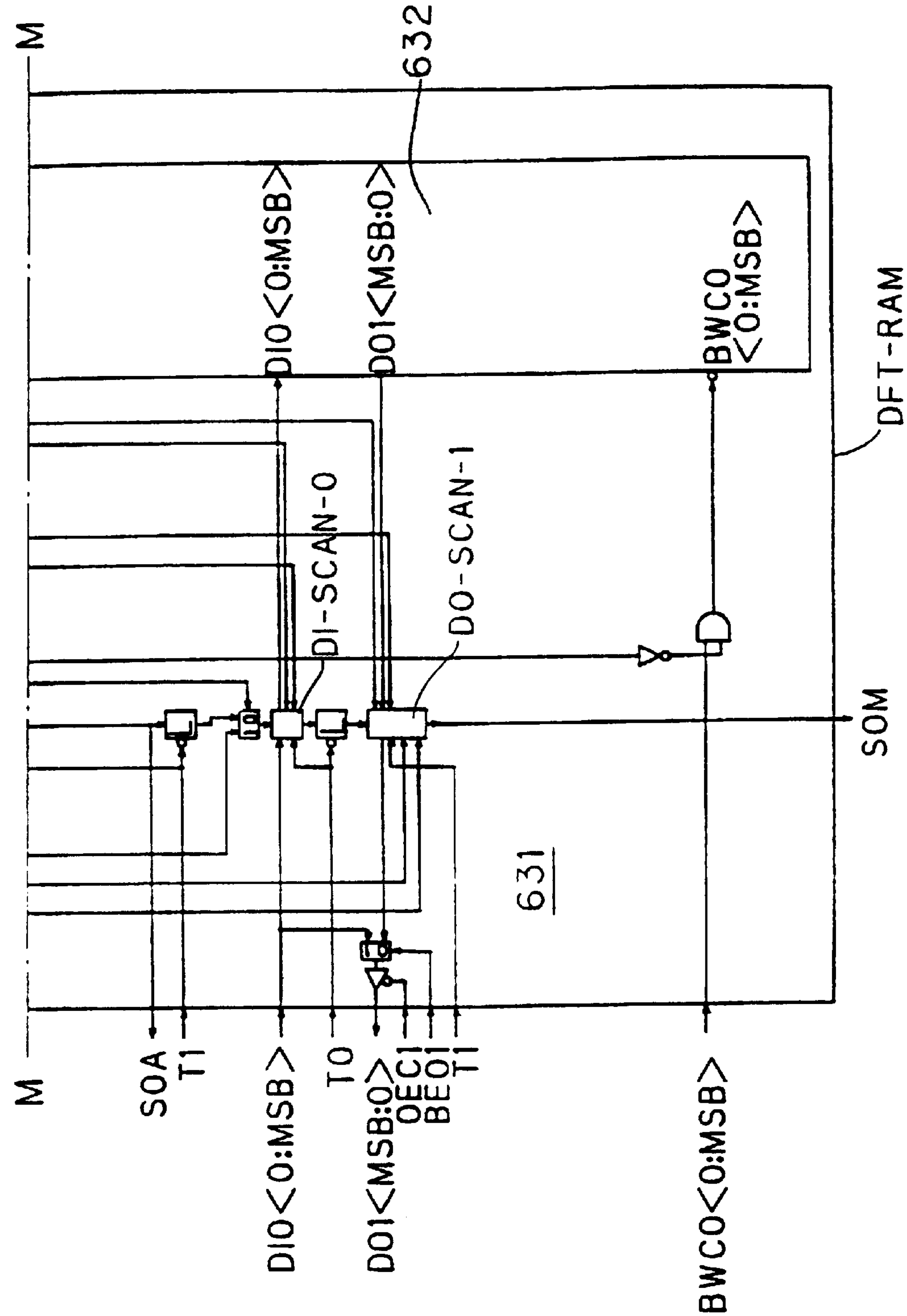
Figure 142:
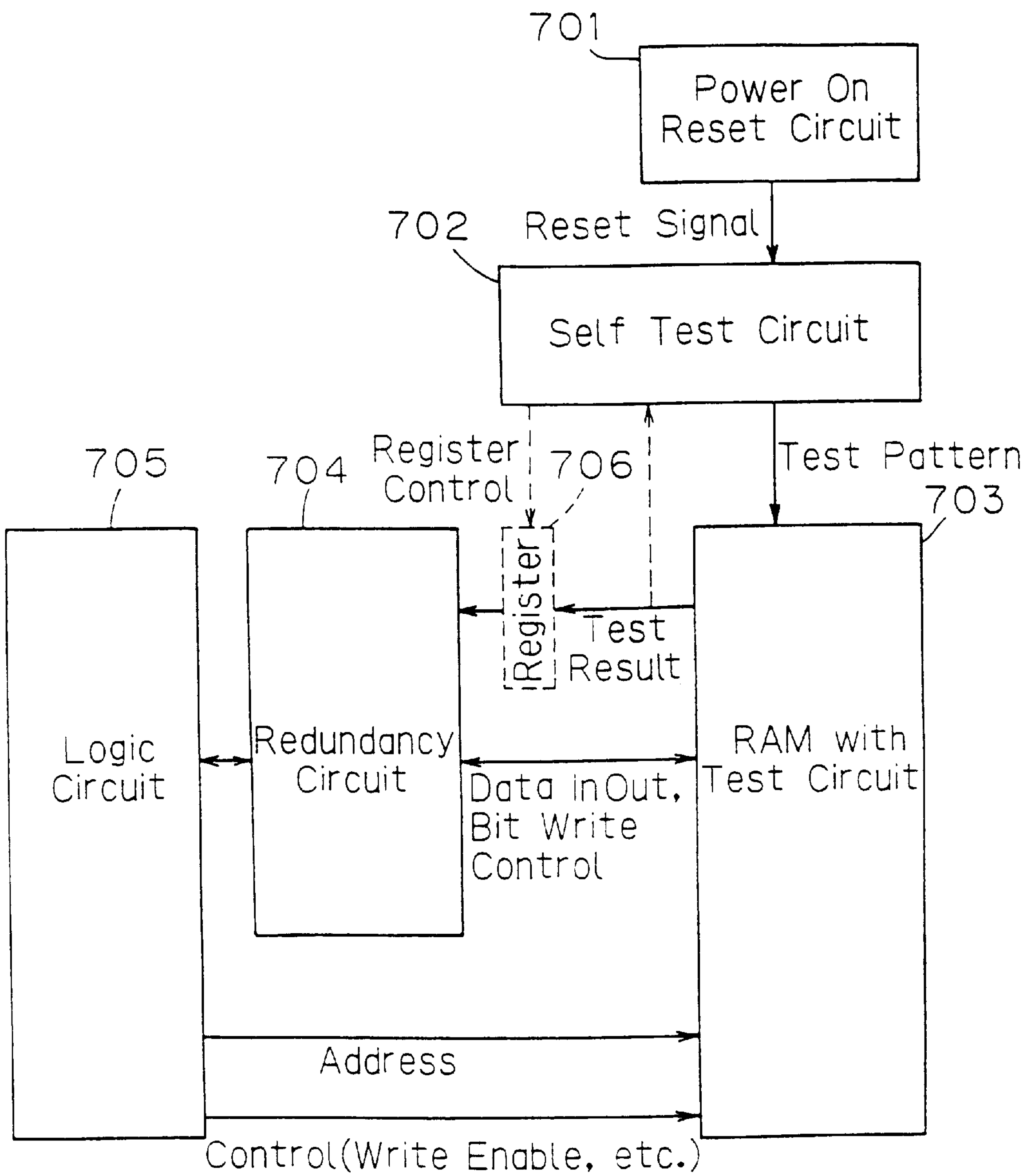
Figure 143:
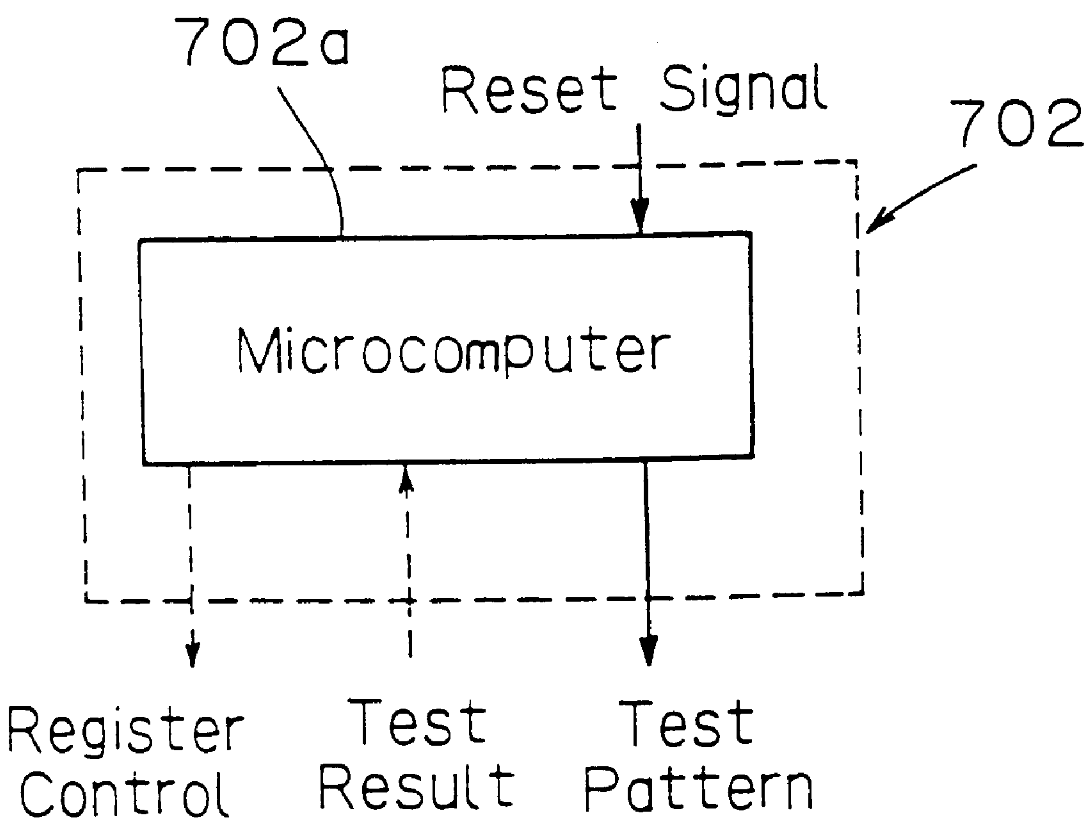
Figure 144:
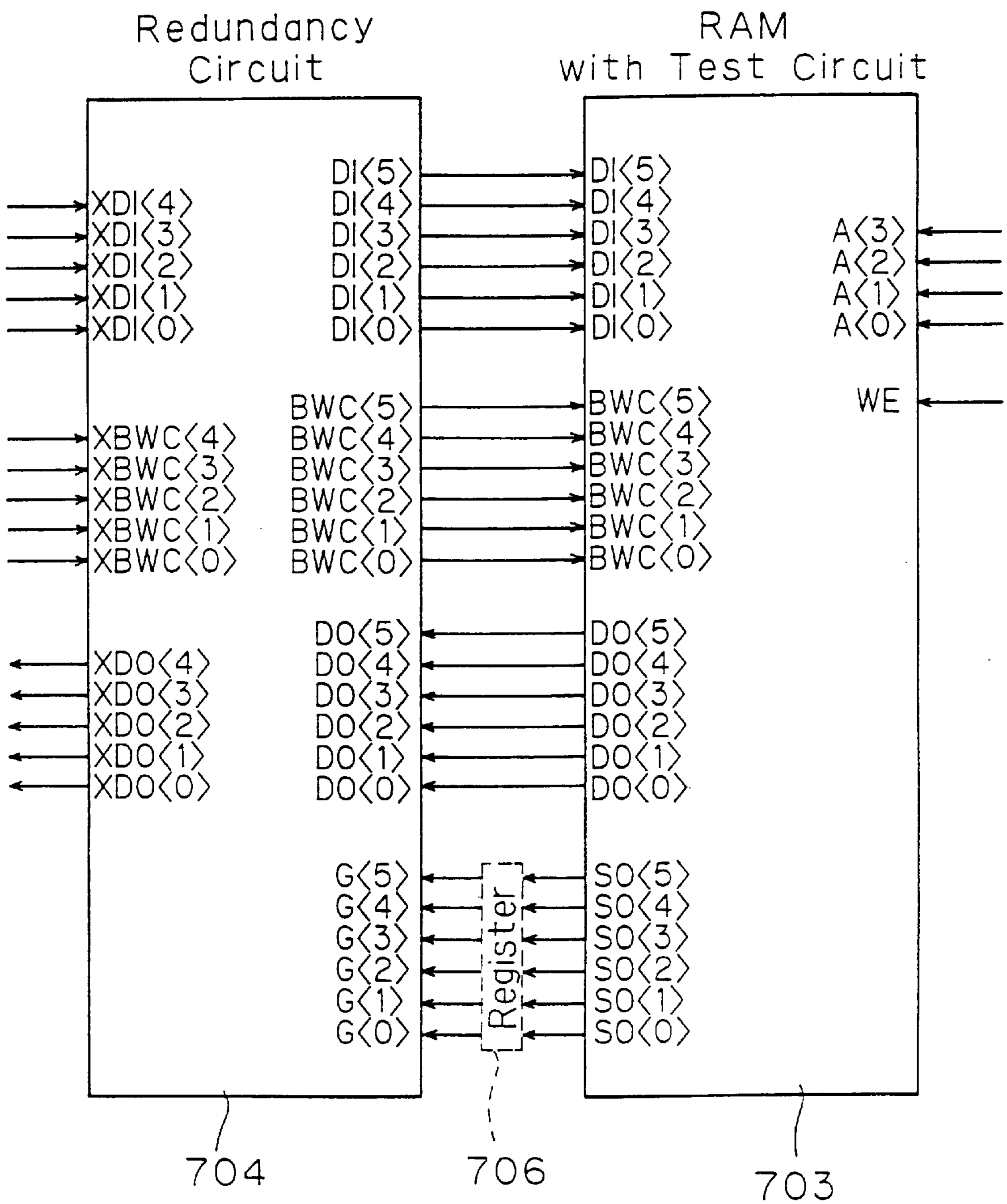
Figure 145:
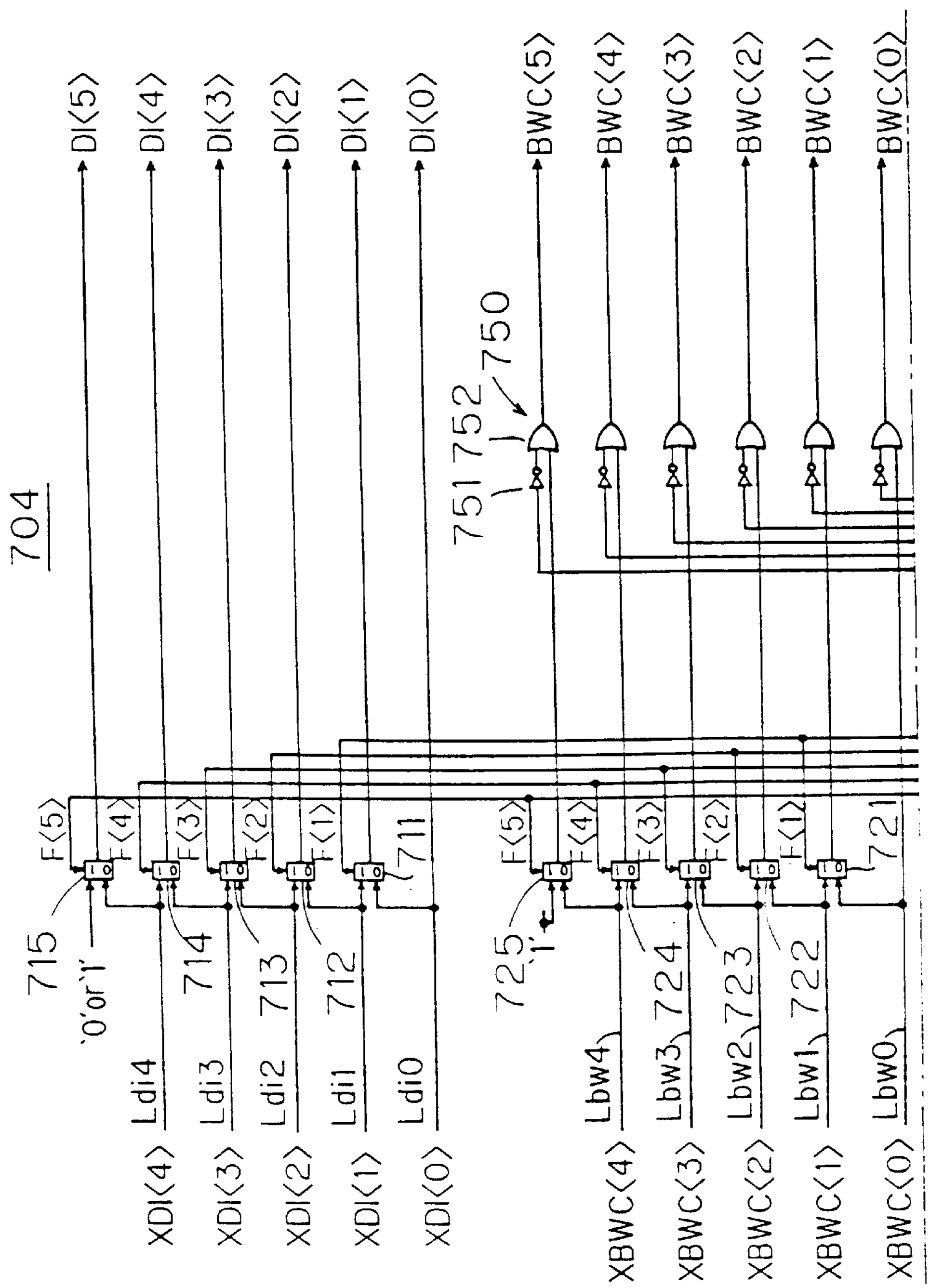
Figure 147:
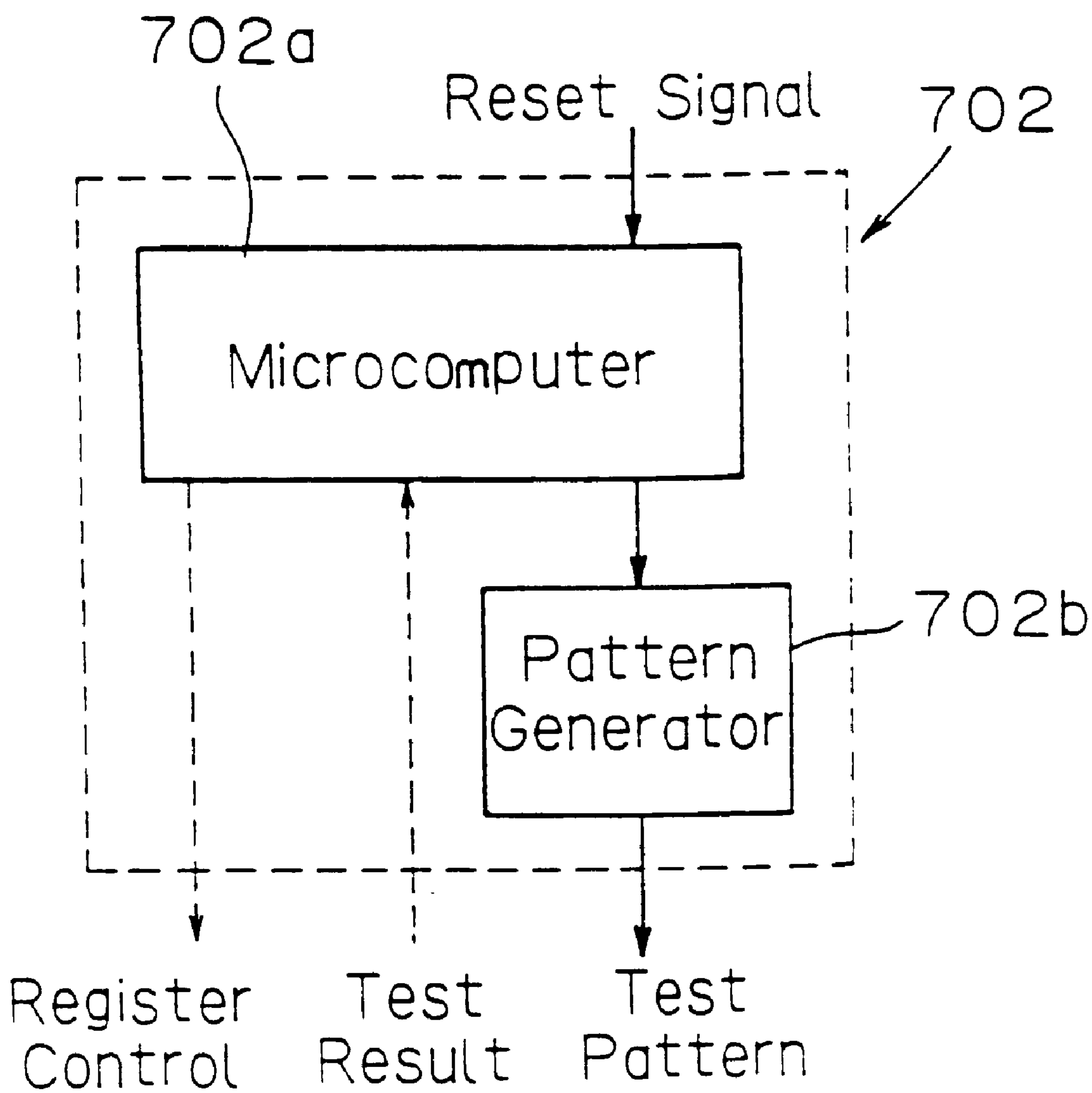
Figure 148:
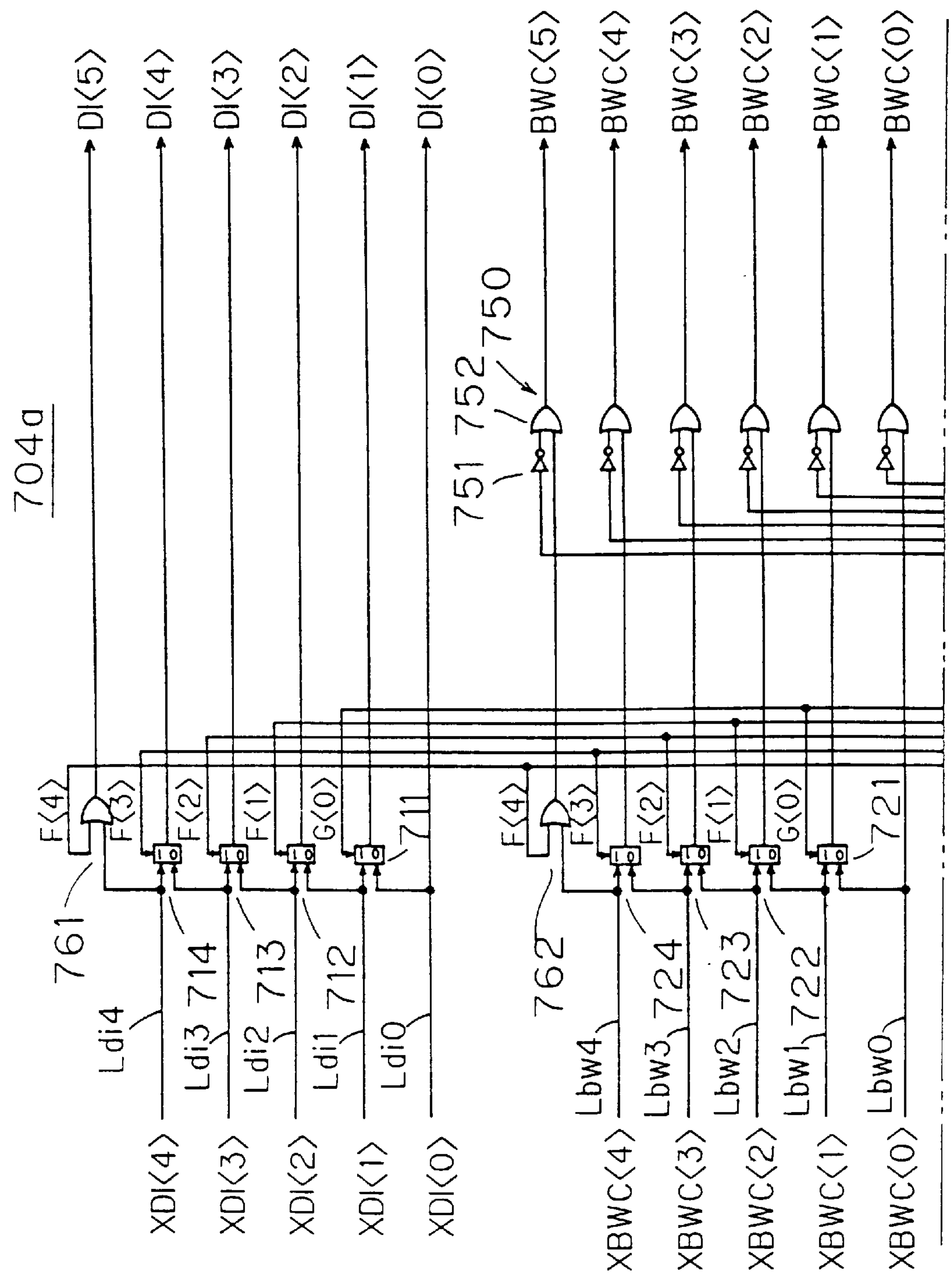
Figure 149:
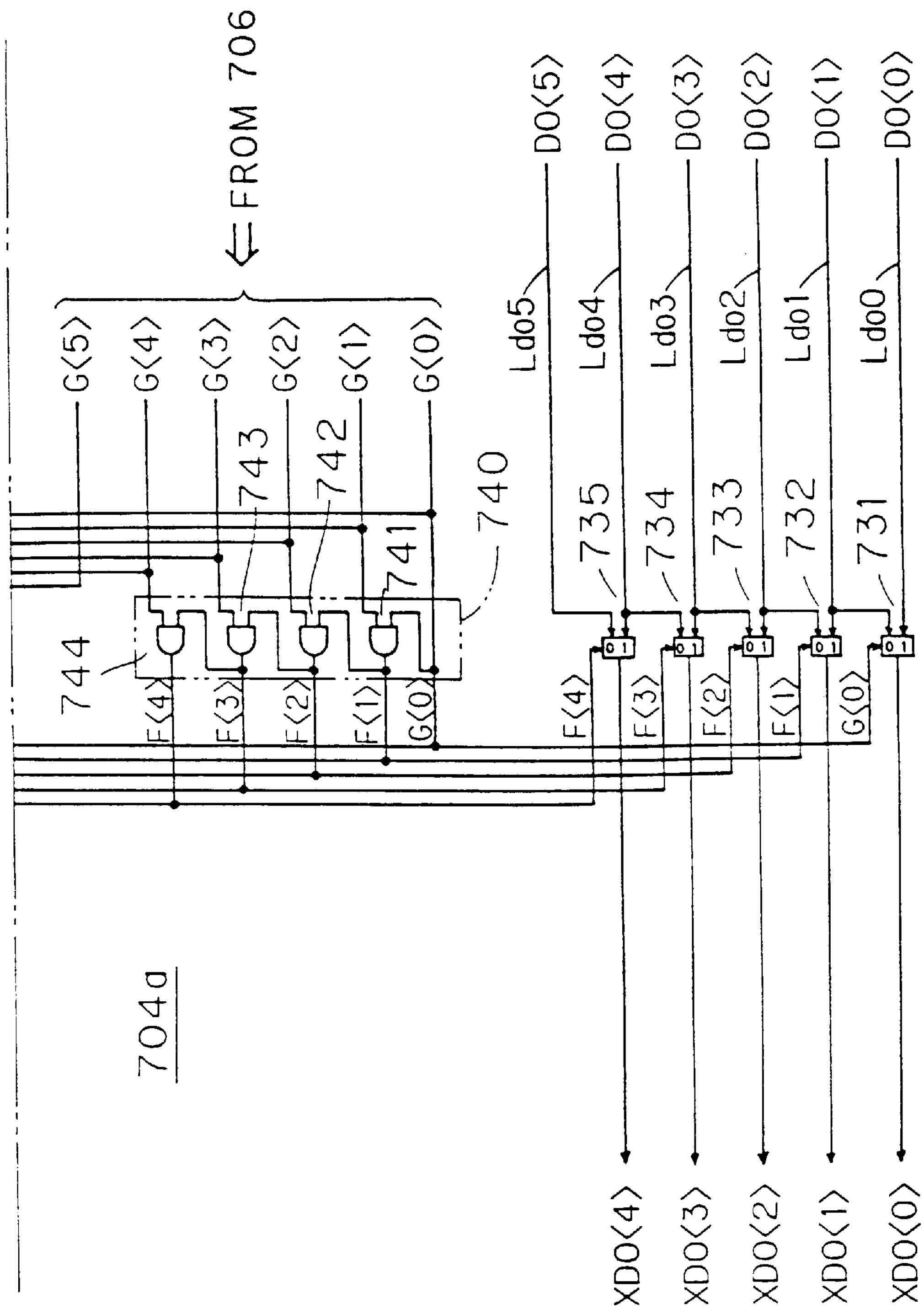
Figure 150:
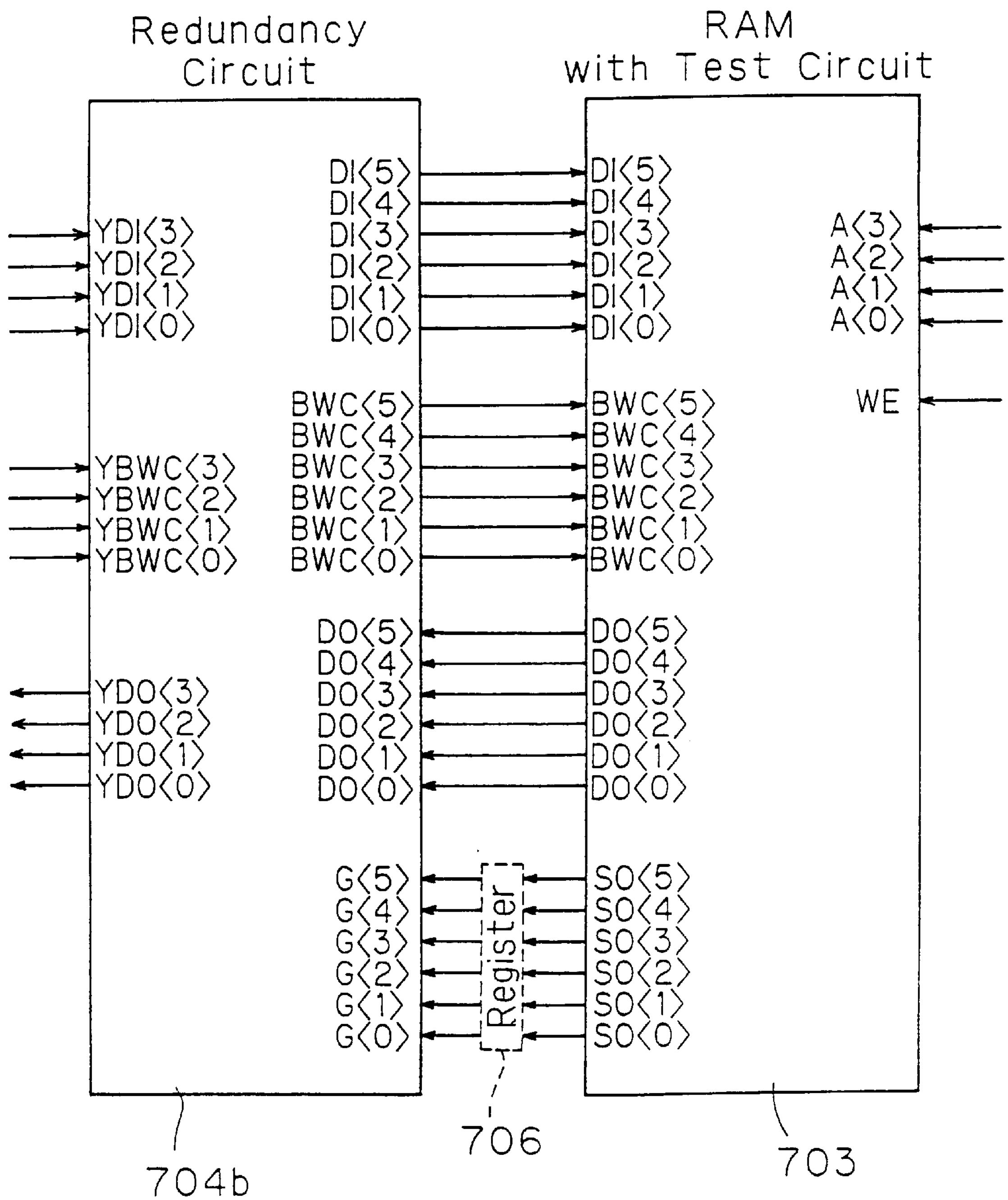
Figure 151:
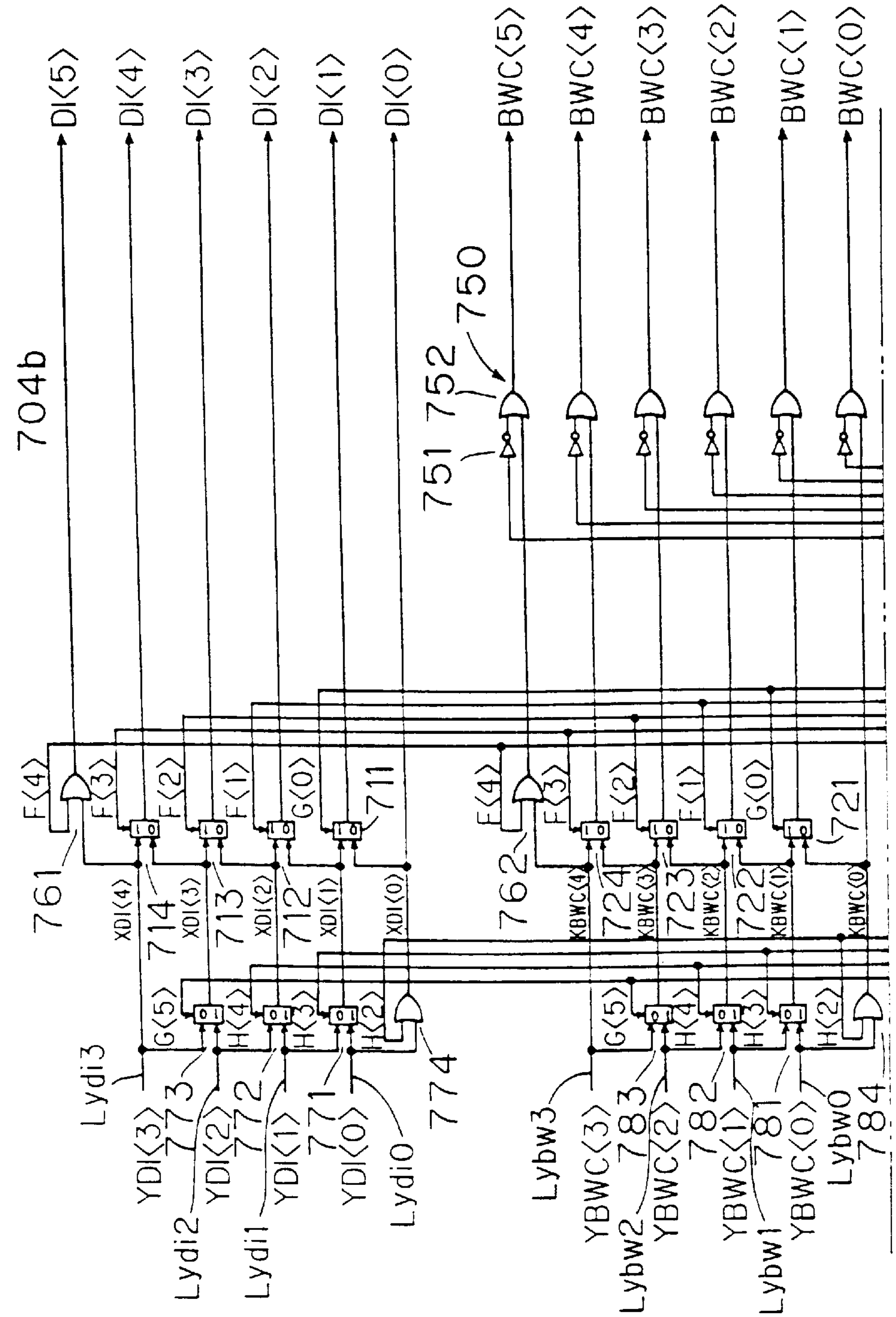
Figure 152:
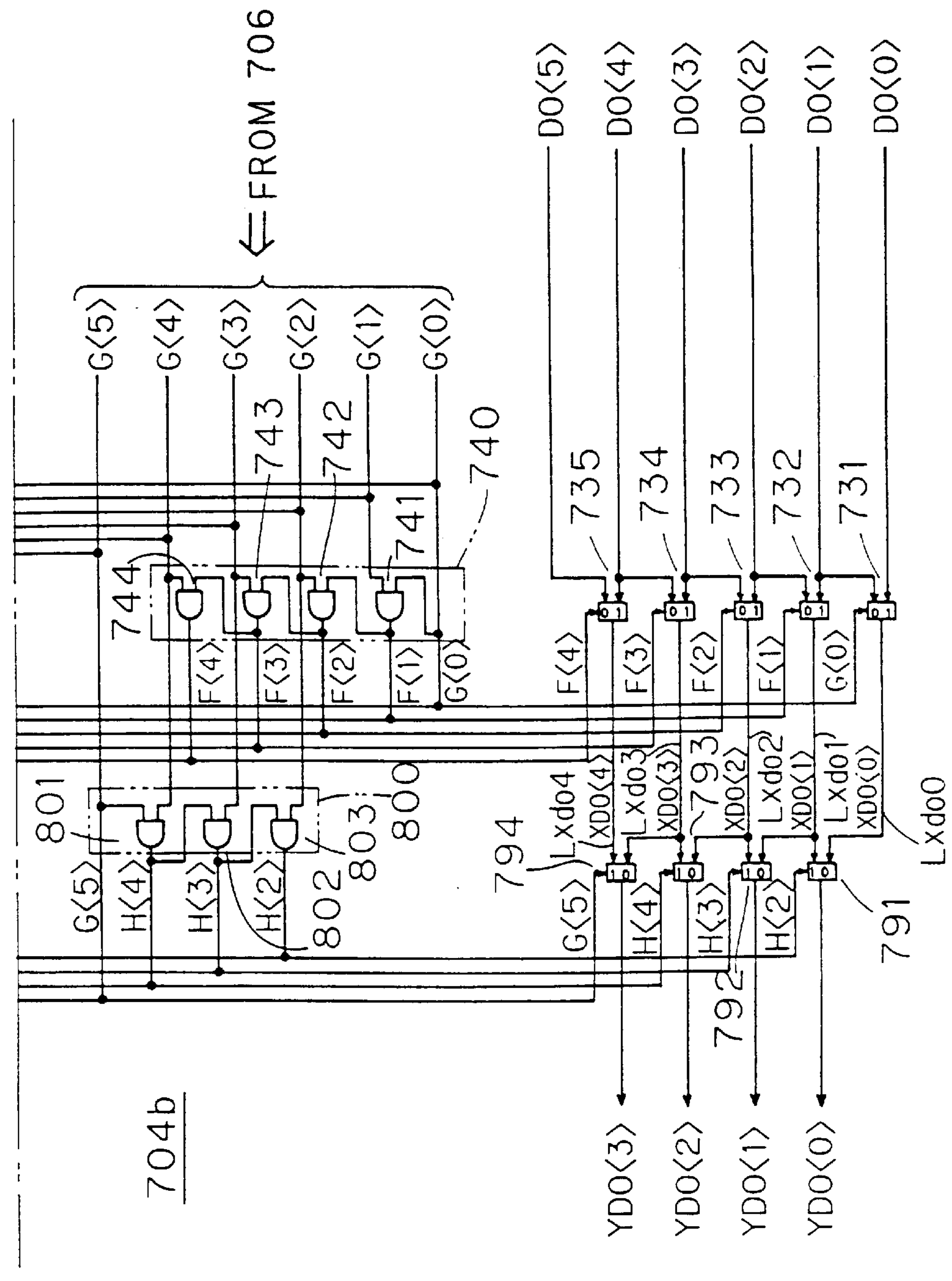
Figure 153:
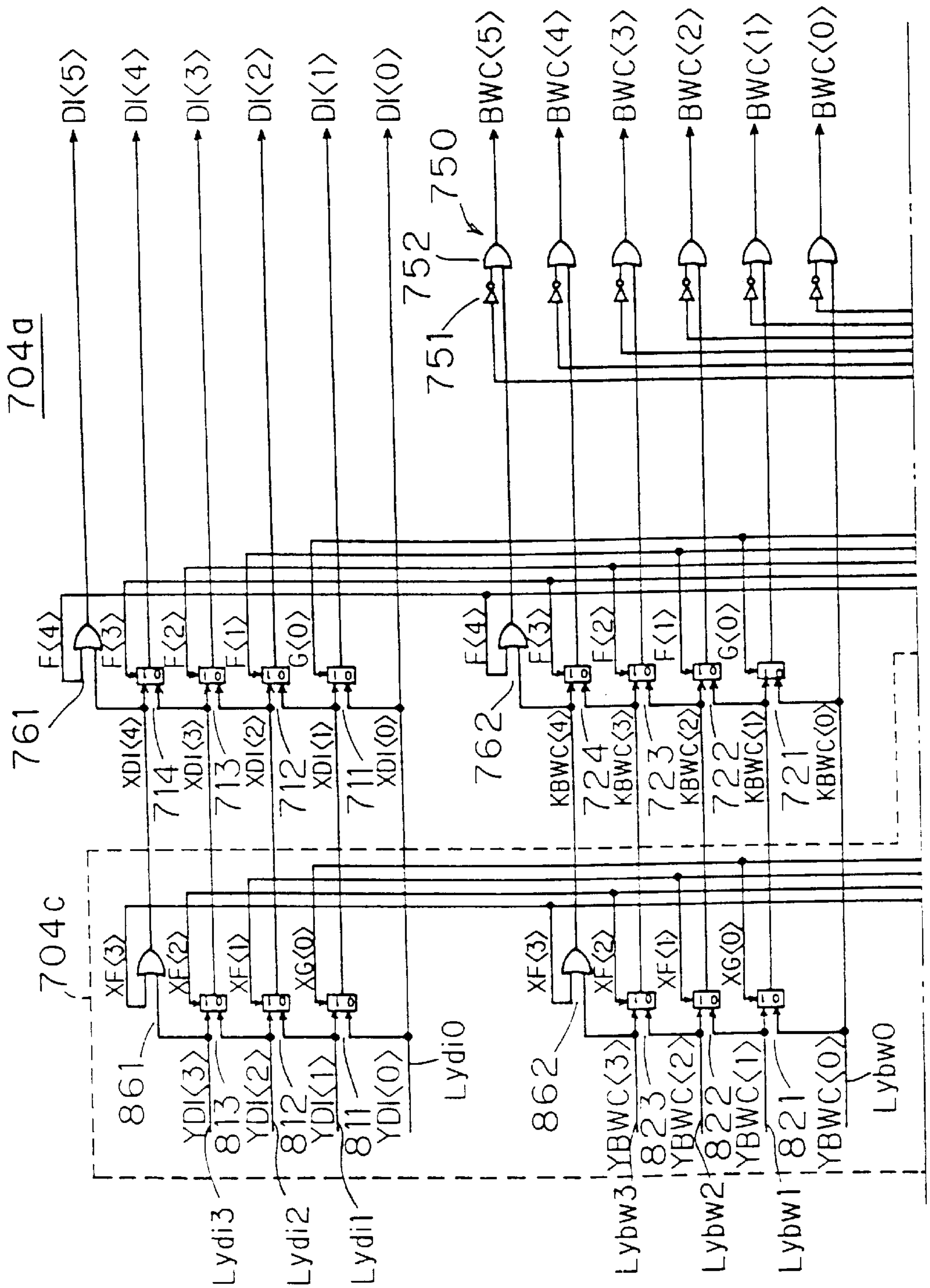
Figure 154:
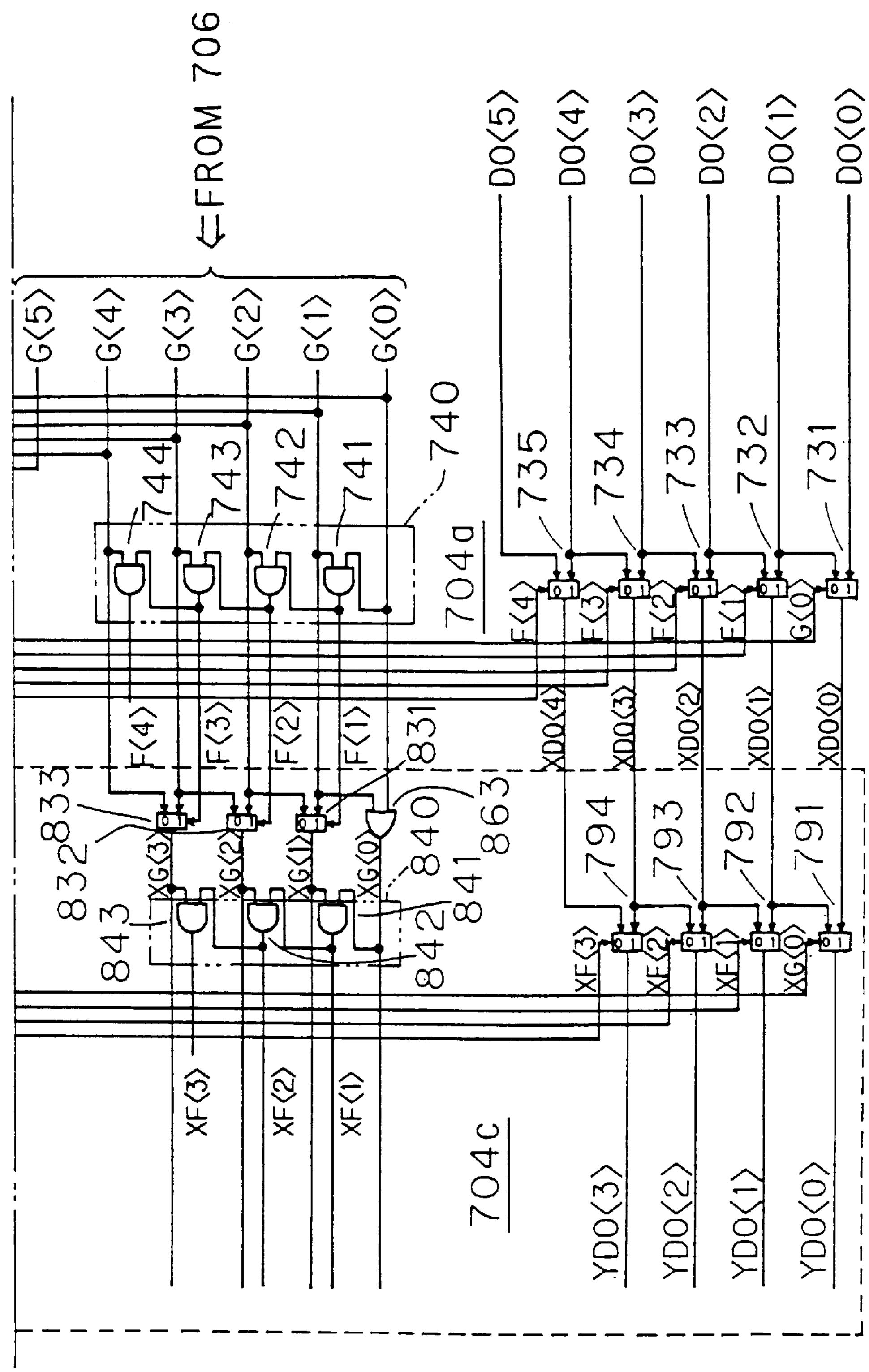
Figure 155:
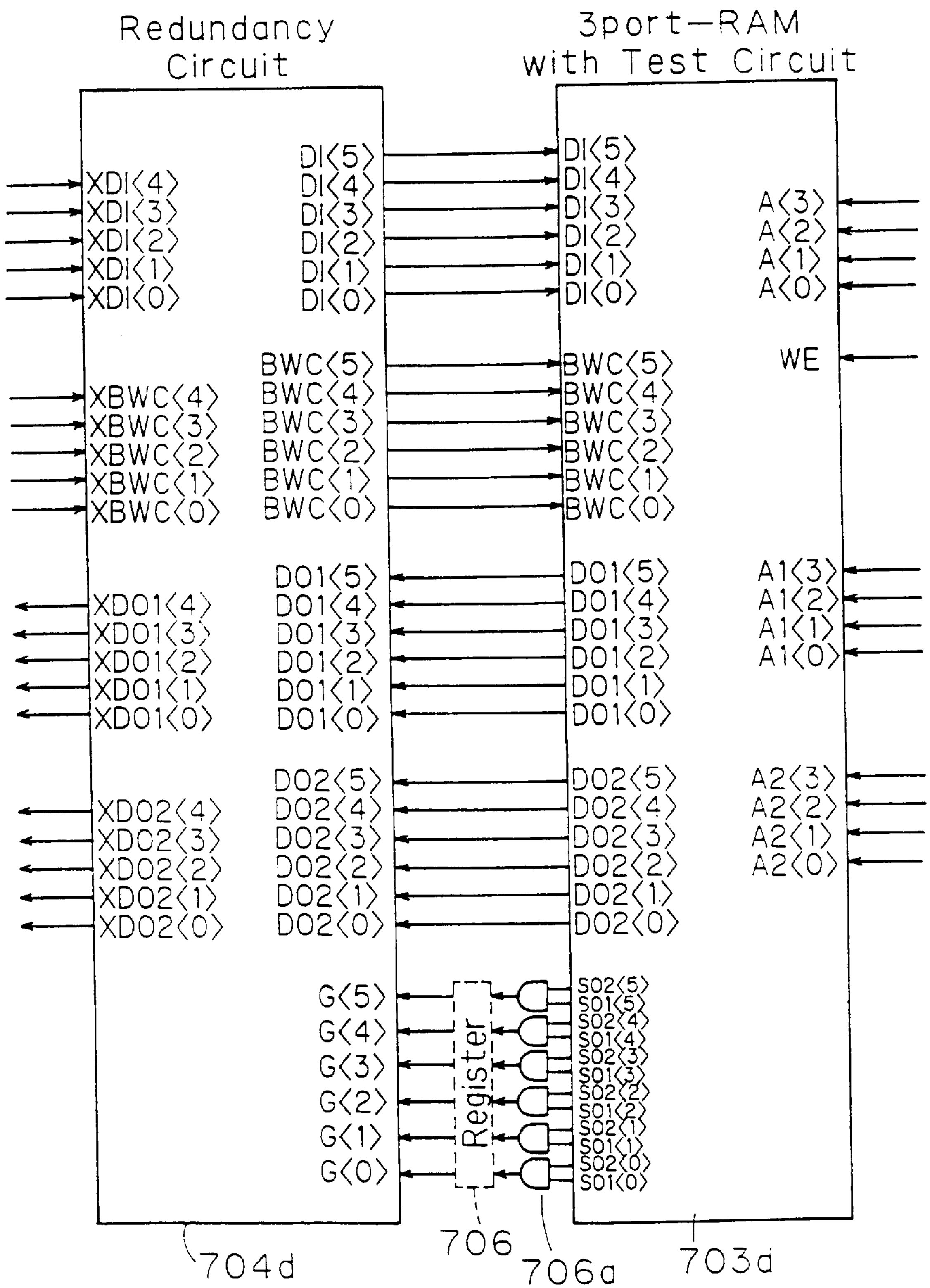
Figure 156:
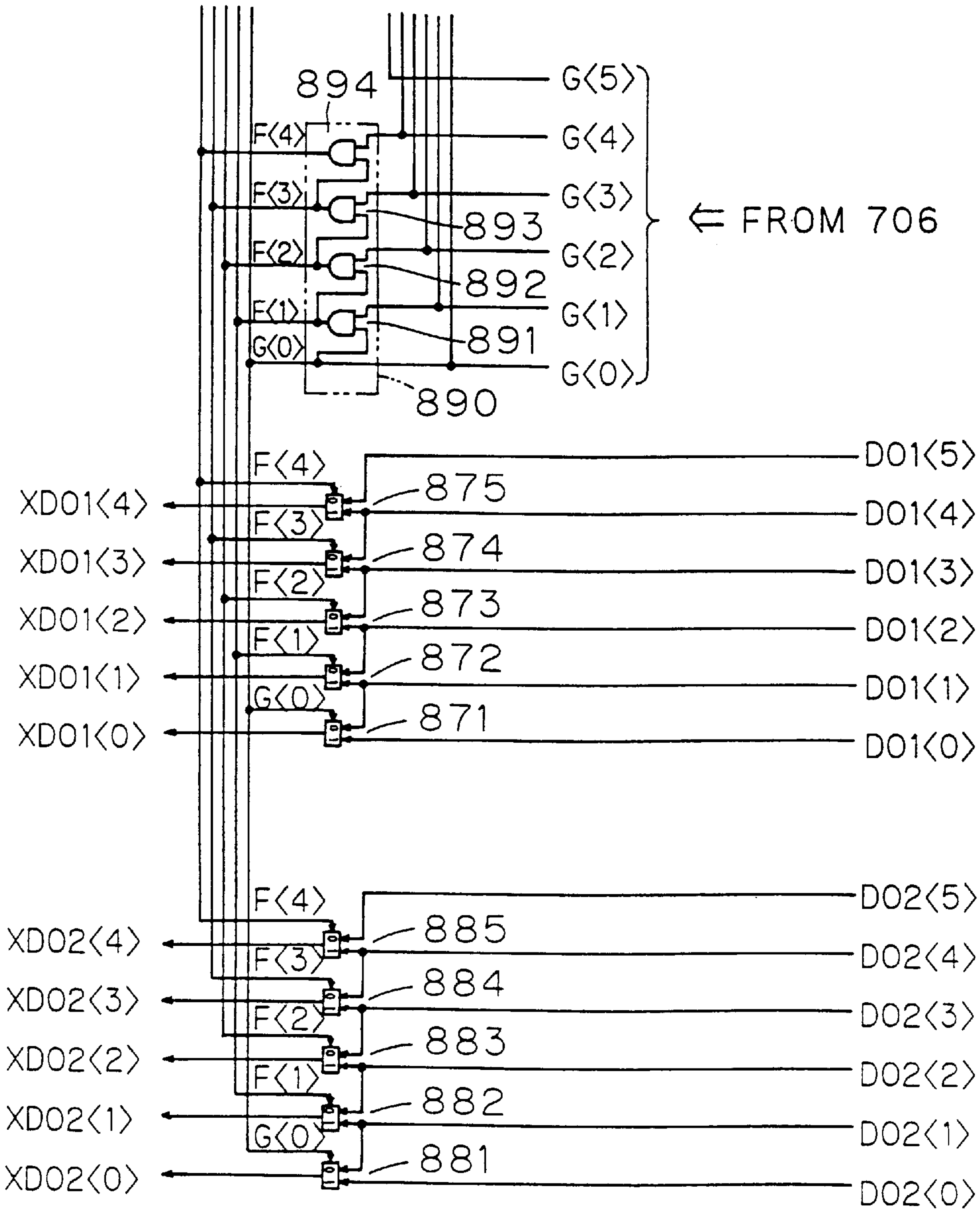
Figure 157:
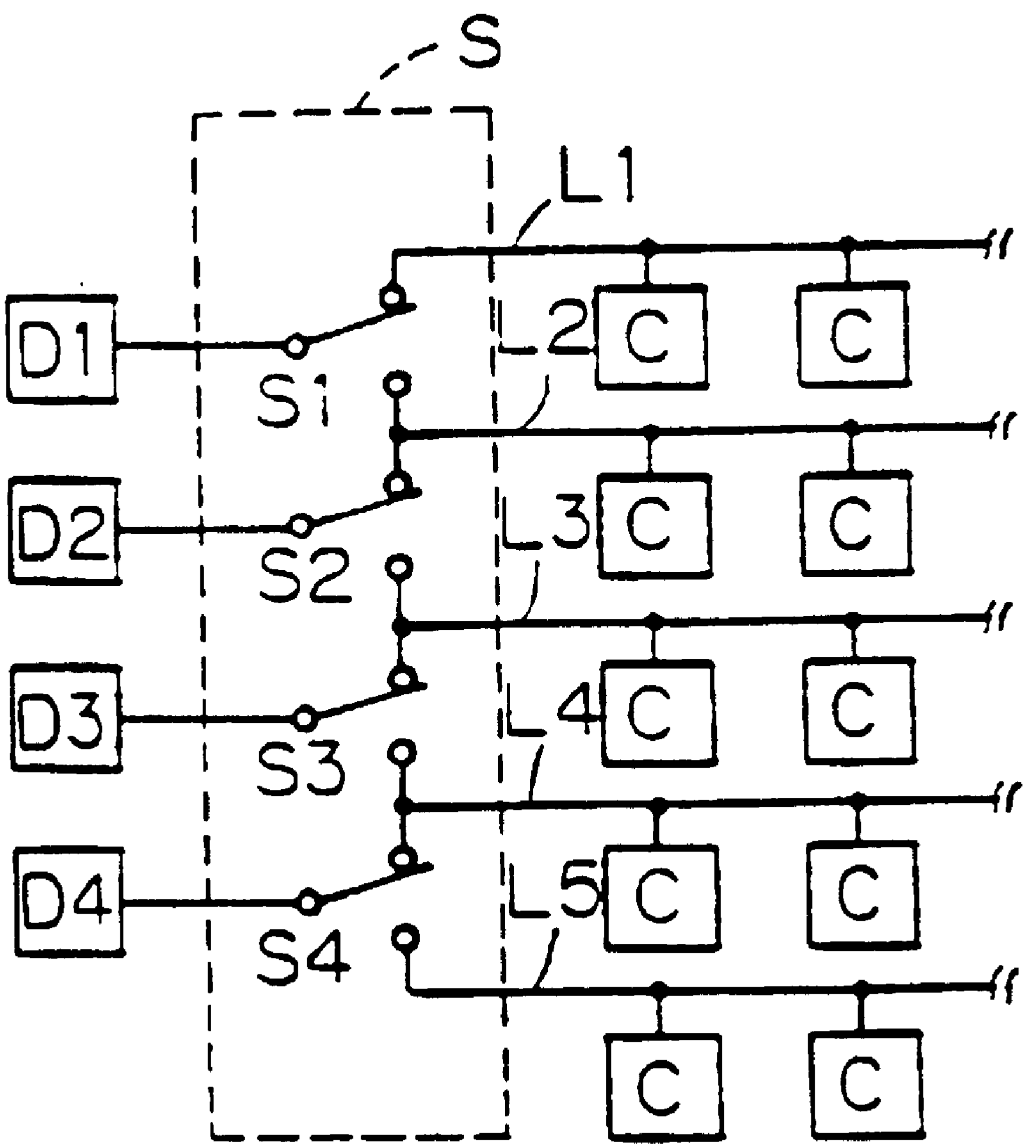
Figure 158:
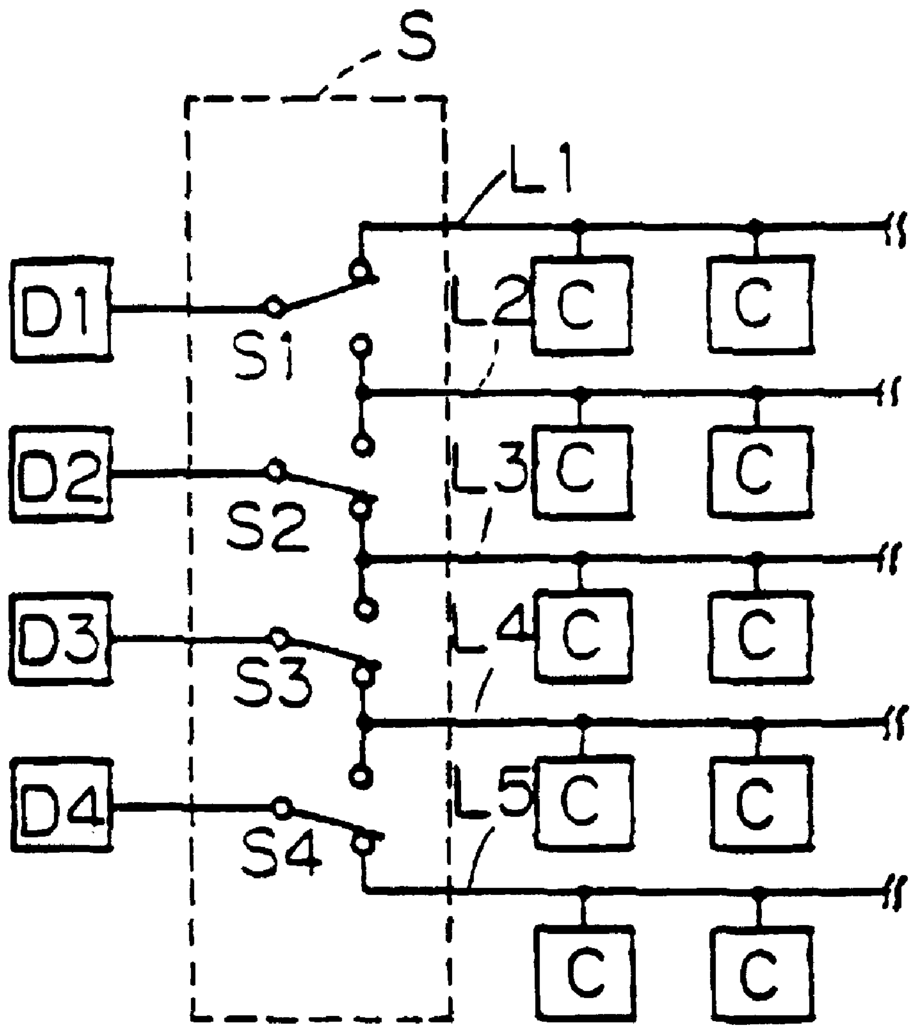

FIG. 132 illustrates a connection state of a RAM in a semiconductor memory testing device according to fourth prior art;

FIG. 133 illustrates a control signal generation circuit in a semiconductor memory testing device according to a seventeenth embodiment of the present invention;

FIG. 134 illustrates a cyclic shift register in the semiconductor memory testing device according to the seventeenth embodiment of the present invention;

FIG. 135 illustrates a RAM core, a test circuit and the control signal generation circuit in the semiconductor memory testing device according to the seventeenth embodiment of the present invention;

FIG. 136 illustrates the RAM core, the test circuit and the control signal generation circuit in the semiconductor memory testing device according to the seventeenth embodiment of the present invention;

FIG. 137 illustrates a RAM core, a test circuit and a test pattern generation circuit in a semiconductor memory testing device according to an eighteenth embodiment of the present invention;

FIG. 138 illustrates the test pattern generation circuit in the semiconductor memory testing device according to the eighteenth embodiment of the present invention;

FIG. 139 illustrates the test pattern generation circuit in the semiconductor memory testing device according to the eighteenth embodiment of the present invention;

FIG. 140 illustrates the RAM core and the test circuit in the semiconductor memory testing device according to the eighteenth embodiment of the present invention;

FIG. 141 illustrates the RAM core and the test circuit in the semiconductor memory testing device according to the eighteenth embodiment of the present invention;

FIG. 142 is a block diagram showing a self-correcting semiconductor memory testing device according to a ninteenth preferred embodiment of the present invention;

FIG. 143 is a view showing an example of a structure of a self test circuit of the semiconductor memory testing device according to the ninteenth preferred embodiment of the present invention;

FIG. 144 is a view showing in detail an example of connection between a RAM with test circuit of and a redundancy circuit in the semiconductor memory testing device according to the ninteenth preferred embodiment of the present invention;

FIGS. 145 and 145 illustrate a redundancy circuit for compensating one bit disposed in the semiconductor memory testing device according to the ninteenth preferred embodiment of the present invention;

FIG. 147 is a view showing an example of a structure of a self test circuit of a semiconductor memory testing device according to a twentieth preferred embodiment of the present invention;

FIGS. 148 and 149 illustrate a redundancy circuit for compensating one bit disposed in a semiconductor memory testing device according to a twenty-first preferred embodiment of the present invention;

FIG. 150 is a view showing in detail an example of connection between a RAM with test circuit of and a redundancy circuit in a semiconductor memory testing device according to twenty-second preferred embodiment of the present invention;

FIGS. 151 and 152 illustrate a two-bit redundancy circuit disposed in the semiconductor memory testing device according to the twenty-second preferred embodiment of the present invention;

FIGS. 153 and 154 illustrate a two-bit redundancy circuit disposed in a semiconductor memory testing device according to a twenty-third preferred embodiment of the present invention;

FIG. 155 is a view showing in detail an example of connection between a RAM with test circuit of and a redundancy circuit in a semiconductor memory testing device according to a twenty-fourth preferred embodiment of the present invention;

FIG. 156 is a partial view of the redundancy circuit of the semiconductor memory testing device according to the twenty-fourth preferred embodiment of the present invention; and FIGS. 157 and 158 illustrate a fifth conventional semiconductor memory testing device.

DESCRIPTION OF THE PREFERRED EMBODIMENTS

First Embodiment

<Structure>

Figure 1:
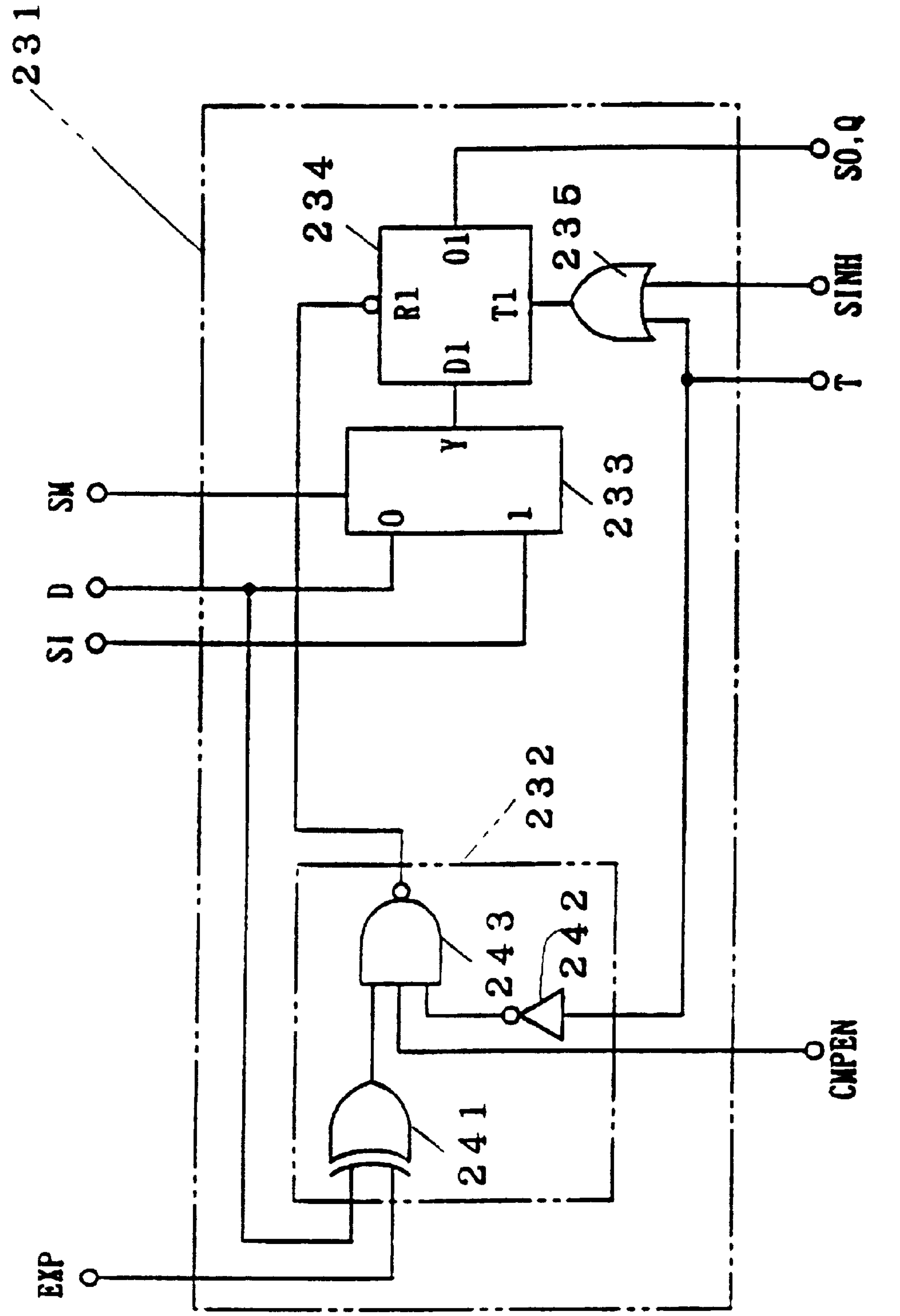
FIG. 1 is a logic circuit diagram showing a semiconductor memory testing device according to a first embodiment of the present invention.
Figure 23:
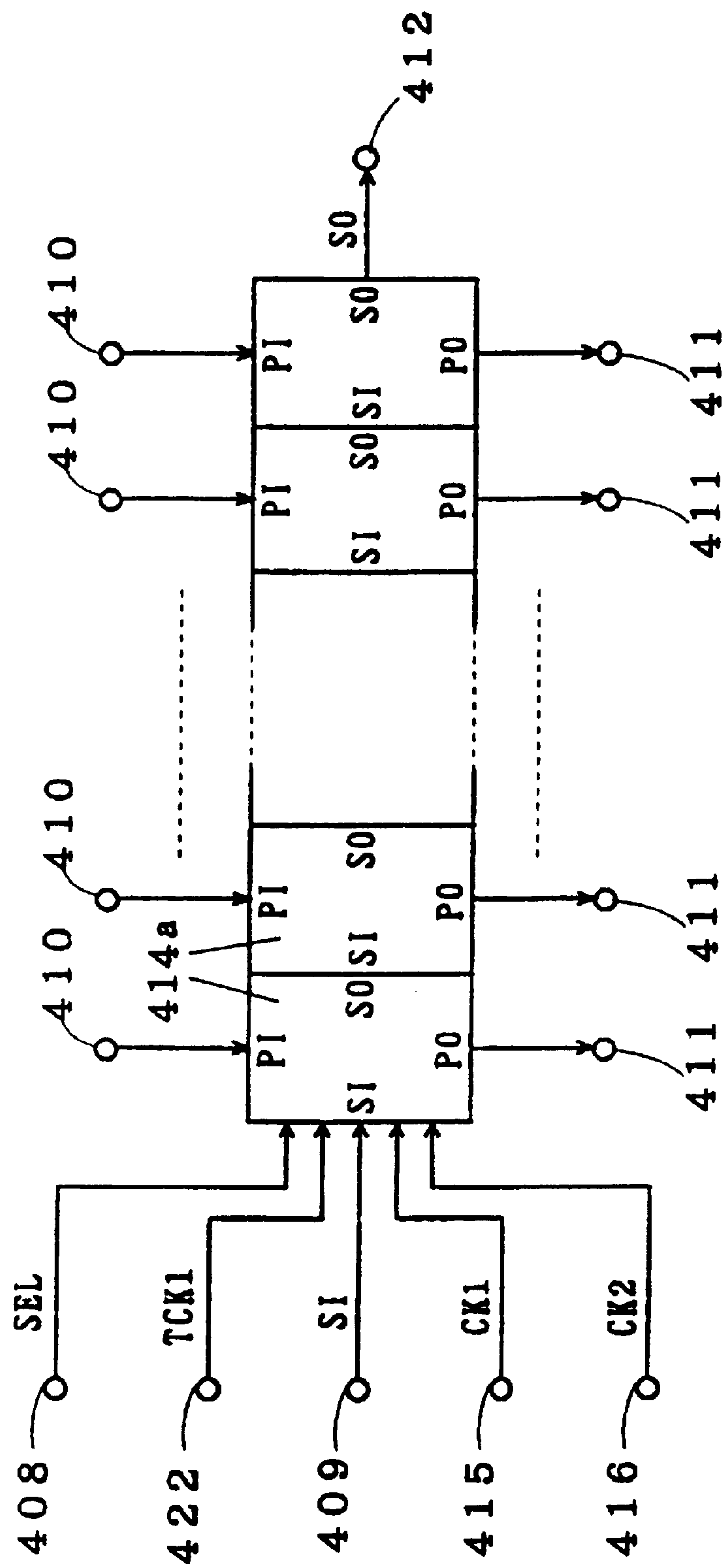
FIG. 23 is a block diagram showing a scan path which is formed by the scan registers according to the first prior art shown in FIG. 22.

FIG. 1 is a logic circuit diagram showing a semiconductor memory (RAM) testing device (test auxiliary circuit) according to a first embodiment of the present invention. Referring to FIG. 1, numeral 231 denotes a scan register. A plurality of such scan registers 231 are connected in series with each other to form a scan path similarly to the first prior art shown in FIG. 23. This scan register 231 outputs data received from a semiconductor integrated circuit device (not shown) to an external circuit in a normal operation while comparing data received from the semiconductor integrated circuit device with expected data in data comparison for outputting information on failure of the data received from the semiconductor integrated circuit device to the external circuit when the data and the expected data mismatch with each other. Referring to FIG. 1, numeral 232 denotes a comparison circuit, numeral 233 denotes a selector circuit (selector means), numeral 234 denotes a flip-flop circuit having a reset function, and numeral 235 denotes an OR circuit.

The comparison circuit 232 is formed by a single exclusive OR circuit (hereinafter referred to as an Ex.OR circuit) 241, a single NOT circuit 242 and a single NAND circuit 243. The Ex.OR circuit 241 has a pair of input terminals, which receive a data input signal (D) from the semiconductor integrated circuit device (not shown) and an external expected data signal (EXP) for comparatively checking whether or not the data input signal (D) is normal respectively. An input terminal of the NOT circuit 242 receives an external clock signal (T). The NAND circuit 241 has three input terminals, which are supplied with an external comparison enable signal (CMPEN), connected to an output terminal of the Ex.OR circuit 241, and connected to an output terminal of the NOT circuit 242 respectively. Thus, the comparison circuit 232 is so set as to compare the external expected data signal (EXP) with the external data input signal (D) only when the external comparison enable signal (CMPEN) and the clock signal (T) are at high and low levels respectively, to output a low level when the signals are different from each other.

The selector circuit 233, which has a pair of signal input terminals "0" and "1" receiving the data input signal (D) from the semiconductor integrated circuit device and an external serial input signal (SI) respectively and a single control input terminal receiving an external shift mode control signal (SM), is so set as to select the signal input terminal "0" in a normal operation and a test mode on the basis of the external shift mode control signal (SM) while selecting the other signal input terminal "1" (serial input signal (SI)) in a shift mode on the basis of the shift mode control signal (SM).

The flip-flop circuit 234, which has a data input terminal D1, a data output terminal O1, a timing signal input terminal T1 and a reset input terminal R1, is so set as to incorporate data from the data input terminal D1 for transmitting the data (SO.Q) to the data output terminal O1 when the timing signal input terminal T1 receives a timing signal while resetting the incorporated data when the reset input terminal R1 receives a low-level reset signal. The flip-flop circuit 234 is made to incorporate data on the leading edge of the timing signal which is received in the timing signal input terminal T1 (positive edge trigger type). While the data becomes "0" by a reset operation in this operation, the same may alternatively become "1". The data output terminal O1 is connected to a signal input terminal of a flip-flop circuit of a next-stage scan register, so that the data is transmitted as a serial input signal (SO.Q=SI).

The OR circuit 235, which is adapted to output a timing signal for defining prescribed timing of a shift operation to the flip-flop circuit 234, has a pair of input terminals and a single output terminal so that the clock signal (T) is received in one input terminal, an external shift inhibiting signal (SINH) is received in the other input terminal and the single output terminal is connected to the timing signal input terminal T1 of the flip-flop circuit 234. Thus, the OR circuit 235 allows data incorporation of the flip-flop circuit 234 in accordance with the external cyclic clock signal (T) when no external shift inhibiting signal (SINH) is received while serving as a timing stop circuit (data holding means) for stopping the timing signal defining the prescribed timing for holding the data of the flip-flop circuit 234 when the shift inhibiting signal (SINH) is received, whether the clock signal (T) is received or not.

<Operation>

Figure 2:
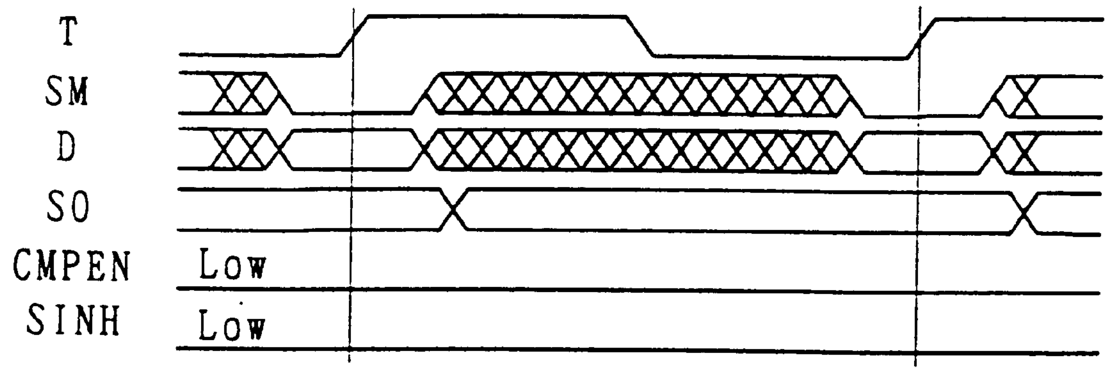
FIG. 2 is a timing chart showing a data incorporating operation of a flip-flop circuit provided in the semiconductor memory testing device according to the first embodiment of the present invention.

The operations of the scan register 231 having the aforementioned structure are now described. FIG. 2 is a timing chart showing an operation of incorporating data at the data input terminal D when the scan register 231 is employed as an output flip-flop of the semiconductor integrated circuit device (RAM) in a normal operation. As shown in FIG. 2, the clock signal (T) is transmitted to the timing signal input terminal T1 of the flip-flop circuit 234 as such through the OR circuit 235 when the shift inhibiting signal (SINH) is at a low level. When the comparison enable signal (CMPEN) is at a low level, the output of the NAND circuit 243 of the comparison circuit 232 regularly goes high and no reset signal (low-level signal) is generated, as shown in FIG. 2. When the shift mode control signal (SM) is at a low level on the leading edge of the clock signal (T), the selector circuit 233 selects the signal input terminal "0", so that the data input signal (D) from the semiconductor integrated circuit device (RAM) is incorporated in the flip-flop circuit 234.

Figure 3:
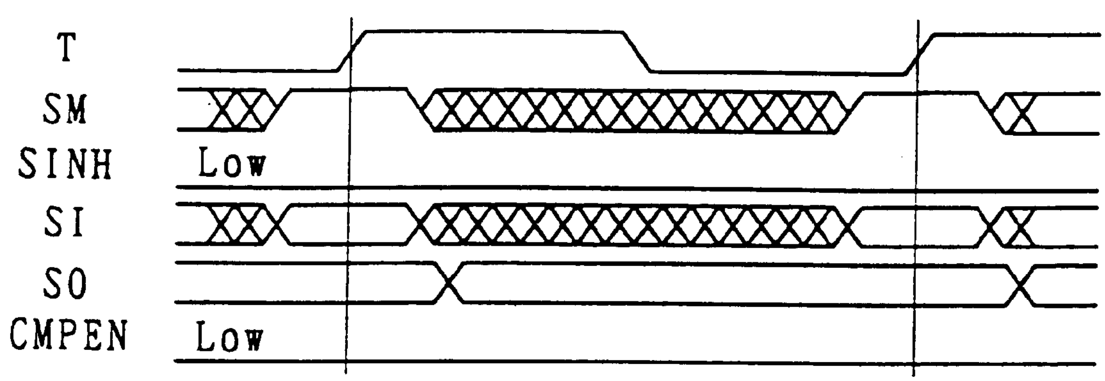
FIG. 3 is a timing chart showing a shift operation of the flip-flop circuit provided in the semiconductor memory testing device according to the first embodiment of the present invention.

FIG. 3 is a timing chart showing a shift operation of the flip-flop circuit 234 in initialization (setting "1") before starting a test of the semiconductor integrated circuit device (RAM) or in reading of a test result upon completion of the RAM test. As shown in FIG. 3, the clock signal (T) is transmitted to the timing signal input terminal T1 of the flip-flop circuit 234 as such through the OR circuit 235 when the shift inhibiting signal (SINH) is at a low level. When the comparison enable signal (CMPEN) is at a low level, no reset signal (low-level signal) is generated from the comparison circuit 232. When the shift mode control signal (SM) is at a high level on the leading edge of the clock signal (T), the selector circuit 233 selects the signal input terminal "1" so that the serial input signal (SI) is incorporated in the flip-flop circuit 234 and outputted to the data output terminal O1 (serial output terminal). The data output terminal O1 is connected to the signal input terminal ("1") of the next-stage scan register (see FIG. 23), so that the data is transmitted as a serial input signal (SO.Q=SI) for a shift operation.

FIG. 4 is a timing chart showing an operation of inhibiting the shift operation of the flip-flop circuit 243 when a comparison operation must not be performed due to indefinite output data of the RAM or the like. As shown in FIG. 4, the OR circuit 235 regularly outputs a high level when the shift inhibiting signal (SINH) is at a high level, and hence no clock signal (T) is transmitted to the timing signal input terminal T1 of the flip-flop circuit 234. Thus, the flip-flop circuit 234 cannot detect the leading edge of the clock signal (T), whereby no shift operation is carried out. Further, no reset signal (low-level signal) is generated from the comparison circuit 232 when the comparison enable signal (CMPEN) is at a low level, as shown in FIG. 4. The shift mode control signal (SM) may be either at a high or low level on the leading edge of the clock signal (T).

FIG. 5 is a timing chart showing a comparing operation of the comparison circuit 232. As shown in FIG. 5, the OR circuit 235 regularly outputs a high level when the shift inhibiting signal (SINH) is at a high level, and hence no clock signal (T) is transmitted to the timing signal input terminal T1 of the flip-flop circuit 234. Therefore, the flip-flop circuit 234 cannot detect the leading edge of the clock signal (T), and hence no shift operation is carried out. If data at the data input terminal D and the expected data terminal (EXP) are different from each other when the clock signal (T) and the comparison enable signal (CMPEN) are at low and high levels respectively, the comparison circuit 232 generates a reset signal (low-level signal), so that the flip-flop circuit 234 is reset to "0". Since the flip-flop circuit 234 is set at "1" by the initializing shift operation, presence of a failure is stored due to its change to "0". Data on presence/absence of failures held in the scan register 231 are read after completion of the RAM test by a shift operation.

According to this embodiment, data in the flip-flop circuit 234 is reloaded in response to the comparison result of the expected data and the input data in the test mode through only a one-phase clock signal, whereby a test clock signal can be omitted with no requirement for a complicated two-phase clock signal and a complicated clock driver circuit for supplying this clock signal as compared with the first prior art.

Second Embodiment

<Structure>

Figure 6:
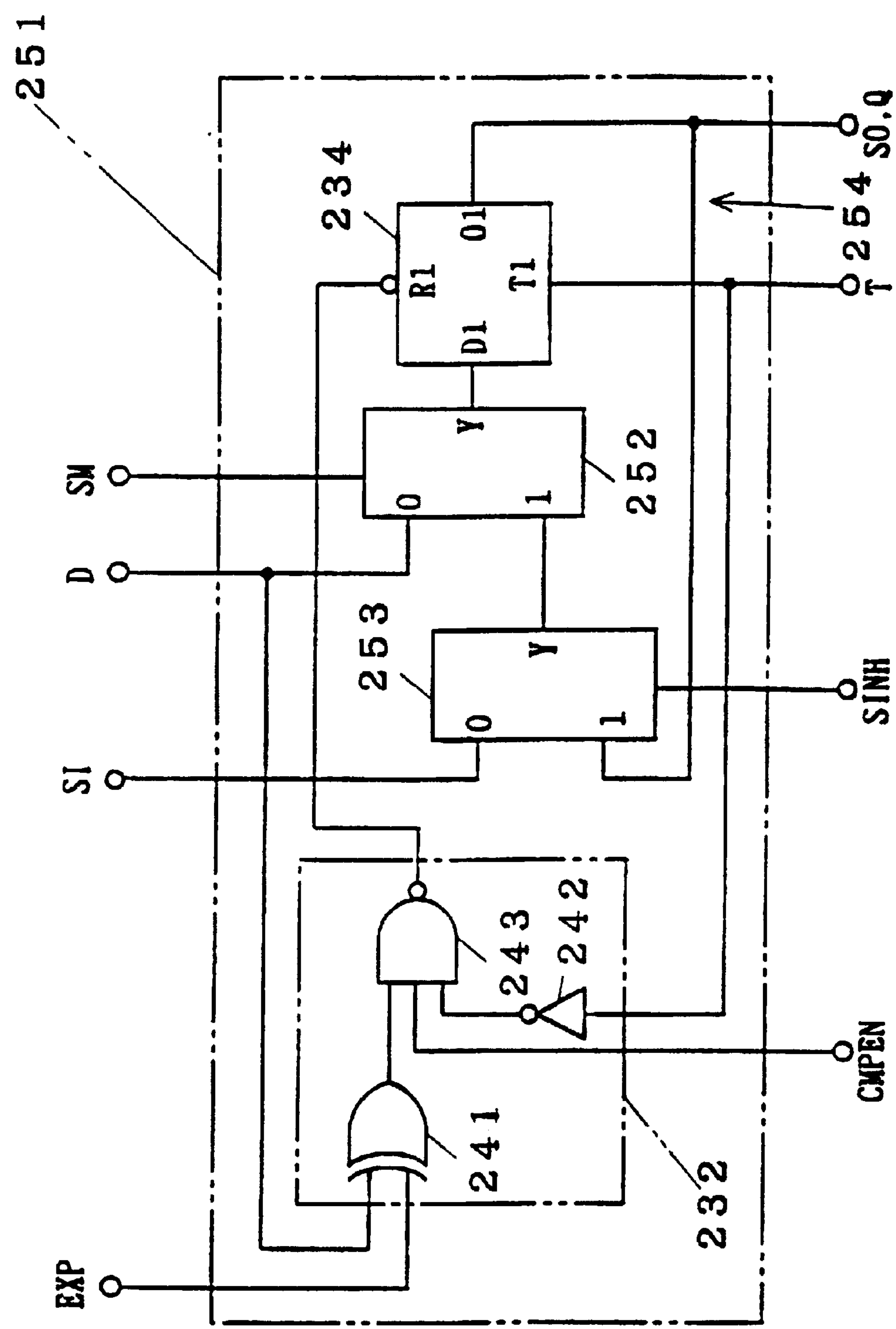
FIG. 6 is a logic circuit diagram showing a semiconductor memory testing device according to a second embodiment of the present invention.

FIG. 6 is a logic circuit diagram showing a semiconductor memory testing device according to a second embodiment of the present invention. Referring to FIG. 6, numeral 251 denotes a scan register of a positive edge trigger type for incorporating data on the leading edge of a clock signal (T) similarly to the first embodiment. The scan register 251 outputs data received from a semiconductor integrated circuit device (not shown) to an external circuit in a normal operation, while comparing the data received from the semiconductor integrated circuit device with expected data for outputting information on failure of the data received from the semiconductor integrated circuit device to the external circuit when the data mismatch with each other in data comparison. Referring to FIG. 6, numerals 232 and 234 denote a comparison circuit and a flip-flop circuit having a rest function, which are similar in structure to those in the first embodiment. Referring to FIG. 6, further, numerals 252 and 253 denote selector circuits which are similar in structure to the selector circuit 233 (see FIG. 1) according to the first embodiment, while a signal input terminal "1" of the selector circuit (hereinafter referred to as a first selector circuit) 252 having a pair of signal input terminals "0" and "1" is connected to an output terminal of the other selector circuit (hereinafter referred to as a second selector circuit) 253. Further, a signal input terminal "0" of the second selector circuit 253 receives an external serial input signal (SI), while another signal input terminal "1" thereof is connected to a data output terminal O1 of the flip-flop circuit 234. Further, the second selector circuit 253, having a control input terminal which receives an external shift inhibiting signal (SINH), outputs the serial input signal (SI) to the first selector circuit 252 when the shift inhibiting signal (SINH) is at a low level, while outputting output data SO.Q from the flip-flop circuit 234 to the first selector circuit 252 when the shift inhibiting signal (SINH) is at a high level.

The data output terminal O1 of the flip-flop circuit 234 and the other signal input terminal "1" of the second selector circuit 253 are connected with each other by an internal wire (loop wire), thereby forming a loop circuit 254 between the data output terminal O1 and a data input terminal D1 of the flip-flop circuit 234 through the second selector circuit 253 and the first selector circuit 252. This loop circuit 254 functions as data holding means for feeding back the output data SO.Q from the flip-flop circuit 234 to the flip-flop circuit 234 in place of the serial input signal (SI) and a data input signal (D) when the same receives the shift inhibiting signal (SINH), for holding the data of the flip-flop circuit 234.

The first selector circuit 252, the second selector circuit 253, a terminal (first input terminal) receiving the serial input signal (SI), a terminal (second input terminal) receiving the data input signal (D) and a terminal (third input terminal) receiving a shift mode control signal (SM) form selector means for selecting and outputting the serial input signal (SI) and the data input signal (D).

Further, the first selector circuit 252, the second selector circuit 253, the loop wire connecting the other signal input terminal "1" of the second selector circuit 253 and the data output terminal O1 of the flip-flop circuit 234, and a terminal (fourth input terminal) receiving the shift inhibiting signal (SINH) form data holding means for holding the data of the flip-flop circuit 234.

<Operation>

Figure 7:
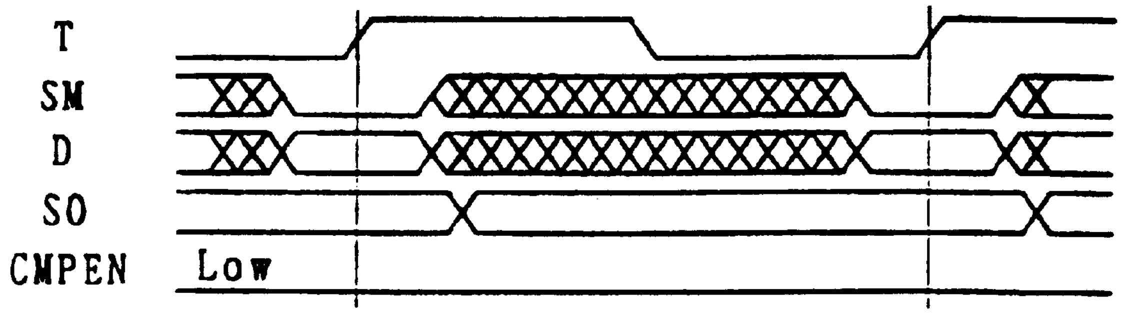
FIG. 7 is a timing chart showing a data incorporating operation of a flip-flop circuit provided in the semiconductor memory testing device according to the second embodiment of the present invention.

Operations of the scan register 251 having the aforementioned structure are now described. FIG. 7 is a timing chart showing an operation of incorporating data at the data input terminal D when the scan register 251 is employed as an output flip-flop of the semiconductor integrated circuit device (RAM) in a normal operation. As shown in FIG. 7, the comparison circuit 232 generates no reset signal when a comparison enable signal (CMPEN) is at a low level. If the shift mode control signal (SM) is at a low level on the leading edge of the clock signal (T), the selector circuit 252 selects the signal input terminal "0", so that the data input signal (D) from the semiconductor integrated circuit device (RAM) is incorporated in the flip-flop circuit 234. Since the data output of the RAM is connected to the data input terminal D, the scan register 251 can be employed as an output flip-flop for the RAM in a normal operation.

Figure 8:
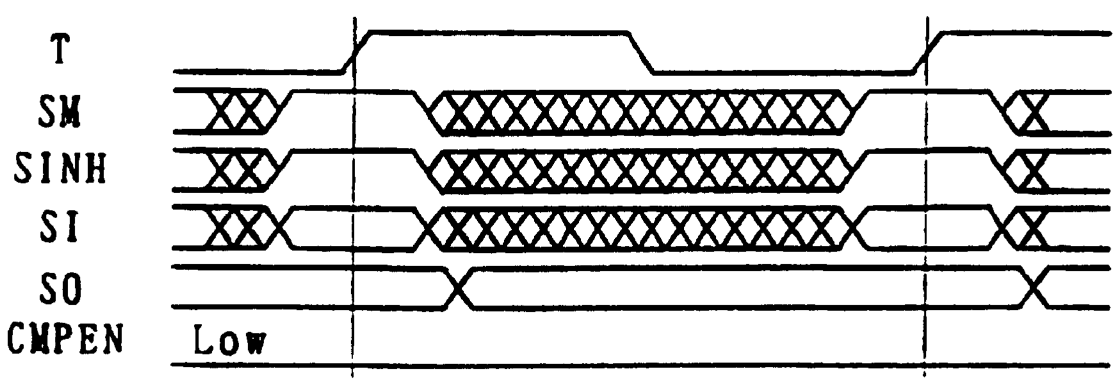
FIG. 8 is a timing chart showing a shift operation of the flip-flop circuit provided in the semiconductor memory testing device according to the second embodiment of the present invention.

FIG. 8 is a timing chart showing a shift operation. When the comparison enable signal (CMPEN) is at a low level, the comparison circuit 232 generates no reset signal. When the shift mode control signal (SM) and the shift inhibiting signal (SINH) are at high and low levels ("1" and "0") respectively on the leading edge of the clock signal (T), the serial input signal (SI) is incorporated in the flip-flop circuit 234 through the second selector circuit 253 and the first selector circuit 252, and outputted to the serial output terminal O1. The serial output terminal O1 is connected to a signal input terminal on a serial input signal (SI) side of a next-stage scan register, whereby a shift operation is carried out. The shift operation is carried out in initialization (setting "1") before starting of a RAM test or reading of a test result upon completion of the RAM test.

Figure 9:
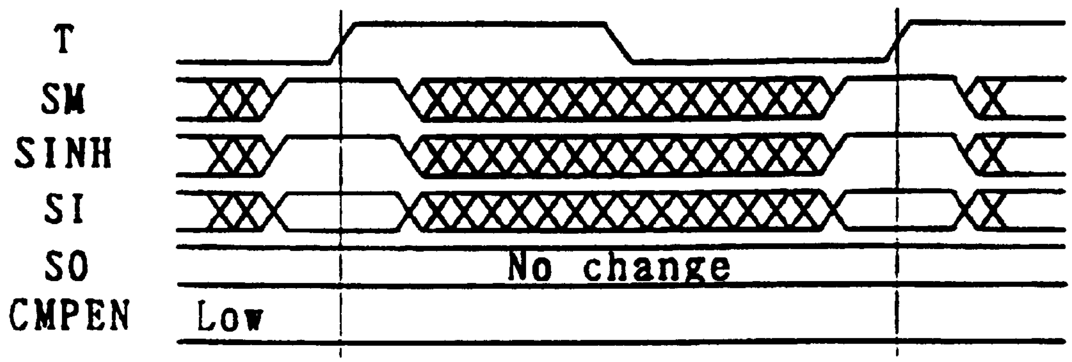
FIG. 9 is a timing chart showing a shift inhibiting operation of the flip-flop circuit provided in the semiconductor memory testing device according to the second embodiment of the present invention.

FIG. 9 is a timing chart showing a shift inhibiting operation. When the comparison enable signal (CMPEN) is at a low level, the comparison circuit 232 generates no reset signal. When the shift mode control signal (SM) and the shift inhibiting signal (SINH) are at high levels ("1") respectively on the leading edge of the clock signal (T), the output data SO.Q of the flip-flop circuit 234 is incorporated in the flip-flop circuit 234 itself through the selector circuits 253 and 252. Thus, the data is held and no shift operation is carried out. The shift inhibiting operation is employed when the comparison operation must not be carried out due to indefinite output data of the RAM or the like.

Figure 10:
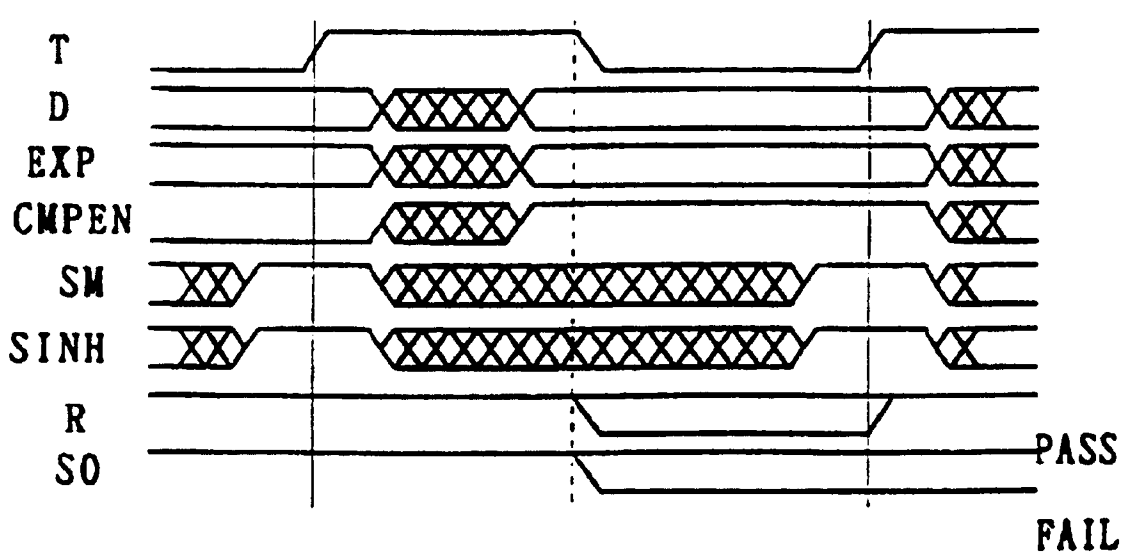
FIG. 10 is a timing chart showing a comparing operation of a comparison circuit provided in the semiconductor memory testing device according to the second embodiment of the present invention.

FIG. 10 is a timing chart showing a comparing operation. When the shift mode control signal (SM) and the shift inhibiting signal (SINH) are at high levels ("1") respectively on the leading edge of the clock signal (T), the output data SO.Q of the flip-flop circuit 234 is incorporated in the flip-flop circuit 234 itself through the selector circuits 253 and 252. Thus, the data is held. If the data at the data input terminal D and that at an expected data terminal (EXP) are different from each other when the clock signal (T) and the comparison enable signal (CMPEN) are at low and high levels respectively, the reset signal is generated to reset the flip-flop circuit 234 to "0". Since the flip-flop circuit 234 is set at "1" by the initializing shift operation, presence of a failure is stored due to its change to "0". Data on presence/absence of failures held in the scan register 231 are read after completion of the RAM test by a shift operation.

Also according to this embodiment, data in the flip-flop circuit 234 is reloaded in response to the comparison result of the expected data and the input data in the test mode through only a one-phase clock signal, whereby a test clock signal can be omitted with no requirement for a complicated two-phase clock signal and a complicated clock driver circuit for supplying this clock signal as compared with the first prior art.

Third Embodiment

<Structure>

Figure 11:
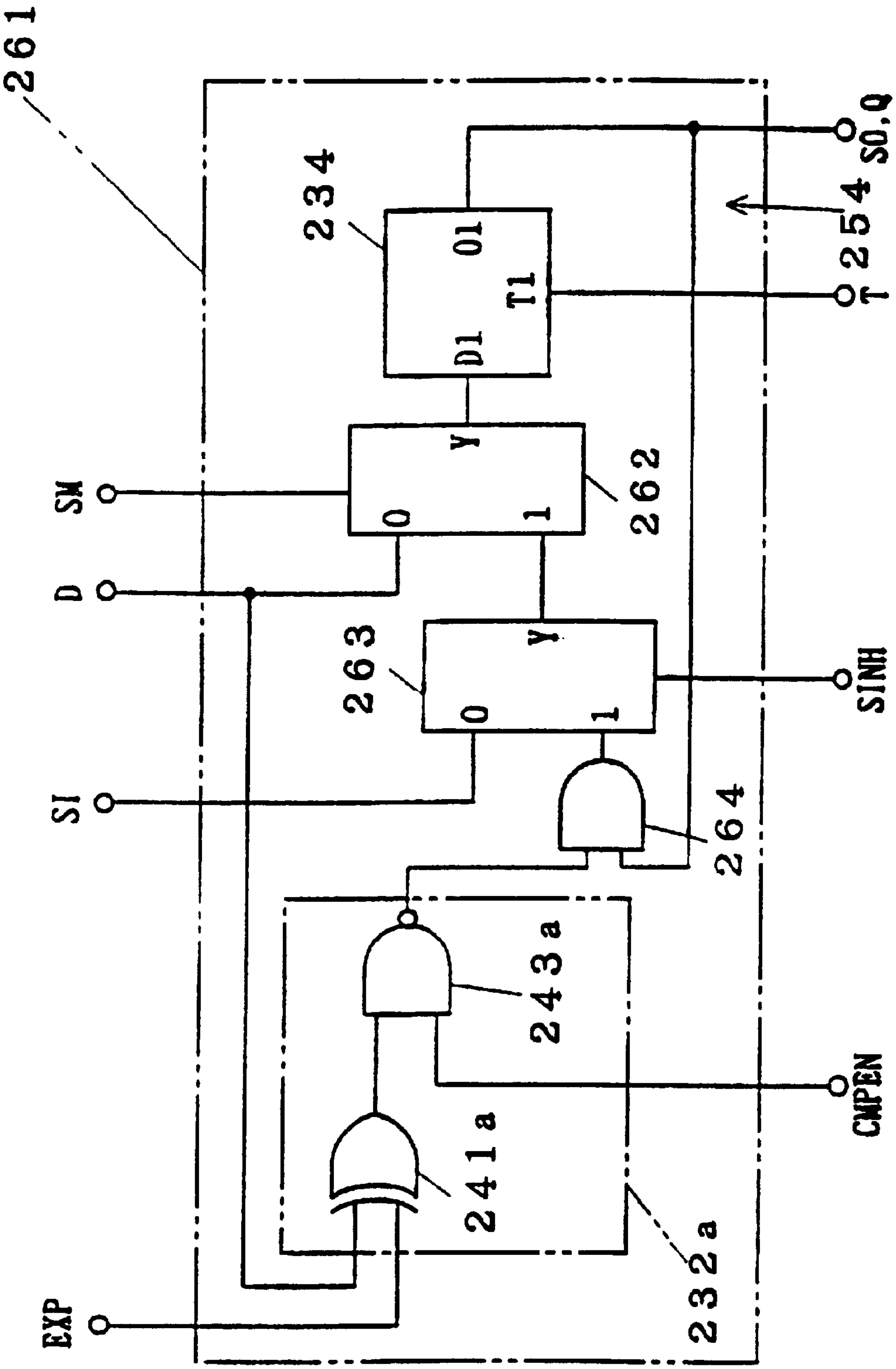
FIG. 11 is a logic circuit diagram showing a semiconductor memory testing device according to a third embodiment of the present invention.

FIG. 11 is a logic circuit diagram showing a semiconductor memory testing device according to a third embodiment of the present invention. Referring to FIG. 11, numeral 261 denotes a scan register of a positive edge trigger type for incorporating data on the leading edge of a clock signal (T) similarly to the first and second embodiments. The scan register 261 outputs data received from a semiconductor integrated circuit device (RAM) (not shown) to an external circuit in a normal operation, while comparing the data received from the semiconductor integrated circuit device with expected data for outputting information on failure of the data received from the semiconductor integrated circuit device to the external circuit when the data mismatch with each other in data comparison. Referring to FIG. 11, numeral 234 denotes a flip-flop circuit, and numeral 254 denotes a loop circuit which is similar to that described with reference to the second embodiment.

Referring to FIG. 11, further, numeral **232*a* denotes a comparison circuit for comparing an external expected data signal (EXP) and an external data input signal (D) with each other on the basis of an external comparison enable signal (CMPEN). This comparison circuit 232*a* is formed by a single Ex.OR circuit 241*a* and a single NAND circuit 243*a*. The Ex.OR circuit 241*a* has a pair of input terminals which receive the data input signal (D) from the semiconductor integrated circuit device (not shown) and the external expected, data signal (EXP) for comparatively checking whether or not the data input signal (D) is normal respectively. The NAND circuit 243*a* has two input terminals, which are supplied with the external comparison enable signal (CMPEN) and connected to an output terminal of the Ex.OR circuit 241 respectively. Thus, the comparison circuit 232*a*** compares the external expected data signal (EXP) and the external data input signal (D) with each other when the external comparison enable signal (CMPEN) is at a high level, to output a low level when the signals are different from each other.

Further, numeral 264 denotes a feedback inhibiting element (AND circuit) for inhibiting feedback of the output from the flip-flop circuit 234 when the NAND circuit **243*a* of the comparison circuit 232*a* outputs a reset signal. This feedback inhibiting element 264 has two input terminals which are connected with an output terminal of the NAND circuit 243*a* of the comparison circuit 232*a* and a data output terminal O1 of the flip-flop circuit 234** respectively.

In addition, numerals 262 and 263 denote first and second selector circuits which are similar in structure to the first and second selector circuits 252 and 253 (see FIG. 6) according to the second embodiment, while a signal input terminal "1" of the second selector circuit 263 having a pair of signal input terminals "0" and "1" is connected to an output terminal of the feedback inhibiting element 264.

The first selector circuit 262, the second selector circuit 263, a terminal (first input terminal) receiving the serial input signal (SI), a terminal (second input terminal) receiving the data input signal (D), and a terminal (third input terminal) receiving a shift mode control signal (SM) form selector means for selecting and outputting the serial input signal (SI), the data input signal (D) and the reset signal from the comparison circuit **232*a***.

Further, the first selector circuit 262, the second selector circuit 263, a loop wire connecting the other signal input terminal "1" of the second selector circuit 263 and the data output terminal O1 of the flip-flop circuit 234 and a terminal (fourth input terminal) receiving a shift inhibiting signal (SINH) form data holding means for holding the data of the flip-flop circuit 234 while no reset signal is received from the comparison circuit **232*a***. Other structure of this embodiment is similar to that of the second embodiment, and hence redundant description is omitted.

<Operation>

Figure 12:
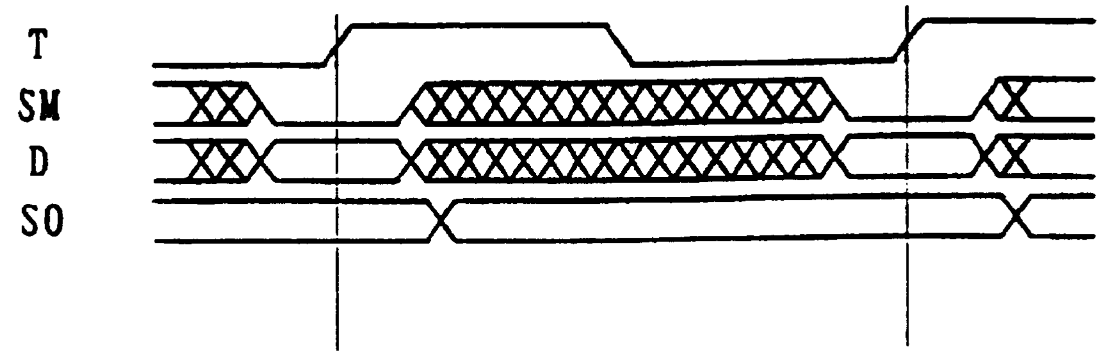
FIG. 12 is a timing chart showing a data incorporating operation of a flip-flop circuit provided in the semiconductor memory testing device according to the third embodiment of the present invention.

Operations of the scan register 261 having the aforementioned structure are now described. FIG. 12 is a timing chart showing an operation of incorporating data at the data input terminal D when the scan register 261 is employed as an output flip-flop of the semiconductor integrated circuit device (RAM). As shown in FIG. 12, the selector circuit 262 selects the signal input terminal "0" side when the shift mode control signal (SM) is at a low level on the leading edge of the clock signal (T), whereby the data input signal (D) received from the RAM is incorporated in the flip-flop circuit 234. Due to this operation, it is possible to employ the scan register 261 as an output flip-flop of the RAM in a normal operation.

Figure 13:
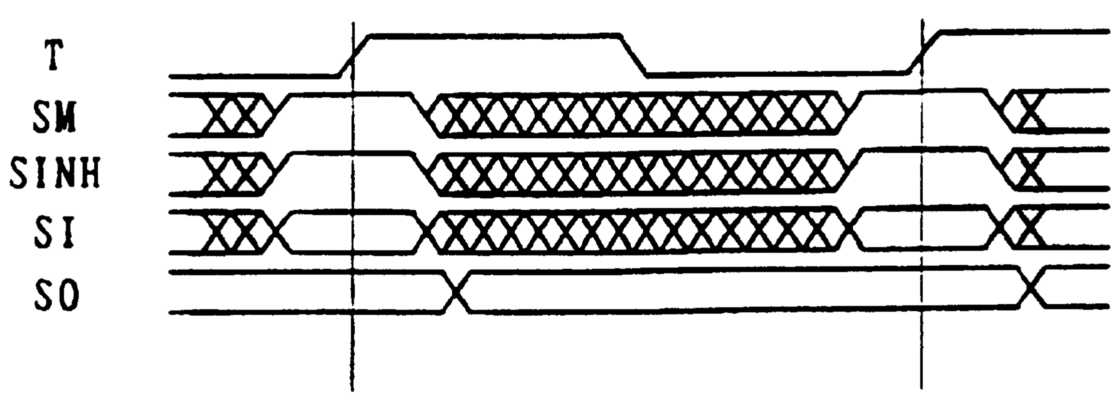
FIG. 13 is a timing chart showing a shift operation of the flip-flop circuit provided in the semiconductor memory testing device according to the third embodiment of the present invention.
Figure 16:
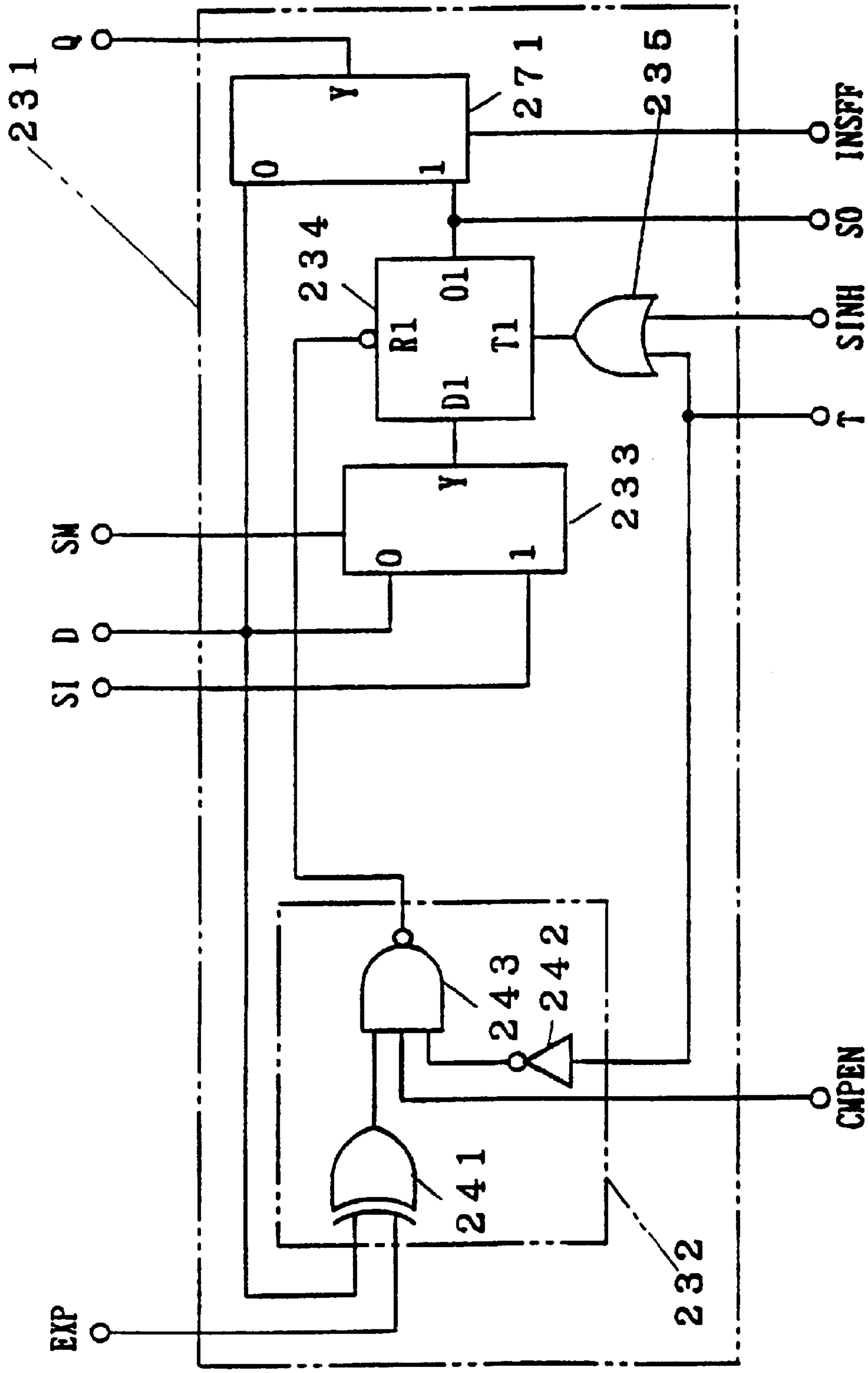
FIG. 16 is a logic circuit diagram showing a first modification of the present invention.

FIG. 13 is a timing chart showing a shift operation. When the shift mode control signal (SM) and the shift inhibiting signal (SINH) are at high and low levels ("1" and "0") respectively on the leading edge of the clock signal (T), the serial input signal (SI) is incorporated in the flip-flop circuit 234 through the selector circuits 263 and 262 and outputted to the serial output terminal O1, as shown in FIG. 13. Since the serial output terminal O1 is connected to a signal input terminal on a serial input signal (SI) side of a next-stage scan register, a shift operation is carried out. The shift operation is carried out in initialization (setting "1") before starting of a RAM test or reading of a test result upon completion of the RAM test.

FIG. 14 is a timing chart showing a shift inhibiting operation. As shown in FIG. 14, the output of the NAND circuit 243*a* goes high when the comparison enable signal (CMPEN) is at a low level. Thus, the feedback inhibiting element 264 outputs data held in the flip-flop circuit 234 as such. When the shift mode control signal (SM) and the shift inhibiting signal (SINH) are at high levels ("1") on the leading edge of the clock signal (T), output data SO.Q of the flip-flop circuit 234 is incorporated in the flip-flop circuit 234 itself through the feedback inhibiting element 264 and the selector circuits 263 and 262. Therefore, the data is held and no shift operation is carried out. The shift inhibiting operation is employed when the comparison operation must not be carried out due to indefinite output data of the RAM or the like.

FIG. 15 is a timing chart showing a comparing operation. When the comparison enable signal (CMPEN) is at a high level, the data input signal (D) from the comparison circuit 232*a* is compared with the expected data signal (EXP), so that the output of the comparison circuit 232*a* goes low when the signals are different from each other, as shown in FIG. 15. Thus, the output of the feedback inhibiting element 264 goes low. When the shift mode control signal (SM) and the shift inhibiting signal (SINH) go high ("1") on the leading edge of the clock signal (T), the flip-flop circuit 234 is reset to "0".

When the data at the data input terminal and that at the expected data terminal (EXP) are identical to each other on the leading edge of the clock signal (T), on the other hand, the NAND circuit 243*a* outputs a high level and the output data SO.Q of the flip-flop circuit 234 is incorporated in the flip-flop circuit 234 itself through the feedback inhibiting element 264 and the selector circuits 163 and 262. Thus, the data is held. Since the flip-flop circuit 234 is set at "1" by the initializing shift operation, presence of a failure is stored due to its change to "0". Data on presence/absence of failures held in the scan register 231 are read after completion of the RAM test by a shift operation.

Also according to this embodiment, data in the flip-flop circuit 234 is reloaded in response to the comparison result of the expected data and the input data in the test mode through only a one-phase clock signal similarly to the first and second embodiments, whereby a test clock signal can be omitted with no requirement for a complicated two-phase clock signal and a complicated clock driver circuit for supplying this clock signal as compared with the first prior art.

Fourth Embodiment

<Structure>

Figure 24:
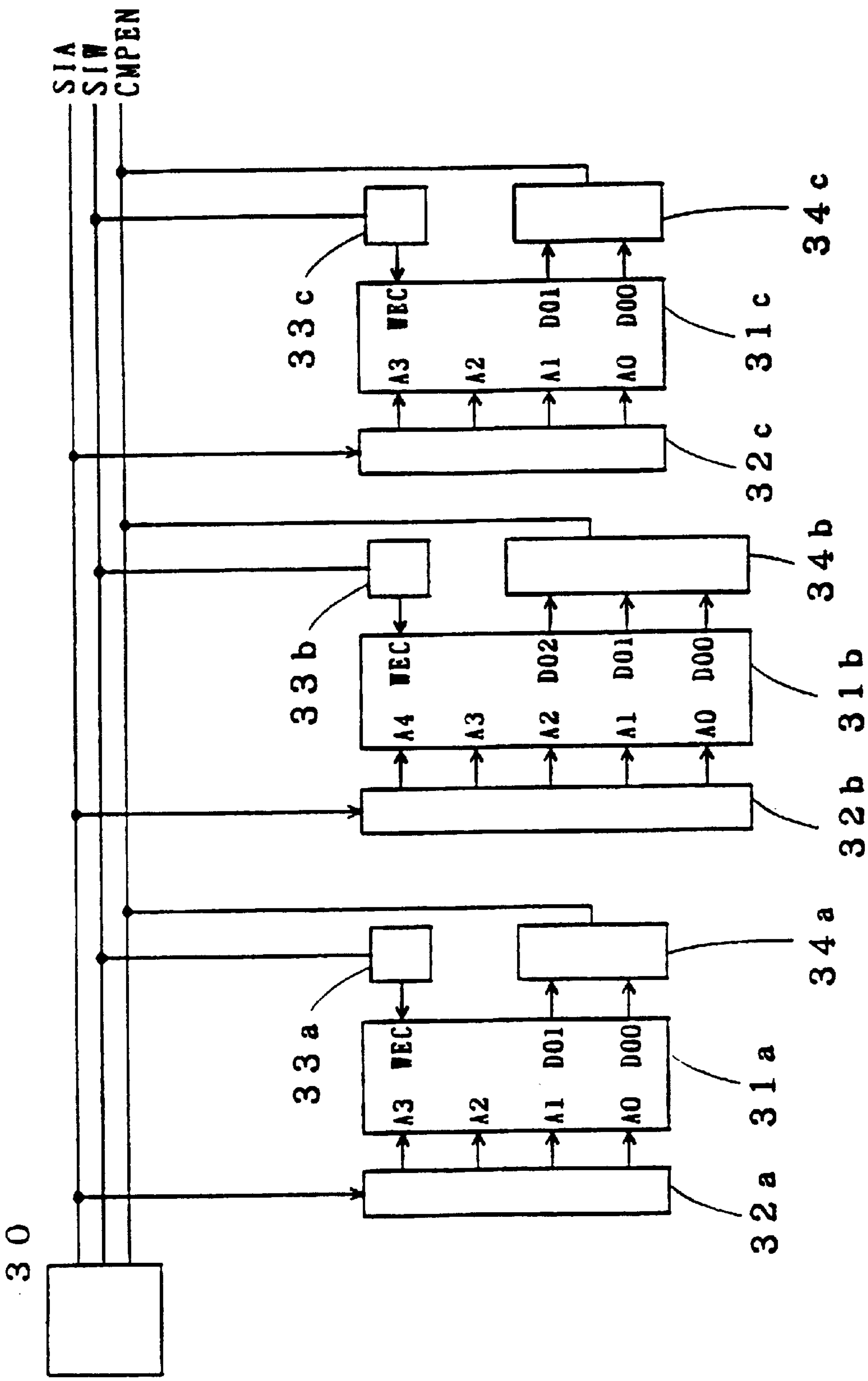
FIG. 24 is a block diagram showing a semiconductor memory testing device according to a fourth embodiment of the present invention, which is connected with a plurality of semiconductor memories.

FIG. 24 is a block diagram schematically showing a semiconductor memory testing device according to a fourth embodiment of the present invention. The testing device according to this embodiment is adapted to make a functional test on a plurality of semiconductor memories (tested circuits) such as RAMs or ROMs. Referring to FIG. 24, numeral 30 denotes the testing device according to this embodiment having a test pattern (algorithmic pattern) generation circuit, numerals 31*a* to 31*c* denote RAMs which are tested circuits, numerals 32*a* to 32*c* denote shift registers for selecting addresses of the respective RAMs 31*a* to 31*c* in the functional test of these RAMs 31*a* to 31*c*, symbol SIA denotes a common wire for transmitting addressing data to all shift registers 32*a* to 32*c*, numerals 33*a* to 33*c* denote write enable (write control) data input registers, symbol SIW denotes a data input wire, numerals 34*a* to 34*c* denote comparison circuits for comparing data output values of the tested circuits 31*a* to 31*c* with expected values, and symbol CMPEN denotes a comparison enable signal input terminal (comparison inhibiting means) for controlling (inhibiting) output correct/error determinations (comparing operations) in the comparison circuits 34*a* to 34*c*. An SIW signal flowing through the data input wire (SIW) is obtained by inverting a comparison enable signal (CMPEN) flowing through the comparison enable signal input terminal (CMPEN). The semiconductor memory testing device according to this embodiment has the same object as that of the second or third prior art in a point that the same increments or decrements addresses in an address generation circuit, while this embodiment switches an LFSR function and a counter function for incrementing or decrementing addresses in the address generation circuit since it is necessary to shift (increment or decrement) the addresses in constant order. Referring to FIG. 24, further, symbol WEC denotes write enable (write control) terminals of the RAMs (tested circuits) 31. As shown in FIG. 24, the comparison circuits 34*a* to 34*c* comprise comparison inhibiting parts 34Z in the interior thereof for comparing the output values of the tested circuits 31*a* to 31*c* with expected values when the CMPEN terminal is "1", while not carrying out such comparison by the comparison inhibiting parts 34Z when the CMPEN terminal is at "0". Numeral 34F denotes flip-flops for correcting 1-clock time differences caused between data inputs in the data input shift registers 33 and data outputs from the comparison circuits 34.

Figure 25:
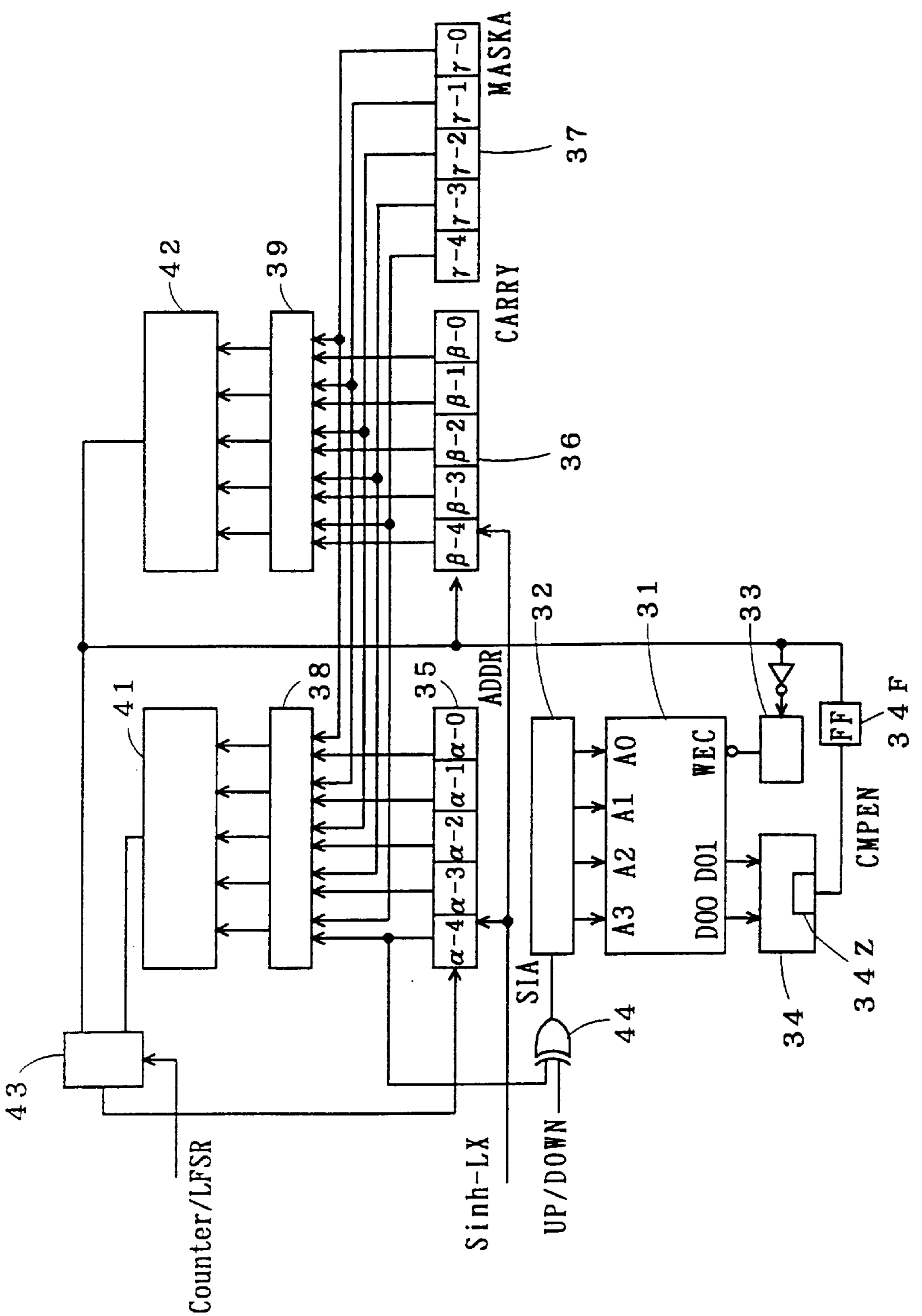
FIG. 25 is a circuit block diagram showing the semiconductor memory testing device according to the fourth embodiment of the present invention.

FIG. 25 illustrates the semiconductor memory testing device according to the fourth embodiment of the present invention. The semiconductor memory testing device according to this embodiment is a 5-bit address generation circuit which generates pseudo-random series within 5 bits while enabling count up/down, for making a functional test on a plurality of semiconductor memories (tested circuits) such as RAMs or ROMs while generating 5-bit addressing data as pseudo-random numbers. Referring to FIG. 25, numeral 31 denotes a tested circuit (semiconductor memory) such as a RAM whose word number (address input terminal number) is set at an arbitrary value such as $2^4$, for example, numeral 32 denotes a 4-bit address input shift register for inputting addresses in address input terminals A0 to A3 of the tested circuit 31, numeral 33 denotes a data input register serving as a write enable (write control) command part, numeral 34 denotes a 2-bit comparison circuit (data output shift register) for comparing data output values of the RAM with an expected value, numeral 35 denotes a 5-bit address generation shift register (address generation part: ADDR)

storing initial values of RAM addresses, symbols α-0 (least significant bit: LSB) to α-4 (most significant bit: MSB) denote flip-flops (1-bit registers) forming the address generation shift register (ADDR) 35, numeral 36 denotes a 5-bit control register (CARRY), symbols β-0 (least significant bit: LSB) to β-4 (most significant bit: MSB) denote flip-flops (1-bit registers) forming the control register (CARRY) 36, numeral 37 denotes a 5-bit flip-flop selection register (effective address number storage part: MASKA) receiving generating functions of all cyclic series as initial values in addressing and storing an effective address number in counting, symbols γ-0 (least significant bit: LSB) to γ-4 (most significant bit: MSB) denote flip-flops forming the flip-flop selection register (MASKA) 37, numeral 38 denotes a first AND (logical product) circuit group obtaining logical products (AND) between the flip-flops α-0 to α-4 of the address generation shift register (ADDR) 35 and the flip-flops γ-0 to γ-4 of the flip-flop selection register (MASKA) 37 corresponding thereto respectively, numeral 39 denotes a second AND (logical product) circuit group obtaining logical products (AND) between the flip-flops β-0 to β-4 of the control register (CARRY) 36 and the flip-flops γ-0 to γ-4 of the flip-flop selection register (MASKA) 37 corresponding thereto respectively, numeral 41 denotes an expected value generation circuit, numeral 42 denotes an OR (logical sum) circuit group for obtaining a logical sum (OR) for the output of the second AND circuit 39, numeral 43 denotes a counter, and numeral 44 denotes an exclusive OR (Ex.OR) circuit. The address generation shift register (ADDR) 35, the control register (CARRY) 36, the flip-flop selection register (MASKA) 37, the first AND circuit group 38, the second AND circuit group 39, the expected value generation circuit 41, and the OR circuit group 42 form an arithmetic and logic part which generates a test pattern of a bit number corresponding to the maximum address value of addresses of a plurality of types of semiconductor memories subjected to a functional test in test pattern generation, while setting effective address numbers of the semiconductor memories in counting.

The address generation shift register (ADDR) 35 and the control register (CARRY) 36 are connected with terminals for inputting external signals (Sinh-LX) for controlling shift inhibition of these registers 35 and 36. The flip-flop selection register (MASKA) 37 functions as an effective address number information storage part for storing effective address number information in counting.

Figure 26:
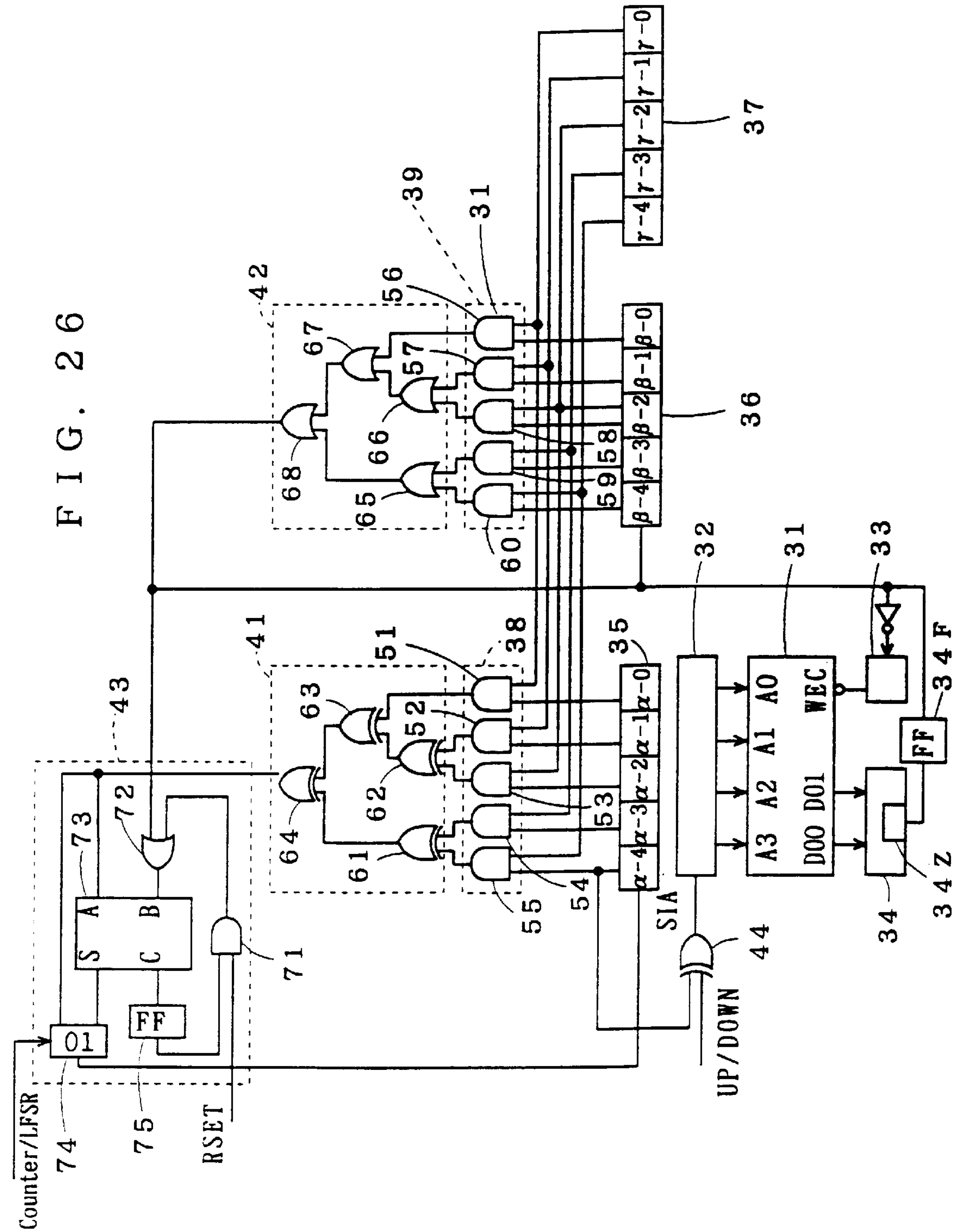
FIG. 26 is a circuit block diagram showing the logic structure of an arithmetic and logic part etc. in the semiconductor memory testing device according to the fourth embodiment of the present invention.

As shown in FIG. 26, the first AND circuit group 38 is formed by five AND circuits 51 to 55 in correspondence to the bit numbers of the address generation shift register (ADDR) 35 and the flip-flop selection register (MASKA) 37. The AND circuits 51 to 55 receive signals from corresponding ones of the flip-flops α-0 to α-4 of the address generation shift register (ADDR) 35 and the flip-flops γ-0 to γ-4 of the flip-flop selection register (MASKA) 37. The AND circuit 51 operates "α-0 AND γ-0", for example, and the AND circuit 54 operates "α-4 AND γ-4", for example.

The second AND circuit group 39 is formed by five AND circuits 56 to 60. in correspondence to the bit numbers of the control register (CARRY) 36 and the flip-flop selection register (MASKA) 37. The AND circuits 56 to 60 receive signals from corresponding ones of the flip-flops β-0 to β-4 of the control register (CARRY) 36 and the flip-flops γ-0 to γ-4 of the flip-flop selection register (MASKA) 37. The AND circuit 56 operates "β-0 AND γ-0", for example, and the AND circuit 60 operates "β-4 AND γ-4", for example.

The expected value generation circuit 41 comprises four exclusive OR (Ex.OR) circuits 61 to 64. The Ex.OR circuit 61 receives signals from the AND circuits 54 and 55, and the Ex.OR circuit 62 receives signals from the AND circuits 52 and 53. The Ex.OR circuit 63 receives signals from the EX.OR circuit 62 and the AND circuit 51, while the Ex.OR circuit 64 receives signals from the Ex.OR circuits 61 and 63.

The OR circuit group 42 comprises four logical sum (OR) circuits 65 to 68. The OR circuit 65 receives signals from the AND circuits 59 and 60, while the OR circuit 66 receives signals from the AND circuits 57 and 58. The OR circuit 67 receives signals from the OR circuit 66 and the AND circuit 56, while the OR circuit 68 receives signals from the OR circuits 65 and 67.

The counter 43 comprises a single AND circuit 71, a single OR circuit 72, a single half adder (half adder circuit) 73, a single switch 74, and a single flip-flop (hereinafter referred to as "FF") 75.

Figure 27:
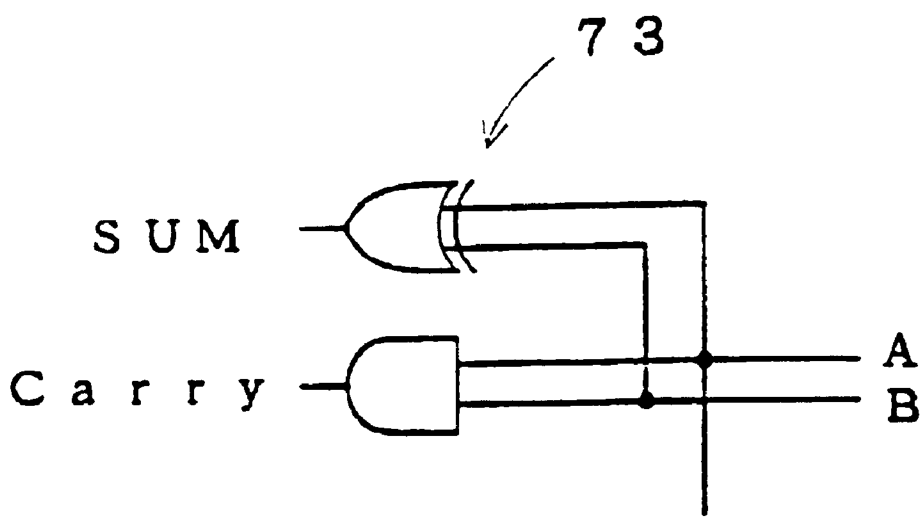
FIG. 27 is a circuit diagram showing the internal structure of a half-adder provided in the semiconductor memory testing device according to the fourth embodiment of the present invention.

The AND circuit 71 has two input terminals, which receive a reset signal (RSET) and a signal from the FF 75 respectively. Thus, the counter 43 is reset when the signal from the FF 75 and the reset signal (RSET) are received. The OR circuit 72, which functions as an adder element for counting a number of times corresponding to the effective address number of the semiconductor memory on the basis of effective address number information received from the arithmetic and logic part thereby detecting whether it is a point of time immediately after the address is incremented or decremented and adding 1 at this point of time, has two input terminals which receive a signal (incarry) from the AND circuit 71 and a signal (set) from the OR circuit 68 of the OR circuit group 42 respectively. As shown in FIG. 27, the half adder 73 is a combinatorial logic element having two outputs of SUM (hereinafter simply referred to as S) and Carry (hereinafter simply referred to as C) and two inputs of A and B. S represents a total sum (sum output) with no carry and C represents carry (carry output), and the input terminals A and B and the output terminals S and C are in the following relations:

S=A Ex.OR B

C=A AND B

The input terminal A receives a signal (coin) from the Ex.OR circuit 64 of the expected value generation circuit 41, while the input terminal B receives a signal (cain) from the OR circuit 72. The switch 74, which selects whether the same generates pseudo-random series or functions as a counter on the basis of an external selection signal (Counter/LFSR), has two input terminals which receive the signal from the Ex.OR circuit 64 of the expected generation circuit 41 and an output S (Data Out) from the half adder 73 respectively. The FF 75 functions as a storage element for storing the address content immediately before an address incrementing or decrementing operation of the OR circuit 72 on the basis of the carry output C of the half adder 73 and transmitting the same to the OR circuit 72.

The Ex.OR circuit 44, which is adapted to invert a generated pattern on the basis of an external UP/DOWN signal, has two input terminals, which receive a signal from the switch 74 and the UP/DOWN signal respectively. An output of this Ex.OR circuit 44 is transmitted to a serial input terminal of the address input shift register 32. While FIG. 25 simply illustrates the address input shift register 32 as a single one, a plurality of address input shift registers 32*a* to 32*c* are connected in parallel with each other in practice as shown in FIG. 24, for functionally testing a plurality of tested circuits 31*a* to 31*c*. Referring to FIG. 25, symbol SIA denotes a common wire for transmitting addressing data to the plurality of address input shift registers 32.

<Using Method>

A method of using the semiconductor memory testing device having the aforementioned structure is now described. In a functional test of the tested circuit 31, test data is inputted in the serial input terminal of the address input shift register 32 through the common wire SIA, to be inputted in the tested circuit (RAM) 31 as an address. When the tested circuit (semiconductor memory) 31 corresponds up to address terminals of m bits (five bits in this embodiment, for example) and the tested circuit 31 to be tested is of n bits (4 bits in FIGS. 25 to 30, for example), m−n (5−4=1 in this embodiment) bits of the address generation shift register (ADDR) 35, the control register (CARRY) 36 and the flip-flop selection register (MASKA) 37 go redundant. Namely, the circuit corresponds to a RAM having address terminals of 5 bits at the maximum and the RAM to be tested is of 4 bits in the embodiment shown in FIGS. 25 to 30, and hence there exists only 1 redundant bit. Such a redundant bit is set to be on the least significant bit (LSB) side of each register.

Figure 28:
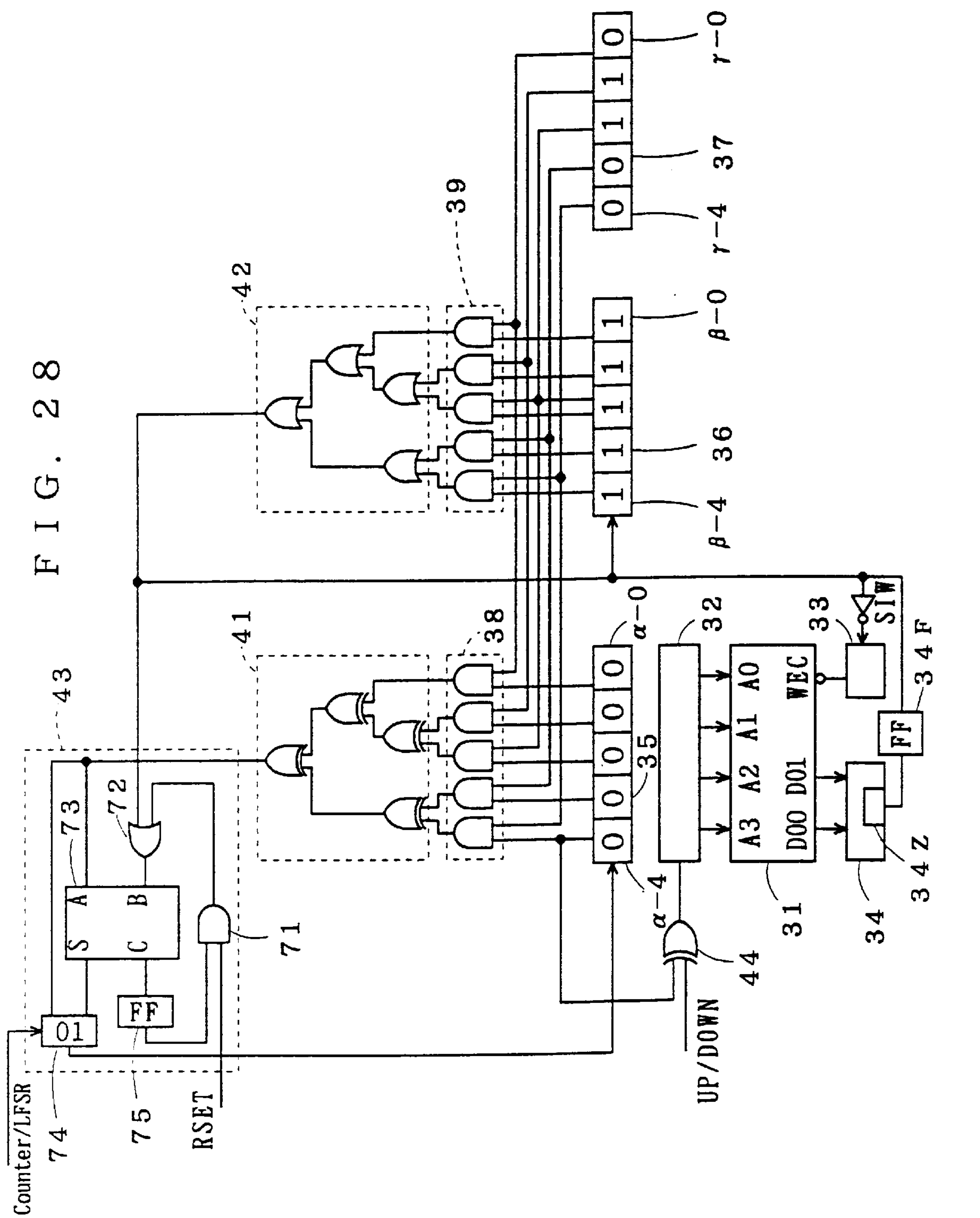
FIG. 28 is a circuit block diagram showing an operation for generating a quaternary test pattern in the semiconductor memory testing device according to the fourth embodiment of the present invention.

FIG. 28 shows such an example that the testing device according to this embodiment generates quaternary full cyclic series (test pattern). First, "00000", "11111", "00110" and "0000" are previously inputted in the flip-flops α-0 to α-4 of the address generation shift register (ADDR) 35, the flip-flops β-0 to β-4 of the control register (CARRY) 36, the flip-flops γ-0 to γ-4 of the flip-flop selection register (MASKA) 37 and the flip-flop of the address input shift register 32 respectively. The data set in the flip-flop selection register (MASKA) 37 is a generating function of LFSR generating the full cyclic series. For example, the generating function employed in this embodiment is as follows:

$$1+X^3+X^4$$

$$1+0\times X^1+0\times X^2+1\times X^3+1\times X^4+0\times X^5$$

Thus, "00110" is set in the flip-flop selection register (MASKA) 37, as described above. Another example of the quaternary generating function is $1+X^2+X^4$, and it is possible to generate a different test pattern by setting "01010" in the flip-flop selection register (MASKA) 37 in this case.

The data "00000" set in the address generation shift register (ADDR) 35 is an initial value "0000" of the address supplied to the tested circuit (RAM) 31 having $2^4$-word addresses. In the embodiment shown in FIG. 28, however, the least significant bit (LSB) α-0 of the address generation shift register (ADDR) 35 is rendered redundant.

Further, "11111" is set in the control register (CARRY) 36, as described above. In test execution, an output (CMPEN) of the comparison circuit 34 is regularly made "1" and an input (SIW) in the write enable (write control) data input register 33 is regularly made "0", whereby writing in the testes circuit (RAM) 31 and comparison of the expected value with the output data of the tested circuit 31 are regularly carried out.

As described above, "0000" is previously inputted in the address input shift register 32. The selection signal terminal Counter/LFSR is set at "0" (LFSR specification) so that the testing device according to this embodiment functions as an LFSR. Further, the selection signal UP/DOWN is set at "0" (UP specification).

Figure 29:
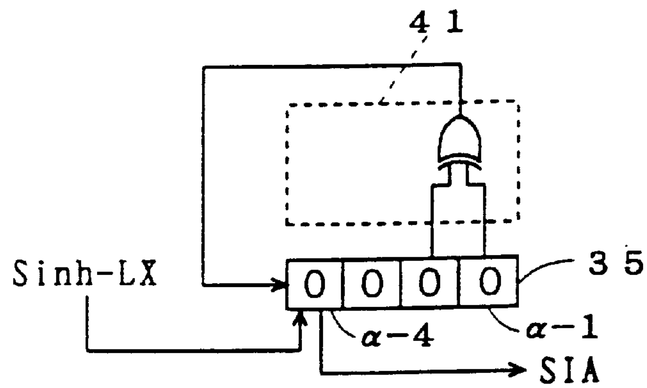
FIG. 29 is a circuit block diagram showing an equivalent circuit in generation of the quaternary test pattern in the semiconductor memory testing device according to the fourth embodiment of the present invention.

FIG. 29 is an equivalent circuit in a case of setting initial values of the respective registers as shown in FIG. 28. Numerals and symbols appearing in FIG. 29 correspond to those of FIG. 25 respectively. Namely, the testing device according to this embodiment is a 4-bit LFSR comprising the address generation shift register (ADDR) 35 having the flip-flops α-0 to α-4, and generates quaternary full cyclic series when a terminal Sinh-LX is set at "0". After all patterns are generated, it is possible to generate patterns in reverse order to the precedently generated ones by inverting the terminal UP/DOWN to DOWN specification.

Figure 30:
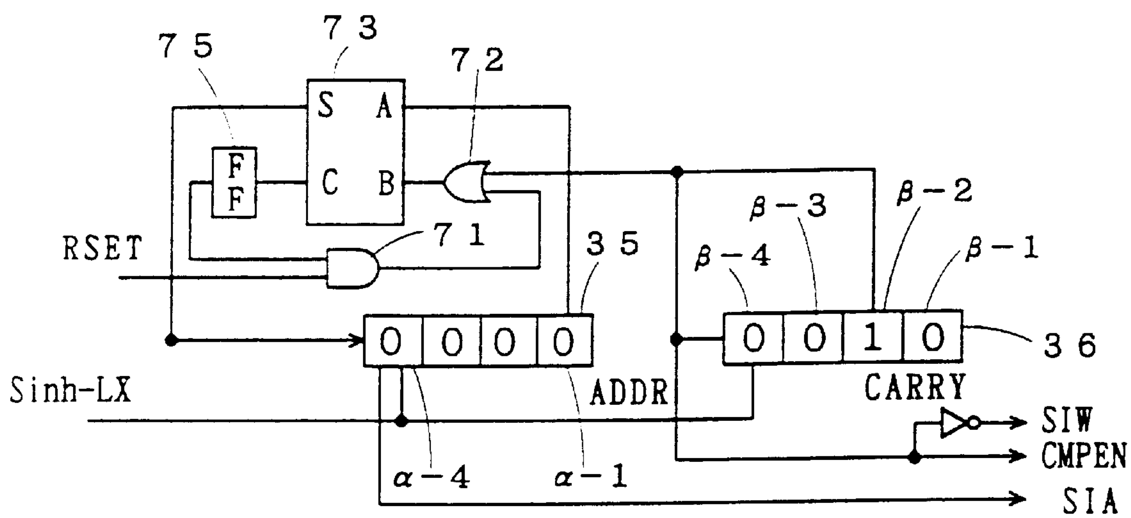
FIG. 30 is a circuit block diagram showing a count operation in the semiconductor memory testing device according to the fourth embodiment of the present invention.

Description is now made on a case of driving the semiconductor memory testing device according to this embodiment as a counter. FIG. 30 shows such an example that this circuit generates a quaternary counter. "00000" and "00010" are previously inputted in the address generation shift register (ADDR) 35 and the control register (CARRY) 36 respectively. Further, "00010" indicating the bit number (=4) of the address input shift register 32 is previously inputted in the flip-flop selection register (MASKA) 36. When the flip-flop selection register (MASKA) 37 is of m bits (5 bits in this embodiment) and the address input shift register 32 is of n bits (4 bits in FIG. 30), only the first digit of an effective data column of the flip-flop selection register (MASKA) 37 is set at "1" and the remaining registers are set at "0" in general. In this example, only the flip-flop γ-1 is set at "1".

The data "00000" inputted in the address generation shift register (ADDR) 35 is the initial value of the tested circuit (RAM) 31 having $2^4$-word addresses, while the least significant bit α-0 is a redundant bit. The data "00010" inputted in the control register (CARRY) 36 is identical to that inputted in the flip-flop selection register (MASKA) 37. The initial value "0000" of the same address (data omitting the least significant bit α-0) as the address generation shift register (ADDR) 35 is set in the address input shift register 32. In this case, the circuit shown in FIG. 30 is equivalent to that shown in FIG. 31. Namely, the testing device becomes a 1-bit counter serving as address change means in such condition setting and makes incrementation every 4 cycles.

Figure 31:
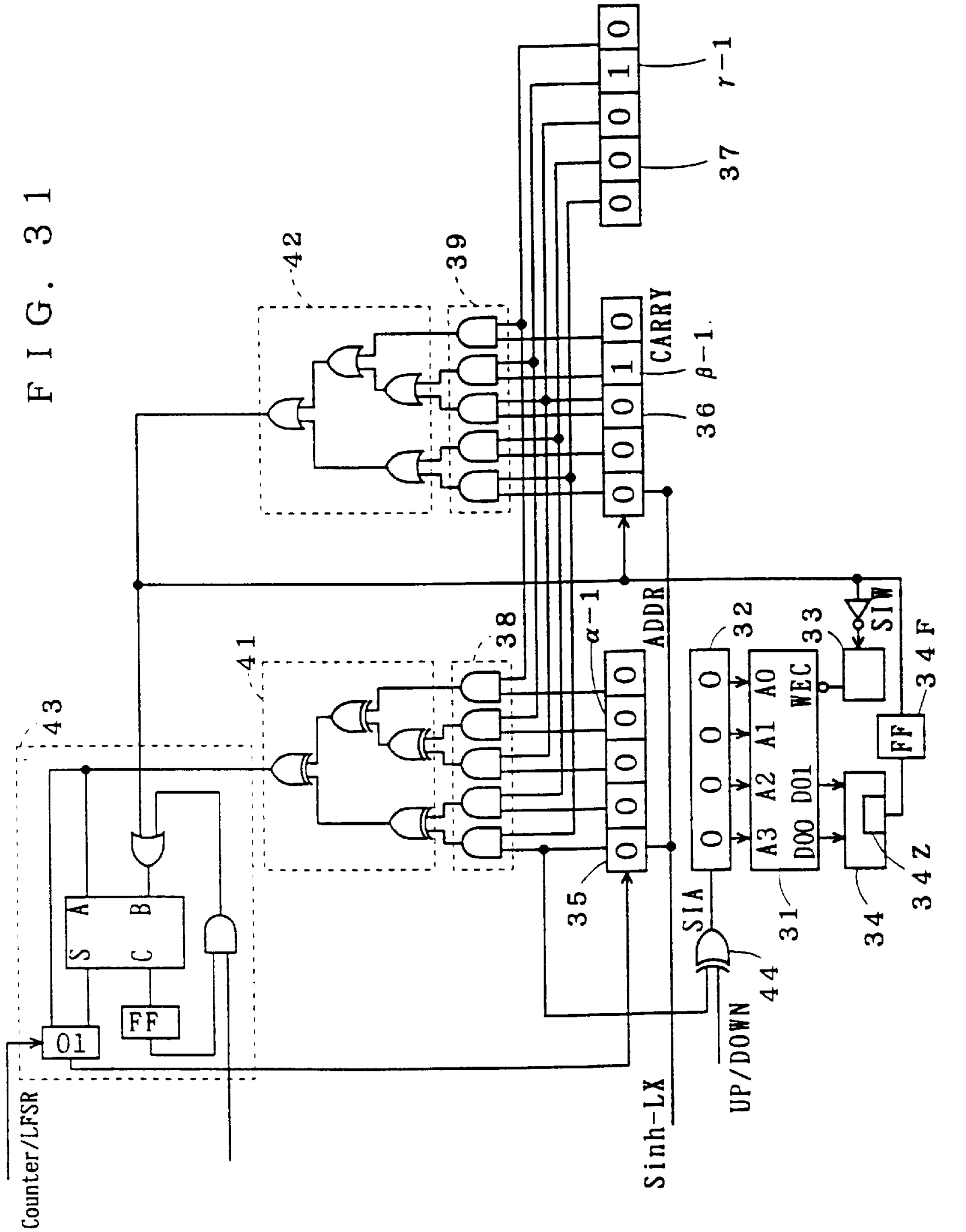
FIG. 31 is a circuit block diagram showing an equivalent circuit in counting of the semiconductor memory testing device according to the fourth embodiment of the present invention.

Operations of the testing, device according to this embodiment are described with reference to FIG. 31. First, a reset (RSET) signal is zeroed so that the interior of the FF 75 is zeroed. At this time, Sinh-LX is converted to "1", so that data in the address generation shift register (ADDR) 35 is not shifted.

Then, the reset (RSET) signal is converted to "1" and Sinh-LX is simultaneously converted to "0". At this time, the address generation shift register (ADDR) 35 and the address input shift register 32 are "0000", and the control register (CARRY) 36 is "0001".

SIW (write enable) in FIG. 30 is "0" and CMPEN (data output) is "1", so that data is written in an address 0 of the tested circuit (RAM) 31 or the data output of the tested circuit (RAM) 31 is compared with the expected value. The half adder 73 executes "α-1" AND "β-1", so that S=1 and C=0. Thus, the address generation shift register (ADDR) 35 and the address input shift register 32 become "1000" and the control register (CARRY) 36 becomes "1000" in a next clock. At this time, SIW is "1" and CMPEN is "0", whereby data writing in the tested circuit (RAM) 31 and comparison of the data output value and the expected value are inhibited. The address input shift register 32 is "0000".

In a fourth clock cycle, the address generation shift register (ADDR) 35 becomes "0001", and the address input shift register 32 is "0010". SIW is "0" and CMPEN is "1", so that data is written in an address 1 of the tested circuit 31, or the data output is compared with the expected value.

In a fifth clock cycle, the address generation shift register (ADDR) 35 becomes "0000", and the address input shift register 32 is "0001". SIW is "1" and CMPEN is "0", whereby data writing in the tested circuit (RAM) 31 and comparison of the data output value with the expected value are inhibited.

Then, the half adder 73 executes "α-1" AND "β-1", whereby S=0 and C=1. Thus, the address generation shift register (ADDR) 35 and the address input shift register 32 become "0000" and the control register (CARRY) 36 becomes "1000" in a next clock. At this time, SIW is "1" and CMPEN is "0", whereby data writing in the tested circuit (RAM) 31 and comparison of the data output value with the expected value are inhibited.

In an eighth clock cycle, the address generation shift register (ADDR) 35 and the address input shift register 32 are "0010" and the control register (CARRY) 36 is "0001". SIW is "0" and CMPEN is "1", so that data is written in an address 2 of the tested circuit 31, or the data output of the RAM is compared with the expected value.

Thus, this circuit sets address incrementation every four shift operations. CMPEN outputs a signal in synchronization with shifting of CARRY for generating "0" in addressing and "1" in testing, while SIW receives inverted values thereof.

As hereinabove described, the circuit according to this embodiment can increment addresses every n shift operations when an n-bit shift register is set. Further, it is possible to decrement addresses by making the UP/DOWN terminal "1" and inverting SIA.

Figure 59:
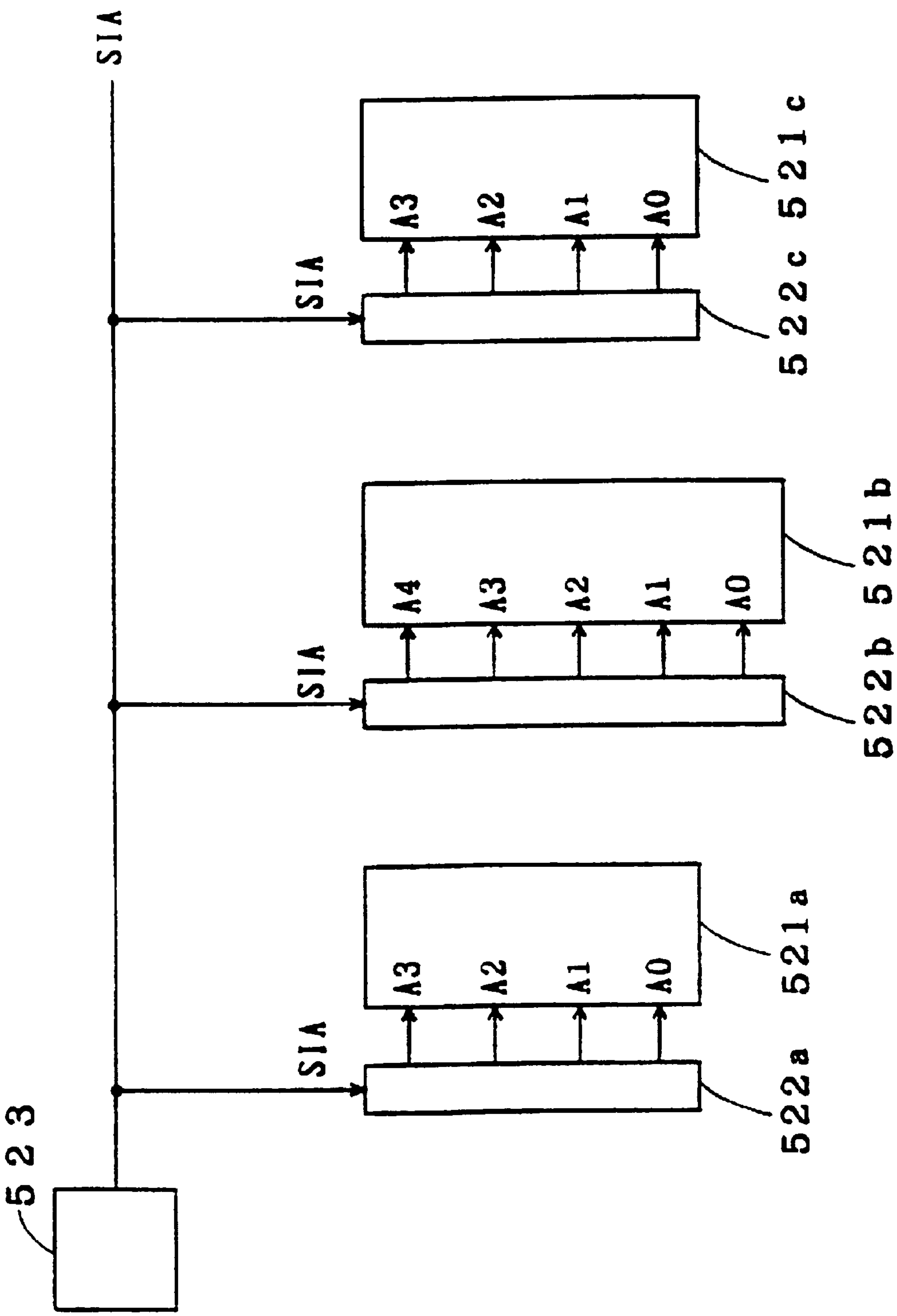
FIG. 59 is a block diagram showing a semiconductor memory testing device according to third prior art, which is connected with a plurality of semiconductor memories.

It is necessary to shift (increment or decrement) the addresses in constant order in order to solve the aforementioned first problem. In order to increment or decrement the addresses in the address Generation circuit, LFSR and counter functions are switched by the same circuit in this embodiment. In order to increment or decrement the addresses by the address generation circuit, it may be possible to connect a general counter to an LFSR circuit 523, which is identical in structure to that of the second prior art shown in FIG. 59, as a separate member for incrementing or decrementing addresses by interlocking operations of such a counter and the LFSR circuit 523. In general, however, such a counter is so larger in area scale than the LFSR circuit 523 that it is difficult to integrate the counter in a single integrated circuit, and hence an address bus must be provided on an outer side to mount the counter. Thus, not only an extra area for the counter but a wiring mechanism for the address bus etc. is required, to remarkably reduce area efficiency. In consideration of this, a 1-bit register formed by the half adder 73 and the FF 75 is employed in this embodiment to implement a testing device having a small area.

Fifth Embodiment

<Structure>

Figure 32:
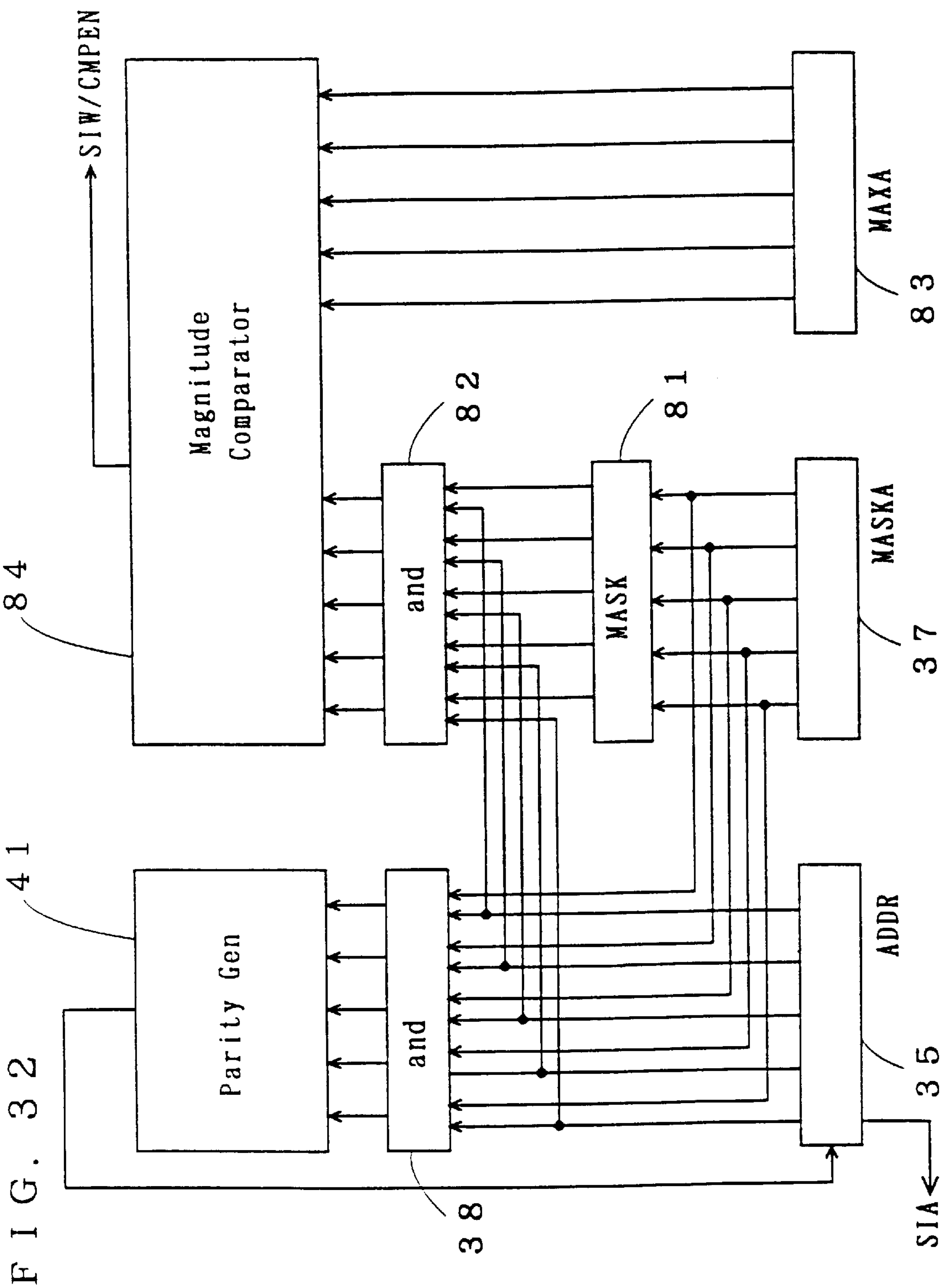
FIG. 32 is a circuit block diagram showing a semiconductor memory testing device according to a fifth embodiment of the present invention.

FIG. 32 illustrates a semiconductor memory testing device according to a fifth embodiment of the present invention. The semiconductor memory testing device according to this embodiment is similar in structure to that of the fourth embodiment in a point that the same is an address generation circuit of 5 bits, i.e., not more than a word number $2^5$, while the former is different from the latter in a point that the same comprises a magnitude comparator in its interior. Referring to FIG. 32, numeral 35 denotes a 5-bit address generation shift register (ADDR) which stores initial values of RAM addresses, numeral 37 denotes a 5-bit flip-flop selection register (MASKA) which is supplied with a generating function of full cyclic series as initial values, numeral 38 denotes a first AND (logical product) circuit group and numeral 41 denotes an expected value generation circuit. All elements are similar in structure to those described with reference to the fourth embodiment. Referring to FIG. 32, further, numeral 81 denotes an OR (logical sum) circuit group (MASK), numeral 82 denotes a second AND (logical product) circuit group, numeral 83 denotes a 5-bit maximum address value storage register (MAXA) which is supplied with the maximum value of the RAM addresses as an initial value, and numeral 84 denotes a magnitude comparator. The address generation shift register (ADDR) 35, the flip-flop selection register (MASKA) 37, the first AND circuit group 38, the expected value generation circuit 41, the OR circuit group (MASK) 81 and the second AND circuit group 82 form an arithmetic and logic part which generates a test pattern of a bit number corresponding to the maximum address value of an address number of a plurality of types of semiconductor memories subjected to a functional test in test pattern generation.

The OR circuit group (MASK) 81 has a function of reading data successively from the least significant bit γ-0 (LSB) to the most significant bit γ-4 (MSB) as to the flip-flop selection register (MASKA) 37 and converting all bits from an upper bit (γ-n+1) to the most significant bit γ-4 (MSB) to "1" if a bit γ-n is "1". This OR circuit group (MASK) 81 has four OR circuits 91, 92, 93 and 94 each having two input terminals. The terminals of the OR circuit 91 are connected to the flip-flops γ-0 and γ-1 of the flip-flop selection register (MASKA) 37 respectively. The terminals of the OR circuit 92 are connected to an put terminal of the OR circuit 91 and the flip-flop γ-2 respectively. The terminals of the OR circuit 93 are connected to an output terminal of the OR circuit and the flip-flop γ-3 respectively. The terminals of the OR circuit 94 are connected to an output terminal of the OR circuit 93 and the flip-flop γ-4 respectively. The OR circuits 91 to 94 of the OR circuit group 81 are referred to MASKADDR(1) to MASKADDR(4), and the junction between the least significant bit γ-0 of the flip-flop selection register (MASKA) 37 and the OR circuit 91 is referred to as MASKADDR(0).

The second AND circuit group 82. ANDs respective bits and outputs the results as to the address generation shift register (ADDR) 35 and MASKADDR(0) to MASKADDR (4) of the OR circuit group 81. This second AND circuit group 82 is formed by five AND circuits 95 to 99, in correspondence to the bit numbers of the address generation shift register (ADDR) 35 and the flip-flop selection register (MASKA) 37. The AND circuits 95 to 99 receive signals from the respective flip-flops α-0 to α-4 of the address generation shift register (ADDR) 35 and the respective flip-flops γ-0 to γ-4 of the flip-flop selection register (MASKA) 37. The AND circuit 95 operates "α-0 AND γ-0", for example, while the AND circuit 99 operates "α-4 AND γ-4", for example.

The maximum address value storage register (MAXA) 83, which is a register storing the maximum word number of a tested circuit 31, comprises five flip-flops δ-0 to δ-4, similarly to the address generation shift register (ADDR) 35 and the flip-flop selection register (MASKA) 37.

The magnitude comparator 84, which is a digital data comparison circuit, outputs "1" at SIW and "0" at CMPEN when the full cyclic series as generated outputs a value exceeding the RAM address values.

A data input register 33 and a comparison circuit 34 shown in FIG. 32 are similar to those described with reference to the fourth embodiment. The magnitude comparator 84, the data input register 33 and the comparison circuit 34 form a write control command part which inhibits data of redundant bits of the arithmetic and logic part not corresponding to the addresses of the tested circuit (ROM) 31 from being written in the semiconductor memory.

<Using Method>

A method of using the semiconductor memory testing device having the aforementioned structure is described. Similarly to the fourth embodiment, the initial values of the RAM addresses, the generating function (="00110") of the full cyclic series, and the maximum value (="1011") of the RAM addresses are stored in the address generation shift register (ADDR) 35, the flip-flop selection register (MASKA) 37 and the maximum address value storage register (MAXA) 83 respectively, as an initial stage. According to this embodiment, the redundant bits are set on the least significant bit (LSB) side, and α-0 and δ-0 are redundant bits, similarly to the fourth embodiment.

Consider a point of time of a certain clock cycle such that the address generation shift register (ADDR) 35 is "1001", as shown in FIG. 33. FIG. 34 shows an equivalent circuit of FIG. 33. A pseudo-random address pattern which is generated along a generating function of LFSR of "$1+X^3+X^4$" is outputted at SIA in FIG. 34. The value of the address input shift register 32 is equal to the values α-4 to α-1 of the address generation shift register (ADDR) 35. Thus, it is necessary to inhibit data writing in the RAM and comparison of the data output value of the RAM and the expected value. Thus, the value of the address generation shift register (ADDR) 35 is compared with that of the maximum address value storage register (MAXA) 83 in the magnitude comparator 84, to generate SIW and CMPEN. In more concrete terms, "1" and "0" are generated at SIW and CMPEN respectively when the RAM address value exceeds the value (="1011") previously set in the maximum address value storage register (MAXA) 83, to inhibit data writing in the RAM and comparison of the data output value of the RAM and the expected value.

Thus, it is possible to reliably remove redundant bits by comparing the address value with the reference value, regardless of the address number of the tested circuit 31 to be subjected to a functional test.

Sixth Embodiment

When "00000" is generated as a test pattern in the fifth embodiment, all data passing through the first and second AND circuit groups 38 and 82 become "0" and thereafter the input (SIA) in the address input shift register 32 remains "0" to be not converted to "1" permanently regardless of shifting of the address generation shift register (ADDR) 35. Thus, the fifth embodiment has such a problem that it is impossible to generate "00000" as a test pattern and the test pattern is limited in this point. A semiconductor memory testing device according to a sixth embodiment of the present invention is adapted to enable generation of "00000", which cannot be generated in the fifth embodiment.

Figure 35:
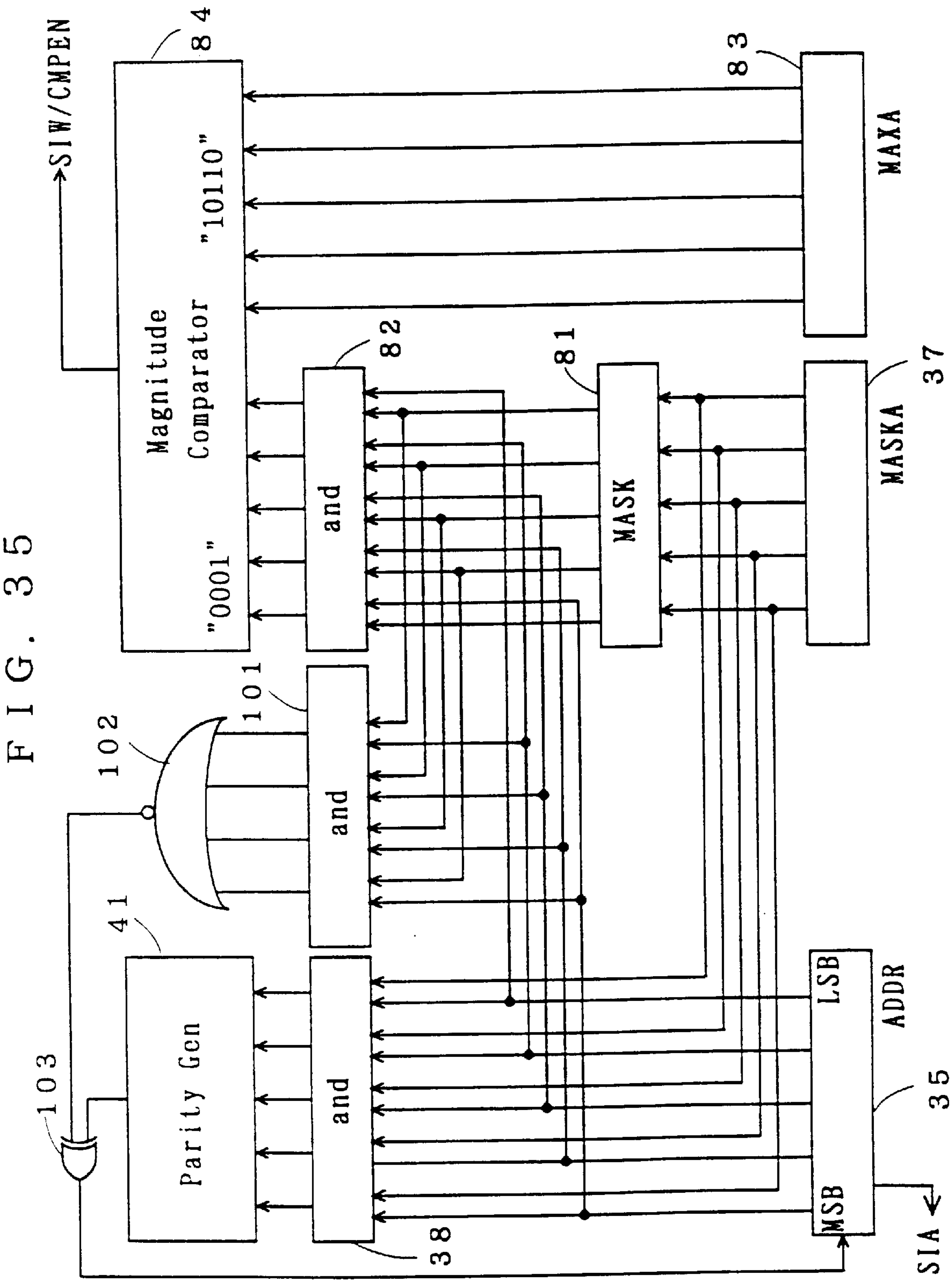
FIG. 35 is a circuit block diagram showing a semiconductor memory testing device according to a sixth embodiment of the present invention.

FIG. 35 illustrates the semiconductor memory testing device according to the sixth embodiment of the present invention. Referring to FIG. 35, numeral 101 denotes a third AND circuit group which is similar in structure to the first and second AND circuit groups 38 and 82 described with reference to the fifth embodiment. In more concrete terms, the third AND (logical product) circuit group 101 has four AND circuits 101*a* to 101*d*, so that first input terminals of these AND circuits 101*a* to 101*d* are connected to the respective flip-flops α-0 to α-4 of the aforementioned address generation shift register (ADDR) 35 excluding the least significant bit and second input terminals thereof are connected to MASKADDR(0) to MASKADDR(4) of the aforementioned OR circuit group 81 (refer to the fifth embodiment). The third AND circuit group 101 is {1,0,0,1} AND {1,1,1,0} in FIG. 35. Referring to FIG. 35, further, numeral 102 denotes a 4-bit NOR circuit, which NORs all outputs of the third AND circuit group 101.

In an M-bit address generation circuit, the aforementioned second AND circuit group 82 outputs:

"ADDR(1) AND MASKA(0)"

"ADDR(2) AND MASKA(1)"

"ADDR(M) AND MASKA(M-1)"

Referring to FIG. 35, further, numeral 103 denotes an Ex.OR circuit which receives output signals from the aforementioned NOR circuit 102 and the aforementioned expected value generation circuit 41. The NOR circuit 102 and the Ex.OR circuit 103 form a circuit which generates bit data having values different from those of all bit data precedingly generated from a semiconductor memory when these bit data are "0001" for supplying "0000" to addresses of a subsequent semiconductor memory.

<Using Method>

Figure 36:
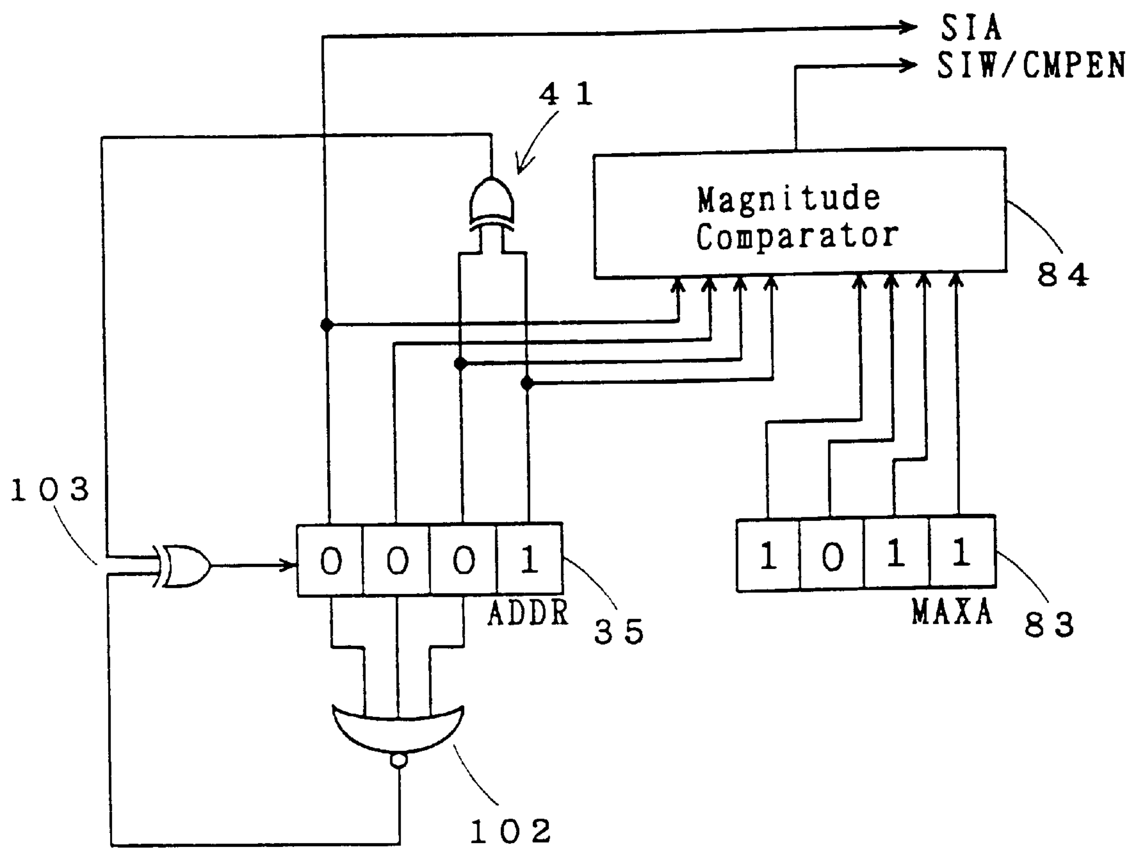
FIG. 36 is a circuit block diagram showing an equivalent circuit in operation of the semiconductor memory testing device according to the sixth embodiment of the present invention.

FIG. 36 shows an equivalent circuit of FIG. 35. Description is now made on a method of using the semiconductor memory testing device having the aforementioned structure, which generates a pseudo-random address pattern. First, the expected value generation circuit 41 generates a pseudo-random address pattern on the basis of a signal received from the address generation shift register (ADDR) 35. When a RAM address value exceeds a value stored in a maximum address value storage register (MAXA) 83, a magnitude comparator 84 decides this to output "1" and "0" to SIW and CMPEN respectively and transmit a write enable signal and a comparison enable signal to a tested circuit (RAM), for inhibiting data writing in the RAM and correct/error decision (checking). When all of α-2 to α-4 are "0001", the Ex.OR circuit 103 outputs "0" to a wire SIA reaching an address input shift register at a next clock timing, to generate an address 0 of the RAM. Also according to this embodiment, it is possible to attain an effect similar to that of the fifth embodiment.

Seventh Embodiment

Figure 37:
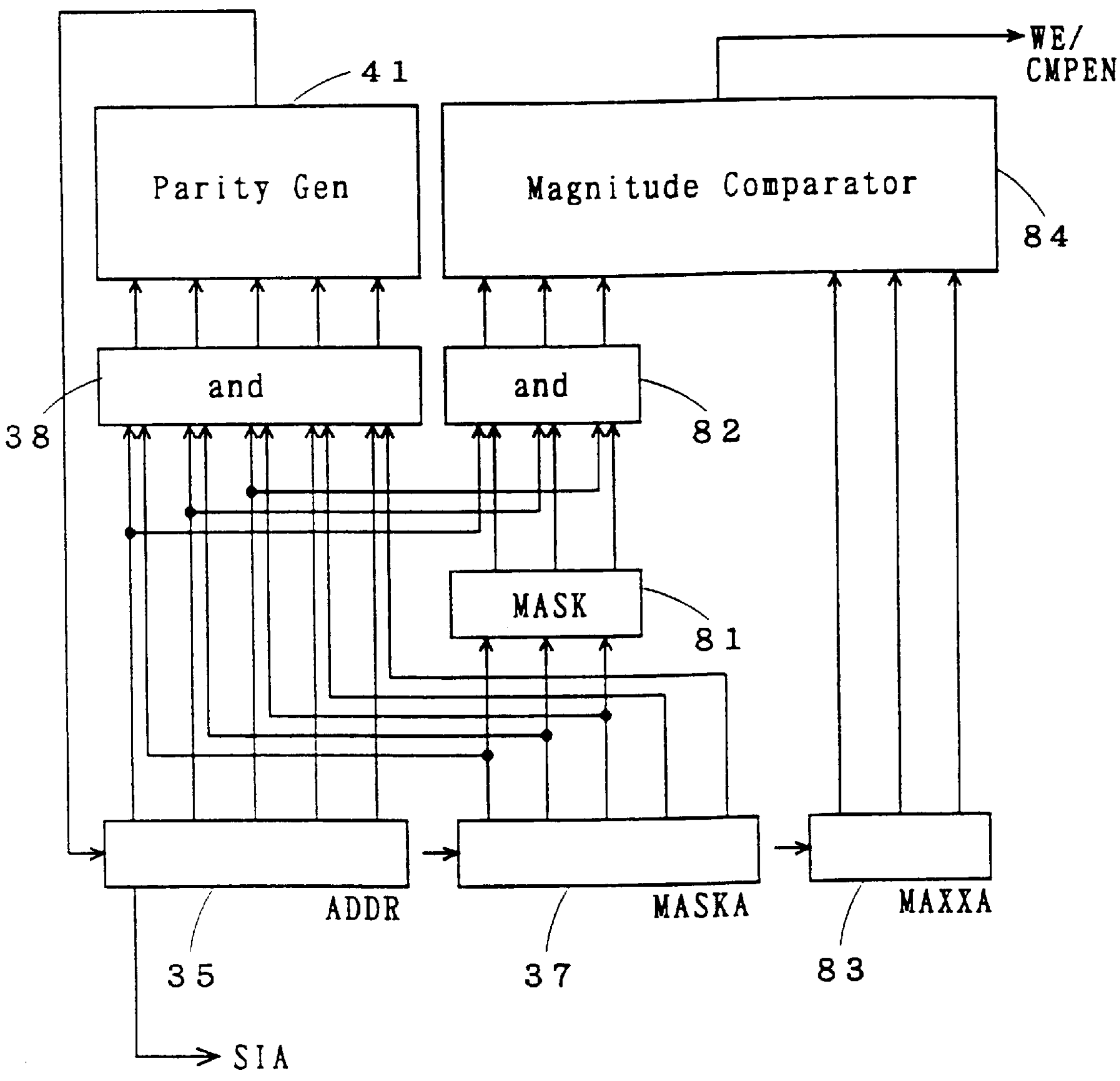
FIG. 37 is a circuit block diagram showing a semiconductor memory testing device according to a seventh embodiment of the present invention.

The magnitude comparator 84 shown in each of the fifth and sixth embodiments has a large circuit scale and a long delay time, leading to deterioration of both of area efficiency and processing efficiency. Depending on the word number, it may not be necessary to regularly compare relatively lower bits. When the least significant bit α-0 (LSB) is redundant and the maximum word (binary number) is "1001" (10 words in decimal number), i.e., when "α-4"="1", "α-3"="0", "α-2"="0" and "α-2"="1", it is not necessary to make comparison since both of "0" and "1" are allowable for the lowest bit "α-1". In this case, therefore, it is possible to compare only upper three bits of "α-4", "α-3" and "α-2". When the maximum word (binary number) is "1011" (12 words in decimal number), i.e., when "α-4"="1", "α-3"="0", "α-2"="1" and "α-1"="1", it is possible to compare only the upper two bits of "α-4" and "α-3" since both of "0" and "1" are allowable for the lower two bits "α-2" and "α-1". According to a seventh embodiment of the present invention, therefore, a magnitude comparator 84 is formed to compare only specific upper bits while omitting unnecessary comparison of lower bits. Thus, it is possible to reduce the circuit scale of the magnitude comparator 84 for improving area efficiency as compared with the fifth embodiment, while it is possible to improve processing efficiency by reducing the delay time. In the case of maximum 10 words (decimal number) as shown in FIG. 37, only upper three bits of "α-4", "α-3" and "α-2" may be compared as described above, whereby only a circuit area required for data comparison of three bits is sufficient for the magnitude comparator 84 as described above, while only three wires may be provided between a maximum address value storage register (MAXA) 83 and the magnitude comparator 84 as well as between a second AND circuit group 82 and the magnitude comparator 84, for reducing the area in wiring.

Eighth Embodiment

In such a test pattern that the cycle of a data input (DI) of a RAM is changed during addressing, it is necessary to prepare a circuit generating a data input pattern while changing the same in synchronization with an address pattern. When ROM addresses are successively incremented from "0000" to "1111" in a checker board pattern shown in FIG. 39, for example, patterns corresponding to respective bits must be stored in order of "0", "1", "0", "1", "1", "0", "1", "0", "0", "1", "0", "1", "1", "0", "1" and "0", not in simple repetition of "0" and "1" but in complicated order with inversion every stage. An eighth embodiment of the present invention is provided with a data input pattern generation circuit generating a test pattern in such complicated order.

Figure 38:
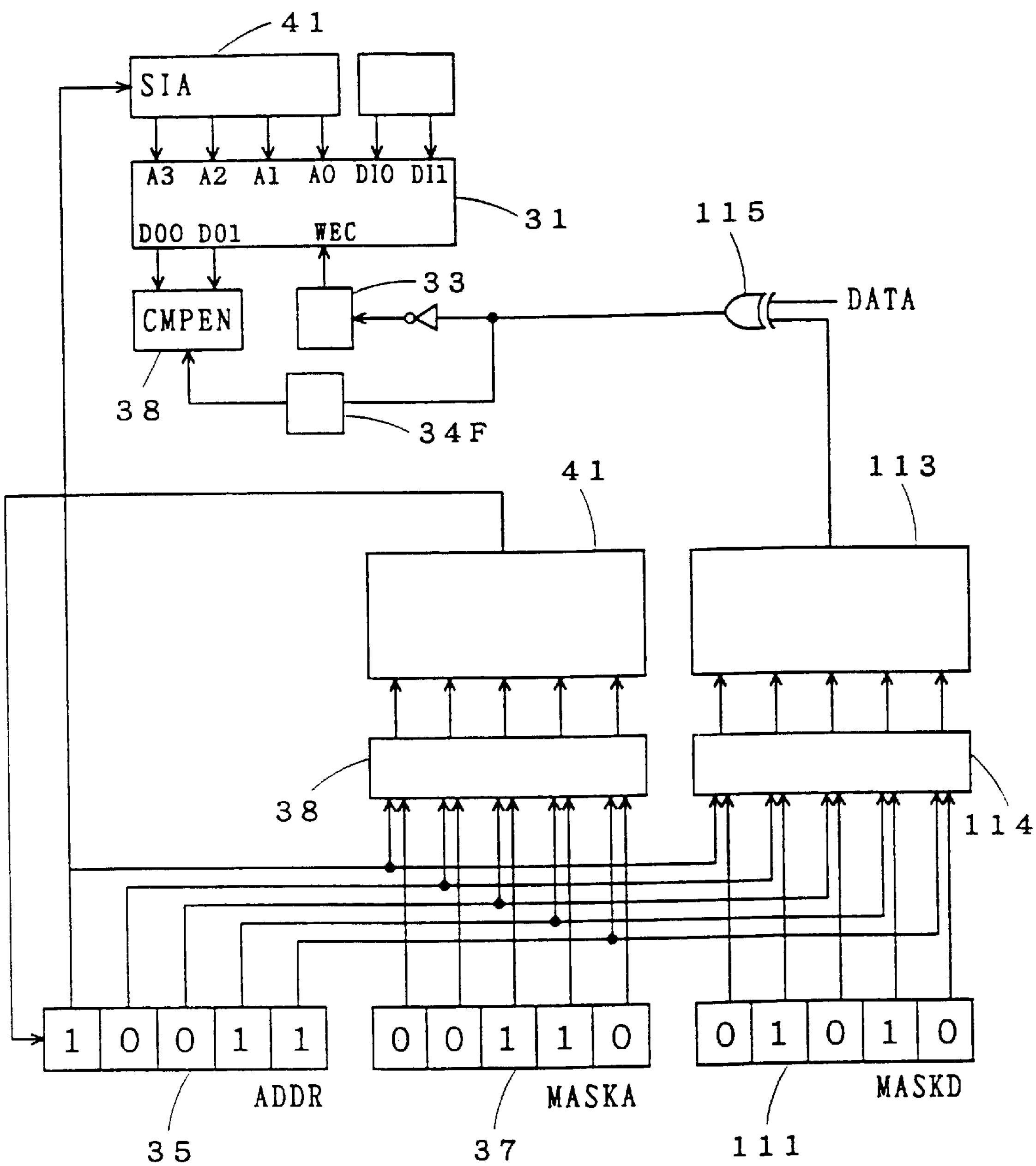
FIG. 38 is a circuit block diagram showing a state in operation of a semiconductor memory testing device according to an eighth embodiment of the present invention.

FIG. 38 illustrates a semiconductor memory testing device according to the eighth embodiment of the present invention. Description is now made on methods of generating a checker board pattern, a column bar pattern and a row bar pattern, which are generally employed in a memory circuit test. Referring to FIG. 38, numeral 35 denotes an address generation shift register (ADDR), numeral 37 denotes a flip-flop selection register (MASKA), numeral 38 denotes a first AND circuit and numeral 41 denotes an expected value generation circuit. All these elements are similar to those described with reference to the fourth embodiment. Further, numeral 111 denotes a 5-bit shift register (hereinafter referred to as MASKD) serving as a two-dimensional pattern storage part, numeral 113 denotes an expected value generation circuit which is similar to the expected value generation circuit 41, numeral 114 denotes a second AND circuit group, which is similar in internal structure to the first AND circuit group 38, for executing "{ADDR} AND {MASKD}", and numeral 115 denotes an Ex.OR circuit 115. The expected value generation circuit 1134 generates expected values for the address generation shift register (ADDR) 35 and the MASKD 111. The output of the expected value generation circuit 113 is transmitted to the Ex.OR circuit 115, to control SIW and CMPEN.

Figure 40:
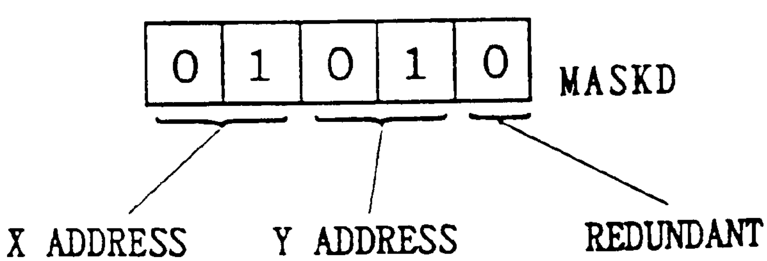
FIG. 40 illustrates a two-dimensional pattern storage part storing the checker board pattern of the semiconductor memory testing device according to the eighth embodiment of the present invention.
Figure 41:
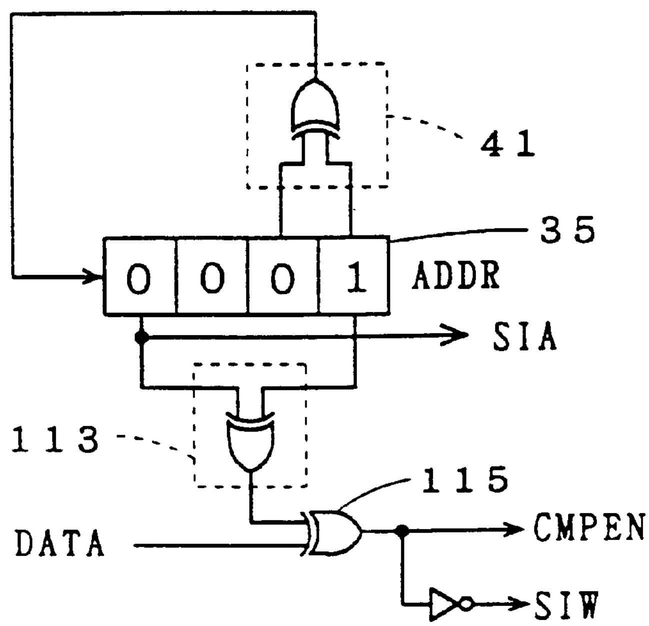
FIG. 41 illustrates an equivalent circuit of the semiconductor memory testing device according to the eighth embodiment of the present invention in formation of the checker board pattern.

As shown in FIG. 40, RAM addresses can be classified into upper addresses (hereinafter referred to as X addresses) serving as virtual vertical axis addresses, and lower addresses (hereinafter referred to as Y addresses) serving as virtual horizontal axis addresses. FIGS. 40 and 41 show such an example that the MASKD 111 is set to generate a checker board pattern. Namely, the MASKD 111 is formed by a 2-bit virtual vertical axis (X) address storage bit group, a 2-bit virtual horizontal axis (Y) address storage bit group and a 1-bit redundant bit which are connected with each other. As shown in FIG. 40, the least significant bit (hereinafter referred to as X(lsb)) of the X addresses is set at "1", the least significant bit (hereinafter referred to as Y(lsb)) of the Y addresses is set at "1" and the remaining bits are set at "0". DATA inputted in one terminal of the Ex.OR circuit 115 is set at "0". The expected value generation circuit 113 outputs "0" when values of the address generation shift register (ADDR) 35 and the MASKD 111 are equal to each other. At this time, the Ex.OR circuit 115 outputs SIW of "1" and CMPEN of "0", to inhibit comparison of a RAM output and the expected value and writing. When X(lsb) and Y(lsb) are different from each other, on the other hand, comparison of the RAM output and the expected value or writing is carried out. It is possible to invert SIW and CMPEN by setting the DATA at "1". FIG. 41 shows a current equivalent circuit.

The procedure of generating the aforementioned checker board pattern is now simply described.

1. The MASKD 111 is set at "01010". The address generation shift register (ADDR) 35 and the address input shift register 32 are initialized at addresses for starting the test. The DATA is set at "0", and all DI of a tested circuit (RAM) 31 are set at "0".

2. LFSR is executed to generate all addresses.

3. DATA is set at "1". All DI of the RAM are set at "0".

Figure 39:
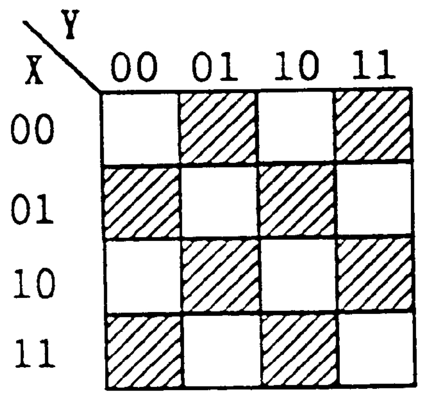
FIG. 39 illustrates a checker board pattern in a functional test of the semiconductor memory testing device according to the eighth embodiment of the present invention.

4. LFSR is executed to generate all addresses. The pattern shown in FIG. 39 is generated in such a procedure.

Figure 42:
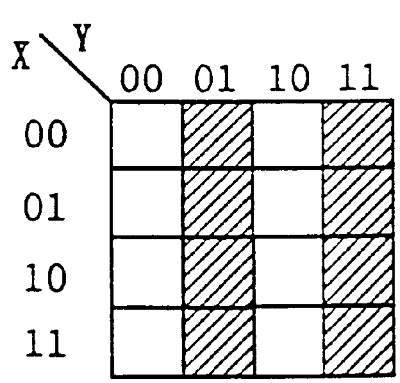
FIG. 42 illustrates a column bar pattern in a functional test of the semiconductor memory testing device according to the eighth embodiment of the present invention.
Figure 43:
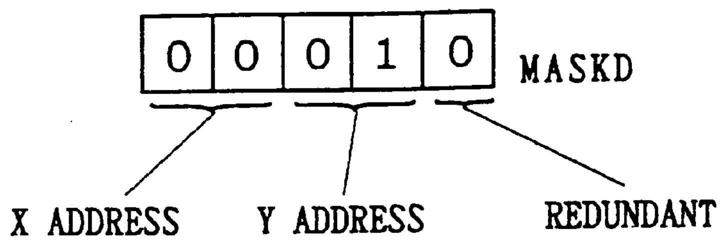
FIG. 43 illustrates a two-dimensional storage part storing the column bar pattern of the semiconductor memory testing device according to the eighth embodiment of the present invention.
Figure 44:
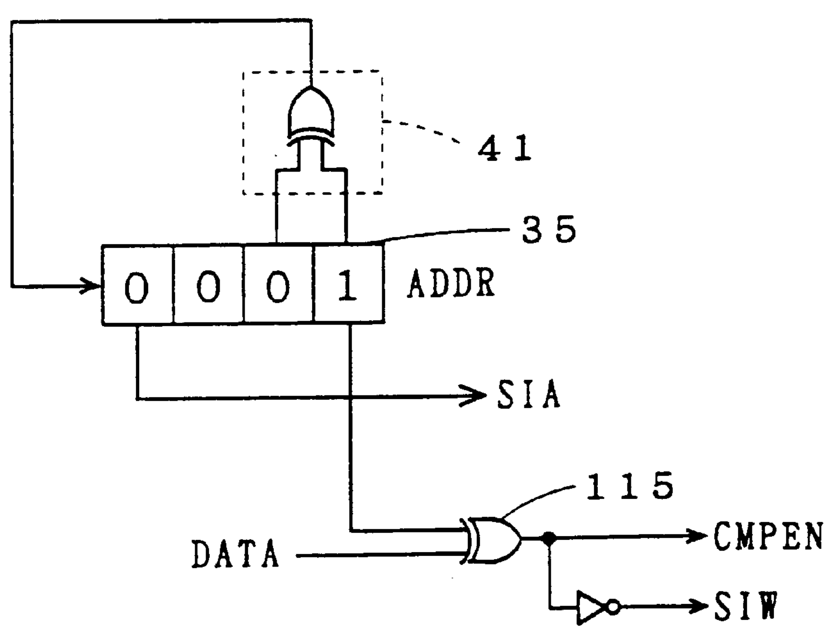
FIG. 44 illustrates an equivalent circuit of the semiconductor memory testing device according to the eighth embodiment of the present invention in formation of the column bar pattern.

FIGS. 42 and 43 show such an example that the MASKD 111 is set to generate a column bar pattern. The least significant bit (hereinafter referred to as Y(lsb)) of the Y addresses is set at "1", while the remaining bits are set at "0". DATA is set at "0". Since the expected value generation circuit 113 outputs the value of Y(lsb), SIW and CMPEN generate "1" and "0" respectively when Y(lsb) is "0", while SIW and CMPEN go "0" and "1" respectively when Y(lsb) is "1". It is possible to invert SIW and CMPEN by converting DATA to "1". FIG. 44 shows a current equivalent circuit.

The procedure of generating the column bar pattern is as follows:

1. The MASKD 111 is initialized as described above, i.e., set at "000010". The address generation shift register (ADDR) 35 and the address input shift register 32 are initialized at addresses for starting the test. Further, DATA inputted in one terminal of the Ex.OR circuit 11t is set at "0". All DI of the tested circuit (RAM) 31 are set at "0".

2. LFSR is executed to generate all addresses.

3. DATA is set at "1". All DI of the tested circuit (RAM) 31 are set at "0".

4. LFSR is executed to generate all addresses. The pattern shown in FIG. 42 is generated in such a procedure.

Figure 45:
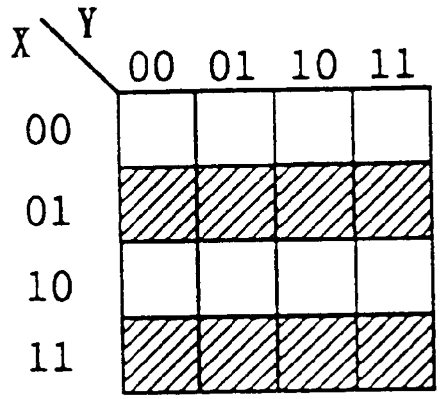
FIG. 45 illustrates a row bar pattern in a functional test of the semiconductor memory testing device according to the eighth embodiment of the present invention.
Figure 46:
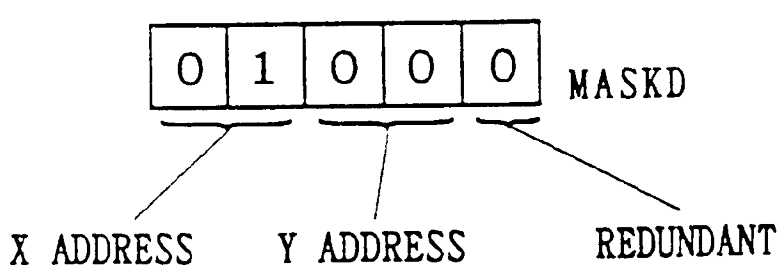
FIG. 46 illustrates a two-dimensional storage part storing the row bar pattern of the semiconductor memory testing device according to the eighth embodiment of the present invention.
Figure 47:
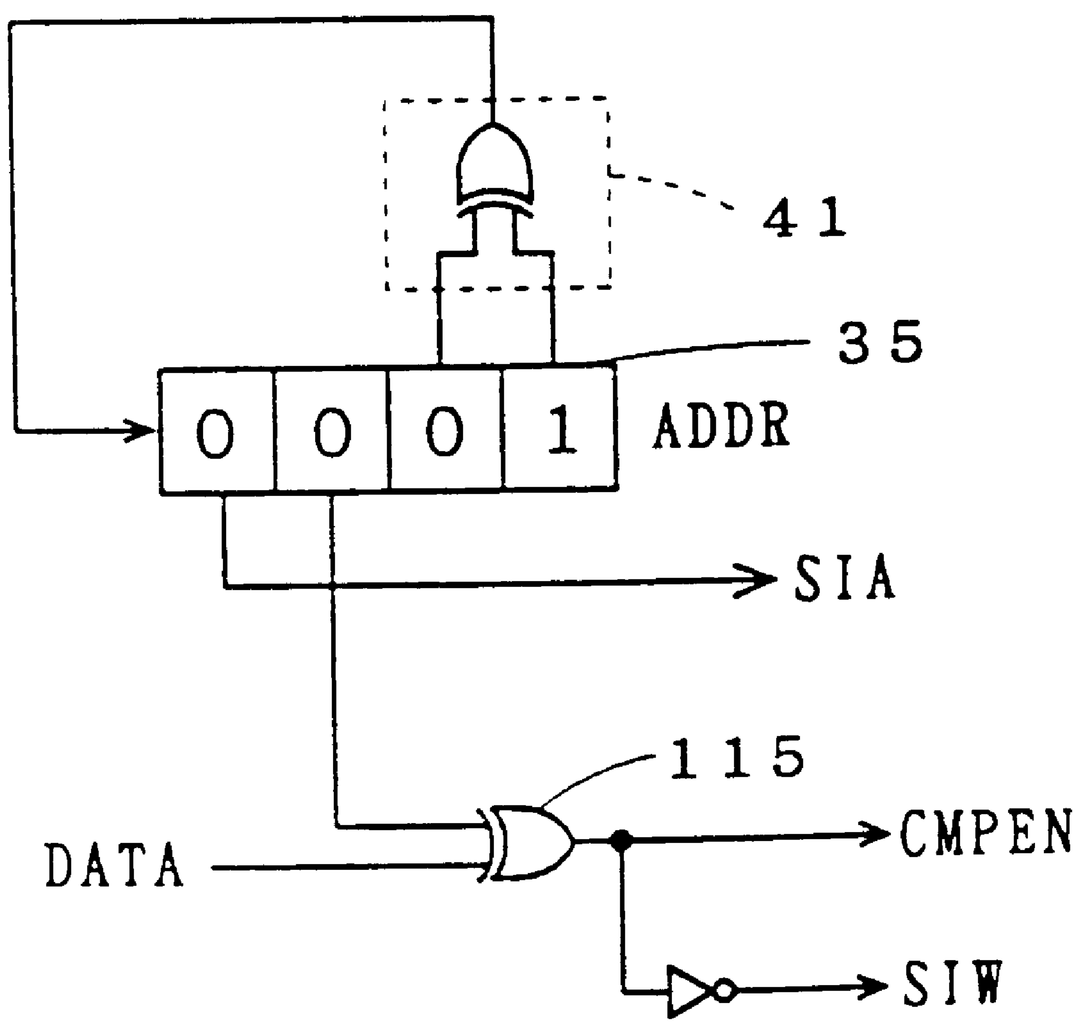
FIG. 47 illustrates an equivalent circuit of the semiconductor memory testing device according to the eighth embodiment of the present invention in formation of the row bar pattern.

FIGS. 45 and 46 show such an example that the MASKD 111 is set to generate a row bar pattern. The least significant bit (hereinafter referred to as X(lsb)) of the X addresses is set at "1", while the remaining bits are set at "0". DATA is set at "0". Since the expected value generation circuit 113 outputs the value of X(lsb), SIW and CMPEN generate "1" and "0" respectively when X(lsb) is "0", while the same generate "0" and "1" respectively when X(lsb) is "1". It is possible to invert SIW and CMPEN by converting DATA to "1". FIG. 47 shows a current equivalent circuit.

The procedure of generating the row bar pattern is as follows:

1. The MASKD 111 is initialized as described above, i.e., set at "01000". The address generation shift register (ADDR) 35 and the address input shift register 32 are initialized at addresses for starting the test. Further, DATA is set at "0". All DI of the RAM are set at "0".

2. LFSR is executed to generate all addresses.

3. DATA is set at "1". All DI of the RAM are set at "0".

4. LFSR is executed to generate all addresses.

Ninth Embodiment

<Structure>

Figure 48:
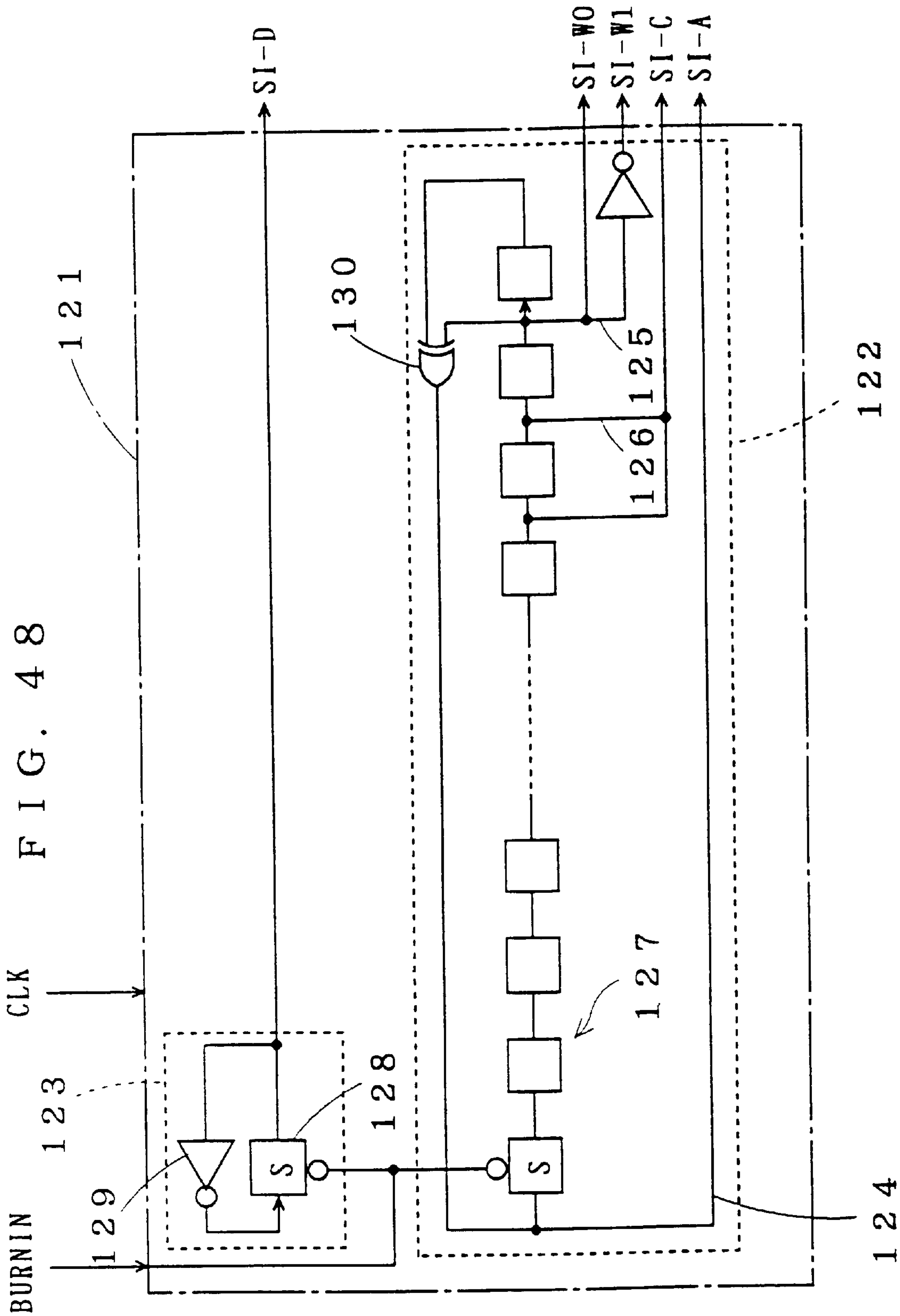
FIG. 48 is a circuit block diagram showing a semiconductor memory testing device according to a ninth embodiment of the present invention.
Figure 49:
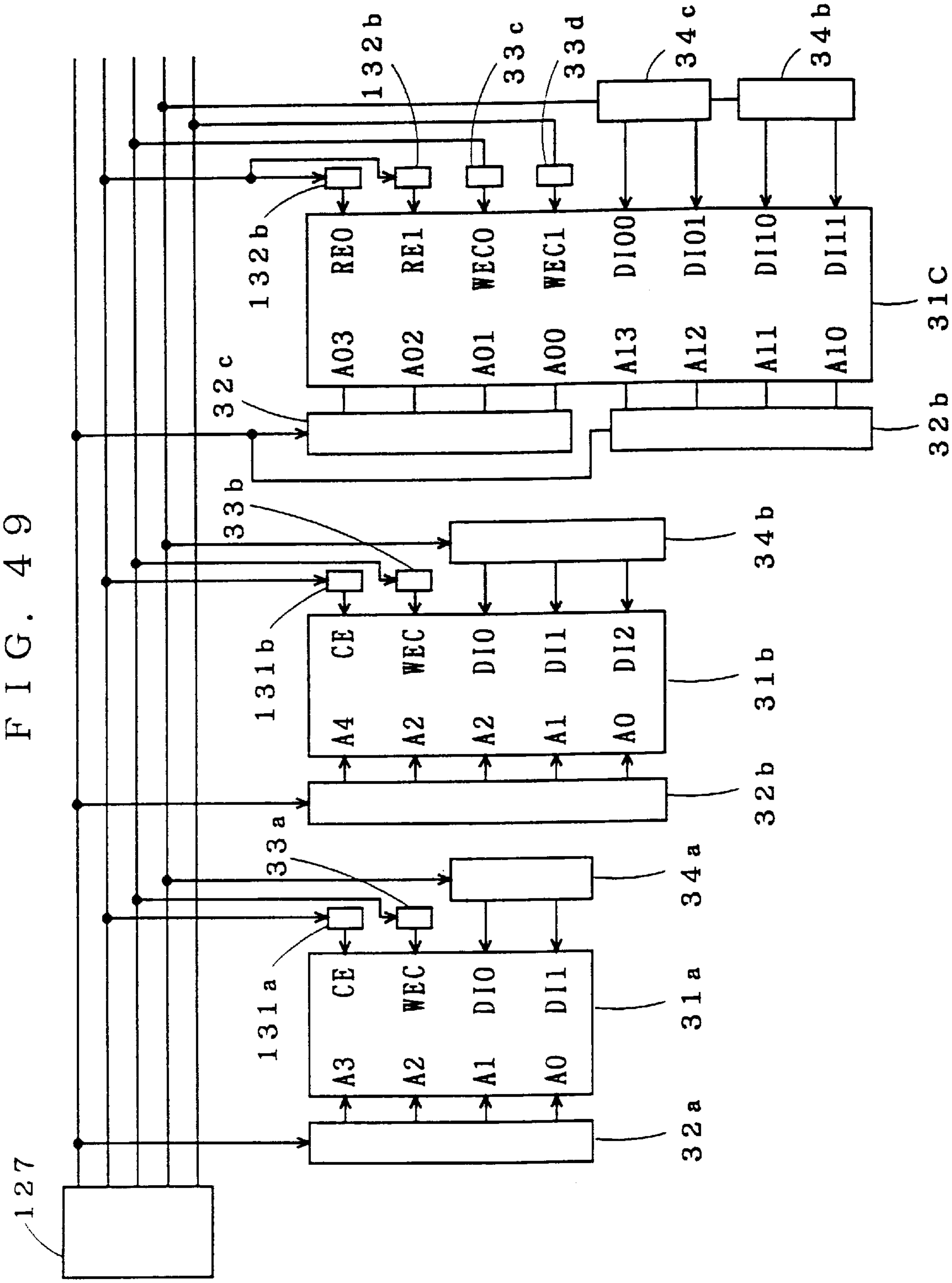
FIG. 49 is a block diagram showing the semiconductor memory testing device according to the ninth embodiment of the present invention, which is connected with a plurality of semiconductor memories.

FIG. 48 illustrates a semiconductor memory testing device according to a ninth embodiment of the present invention. In order to execute a functional test of a tested circuit (RAM), it is necessary to carry out a burn-in test while moving all addresses, bits and the like (dynamic burn-in). The semiconductor memory testing device according to this embodiment is adapted to generate a dynamic burn-in test pattern only with a single pin. Referring to FIG. 48, numeral 121 denotes a dynamic burn-in pattern generation circuit, numeral 122 denotes an LFSR circuit, numeral 123 denotes a 1-bit counter, numerals 124, 125 and 126 denote signal wires, numeral 127 denotes a shift register, numeral 128 denotes a flip-flop (hereinafter referred to as FF) serving as a 1-bit counter, numeral 129 denotes a NOT circuit, numeral 130 denotes an Ex.OR circuit, symbol SI-D denotes a data output, symbols SI-W0 and SI-W1 denote inverted outputs, symbol SI-C denotes an output of a chip enable signal or a read enable signal, and symbol SI-A denotes an address output. FIG. 49 shows a connection state for addressing a plurality of tested circuits 31*a* to 31*c* by the dynamic burn-in pattern generation circuit 121. Referring to FIG. 49, numerals 32*a* to 32*d* denote address input shift registers, numerals 33*a* to 33*d* denote write enable (write control) data input registers, numerals 34*a* to 34*d* denote comparison circuits for comparing data output values of the tested circuits 31*a* to 31*c* with expected values, numerals 131*a* and 131*b* denote registers transmitting chip enable signals to chip enable terminals CE, and numerals 132*a* and 132*b* denote registers transmitting read enable signals to read enable terminals RE0 and RE1. Further, symbols DI0 to DI2 denote data input terminals.

As shown in FIG. 4A, it is possible to form the LFSR circuit 122 by combining the shift register 127 having a plurality of FFs and the Ex.OR circuit 130 on the basis of a generating function. The generating function is set as $1+X+X^{22}$ in the LFSR circuit 122 shown in FIG. 48. The generating function is set to be greater in bit number than the sum of address terminal numbers and control terminal numbers of the dynamic burn-in pattern generation circuit 121 and the plurality of tested circuits (RAMs) 31*a* to 31*c* to be tested. In a multi port RAM such as the tested circuit 31*a* shown in FIG. 49, the effect of the invention remains unchanged also when a shift input of an address shift register and the read enable (RE) signal are rendered common. When there are two WEC terminals WEC0 and WEC1, a WEC0 signal is inverted and inputted in the WEC1 terminal, to prevent simultaneous writing in the same address. For example, the RAMs 31*a* and 31*b* have terminal numbers of 6 and 7 respectively in FIG. 49, and hence the generating function is set to generate septenary or higher order total cyclic series.

The data output SI-D generated by the dynamic burn-in pattern generation circuit 121 in FIG. 48 is connected to the address input shift registers 32 for the tested circuits 31. Symbol BURNIN denotes a reset terminal for the 1-bit counter 123 and the LFSR circuit 122 of this stricture. Symbol CLK denotes a clock signal, which is supplied to the 1-bit counter 123 and the LFSR circuit 122.

<Using Method>

A method of using the semiconductor memory testing device having the aforementioned structure is now described.

1. An RSET terminal is set at "0", to reset the LFSR circuit 122 and the 1-bit counter 123.

2. The reset terminal BURNIN is set at "1", so that the LFSR circuit 122 generates 22-ary total cyclic series and the 1-bit counter 123 generates "1", "0", . . .

3. An n-ary LFSR circuit 122 generates full cyclic series of odd bits ($2^n-1$), while the 1-bit counter generates 2-bit data. After the LFSR circuit 122 generates the full cyclic series, therefore, the 1-bit counter 123 generates data inverted from those in the precedent stage (above item 2.) in a second cycle. Namely, data inverted in odd and even cycles are inputted in DI0, DI1 and DI00 to DI11 with respect to addresses A0 to A4 and A00 to A13 and combinations of all CE, RE0, RE1, WEC0 and WEC1.

Such an operation (1. to 3.) is repeated for a constant period.

Tenth Embodiment

<Structure>

Figure 50:
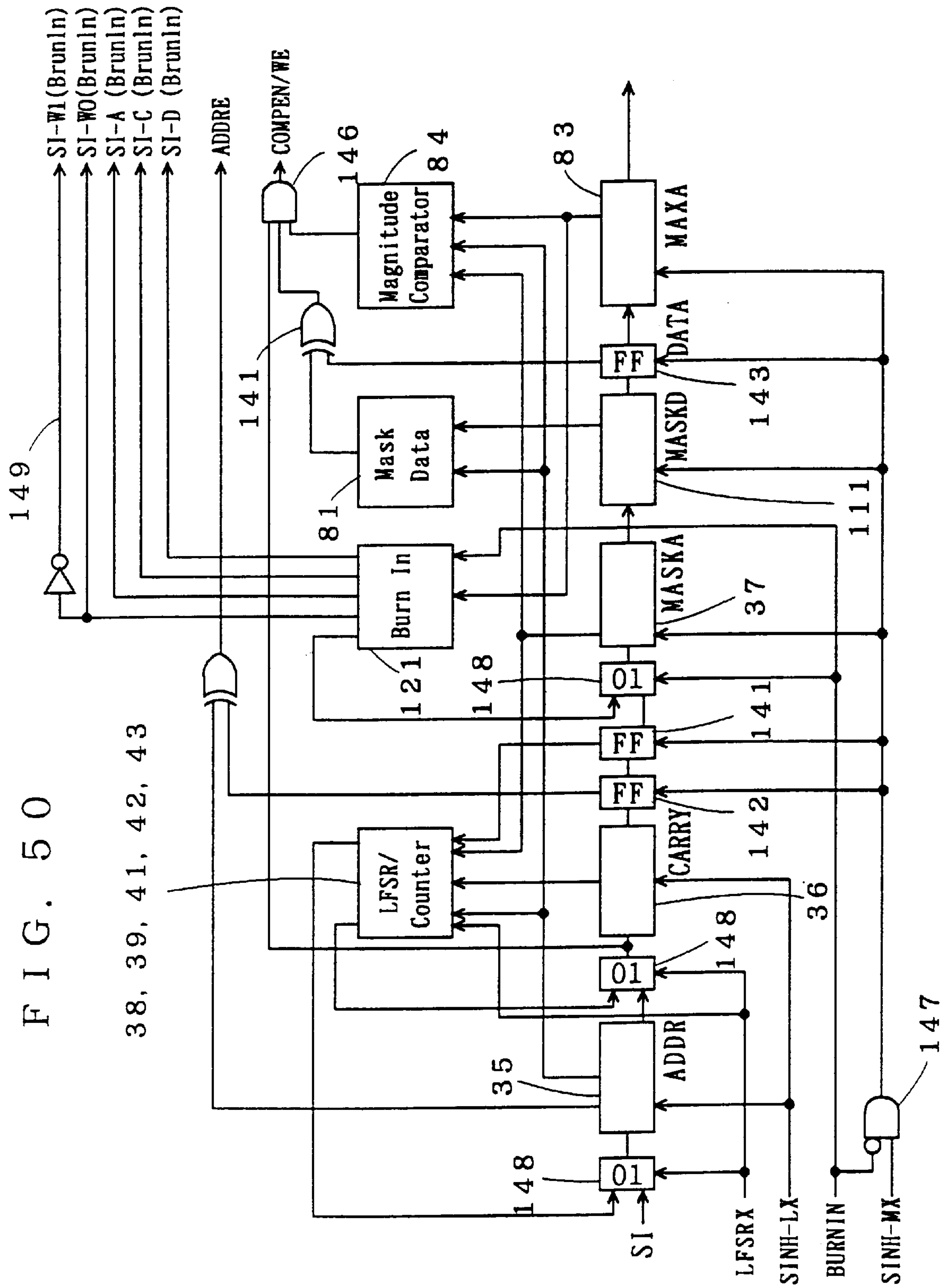
FIG. 50 is a circuit block diagram showing a semiconductor memory testing device according to a tenth embodiment of the present invention.

FIG. 50 illustrates a semiconductor memory testing device according to a tenth embodiment of the present invention. The semiconductor memory testing device according to this embodiment is obtained by integrating the respective elements of the fourth to ninth embodiments in a single circuit. Elements having functions which are similar to those in the fourth to ninth embodiments are denoted by the same reference numerals. Referring to FIG. 50, numerals 141, 142 and 143 denote FFs, numerals 144 and 145 denote OR circuits, numeral 146 denotes an AND circuit, numeral 147 denotes an AND circuit having a negative input on one input terminal, numeral 148 denotes a switching element, and numeral 149 denotes an inverter. Symbol SI denotes a shift input signal, symbol SO denotes a shift output signal, symbol LFSRX denotes a selector selection signal, and symbol Sinh-LX denotes a shift inhibiting signal for an address generation shift register (ADDR) 35. Further, symbol Sinh-MX denotes a shift inhibiting signal for a control register (CARRY) 36, a flip-flop selection register (MASKA) 37, a MASKD 111, a control register (MAXA) 83, flip-flop UP/DOWN, Counter and DATA, which is obtained by ANDing a signal obtained by inverting BURNIN. Sinh-LX and Sinh-MX inhibit shift operations of the respective shift registers and flip-flops when the same are "1" respectively.

Figure 52:
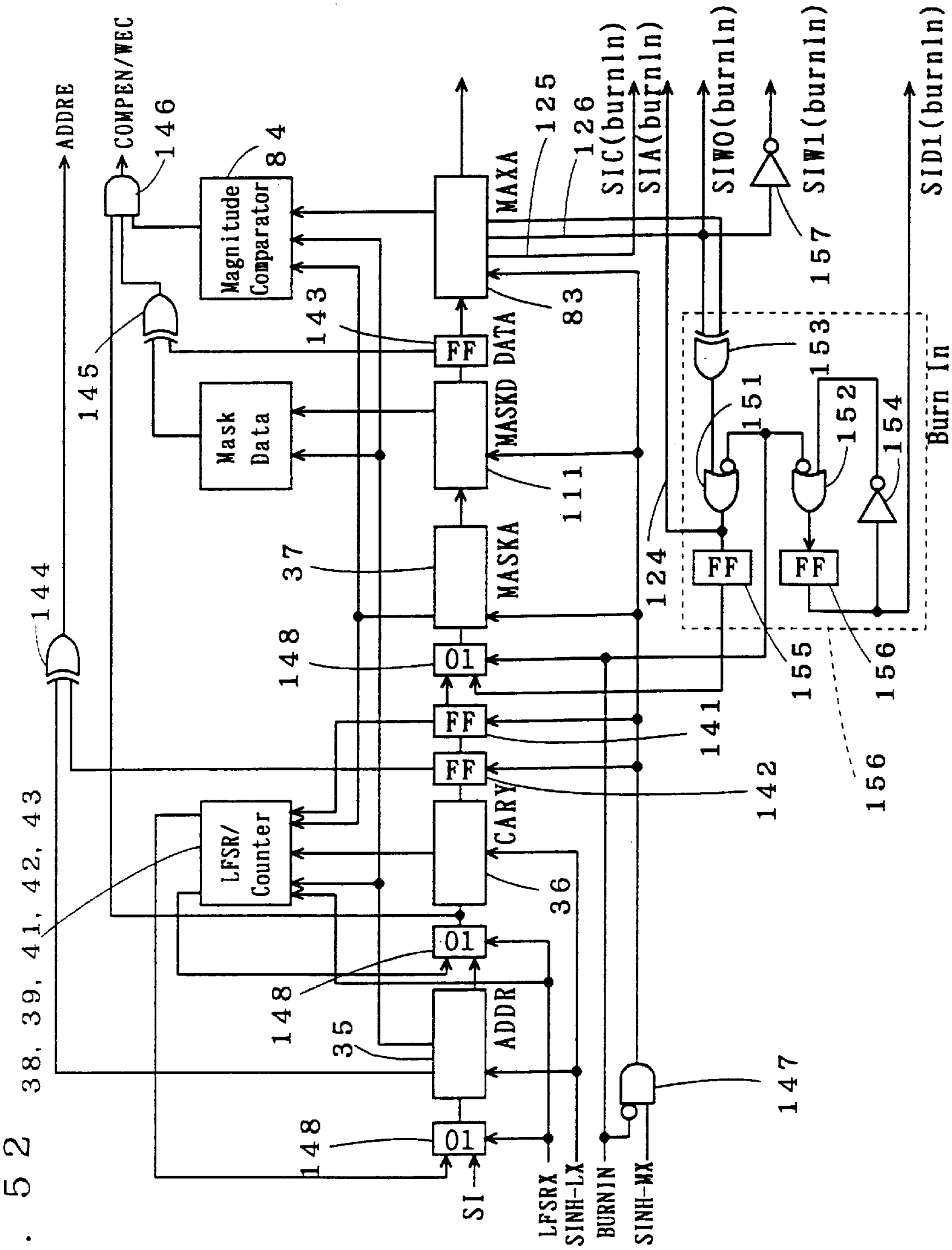
FIG. 52 is a circuit block diagram showing the logic structure of a dynamic burn-in pattern generation circuit etc. of the semiconductor memory testing device according to the tenth embodiment of the present invention.

FIG. 52 shows a dynamic burn-in pattern generation circuit 121 appearing in FIG. 50 in detail. MASKA, MASKD and MAXA are utilized in common with shift registers (LFSR/Counter) 38, 39, 41, 42 and 43 forming an LFSR circuit for generating a burn-in test pattern. The dynamic burn-in pattern generation circuit 121 shown in FIG. 52 is similar in structure to the LFSR circuit 122 of a generating function shown in FIG. 48. The FF 141 resets the LFSR circuits 38, 39, 41, 42 and 43. Namely, the FF 141 corresponds to the Counter/LFSR terminal in the fourth embodiment shown in FIG. 25. Numerals 124, 125 and 126 correspond to signal wires of the same numerals appearing in the fourth embodiment respectively. The FF 143 corresponds to the DATA terminal in FIG. 38.

Figure 53:
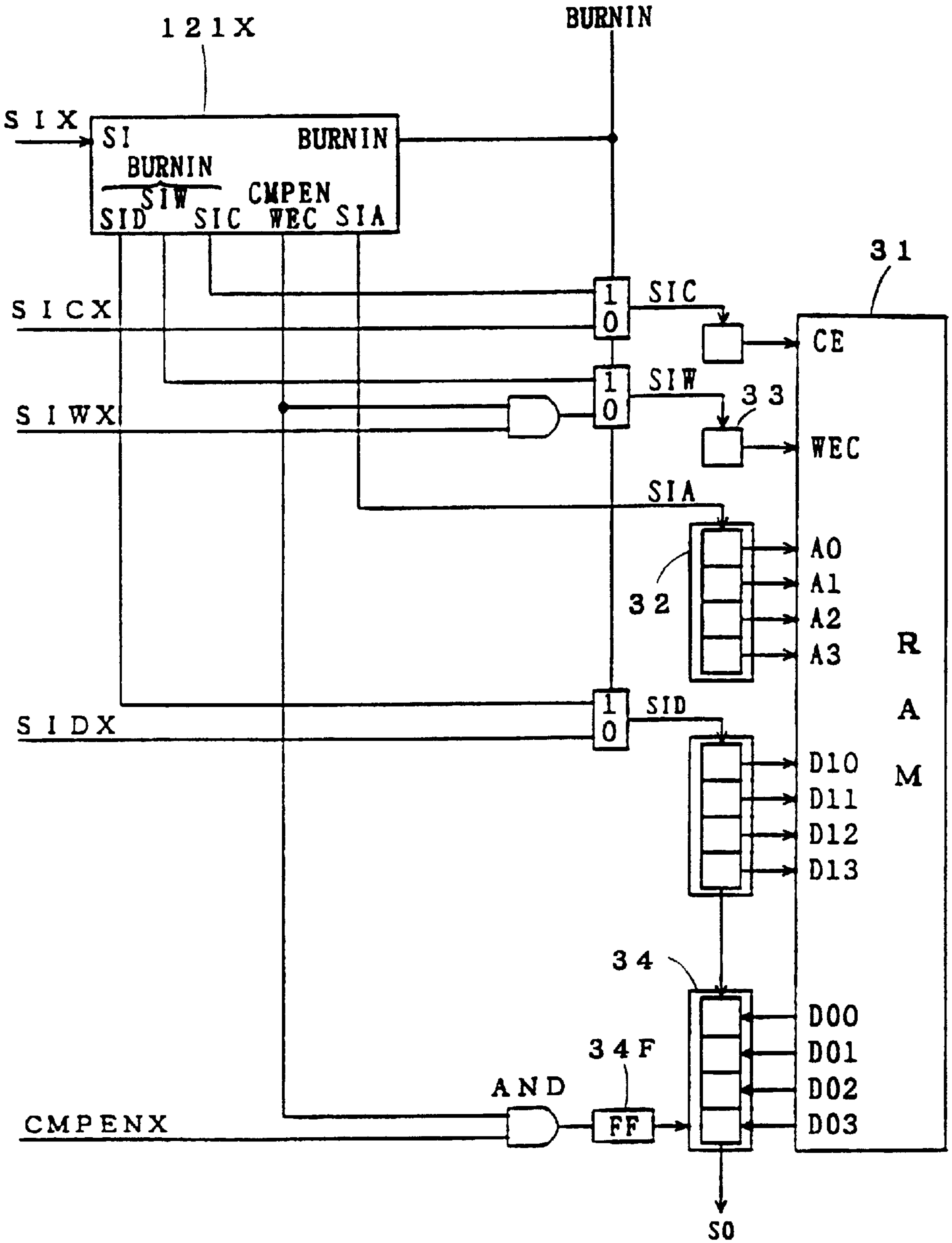
FIG. 53 is a circuit block diagram showing a connection state of the semiconductor memory testing device according to the tenth embodiment of the present invention and semiconductor memories.

FIG. 53 shows connection between the dynamic burn-in pattern generation circuit 121 and a tested circuit 31 in detail. Referring to FIG. 53, symbols SIA, SID, SIC and SIW denote outputs of the dynamic burn-in pattern generation circuit 121X, which are transmitted to an address input shift register 32, a data input shift register 140, CEC(REC) and WEC respectively. Symbol SIX denotes an SI input in the dynamic burn-in pattern generation circuit 121X, symbol SICX denotes a signal for outputting SIC, symbol SIWX denotes a signal for outputting SIW, symbol SIDX denotes a signal for outputting SID, and symbol CMPENX denotes a signal for outputting CMPEN to 34F. CMPEN and SIWX from the dynamic burn-in pattern generation circuit 121X are inputted in one AND circuit, while SIW is inputted in the tested circuit 31. Further, CMPEN and CMPENX from the dynamic burn-in pattern generation circuit 121X are inputted in another AND circuit, while CMPEN is inputted in 34F.

<Using Method>

A method of using the semiconductor memory testing device having the aforementioned structure is now described. FIG. 51 is a table showing setting of the input terminals. In the semiconductor memory testing device according to this embodiment, the control registers MASKA, MASKD and MAXA shown in the fourth to eighth embodiments are made by shift registers. These shift registers form a single scan path in each initialization. The same operate as control registers by the shift inhibiting signal Sinh-MX in test pattern generation.

{1} Operation in Dynamic Burn-In Test Pattern Generation

Description is now made on a case of employing the semiconductor memory testing device according to this embodiment as a circuit for generating an address pattern in a normal test.

(In Initialization)

The BURNIN terminal is set at "0", to reset the LFSR circuits 38, 39, 41, 42 and 43 and the dynamic burn-in pattern generation circuit 121 serving as a 1-bit counter.

(In Dynamic Burn-In Pattern Generation)

When the BURNIN terminal is converted to "1", the LFSR circuits 38, 39, 41, 42 and 43 generate 22-ary full cyclic series while the dynamic burn-in pattern generation circuit 121 generates "1", "0", "1", "0", "1", . . . The n-ary LFSR circuits 38, 39, 41, 42 and 43 generate full cyclic series of odd bits ($2^n-1$), while the 1-bit counter 121 generates 2-bit data. After the LFSR circuits generate the full cyclic series, therefore, the 1-bit counter 121 generates data inverted from those in the precedent stage in starting of a second cycle.

Such an operation (1. to 3.) is repeated for a constant period. Other input terminals exert no influence on the testing device at this time.

{2} Operation in Address Pattern Generation (In Initialization)

First, initial values are set in the respective shift registers. As to the initial values of the respective shift registers, Sinh-LX and Sinh-MX are zeroed to enable shift operations. Other operation is identical to that described with reference to the fourth to ninth embodiments. The FF 142, which corresponds to the control signal terminal UP/DOWN in the fourth embodiment shown in FIG. 25, can invert the address pattern by setting "1".

(In Test Pattern Generation)

A test pattern is generated in accordance with initialization of the respective shift registers 35, 36, 37, 111 and 83 and the respective FFs 141 to 143. A test execution time is $2^n$ cycles with respect to FAMs 31*a* to 31*c* having n address lines. The Sinh-LX is set at "0" to enable a shift operation of the address generation shift register (ADDR) 35. Sinh-MX is set at "1", to inhibit shift operations of the flip-flop selection register (MASKA) 37, the MASKD 111, the control register (MAXA) 83, flip-flop UP/DOWN, Counter and DATA. Operations of the respective parts are identical to those described with reference to the fourth to ninth embodiments.

Thus, it is possible to remarkably reduce the number of test vectors with respect to a complicated test pattern in the semiconductor memory testing device according to this embodiment.

Eleventh Embodiment

Figure 54:
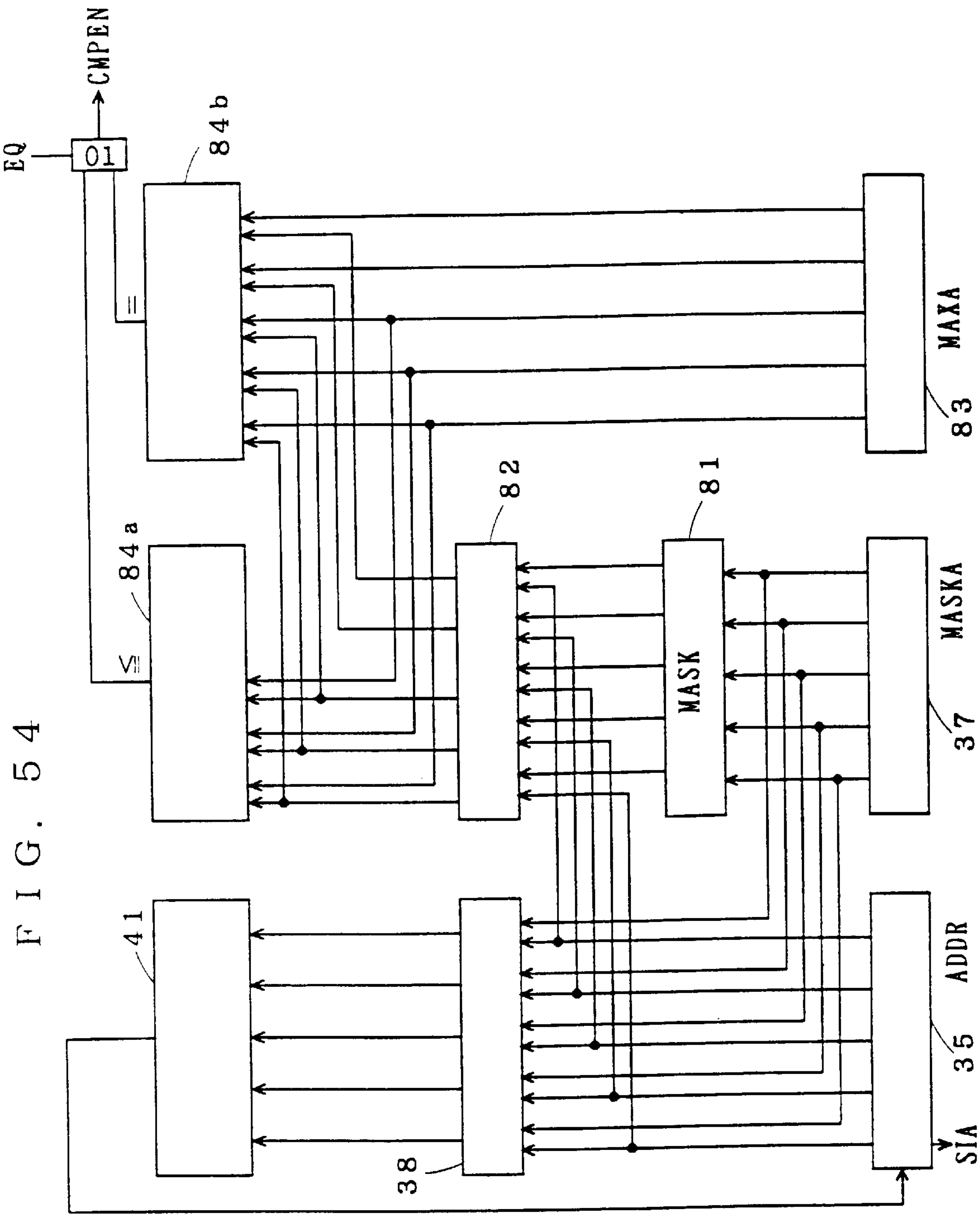
FIG. 54 is a circuit block diagram showing the logic structure of a semiconductor memory testing device according to an eleventh embodiment of the present invention.

FIG. 54 shows a semiconductor memory testing device according to an eleventh embodiment of the present invention. The semiconductor memory testing device according to this embodiment can detect a failure in a specific address of a RAM. This semiconductor memory testing device, which is similar in circuit structure to those of the fifth, sixth and seventh embodiments, comprises a pair of magnitude comparators 84*a* and 84*b* although the device according to each of the fifth to seventh embodiments comprises a single magnitude comparator 84. The magnitude comparator 84*a* has a function which is similar to that of the magnitude comparator 84 described with reference to each of the fifth to seventh embodiments, i.e., a function of comparing the maximum address value stored in a control register (MAXA) 83 with an address newly generated in an arithmetic and logic part. The other magnitude comparator 84*b* (detection circuit) has a function of detecting whether or not the maximum address value stored in the control register (MAXA) is equal to the address newly generated in the arithmetic and logic part. The magnitude comparator 84*b*, which compares the newly generated RAM address with the MAXA value, generates CMPEN="1" only when the RAM address coincides with the MAXA value, to compare the RAM data with an expected value. Thus, it is possible to detect a failure in a specific address of a tested circuit 31 by setting the specific address of the tested circuit 31 in the control register (MAXA) 83.

As shown in FIG. 54, the semiconductor memory testing device according to this embodiment is obtained by adding the magnitude comparator 84*b* for detecting a failure of a specific address to the circuit of the fifth embodiment shown in FIG. 32. The control register (MAXA) 83 sets the final address of the tested circuit 31 or an address to be subjected to failure detection. The RAM address and the MAXA value may be compared with each other only in upper bits for reducing the circuit scale as well as the delay time, similarly to the seventh embodiment. Referring to FIG. 54, symbol EQ denotes a switching signal for both outputs of the pair of magnitude comparators 84*a* and 84*b*. The magnitude comparator 84*a* is selected when EQO =0, while the magnitude comparator 84*b* is selected when EQ=1

<Using Method>

In order to detect a failure in a specific address in the semiconductor memory testing device having the aforementioned structure, the magnitude comparator 84*b* compares the newly generated RAM address with the MAXA value, so that CMPEN generates "1" only when the RAM address coincides with the MAXA value for comparing the RAM data with the expected value. Therefore, it is possible to detect a failure in a specific address of the tested circuit 31 by setting the specific address in MAXA.

On the other hand, a normal functional test may be executed in a method similar to that described with reference to the fifth embodiment.

Twelfth Embodiment

<Background>

Figure 60:
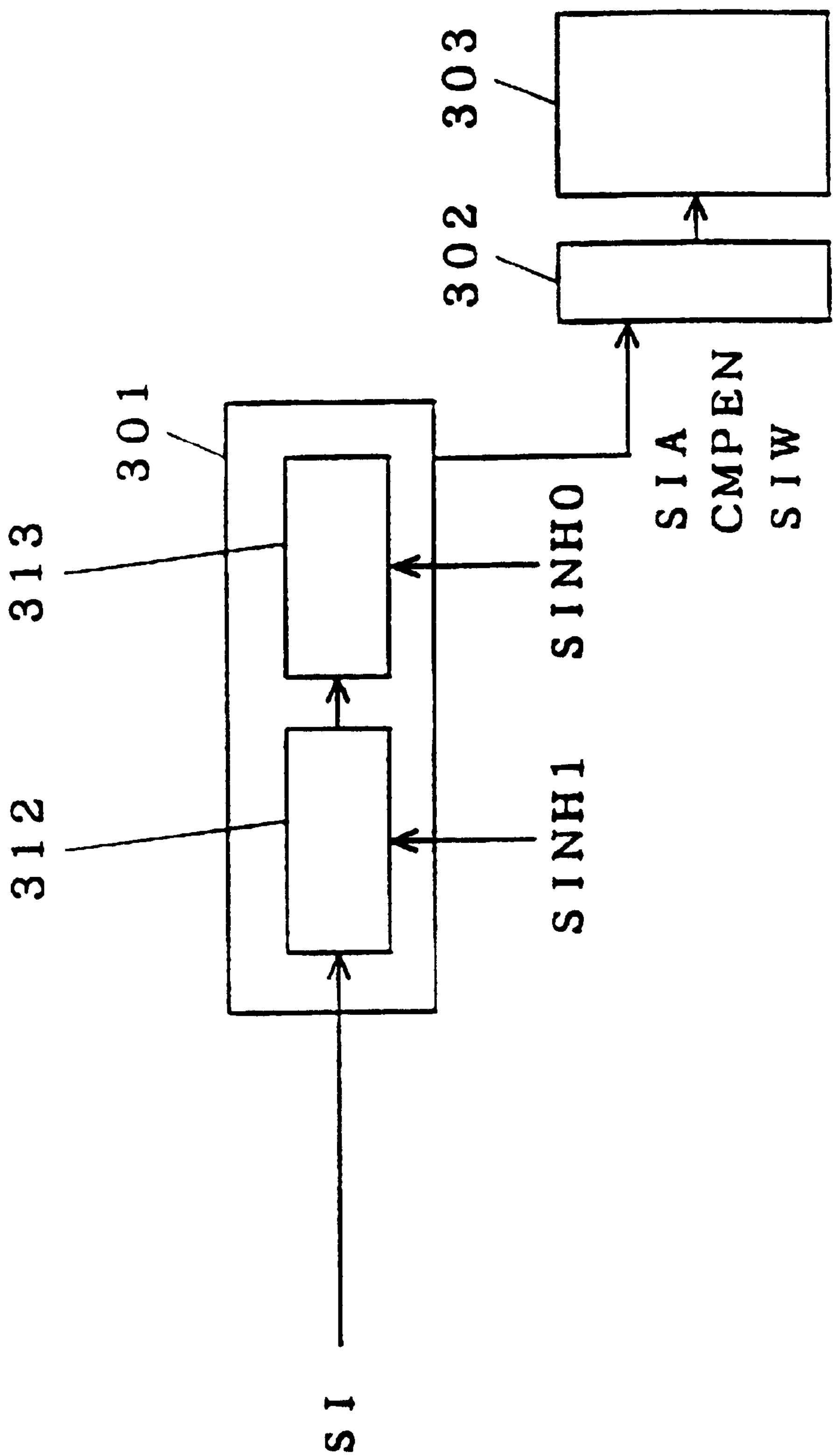
FIG. 60 is a block diagram showing a semiconductor memory testing device according to a proposed example.

FIG. 60 shows an exemplary circuit of a semiconductor memory testing device. Referring to FIG. 60, numeral 301 denotes a test pattern generation circuit (e.g., LFSR: random number generation circuit), numeral 302 denotes a test circuit serving as a peripheral circuit, and numeral 303 denotes a RAM core (memory core). The test circuit 302 also serves as a data input/output circuit (peripheral circuit) for transferring various data for the RAM core 303 in a normal operation. The test pattern generation circuit 301, which is formed by shift registers 312 and 313 of prescribed bit numbers. generates a test pattern for testing the RAM core 303. The shift register 312 corresponds to the effective address number storage part (MASKA) 37 or the two-dimensional pattern storage part (MASKD) 111 in the fourth to eleventh embodiments, for example, while the other shift register 313 corresponds to the address generation part (ADDR) 35 or the control register (CARRY) 36 of the fourth to eleventh embodiments, for example. Symbol BIST denotes an input pin for a mode switching signal (BIST signal) for switching a normal operation mode and a test mode as to the peripheral circuit (test circuit) 302. Symbol SI denotes a logic data (first input data) input pin for the test pattern generation circuit 301, which shifts in data. Symbols SINH0 and SINH1 (shift inhibiting signals) denote input pins for outputting "1" for ascertaining addresses etc. respectively, thereby inputting control signals for inhibiting shift operations of the shift registers 312 and 313 respectively. Namely, the shift registers 312 and 313 are shifted when SINH1 and SINH0 are "0", and inhibited from shifting when SINH1 and SINH0 are "1". The test pattern generation circuit 301 shown in FIG. 60 corresponds to the circuit of the tenth embodiment, as well as to the circuit 121X in FIG. 53. Further, the test circuit 302 shown in FIG. 60 corresponds to the circuit of each of the first to third embodiments, and that of each of first to sixth modifications described later, while the BIST signal corresponds to the SM signal in each of the first to third embodiments and each of the first to sixth modifications described later.

Operations of the circuit shown in FIG. 60 are described. In a normal operation, the BIST signal is zeroed. The test circuit 302 is inoperative at this time, whereby the RAM core 303 performs a normal operation. In a test circuit operation, on the other hand, the BIST signal is converted to "1". At this time, SINH0 and SINH1 appearing in FIG. 60 correspond to SINH-LX and SINH-MX appearing in FIG. 50 respectively.

FIG. 61 shows the operations. The BIST signal is maintained at "0" in a normal operation (Normal state). At this time, the RAM core 303 carries out a normal operation regardless of the SI signal (logic data: first input data), the SINH0 signal and the SINH1 signal.

Referring to FIGS. 60 and 61, on the other hand, the BIST signal is maintained at "1" and the SI signal is inputted in initialization (INIT. state). At this time, SINH0 and SINH1 are maintained at "0". Namely, SINH-LX and SINH-MX are set at "0" respectively in the circuit shown in FIG. 50, and the SI signal (logic data) is shifted in (DATA SHIFT IN state). In test execution (RUN state), SINH0 and SINH1 are maintained at "0" and "1" respectively while maintaining the BIST signal at "1". Namely, SINH-LX and SINH-MX are set at "0" and "1" respectively in the circuit shown in FIG. 50. In this case, the SI signal is ignored in any state (Don't Care state). Thus, the circuit operates as described with reference to the tenth embodiment.

In the test circuit having such functions, three pines SI, SINH1 and SINH0 are required as test signal pins. There is a requirement for reducing the number of the pins, particularly for reducing that driven in testing to one. Effective in this case is a semiconductor memory testing device according to a twelfth embodiment of the present invention.

<Structure>

Figure 62:
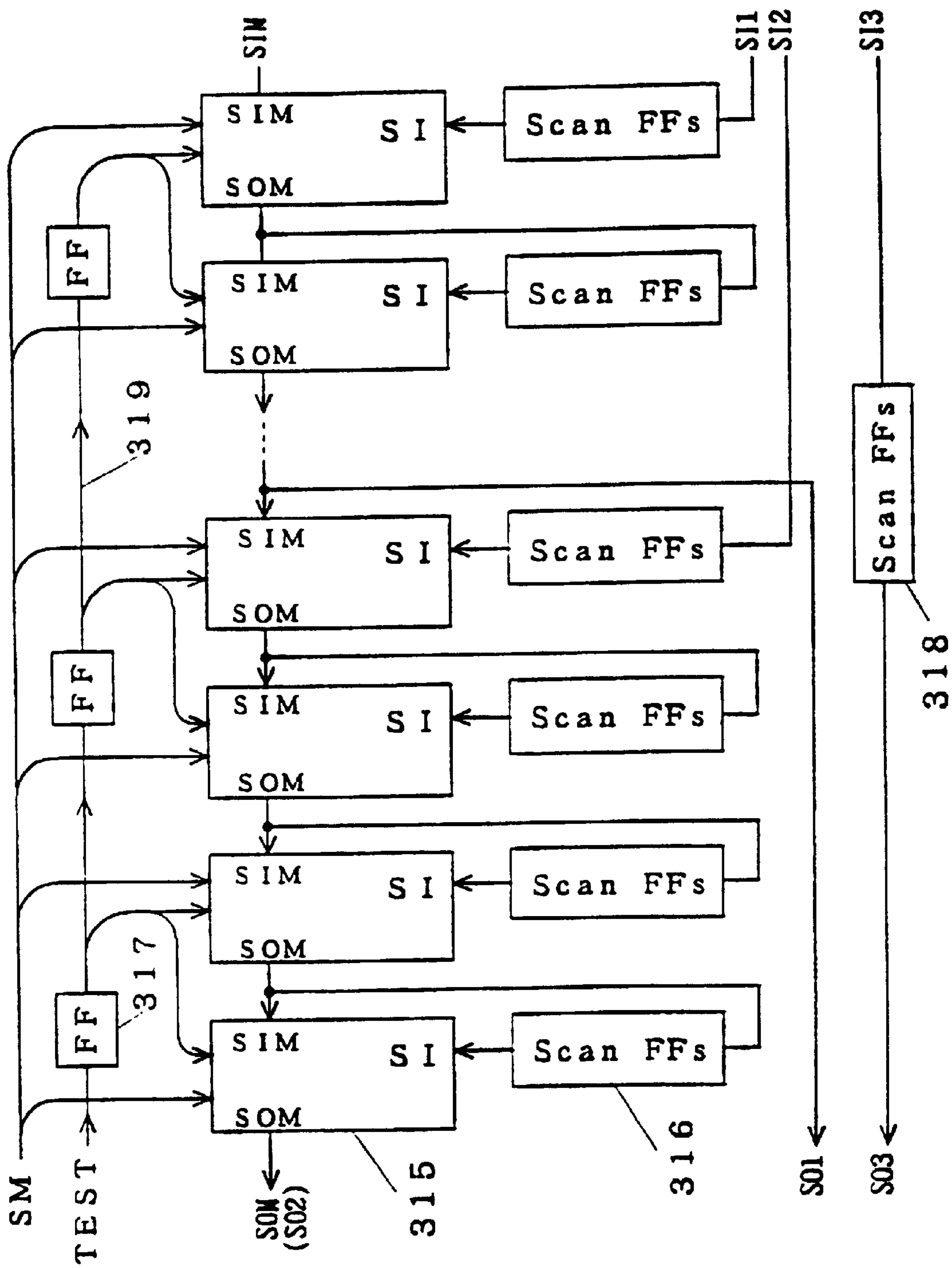
FIG. 62 illustrates a connection state between a semiconductor memory testing device according to a twelfth embodiment of the present invention and a RAM.

FIG. 62 is a block diagram showing the semiconductor memory testing device according to the twelfth embodiment of the present invention. The semiconductor memory testing device according to this embodiment employs the respective circuits described in the aforementioned embodiments in coupling (multiple logic scan chain), and circuits forming respective parts are prepared from those similar to the circuits of the aforementioned embodiments. Referring to FIG. 62, numeral 315 denotes a memory (hereinafter simply referred to as a RAM) assuming the test circuit 302 and the RAM core 303 which are connected with each other in FIG. 60 as a single circuit. The RAM 315 comprises a logic data input (SI) terminal (first input terminal) for inputting logic data (SI signal) in logic data testing, a RAM test data input (SIM) terminal (second input terminal) for inputting an SIM signal (RAM test data: second input data) in RAM data testing, and a read (SOM) terminal for outputting an SOM signal as a read signal. The SOM terminal of one RAM (hereinafter referred to as a precedent RAM) 315 is connected to the SIM terminal (second input terminal) of another RAM (hereinafter referred to as a subsequent RAM) 315 which is adjacent thereto. The SI terminal (first input terminal) of the subsequent RAM 315 is connected to the SOM terminal of the precedent RAM 315 or the test pattern generation circuit 301 (SI1, SI2) through a scan path 316 (SCAN FFs) serving as a shift register having a plurality of flip-flops (FFs).

Various test signals (TEST) in RAM testing, i.e., an EXP signal, a comparison enable signal (CMPEN), an SIA signal, an SID signal, an SIC signal, an SIW signal, an SINH signal, an EXXY signal, a CHDIR (change direction) signal, a WINH signal, an INSFF signal and a MEMTST signal described later, are supplied to each RAM 315 through a pipeline 319 having a plurality of FFs 317. The FFs 317 are provided in one-to-one correspondence to a prescribed number of the RAMs 315. A test data input terminal (TEST) for inputting various test data is connected to the pipeline 319 as shown in FIG. 62, and this test data input terminal (TEST) includes a shift inhibiting signal input terminal for inputting a shift inhibiting signal (SINH). The shift inhibiting signal input terminal (refer to TEST in FIG. 62) and the pipeline 319 form data compression means for compressing data in the aforementioned serially connected body, which is adapted to data-compress the SI signal by supplying the SINH signal to each RAM 315 at prescribed timing, and structured as an FF serially connected body formed by serial connection of a plurality of the FFs 317. The pipeline 319 serving as the FF serially connected body is formed in parallel with a circuit (RAM serially connected body) which is formed by serially connecting the RAMs 315, so that output signals from the respective FFs 317 of the pipeline 319 are inputted in corresponding ones of the RAMs 315 respectively. Signal input terminals for inputting the various test signals (TEST) such as SINH in the pipeline 319 are formed on the most output sides (SOM) of the RAMs 315. Due to such a structure, it is possible to automatically delay data of the SINH signal clock by clock by the FFs 317 particularly when the SINH signal is supplied by the pipeline 319 and the FFs 317, and it is possible to readily perform data compression by inhibiting a shift operation of a scan path 332 (particularly a data output scan path (DO-SCAN)) described later successively from the RAMs 315 of an output side among the plurality of RAMs 315 which are grouped every FF 316. When the SINH signal is directly inputted in each RAM 315 with no employment of the FF 317, for example, it is necessary to drive SINH signals for a number of RAMs and hence the processing speed is reduced. According to this embodiment, however, it is possible to carry out data compression at an extremely high speed by automatically delaying the data clock by clock through the FFs 317.

Further, an SM (shift mode) signal i.e., a BIST signal is supplied to each RAM 315, independently of the test signals. The semiconductor memory testing device outputs SO1 and SOM (SO2) to the exterior. Referring to FIG. 62, numeral 318 denotes a scan path (shift register) which is employed for outputting an S13 signal as supplied directly as SO3 without passing the same through the RAMs 315.

Figure 63:
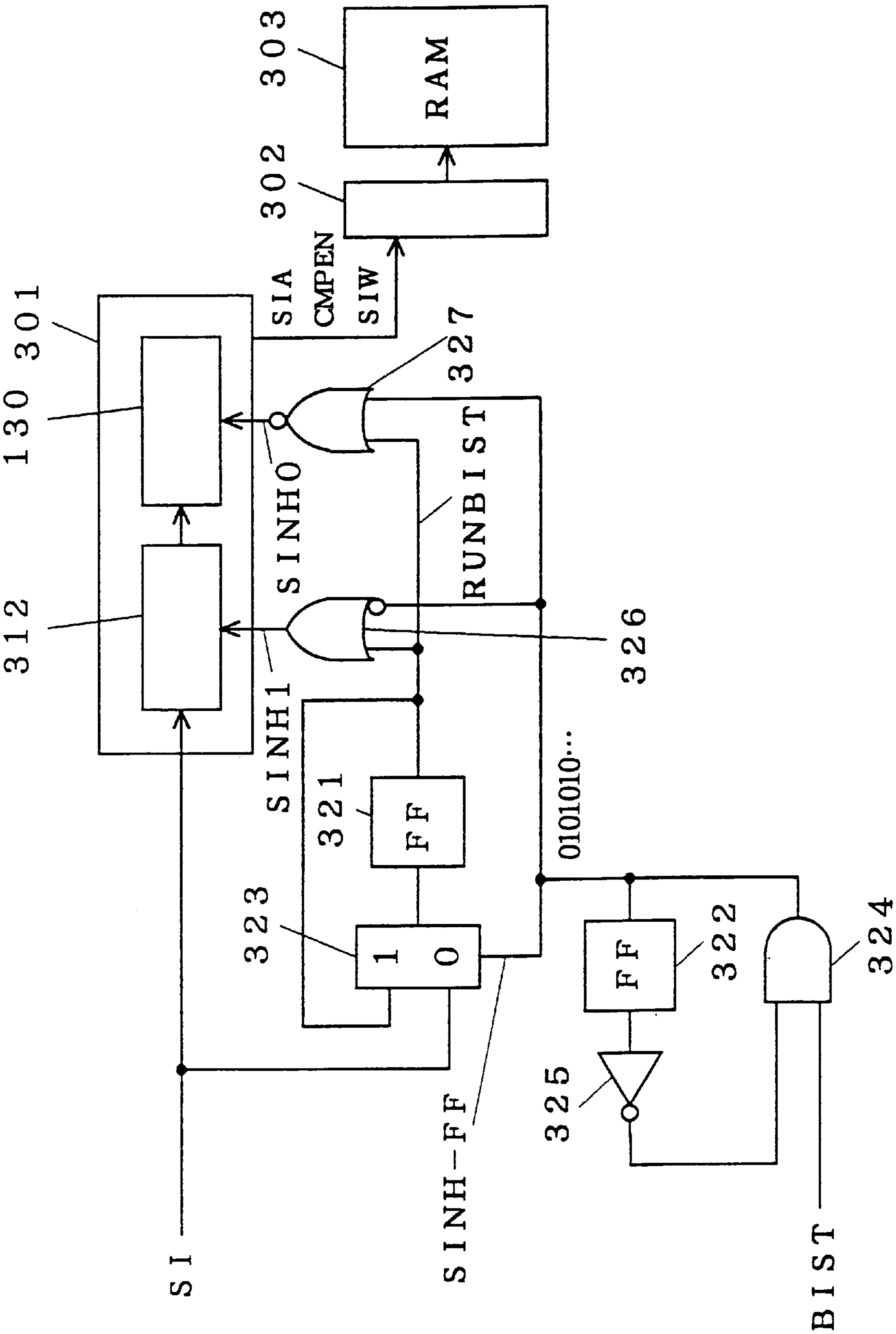
FIG. 63 is a block diagram showing a RAM core and a test circuit in the semiconductor memory testing device according to the twelfth embodiment of the present invention.

FIG. 63 shows the semiconductor memory testing device according to this embodiment, in which elements having similar functions to those of the proposal shown in FIG. 60 are denoted by the same reference numerals. Numerals 321 and 322 denote flip-flops (FFs), numeral 323 denotes a selector, numeral 324 denotes an AND circuit, numeral 325 denotes a NOT circuit, numeral 326 denotes an OR circuit whose one input is inverted, and numeral 327 denotes a NOR circuit. The FFs 321 and 322, the selector 323, the AND circuit 324, the NOT circuit 325, the OR circuit 326 and the NOR circuit 327 form control signal generation means generating the SINH0 and SINH1 signals. One input terminal of the AND circuit 324 is connected to a BIST terminal, which is an indication terminal for inputting an indication signal (BIST signal) for indicating generation of SINH0 and SINH1 (shift inhibiting signals) in the control signal generation means. An input terminal of the FF 322 is connected to an output terminal (SHINH-FF) of the AND circuit 324. An input terminal of the NOT circuit 325 is connected to an output terminal of the FF 322. Another input terminal of the NOT circuit 325 is connected to an output terminal of the FF 322. Another input terminal of the AND circuit 324 is connected to an output terminal of the NOT circuit 325. Logic data (SI signal) is inputted in "0"-side input terminals of the shift register 312 and the selector 323. An output terminal of the selector 323 is connected to the FF 321, while an output of the FF 321 is feedback-inputted in a "1"-side input terminal of the selector 323. A positive input terminal of the OR circuit 326 is connected to an output terminal (RUNBIST) of the FF 321, while its inversion input terminal is connected with an output terminal (SHINH-FF) of the FF 322. The control signals SINH0 and SINH1 for inhibiting shift operations of the shift registers 312 and 313 are outputted from the OR circuit 326 and the NOR circuit 327. Due to this structure, the FF 321 and the selector 323 operate to regularly detect an odd value of the SI signal, to decide an operation mode for the test pattern generation circuit 301 (mode decision part). The odd value of the Si signal represents an initialization operation mode when the same is "0", while representing a test execution operation mode when the same is "1". The FF 322, the ATD circuit 324, the NOT circuit 325, the OR circuit 326 and the NOR circuit 327 form an inhibiting signal generation part for generating the shift inhibiting signals SINH0 and SINH1 corresponding to the shift registers 312 and 313 of the test pattern generation circuit 301 on the basis of the decision at the mode decision part (321 and 323). The mode decision part and the inhibiting signal generation part form inhibiting signal generation means for generating the shift inhibiting signals SINH0 and SINH1 on the basis of the data input signal and transmitting the same to the test pattern generation circuit 301.

Figure 64:
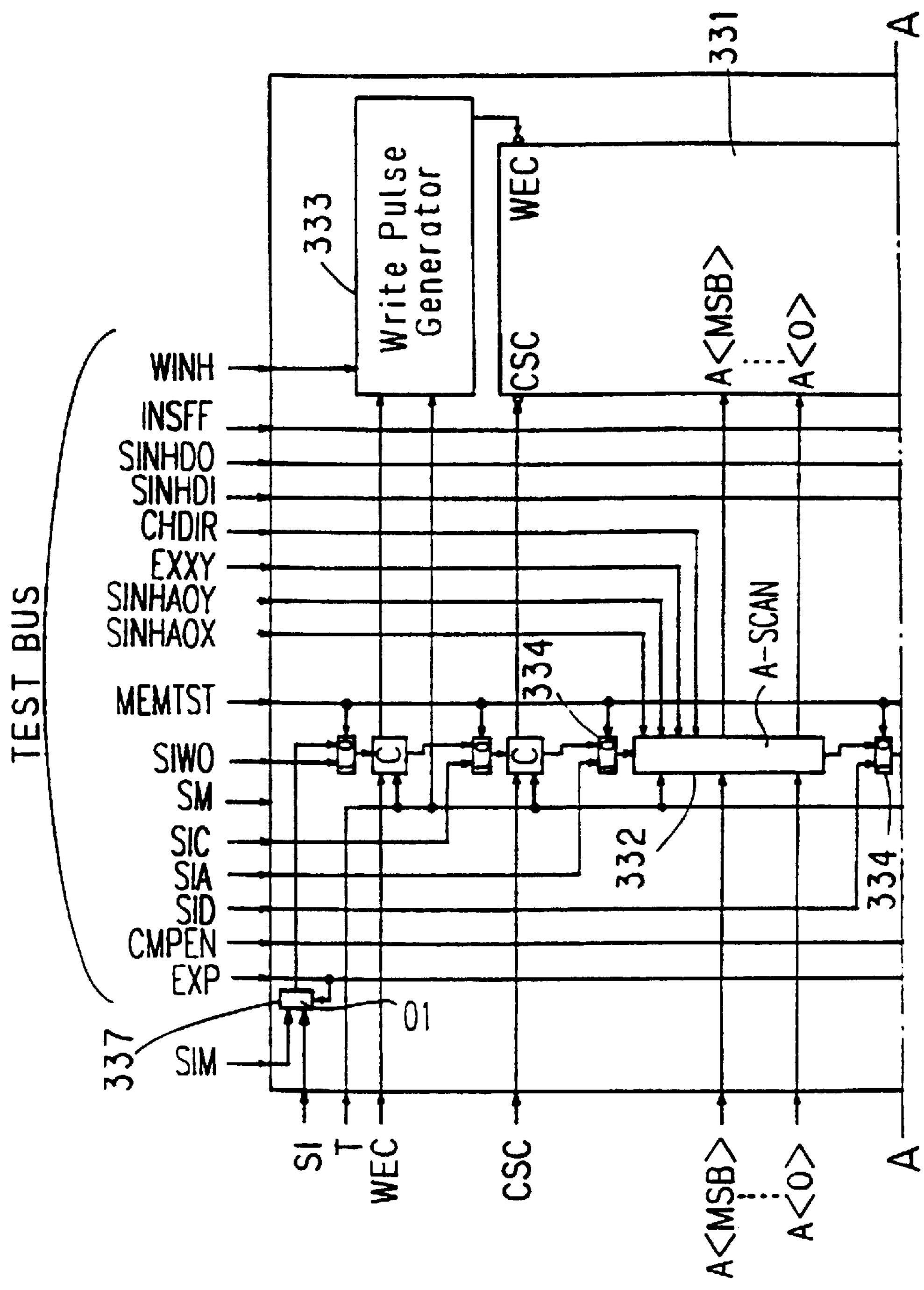
FIG. 64 is a block diagram showing the RAM core and the test circuit in the semiconductor memory testing device according to the twelfth embodiment of the present invention.
Figure 65:
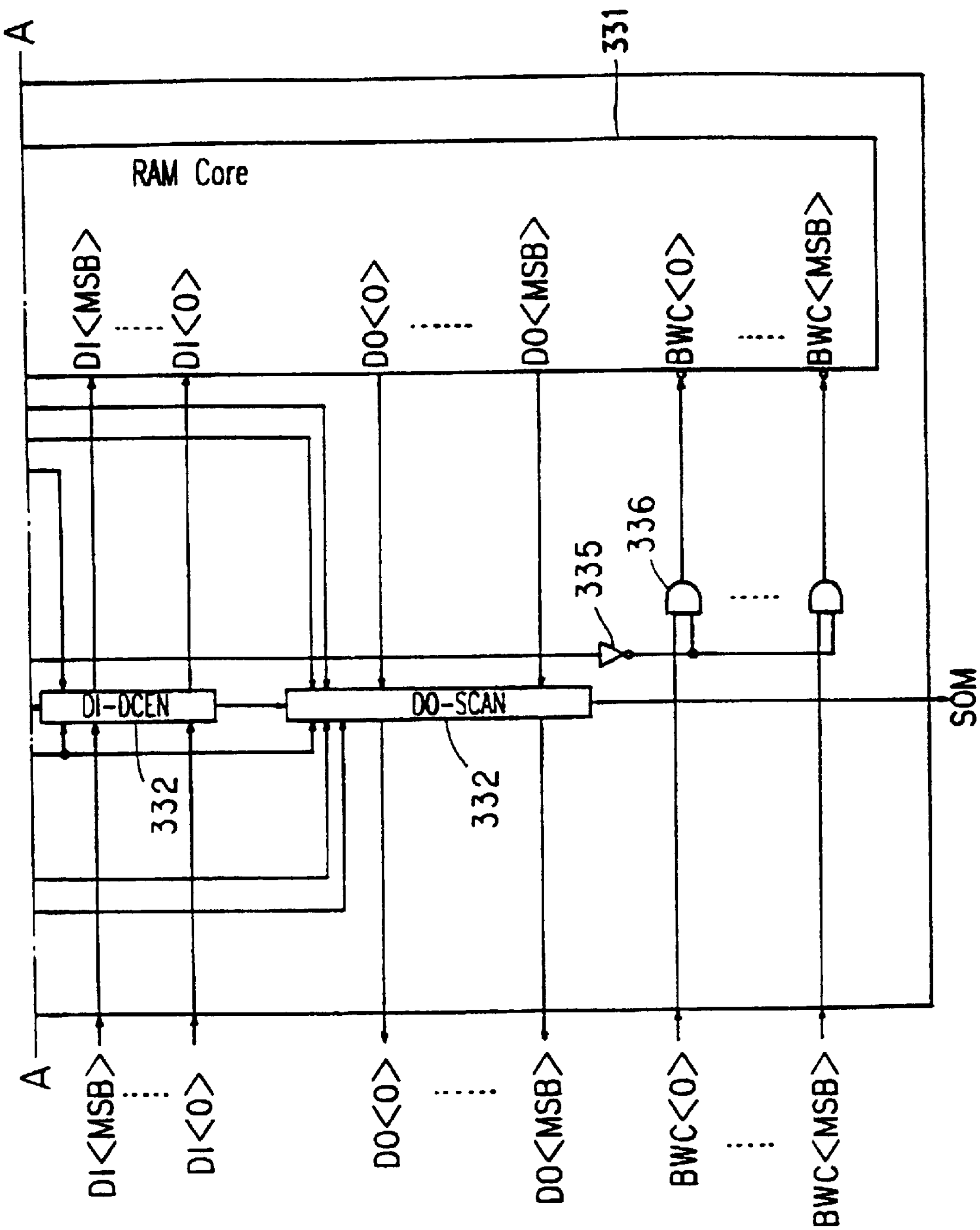
FIG. 65 is a block diagram showing the RAM core and the test circuit in the semiconductor memory testing device according to the twelfth embodiment of the present invention.

FIGS. 64 and 65 illustrate the semiconductor memory testing device (single port RAM) according to the twelfth embodiment of the present invention. These figures are fragmented along the line A—A. Referring to FIG. 65, the term "single port RAM" is directed to a RAM core serving as a semiconductor memory and a peripheral circuit inputting/outputting various signals in/from the RAM core, which can read and write data with a single address system (single port). A plurality of scan paths 332 (A-SCAN, DI-SCAN and DO-SCAN) serving as shift registers and a single write pulse generator 333 are added around a synchronous RAM core (memory core) 331 (corresponding to the above RAM core 303). Referring to FIG. 64, symbol TEST BUS denotes terminals which are employed in RAM testing, including an EXP (expected data) signal, a CMPEN (comparison enable) signal, an SID (test data) signal, an SIA (address) signal, an SIC signal, an SM (shift mode) signal, an SIW0 signal, an MEMTST (memory test) signal, an SINHA0X signal, an SINHA0Y signal, an EXXY (XY conversion) signal, a CHDIR (change direction) signal, an SINHDI signal, an SINHD0 signal, an INSFF signal and a WINH signal.

Figure 66:
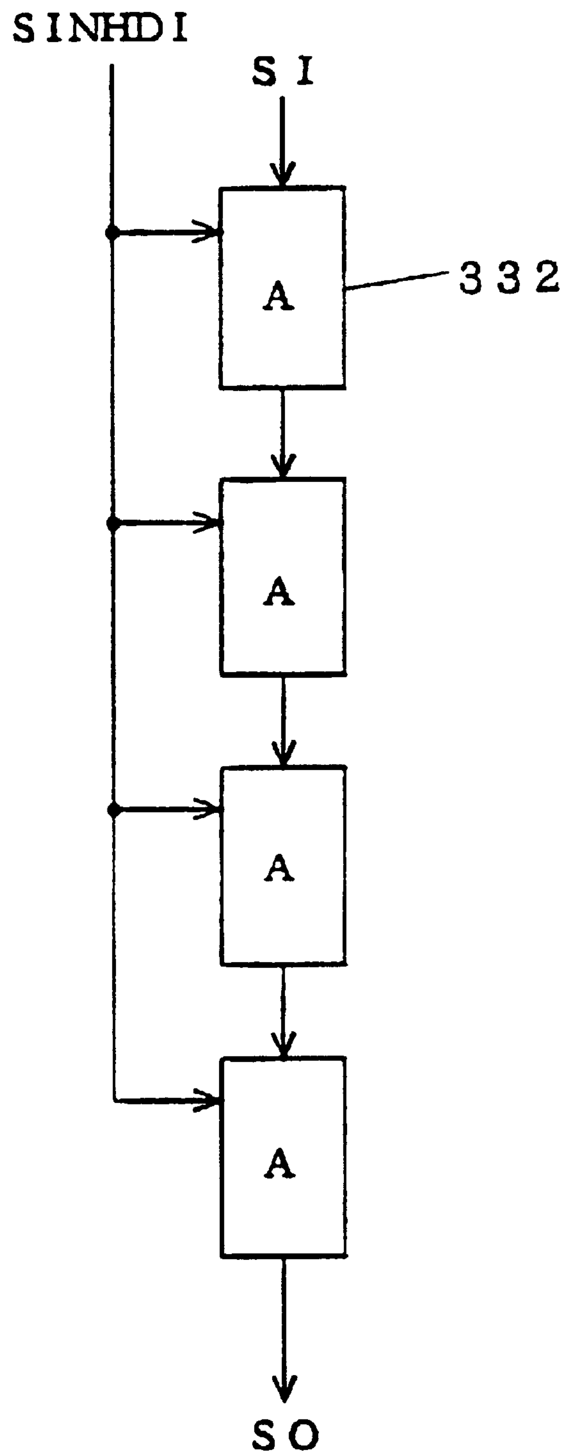
FIG. 66 is a block diagram showing a data input scan path provided in the semiconductor memory testing device according to the twelfth embodiment of the present invention.

FIG. 66 shows the data input scan path 332 (DI-SCAN). Referring to FIG. 66, symbol A denotes a scan FF corresponding to each address of the data input scan path 332 (DI-SCAN) of each single port RAM, and a plurality of such scan FFs ("A") are serially connected with each other. The data input scan path 332 (DI-SCAN) has a shift operation suppressing function, and can suppress a shift operation by setting the SM signal and SINHDI at "1" respectively. It is possible to fix all write data at "0" or "1" or switch patterns of "0101 . . . " and "1010 . . . " every clock by the shift operation suppressing function. In RAM testing, the same logic value can be employed for respective bits of data I/O. Namely, it is hardly necessary to care for the bit number of the data I/O on test algorithm. Therefore, all data may be set at "0" or "1" as the input/output data pattern. When a shift operation is employed, however, it is impossible to perform an operation of switching "0000" to "1111" or vice versa in one clock (i.e., only one shift time) (four clocks are required in this example). In this test circuit, each scan FF ("A") is structured as shown in FIG. 67, for remarkably improving the data input speed by switching the data by 1 clock data. Namely, each scan FF ("A") is formed by a register **332*a* for storing and outputting data, a first selector 332*b* for switching an output of the register 332*a* and the SI signal, and a second selector 332*c* for switching an output from the first selector 332*b*** and a data (D) signal received from an external logic circuit.

Figure 68:
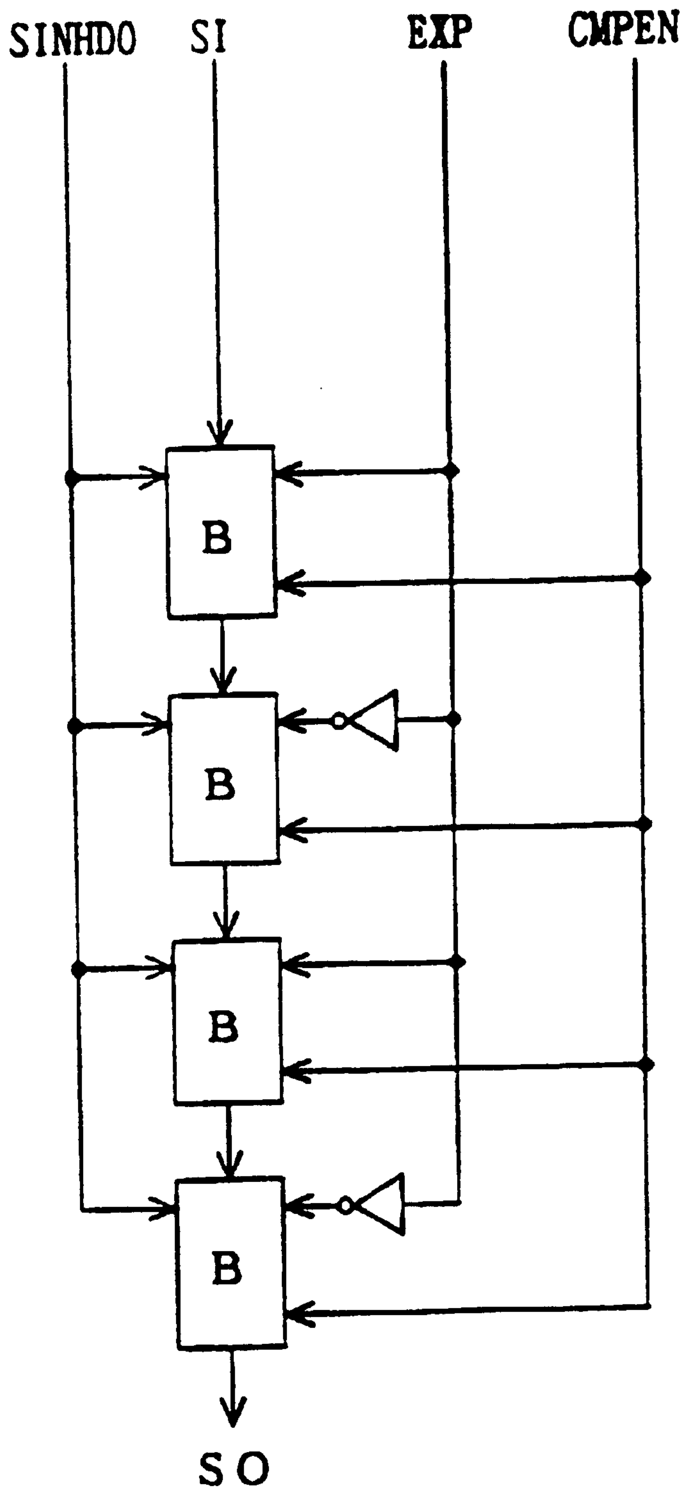
FIG. 68 is a block diagram showing the data input scan path provided in the semiconductor memory testing device according to the twelfth embodiment of the present invention.

The data output scan path 332 (DO-SCAN) is structured as shown in FIG. 68. This data output scan path 332 (DO-SCAN) is provided with a comparison circuit (34, **34*a* to 34*c*) and a comparison inhibiting part (34Z), as described with reference to the fourth embodiment etc. (see FIGS. 25, 26, 28 and 31). Referring to FIG. 68, symbol B denotes a scan FF of each data output scan path 332 (DO-SCAN). The data output scan path 332 (DO-SCAN) has a shift operation suppressing function, and each scan FF ("B") is formed by a register 332*a* for storing and outputting data, a first selector 332*b* for switching an output signal of the register 332 and the SI signal, a second selector 332 for switching an output of the first selector 332*b* and a data (D) signal received from an external logic circuit, an Ex.OR circuit 332*d* for exclusively ORing the data (D) signal and the EXP signal, a NAND circuit 332*e* for NANDing an output signal from the Ex.OR circuit 332*d* and the comparison enable signal (CMPEN), and an AND circuit 332*f* for ANDing output signals from the NAND circuit 332*e* and the register 332*a*. The data output scan path 332 (DO0**SCAN) can suppress a shift operation by setting the SM signal and SINHDI at "1". The EXP value and D are compared on the leading edge of a clock signal by setting CMPEN at "1" in a shift operation suppressing state. If the EXP and D are different from each other, the scan FF ("B") is reset to "0". Therefore, it is necessary to set "1" in the scan FF ("B") by a shift operation before testing the RAM. It is possible to decide which bit has a failure by shifting out the value of the scan FF ("B") of the data output part after the RAM test. Since the expected data (EXP) signal is supplied to all bits of the data output in common, even or odd bits are necessarily ignored when a pattern of "0101" or "1010" is employed for write data. Therefore, it is necessary to carry out two tests by employing both of test patterns directed to only even bits and odd bits respectively.

The scan FF ("B") connects the NOT circuit to scan FFs of only even or odd bits, in order to alternatively readily change the expected data (EXP) signal between odd and even bits. Due to this structure, test data such as "0101" or "1010" can be readily inputted when serial data input (see FIG. 66) is carried out. The data output scan path 332 (DO-SCAN) shown in FIG. 68 corresponds to the circuits of the first to third embodiments and the first to sixth modifications.

Figure 70:
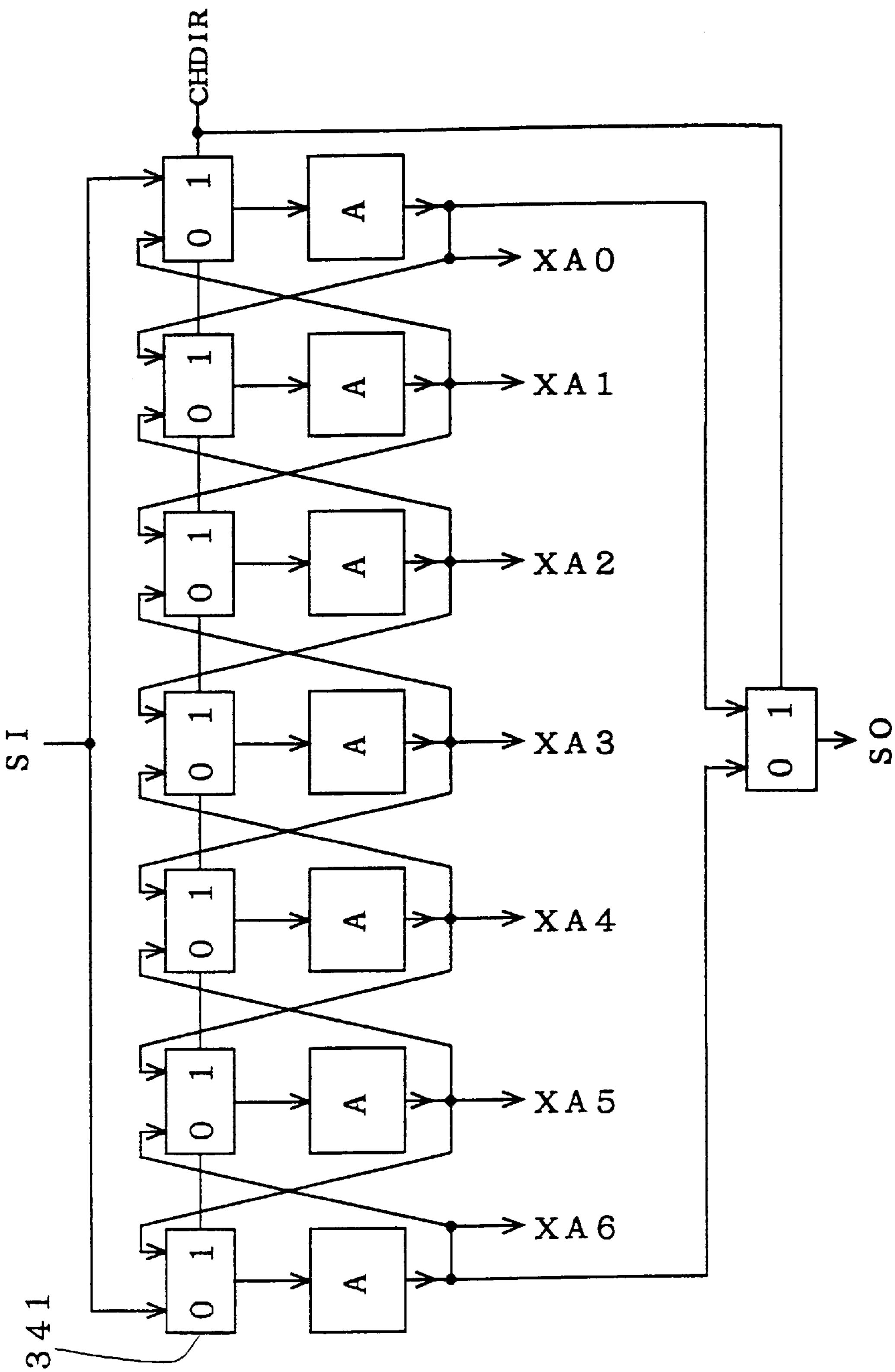
FIG. 70 illustrates a plurality of RAMs which are coupled with respect to the semiconductor memory testing device according to the twelfth embodiment of the present invention.

The address input scan path 332 (A-SCAN) shown in FIG. 64, which is formed by serially connecting seven FFs ("A") XA0 to XA6 as shown in FIG. 70, for example, is connected to a similar A-SCAN of an adjacent single port RAM. FIG. 70 shows such a structure that only X addresses are inputted when there are no Y addresses. The address input scan path 332 (A-SCAN), which is formed to be capable of bidirectionally shifting addresses, can change the shift direction of the FFs ("A") by switching selectors 341 which are connected to the respective FFs ("A": XA0 to XA6) denoted by "A" in FIG. 70, by a change direction signal (switching signal: CHDIR). The SI signal is inputted from the upper (MSB) side when CHDIR=0, while the same is inputted from the lower (LSB) side when CHDIR=1, for example. As shown in FIG. 67, each FF ("A") is formed by a register 332*a* for storing and outputting data, a first selector 332*b* for switching an output of the register 332 and the SI signal, and a second selector 332*c* for switching an output of the first selector 332*b* and the data (D) signal received from the external logic circuit.

The test circuit 302 shown in FIG. 63 corresponds to the peripheral circuit excluding the RAM core 331 shown in FIGS. 64 and 65. Referring to FIGS. 64 and 65, symbols A<0> . . . A(MSB> denote address input terminals of a multiplexer (multiple equivalent distribution) system, symbols DI<0> . . . D(MSB) denote multiplexer system data input terminals, symbols DO<0> . . . DO<MSB> denote multiplexer system data output terminals, and symbols BWC<O> . . . BWC<MSB> denote multiplexer system low enable bit write inhibiting signal input terminals for enabling bitwise control in place of control every byte (=8 bits). In each of the terminals, <0> denotes the least significant bit and <MSB> denotes the most significant bit respectively. Each scan path 332 has 32-bit flip-flops (FF), for example (<MSB>=<32> in this case). The low enable signal is inputted in CSC (chip selection terminal) and WEC (write enable terminal). Referring to FIG. 64, symbol C denotes scan FFs. Symbol MEMTST denotes a terminal for inputting a signal for switching a normal operation mode and a memory test mode, which is connected to a selector 334 corresponding to each scan FF (C) and each scan path 332 (A-SCAN and DI-SCAN), as well as to 32 bit write inhibiting signal input AND circuits 336, for example, through a single NOT circuit 335 for inhibiting input from BWC<0> . . . BWC<MSB> in memory testing (MEMTST=1).

As shown in FIGS. 64 and 65, the respective scan paths 332 (A-SCAN, DI-SCAN and DO-SCAN) incorporate addresses from A<0> . . . A<MSB>, input data from DI<0> . . . DI<MSB> and 1-bit data from BWC<0> . . . BWC<MSB> in the multiplexer system to transfer the same to the RAM core 331, or incorporate output data from the RAM core 331 to transfer the same to the data output terminals DO<0> . . . DO<MSB>.

On the other hand, the respective selectors 334 select "0" sides when a mode switching signal (shift mode: SM) is received. In this case, all of the respective selectors 334, the respective scan FFs (C) and the respective scan paths 332 (A-SCAN, DI-SCAN and DO-SCAN) are serially connected with each other, to output the received SI signal to SOM through the respective selectors 334, the respective scan FFs (C) and the respective scan paths 332.

Figure 71:
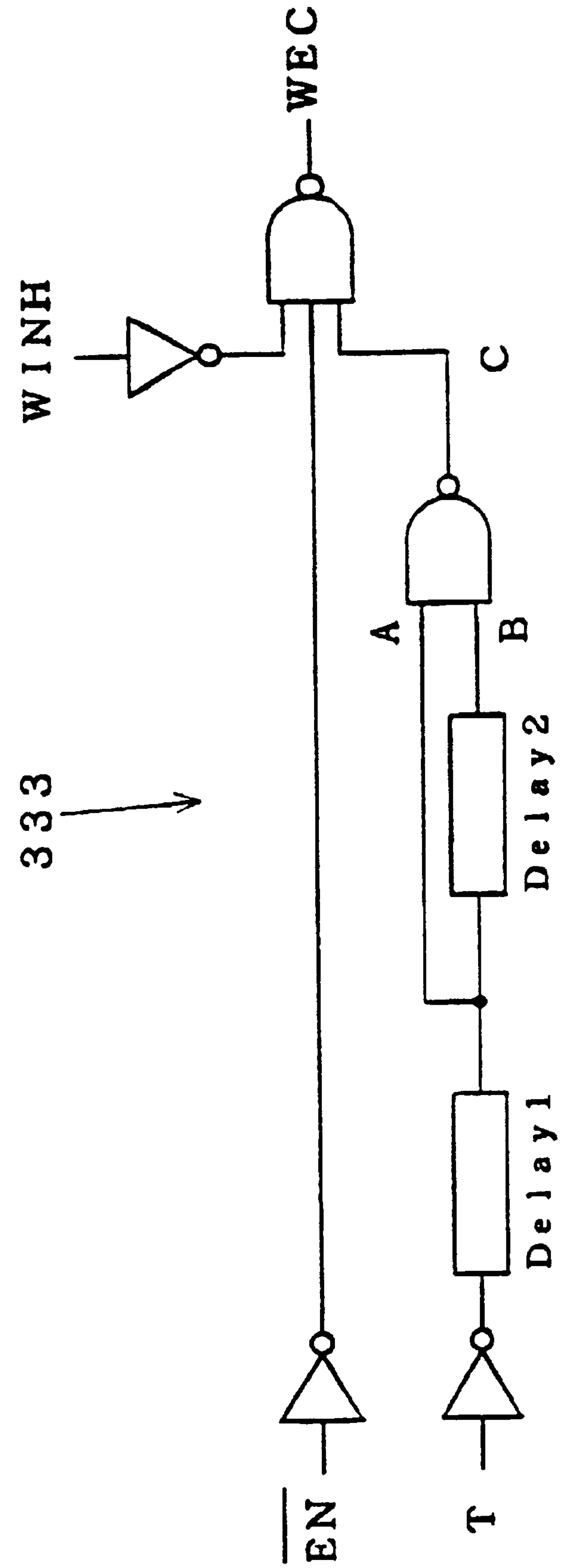
FIG. 71 illustrates a general write pulse generator.
Figure 72:
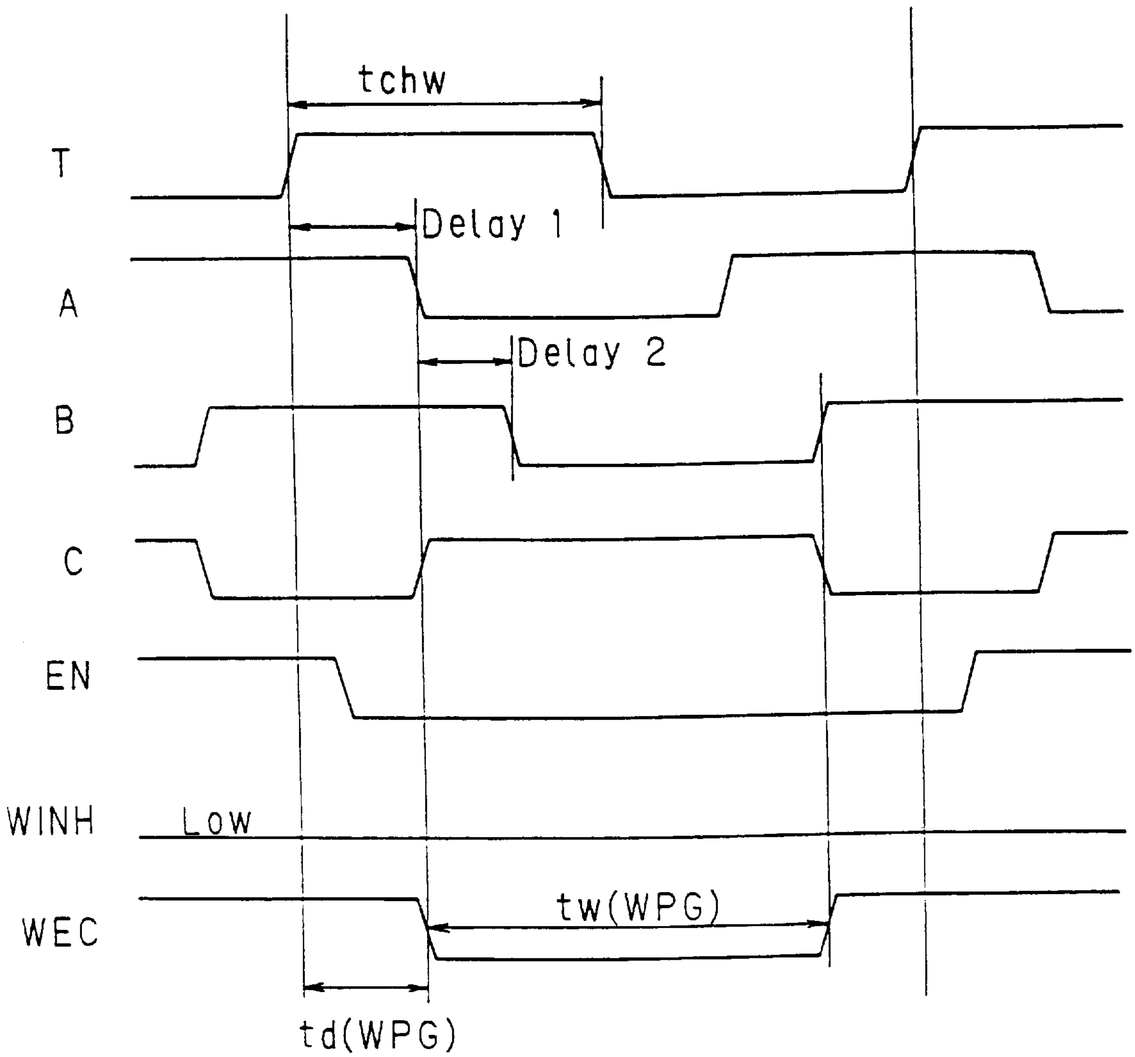
FIG. 72 is a timing chart showing an operation of the write pulse generator.

Numeral 337 appearing in FIG. 64 denotes a selector for switching the SIM signal for RAM testing and the SI signal for logic testing. The EXP signal, which serves as a switching signal for inputting a desired expected data signal of "0" or "1" in RAM testing while switching the selector 337 in other case, inputs "0" in the selector 337 in a normal operation (NORMAL), SI signal inputting (SHIFT-SI) and data incorporation (CAPTURE), while inputting "1" in the selector 337 in SIM signal inputting (SHIFT-SIM). The write pulse generator 333 is prepared from a general one comprising a pair of delays Delay1 and Delay2, three NOT circuits and a pair of NAND circuits, as shown in FIG. 71, for example. FIG. 72 is a timing chart showing the operation of the write pulse generator 333. Referring to FIGS. 72, symbols T, A, B, C, /EN, WINH and WEC correspond to those in FIG. 71 respectively. Referring to FIG. 72, further, symbol techw denotes a half cycle length of a clock signal (T), symbol Delay1 denotes time difference between an input (T) and an output (A) of the delay Delay1, symbol Delay2 denotes time difference between an input (A) and an output (B) of the other delay Delay2, symbol td(WPG) denotes time difference between the clock signal (T) and the WEC signal, and symbol tw(WPG) denotes an output time of the WEC signal.

<Operation>

FIG. 76 shows the circuit operation of this embodiment. The respective signals (CHDIR etc.) appearing in FIG. 76 correspond to those in FIG. 63, while symbols SINHA1X, SINHA1Y, SINHA2X. SINHA2Y and SIW1 denote signals which are related to a test circuit for the adjacent RAM. Referring to FIG. 76, further, symbol NORMAL denotes a normal operation, symbol SHIFT-SI denotes a shift operation in SI signal inputting, symbol SHIFT-SIM denotes a shift operation in SIM signal inputting, symbol CAPTURE denotes an operation for incorporating data generated in an external lofic circuit or the like (SM signal=0), and symbol RAMTEST denotes an operation in RAM testing respectively.

Figure 73:
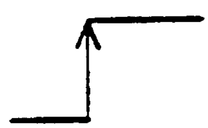
FIG. 73 illustrates states of BIST and SI signals in the semiconductor memory testing device according to the twelfth embodiment of the present invention.
Figure 77:
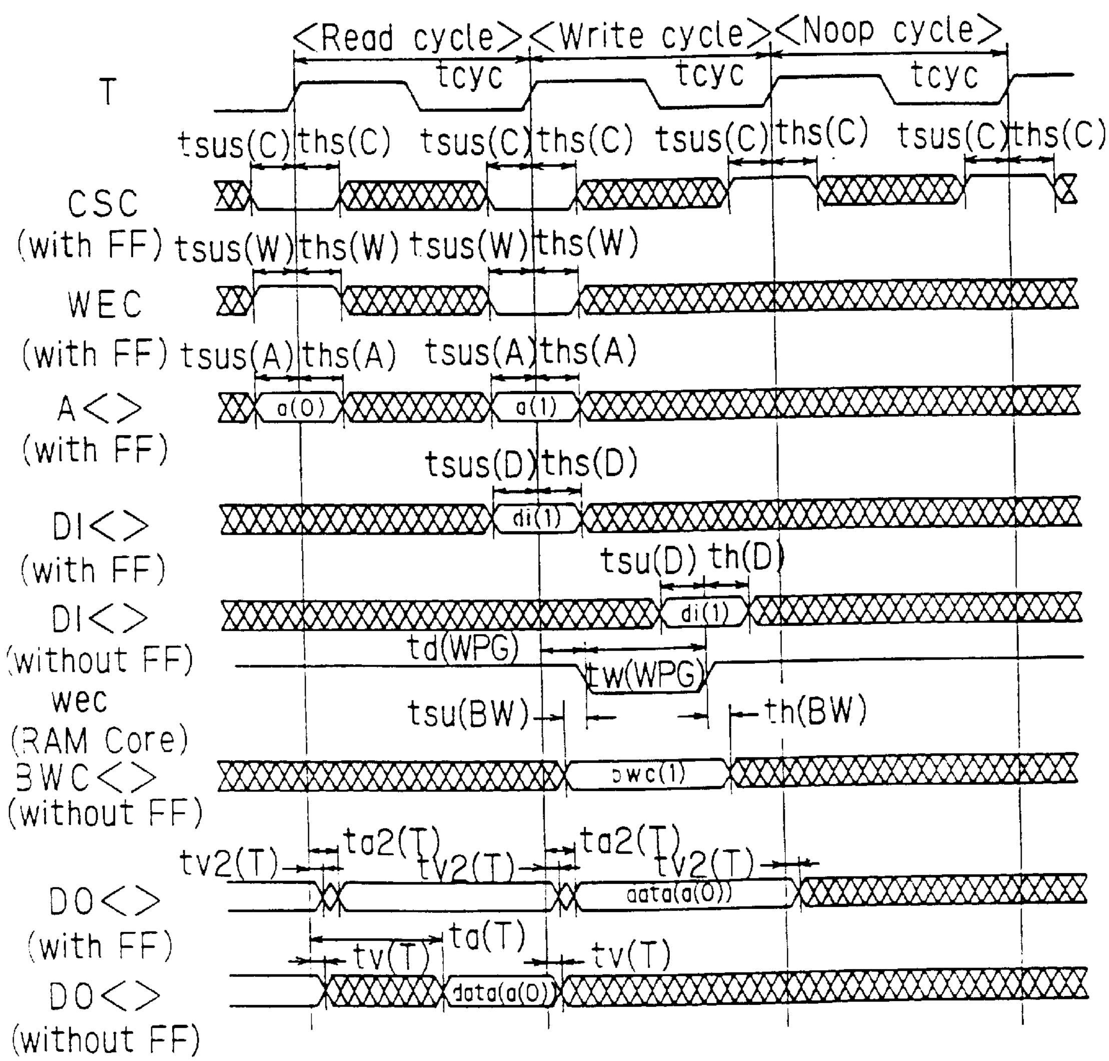
FIG. 77 is a timing chart showing states of respective terminals of a single port RAM in the twelfth embodiment of the present invention.
Figure 78:
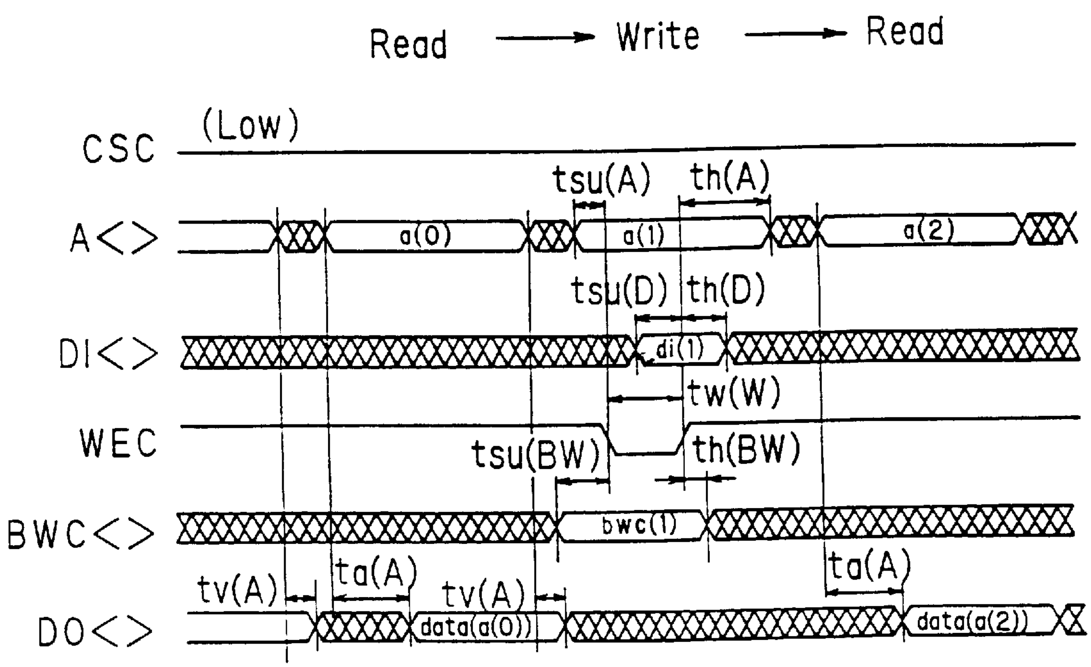
FIG. 78 is a timing chart showing a state of the RAM core in the twelfth embodiment of the present invention.

In the normal operation (Normal state), the BIST signal is converted to "0" as shown in FIG. 73. At this time, the RAM core 303 performs a normal operation whatever data is inputted as the SI signal (Don't Care state). Namely, substantially all data of a test bus are zeroed as shown in FIG. 76, so that data or addresses are inputted from A<>, DI<> or BWC<> in the multiplexer system or data are outputted from DO as shown in FIG. 77. Signals indicated by "-" (i.e., Don't Care) in FIG. 76 may not be zero. Referring to FIGS. 77 and 78, symbols <Read cycle>, <Write cycle> and <Noop cycle> denote states in reading, writing and non-operation respectively. Respective states of read and write operations of the RAM core 331 are as shown in FIG. 78. Referring to FIGS. 77 and 78, symbols tsus(C), tsus(W), tsus(A), tsus(D), tsu(D), tsu(BW) and tsu(A) denote times from input of an external BWC signal to input of a bwc signal in the RAM core 331, symbols ths(C), ths(W), ths(A), ths(D), th(D), th(BW) and th(A) denote effective times of the respective signals, symbol td(WPG) denotes time difference between starting of a write operation and input of the wec (WEC) signal in the RAM core 331, symbols tw(WPG) and tw(W) denote wec(WEC) signal input times, symbols tv(T), tv2(T) and tv(A) denote times from starting of reading or writing to completion of data output, symbols ta(T), ta2(T) and ta(A) denote times from starting of reading or writing to completion of data output, symbols a(0) and a(1) denote addresses, symbol di(1) denotes input data, symbol bwc(1) denotes an input time of the BWC signal, and symbol data(a(0)) denotes output data respectively. No output is made from SOM, as shown in FIG. 76.

Figure 74:
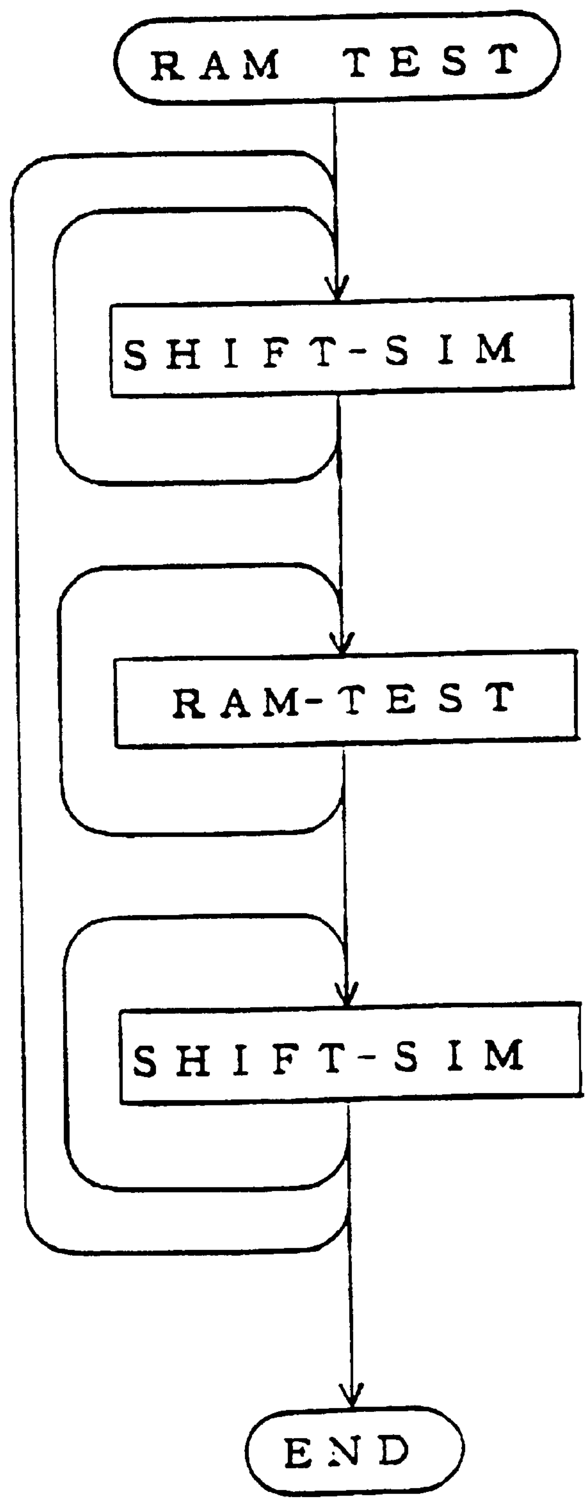
FIG. 74 is a flow chart showing a scan test operation of the semiconductor memory testing device according to the twelfth embodiment of the present invention.
Figure 75:
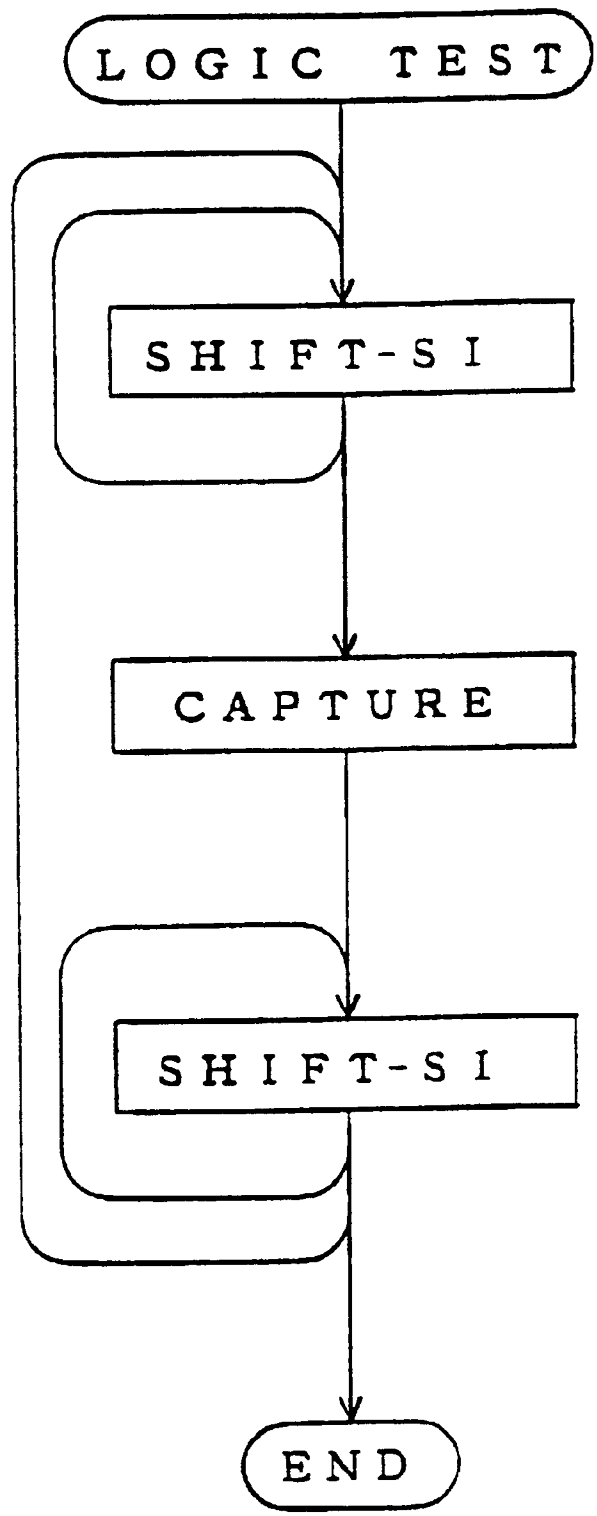
FIG. 75 is a flow chart showing a RAM test operation of the semiconductor memory testing device according to the twelfth embodiment of the present invention.

When a scan test or a RAM test is made, the operation is carried out in a procedure shown in FIG. 74 or 75. In the scan test shown in FIG. 74, a shift operation (SHIFT-SIM) is carried out while inputting the SIM signal (RAM test data), so that the RAM test (TEST) is thereafter carried out and the shift operation (SHIFT-SIM) is again made in continuation. These operations are repeated at need. As to a logic scan test flow shown in FIG. 75, on the other hand, a shift operation (SHIFT-SI) is made while inputting the SI signal so that data incorporation (CAPTURE) is thereafter carried out and the shift operation (SHIFT-SI) is again made in continuation. These operations are repeated at need.

In inputting of the SI signal (logic data) or the SIM signal (RAM test data), The SM, INSFF and WINH signals are converted to "1" respectively, so that the SI signal or the SIM signal (Test Data) is inputted. In data incorporation (CAPTURE), the SM signal is converted to "0". At this time, no data is outputted from SOM. In the RAM test (TEST), the MEMTEST, SINHDO and SM signals are converted to "1" and the WINH signal is converted to "0", so that desired data (0 or 1) may be inputted from the remaining respective terminals.

Data transition in each part in such operations is described. As shown in FIG. 63, the BIST signal is regularly set at "1" (=high) in the test circuit operation (BIST state), and the SI signal is shifted in (DATA SHIFT IN state). At this time, the test circuit 302 enters a test mode. The SINH-FF signal generates "0101010". . . on the basis of a signal received from the AND circuit 324. Then, the OR circuit 326 incorporates data (RUNBIST signal) stored in the FF 321 only when the SINH-FF signal is "0", and supplies the same to the shift register 312. The NOR circuit 327 outputs SINH0 as "1" only when the RUNBIST and SINH-FF signals are "0".

In initialization (INIT. state), "0" is bitwisely inserted in a bit column of data to be originally initialized in the test pattern generation circuit 301. In order to execute an operation which is similar to that of shifting in the following bit train:

"1011"

as data (SI signal) in the circuit shown in FIG. 60, for example,

"01 00 01 01"

is shifted in as an SI signal in this embodiment. At this time, the SINH-FF signal becomes:

"01 01 01 01"

and hence odd bits of the SI signal are incorporated as the RUNBIST signal, which in turn maintains "0" in response. In this case, the OR circuit 326 outputs the SINH-FF signal as such, and its output (SINH1) becomes:

"10 10 10 10"

as shown in FIG. 79. The output (SINH0) of the NOR circuit 327 also becomes:

"10 10 10 10"

and hence the shift register shifts only even bit timing of the bit column of the SI signal, and hence only the even bits of the bit train of the SI signal are incorporated in the shift register. Namely,

"1011"

is inputted. In test execution (RUN state),

"11 11 11 11"

is shifted in as the SI signal. At this time, SINH-FF is:

"01 01 01 01"

and hence odd bits are incorporated in RUNBIST, which in turn maintains a state of "1". Then, the output (SINH1) of the OR circuit 326 regularly becomes "1" as shown in FIG. 79, while the output (SNH0) of the NOR circuit 327 regularly becomes "0". Then, the shift register 312 functions as the effective address number storage part (MASKA) 37 or the two-dimensional pattern storage part (MASKD) 111 in the fourth to eleventh embodiments, for example, while the other shift register 313 functions as the address generation part (ADDR) 35 or the control register (CARRY) 36 in the fourth to eleventh embodiments, for example, thereby transmitting prescribed signals (SIA, CMPEN and SIW in the fourth to eleventh embodiments) to the test circuit 302 for executing the test.

Figure 80:
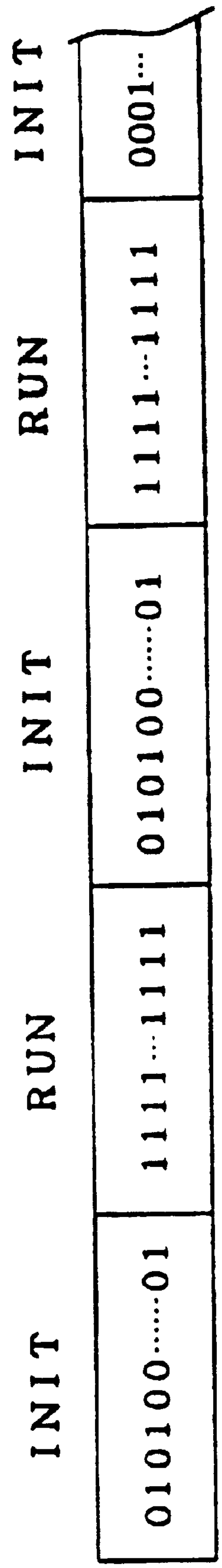
FIG. 80 illustrates an input example of an SI signal in the semiconductor memory testing device according to the twelfth embodiment of the present invention.

As hereinabove described, initialization (INIT. state) and test execution (RUN state) are alternately repeated in the test circuit operation (BIST state). FIGS. 80 and 81 transition examples of the SINH-FF, RUBIST, SINH0 and SIN1 signals with respect to the SI signals respectively. Data are supplied from only a single pin (SI pin) in test execution through such operations, thereby enabling the prescribed test operations described with reference to the fourth to eleventh embodiments.

Thirteenth Embodiment

<Structure>

Figure 82:
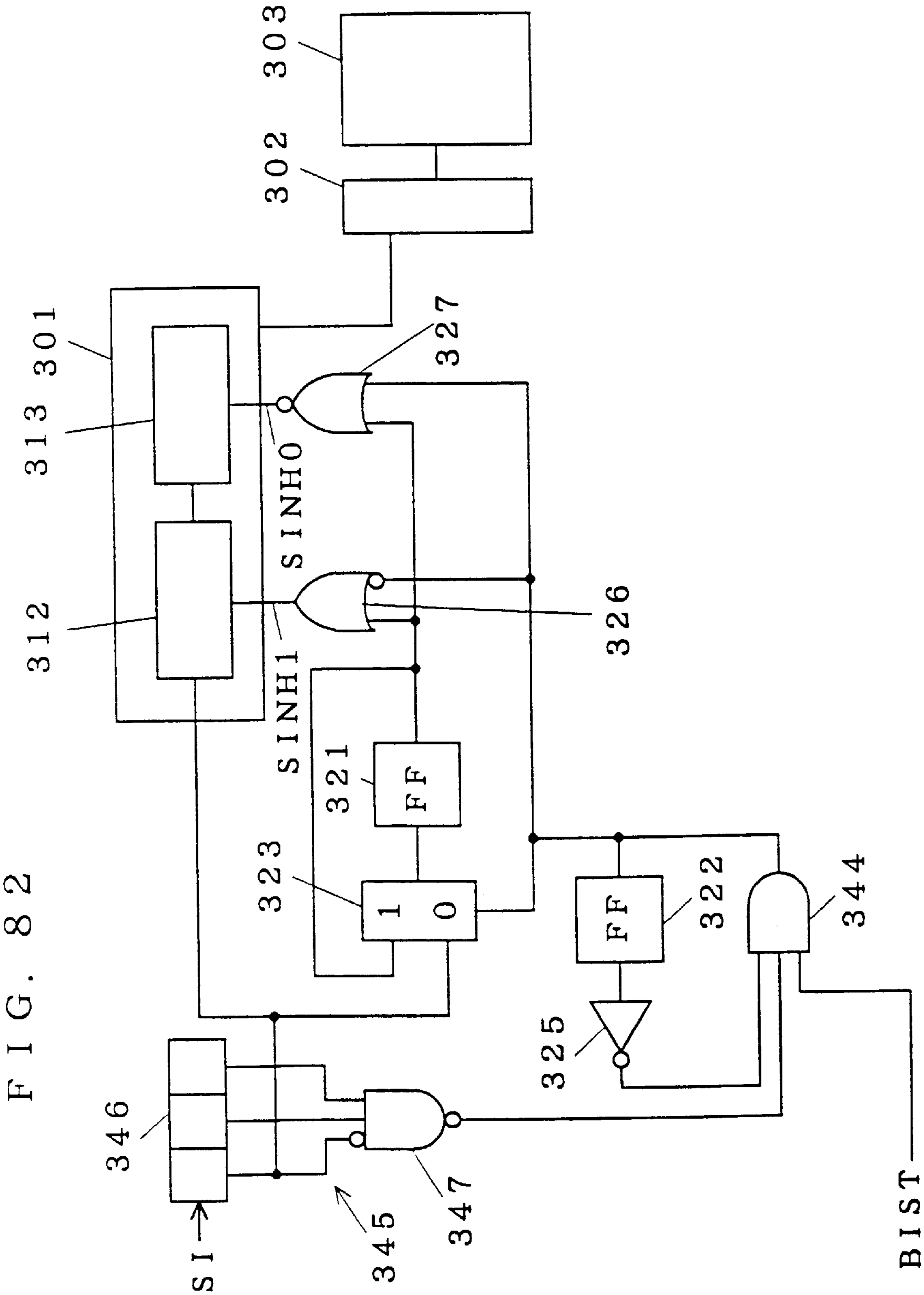
FIG. 82 is a block diagram showing a semiconductor memory testing device according to a thirteenth embodiment of the present invention.

FIG. 82 illustrates a semiconductor memory testing device according to a thirteenth embodiment of the present invention. Elements having functions similar to those of the twelfth embodiment are denoted by the same reference numerals. In this embodiment, an SINH-FF signal is generated only by an SI signal since a malfunction may be caused when SINH-FF timing deviates from SI signal timing in the twelfth embodiment. Referring to FIG. 82, a test pattern generation circuit 301, a test circuit 302, a RAM core 303, FFs 321 and 322, a selector 323, a NOT circuit 325, an OR circuit 326 and a NOR circuit 327 are connected in a similar manner to that described with reference to the twelfth embodiment, and hence redundant description is omitted. The device according to this embodiment comprises an AND circuit 344 having three input terminals, in place of the AND circuit (324) of two input terminals provided in the twelfth embodiment shown in FIG. 63. The first and second input terminals of the AND circuit 344 are connected to a BIST terminal and an output terminal of the NOT circuit 325 respectively similarly to the twelfth embodiment, while the third input terminal is connected to mark detection means 345 for detecting a mark ("11") included in the SI signal. The mark detection means 345, which is adapted to correct deviation caused between SINHFF timing and SI signal timing and preventing a malfunction by detecting the mark ("11") of the SI signal, is formed by a 3-bit shift register 346 and a NAND circuit 347 having three input terminals including an inversion input terminal. The shift register 346 receives the SI signal from its most significant bit (MSB) side. The most significant bit (MSB) of the shift register 346 is so connected that the SI signal stored therein is transmitted as such to an input terminal of a shift register 312 of the test pattern generation circuit 301 and a "0" side input terminal of the selector 323. The inversion input terminal of the NAND circuit 347 is connected to the most significant bit (MSB) of the shift register 346, while the other input terminals are connected to other bits of the shift register 346 respectively. An output terminal of the NAND circuit 347 is connected to the third input terminal of the AND circuit 344. The AND circuit 344 functions as timing correction means for matching indication timing of the BIST signal (indication signal) with a point of time of mark termination of the SI signal. on the basis of the detection result of the mark detection means 345.

<Operation>

A normal operation (Normal state), which is shown in FIG. 83, is similar to that of the twelfth embodiment, and hence redundant description is omitted.

Figure 84:
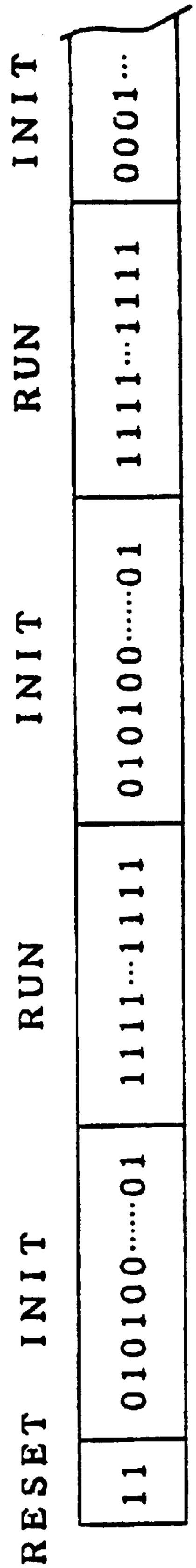
FIG. 84 illustrates an input example of an SI signal in the semiconductor memory testing device according to the thirteenth embodiment of the present invention.

In initialization (BIST-INIT. state) of the test pattern generation circuit 301, the BIST signal is converted to "1" (=high) as shown in FIG. 83, to shift in the SI signal (DATA SHIFT IN state). The test circuit 302 enters a test mode at this time. Data obtained by inserting "11" as a mark in the head of data of an SI signal which is similar to that of the twelfth embodiment shown in FIG. 80 is inputted as the data of the SI signal. Namely,

"11 01 01 00"

is first shifted in the shift register 346 as the SI signal, as shown in FIGS. 84 and 85. At this time, the NAND circuit 347 outputs:

"11 01 11 11"

and thereafter continuously outputs "1". Then, "0" is inevitably inputted from the NAND circuit 347 in the third input terminal of the AND circuit 344 every third bit. Therefore, the AND circuit 344 inevitably outputs "0" every third bit in response. Thereafter the AND circuit 344 outputs SINH-FF which becomes:

"01 01 01 01"

with reference to the third bit of the SI signal by subsequent feedback of inverted data by the FF 322 and the NOT circuit 325 regardless of precedent output of the NOT circuit 325. Similarly to the twelfth embodiment, odd bits of the SI signal are incorporated and hence the RUNBIST signal maintains "0". In this case, the SINH-FF signal is outputted as such and the output (SINH1) of the OR circuit 326 becomes:

"10 10 10 10"

as shown in FIG. 86. The output (SINH0) of the NOR circuit 327 also becomes:

"10 10 10 10"

and hence the shift register shifts only even bit timing of the bit column of the SI signal, whereby only the even bits of the bit column of the SI signal are incorporated in the shift register. Namely, only even data are extracted as to data after completion of "11" in the Si signal.

In test execution (RUN) state,

"11 11 11 11"

is shifted in from the SI signal. At this time, SINH-FF is:

"01 01 01 01"

and hence RUNBIST incorporates odd bits and maintains the state of "1". Thus, the output (SINH1) of the OR circuit 326 regularly becomes "1" as shown in FIG. 79, while the output (SINH0) of the NOR circuit 327 regularly becomes "0".

Thus, according to this embodiment, resetting is automatically applied in the circuit when "011" is supplied as the SI signal regardless of the SINH-FF signal as shown in FIG. 85 so that a normal operation can be ensured with reference to this point of time, whereby no malfunction is caused even if the test operation is made in an odd cycle of the SI signal. Other effects of this embodiment are similar to those of the twelfth embodiment.

Fourteenth Embodiment

<Structure>

Figure 87:
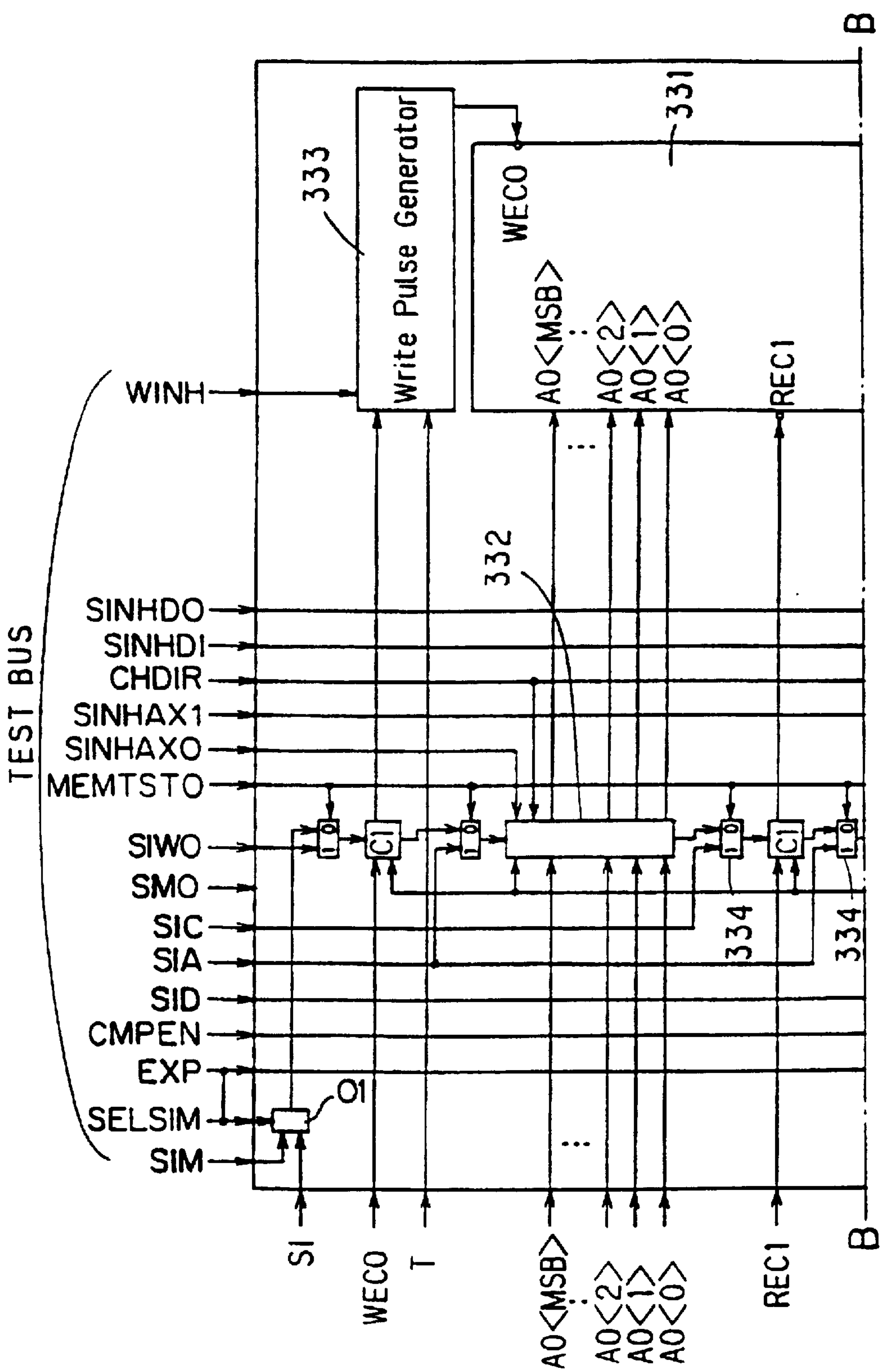
FIG. 87 is a block diagram showing a RAM core and a test circuit in a semiconductor memory testing device according to a fourteenth embodiment of the present invention.
Figure 88:
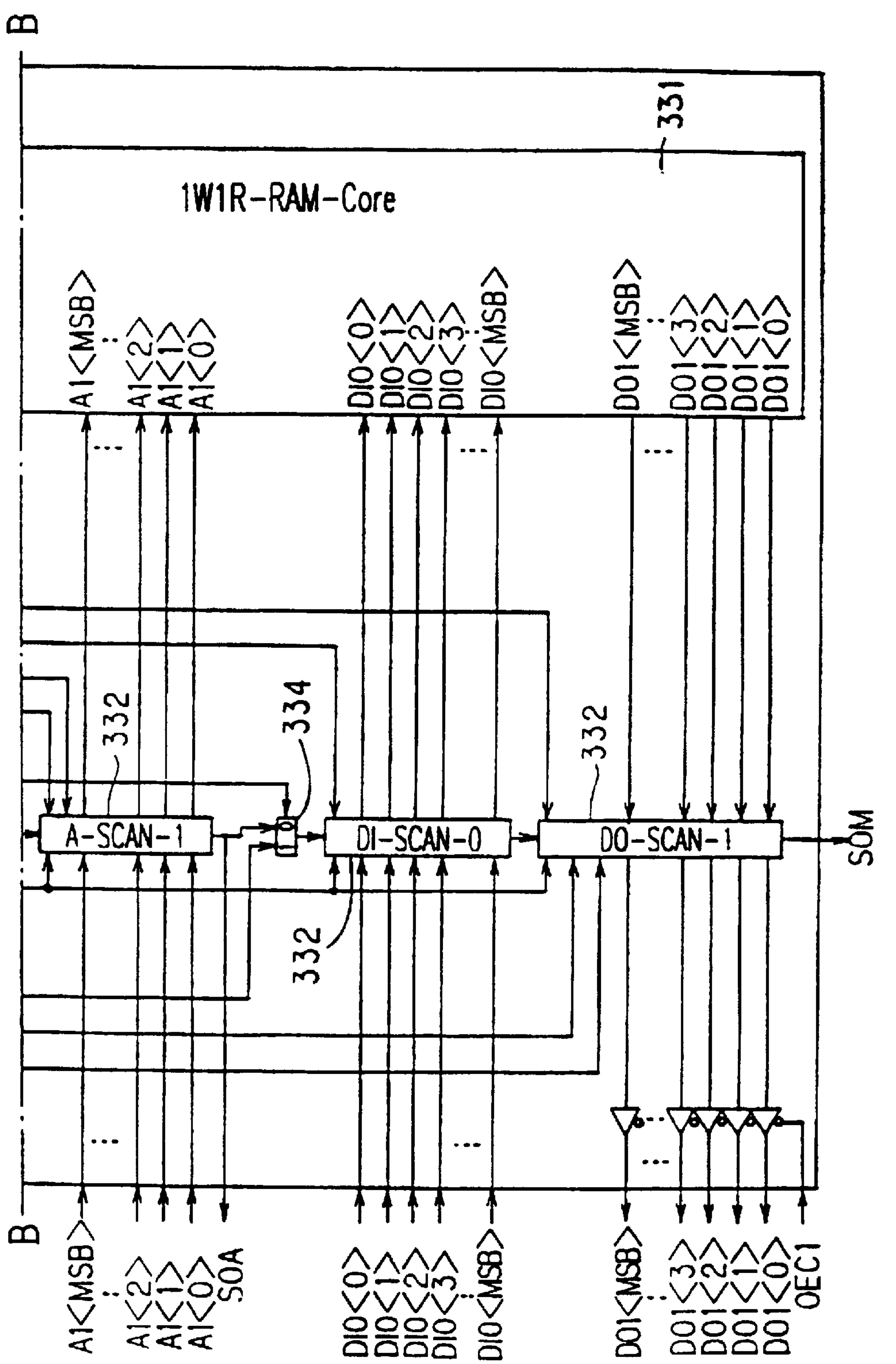
FIG. 88 is a block diagram showing the RAM core and the test circuit in the semiconductor memory testing device according to the fourteenth embodiment of the present invention.

FIGS. 87 and 88 are block diagrams showing a semiconductor memory testing device (DFT-RAM) according to a fourteenth embodiment of the present invention. These figures are fragmented along the line B—B. Elements having functions which are similar to those in the twelfth embodiment are denoted by the same reference numerals. The DFT-RAM is formed by a RAM core and peripheral circuits for inputting/outputting various types of signals in/from the RAM core, i.e., an asynchronous RAM core 331 and a plurality of scan paths 332 serving as shift registers and a single write pulse generator 333 which are added around the same. The test circuit 302 shown in FIG. 63 corresponds to the peripheral circuits appearing in FIGS. 87 and 88 excluding the RAM core 331. As shown in FIGS. 87 and 88, the scan paths 332 (A-SCAN-0 and A-SCAN-1) of an address part can suppress shift operations by shift inhibiting signals (SINHAX0 and SINHAX1). The scan path 332 (DI-SCAN-0) of a data input part can inhibit a shift operation by a shift inhibiting signal (SINHDI). The scan path 332 (DO-SCAN-1) of a data output part can inhibit a shift operation by a shift inhibiting signal (SINHDI0). The scan paths 332 (A-SCAN-0 and A-SCAN-1) of the address part, which have bidirectional shift functions, can perform a test employing bidirectional pseudo-random number addressing at a high speed. In the case, a plurality of RAMs are coupled with each other in the connection system shown in FIG. 70. The scan path 332 (DI-SCAN-0) of the data output part is provided with a data compression function. This data compression function is attained when the aforementioned SINH signal is inputted in each of the aforementioned RAMs 315 to inhibit a shift operation as to a desired RAM 315, while it is possible to compress data by 1 bit around the aforementioned flip-flop 317 by providing the flip-flop 317 in an intermediate portion of a path supplying the SINH signal to the RAM 315, as shown in FIG. 62. Thus, the SINH signal is not simultaneously supplied to all RAMs (RAM1, RAM2 and RAM3) dissimilarly to the fourth prior art shown in FIG. 132, so that no shift out operation is carried out every test address. It is possible to implement inhibition of test pattern increase and a high-speed test by employing the pseudo-random addressing method and the data compression method.

Figure 89:
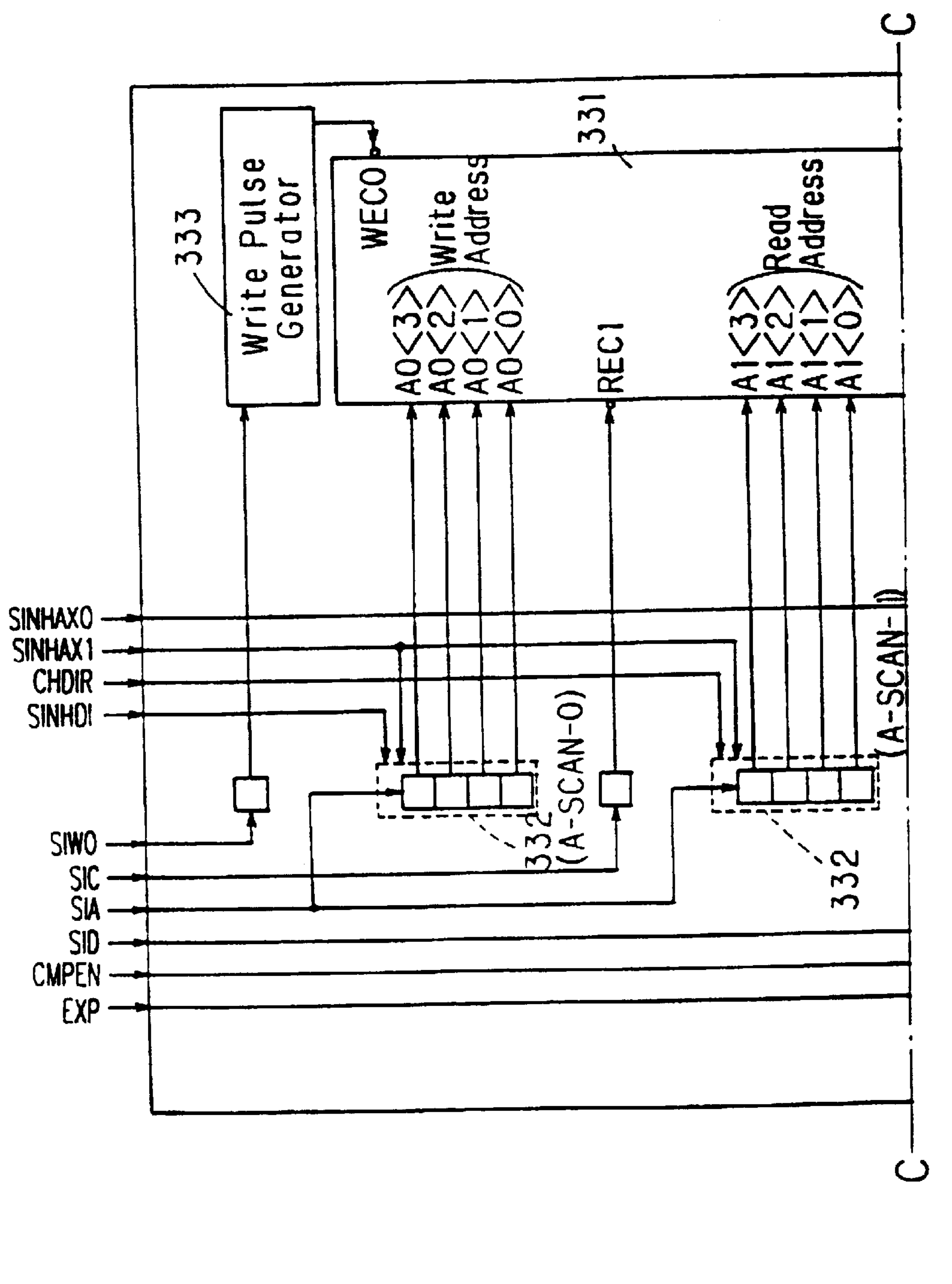
FIG. 89 illustrates the semiconductor memory testing device according to the fourteenth embodiment of the present invention.
Figure 90:
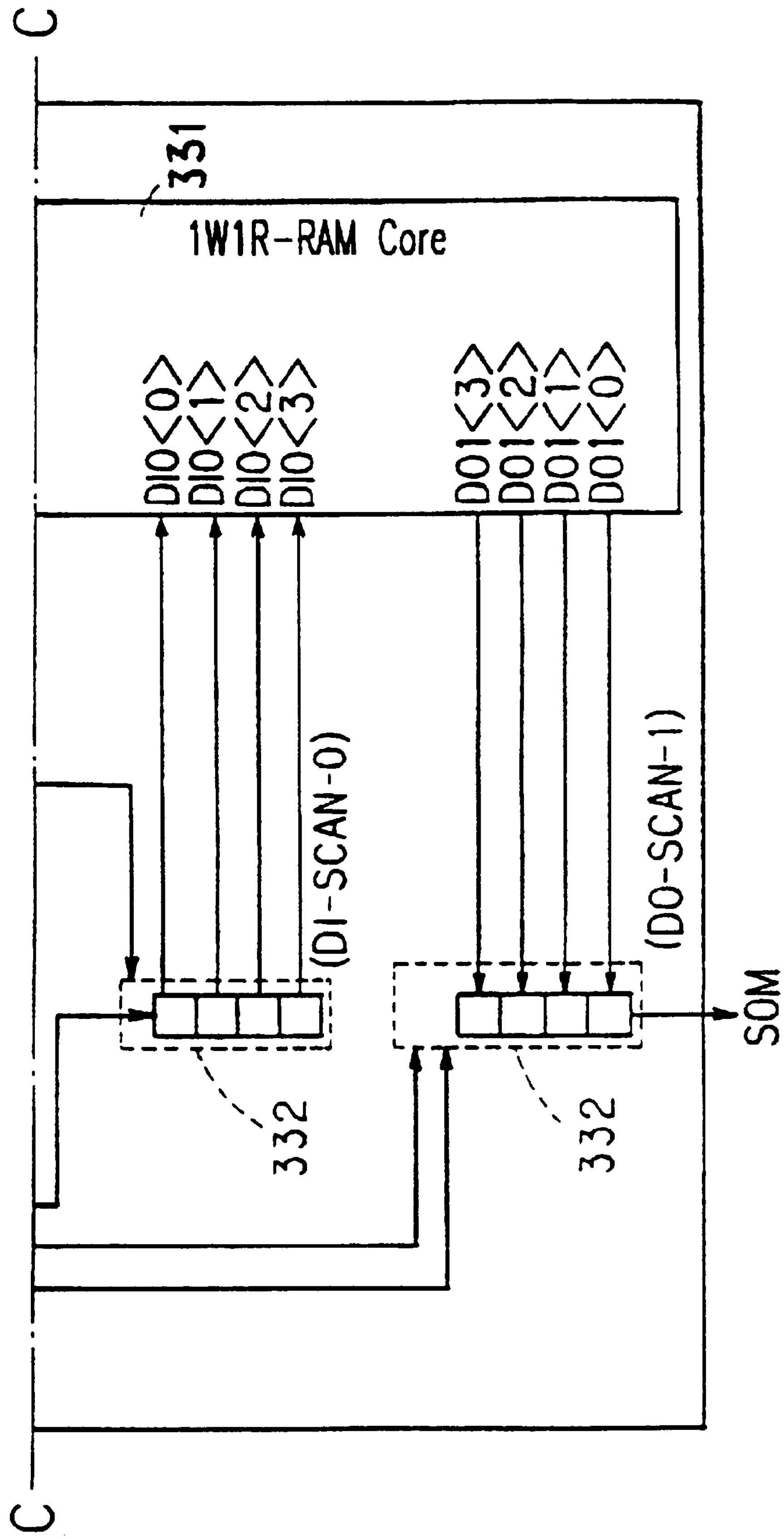
FIG. 90 illustrates the semiconductor memory testing device according to the fourteenth embodiment of the present invention.

The circuit shown in FIGS. 87 and 88 is set at MEMTST0=1 in a test mode so that the same functions as an equivalent circuit shown in FIGS. 89 and 90. FIGS. 89 and 90 are fragmented along the line C—C. When MEMTST0 (=1) is inputted, addresses as to the scan paths 332 (A-SCAN-0 and A-SCAN-1) of the address part can be shifted in from SIA, while write data as to the scan path 332 (DI-SCAN-0) of the data input part can be shifted in from SID. The addresses inputted in the aforementioned SIA are generated by the address generation method described with reference to each of the aforementioned embodiments. At this time, a write enable signal (low enable) and a read enable signal (low enable) are supplied from SIW0 and SIC respectively. Further, a read expected data (EXP) signal for the scan path 332 (DI-SCAN-0) of the data output part and a comparison enable signal (CMPEN) are supplied from an expected data input (EXP) terminal and a CMPEN terminal respectively. These signals can be connected in common with respect to a plurality of RAMs as a test bus, whereby a plurality of RAMs can be tested when the word numbers are identical. This device is so designed that the same addresses can be shifted in from SIA for respective ports, so that a multi port RAM can be tested similarly to a single port RAM.

Shift operations can be stopped when SINHA0, SINHA1 and SINHDI are set at 1.

Fifteenth Embodiment

Figure 91:
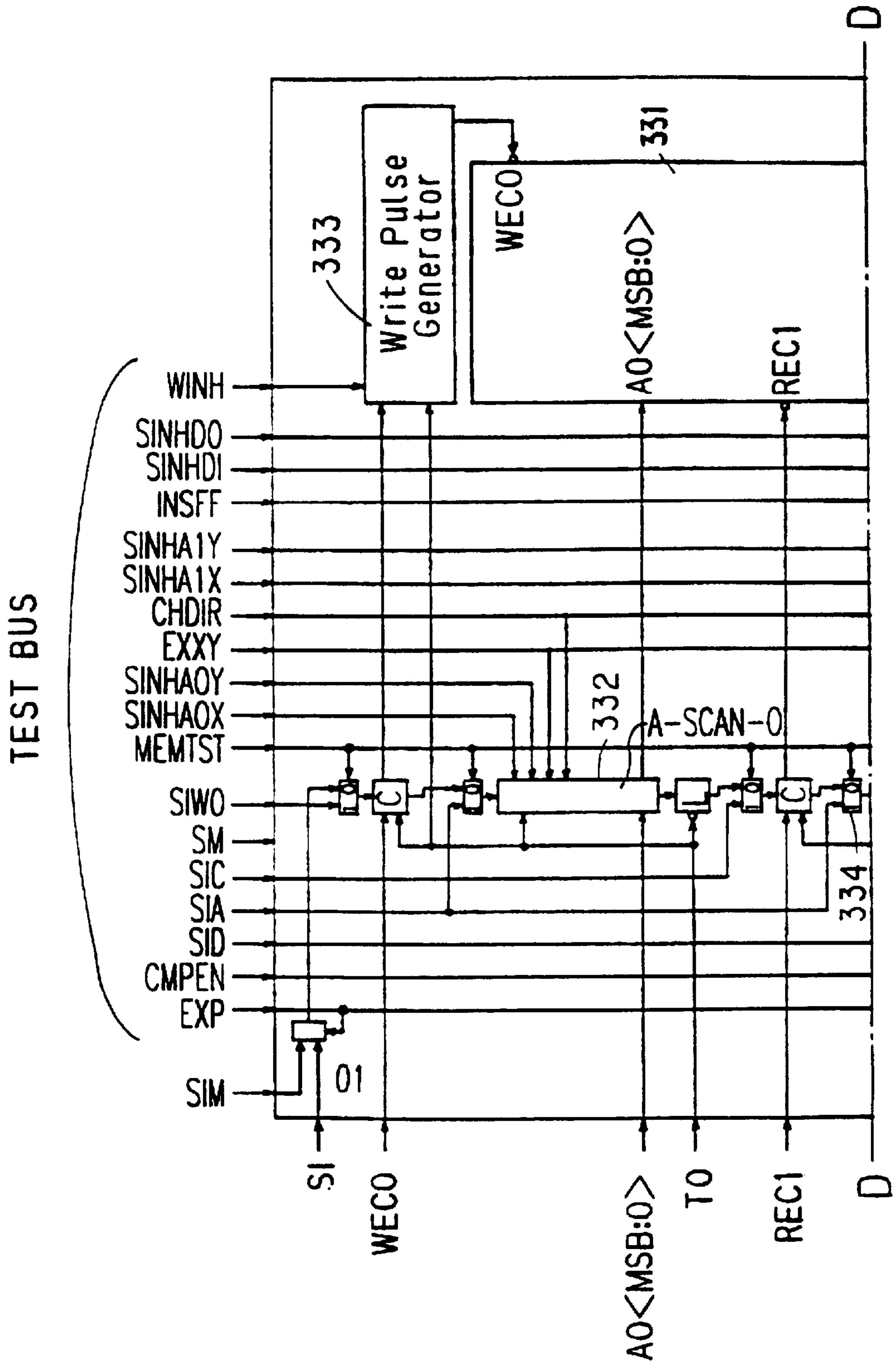
FIG. 91 is a block diagram showing a RAM core and a test circuit in a semiconductor memory testing device according to a fifteenth embodiment of the present invention.

FIGS. 91 and 92 are block diagrams showing a semiconductor memory testing device (2 port RAM having one write port and one read port). These figures are fragmented along the line D—D. Elements having functions which are similar to those of the twelfth embodiment are denoted by the same reference numerals. The semiconductor memory testing device according to this embodiment is so formed as to separately supply addresses and data to respective scan paths 332 serving as shift registers in a normal operation while serially connecting the scan paths 332 with each other for successively shifting data in a RAM test, similarly to the twelfth embodiment. However, the semiconductor memory testing device according to this embodiment is different from that of the twelfth embodiment in a point that an addressing system is divided into two systems of a write-dedicated address system (A0<MSB:0>) and a read-dedicated address system (A1<MSB:0>) so that it is also possible to specify one address (A1<n>) for performing data output (DO1<n>) while writing data in another address (A0<n>) at the same time.

Referring to FIGS. 91 and 92, symbols T0 and T1 denote write and read clock terminals. The two types of clock input terminals are thus set in consideration of a case where separate circuits of different frequencies must be connected to the aforementioned two systems (write/read) of addresses (A0<MSB:0> and A1<MSB:0>) for simultaneously accessing the same. Thus, it is possible to perform writing at 10 MH while performing reading at 20 MH. When a RAM test is made, however, it is necessary to supply clocks of the same frequency to all scan paths 332 since the respective scan paths 332 (A-SCAN-0, A-SCAN-1, DI-SCAN-0 and DO-SCAN-1) operate as serially connected circuits. Therefore, latch circuits ("L" in FIGS. 91 and 92) are interposed between adjacent ones of the scan paths 332 for absorbing timing deviation between the write and read clocks T0 and T1 thereby synchronizing shift operations of the scan paths 332, as shown in FIGS. 91 and 92. Each latch circuit ("L") is so formed as to output a signal when T0 and T1 are negative-inputted and at low levels. An effect which is similar to that of each of the aforementioned embodiments can be attained also by this embodiment.

Sixteenth Embodiment

Figure 121:
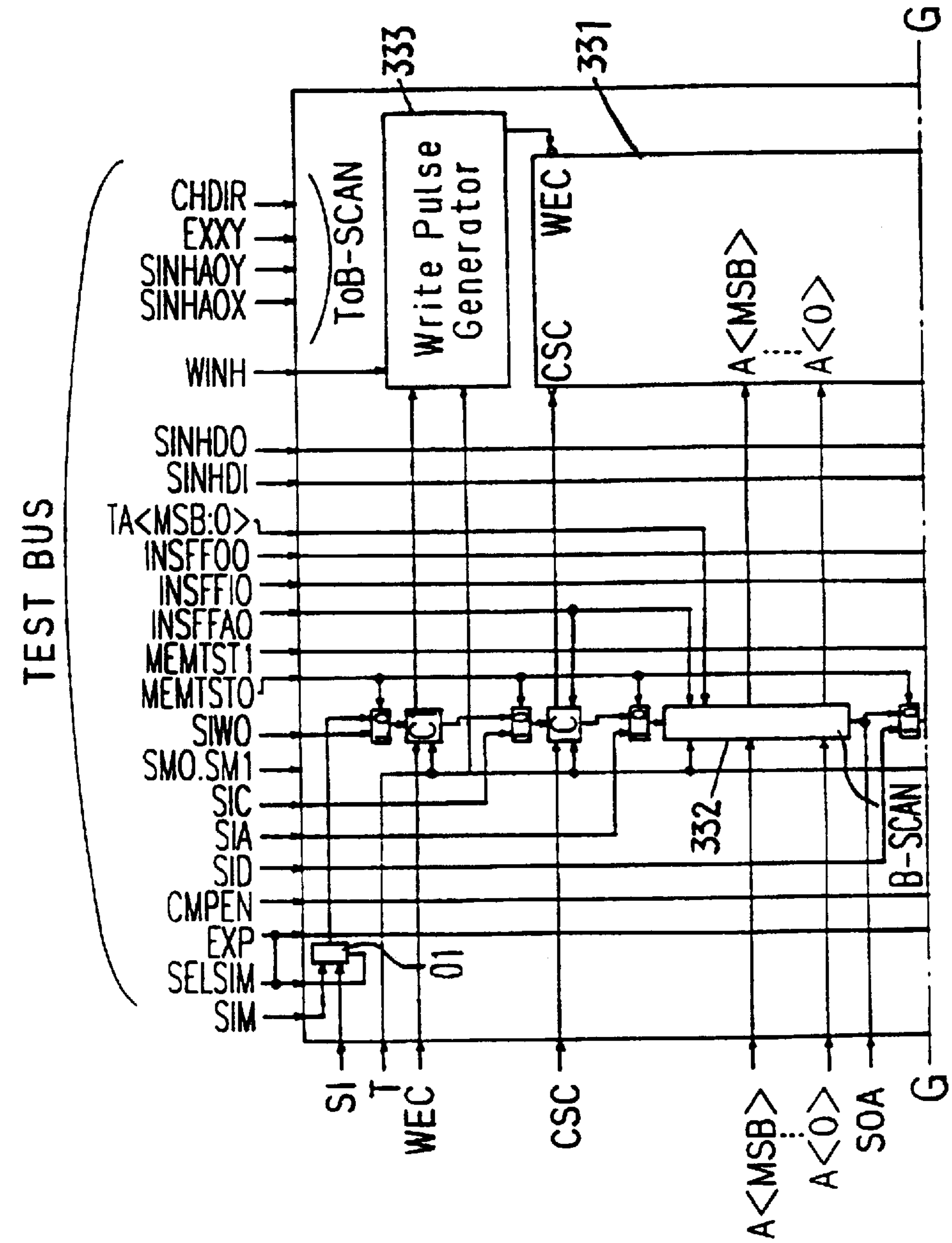
Figure 122:
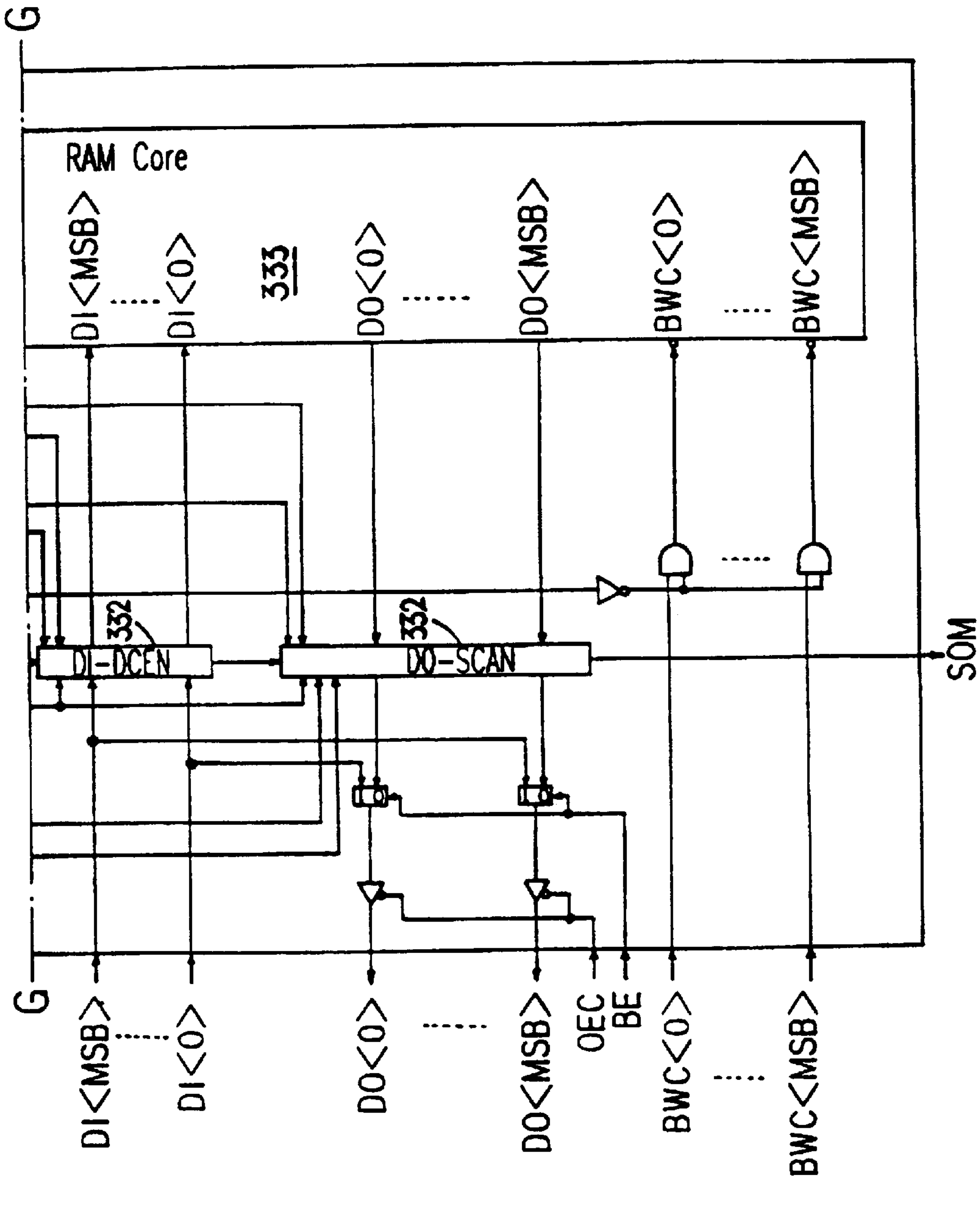
Figure 123:
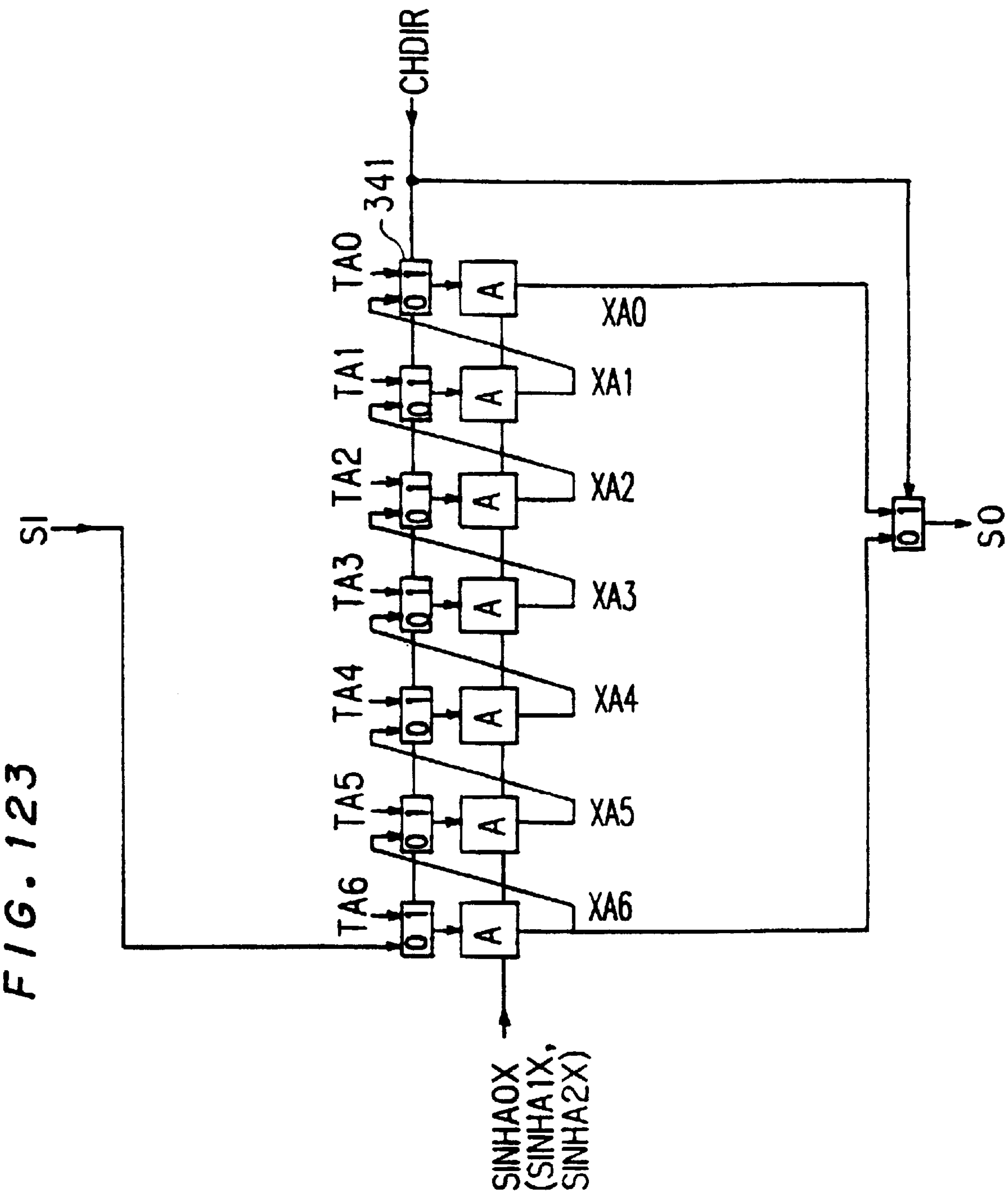

FIGS. 121 and 122 show a semiconductor memory testing device according to a sixteenth embodiment of the present invention, which is similar to that of the twelfth embodiment shown in FIG. 63. FIGS. 121 and 122 are fragmented along the line G—G. Address input scan paths 332 according to this embodiment are prepared from B-SCAN, in place of the address input scan paths 332 (A-SCAN) in the twelfth embodiment (FIG. 63). FIG. 123 shows the internal structure of B-SCAN. This B-SCAN is so formed as to input only X addresses when there are no Y addresses, similarly to the circuit of the twelfth embodiment (FIG. 70). Namely, seven FFs ("A") XA0 to XA6 are serially connected with each other, to be connected to a similar B-SCAN of an adjacent single port RAM. According to this embodiment, however, test address terminals TA (TA0, TA1, TA2, . . . ) are selected when a CHDIR signal is set at "1", dissimilarly to the circuit shown in FIG. 70. As shown in FIG. 121, the test address terminal TA is provided as a pin of the RAM. Thus, it is possible to set addresses in arbitrary order to make a test. Namely, B-SCAN can be addressed by a serial shift operation when the CHDIR signal is "0", while the same can be addressed in a parallel manner by the test address terminal TA when the CHDIR1 signal is "1". An address signal for the test address terminal TA can be supplied from an external pin of an LSI, or by a test address generation circuit (corresponding to 301 in FIG. 60) which is built in the interior of the LSI. This test address generation circuit may be formed by an algorithmic pattern generator which is provided in a memory LSI test device.

Seventeenth Embodiment

A seventeenth embodiment of the present invention is a DFT-RAM type semiconductor memory testing device, and FIG. 133 is a circuit diagram schematically showing its control signal Generation circuit 610. In general, a test pin is switched with a pin which is not employed in test execution by a selector, since the same is not used in a normal operation. However, it may be impossible to insert such a selector in some pin, due to a problem of timing deviation. Further, a pin which cannot operate at the same frequency as the internal frequency cannot be employed as a test pin. The semiconductor memory testing device according to this embodiment is adapted to correct timing deviation when an external signal is in a delay from shift timing of a shift register, for example. In more concrete terms, the device is adapted to substantially delay data shifting with respect to a plurality of shift registers for transmitting control signals to a test circuit which is connected to a memory core by circulating internal data, thereby carrying out the aforementioned timing correction. According to this embodiment, cyclic shift registers 600 provided with loops therein are applied as shift registers of the control signal generation circuit 610. The cyclic shift registers 600 are connected with each other in the control signal generation circuit 610, as shown in FIG. 133. Referring to each cyclic shift register 600 shown in FIG. 133, symbol SI denotes a pin for inputting a shift inhibiting signal (SI), symbol SO denotes an output pin for outputting output data (SO) to the subsequent cyclic shift register 600, and symbol DO denotes a data output pin for outputting output data (DO). Symbol RUNBIST denotes a terminal for inputting a RUNBIST signal which is similar to that shown in FIG. 63, symbol SINH-C denotes a terminal for inputting an SINH signal (shift inhibiting signal), and symbols SR SINHDO, SR SINHDI, SR SINHA1 and SR SINHA0 denote terminals for transmitting inhibiting signals to the test circuit.

FIG. 134 shows the internal structure of each cyclic shift register 600. The cyclic shift register 600 comprises a shift-in selector 601 for selecting the Si signal from the pin SI and the SO signal to the pin SO as data signals to be shifted in, a first register part 603 for data output (DO), and a second register part 604 for outputting the SO signal to the subsequent cyclic shift register 600. The first and second register parts 603 and 604 comprise flip-flops 606_a_ and 606_b_ and selectors 607_a_ and 607_b_ respectively.

A "0" side input terminal of the shift-in selector 601 is connected to the pin SI, while its "1" side input terminal is connected to an output terminal (i.e., the SO terminal) of the second flip-flop 606_b_ of the second register part 604. A "0" side input terminal of the first selector 607_a_ of the first register part 603 is connected to an output terminal of the shift-in selector 601, while its "1" side input terminal is connected to an output terminal of the first flip-flop 606_a_. An input terminal of the first flip-flop 606_a_ of the first register part 603 is connected to an output terminal of the first selector 607_a_, while its output terminal is connected to the DO terminal. A "0" side input terminal of the second selector 607_b_ of the second register part 604 is connected to an output terminal of the first flip-flop 606_a_ of the first register part 603, while its "1" side input terminal is connected to an output terminal of the second flip-flop 606_b_ of the second register part 604. An input terminal of the second flip-flop 606_b_ of the second register part 604 is connected to an output terminal of the second selector 607*b*, while its output terminal is connected to the SO terminal.

Thus, the register parts 603 and 604 are provided with single flip-flops 606*a* and 606*b* and the selectors 607*a* and 607*b* for selecting input signals in the flip-flops 606*a* and 606*b*, whereby outputs from the flip-flops 606*a* and 606*b* can be fed back to be again inputted in the flip-flops 606*a* and 606*b*. Further, the output terminal of the flip-flop 606*b* of the second register part 604 is connected to one input terminal of the shift-in selector 601, whereby the SO signal can be again inputted in the first register part 603 by switching the RUNBIST signal.

Such a control signal generation circuit 610 is connected to a test circuit 611 as shown in FIGS. 135 and 136. FIGS. 135 and 136 are fragmented along the line K—K. Referring to FIGS. 135 and 136, symbols SR SINHA1 and SR SINHA0 denote cyclic shift registers for generating shift inhibiting signals (SINHA1 and SINHA0) for controlling address input scan paths (A-SCAN-1 and A-SCAN-0), symbol SR SINHDO denotes a cyclic shift register for generating a shift inhibiting signal (SINHDO) for controlling a data output scan path (DO-SCAN-1), symbol SR SINHDI denotes a cyclic shift register for generating a shift inhibiting signal (SINHDI) for controlling a data input scan path (DI-SCAN-0), symbol SR SIW denotes a cyclic shift register for generating an SIW signal for controlling a write signal (WEC) input register, symbol SR SIC denotes a cyclic shift register for controlling a read signal (REC) input register, symbol SR SID denotes a data input cyclic shift register, symbol SR CMPEN denotes a cyclic shift register for transmitting a comparison enable signal (CMPEN) to the data output scan path, and symbol SR EXP denotes a cyclic shift register for transmitting an expected value signal (EXP) to the data output scan path. Referring to FIGS. 135 and 136, further, numeral 613 denotes a test pattern generation circuit, numeral 614 denotes an address pattern generation circuit, numeral 615 denotes a RAM core, symbols A00 to A03 denote write address pins for the RAM core 615, symbols A10 to A13 denote read address pins, symbols DI0 to DI3 denote data input pins, and symbols DO0 to DO3 denote data output pins. The test pattern generation circuit 613 is formed by the address pattern generation circuit 614 and a plurality of 2-bit cyclic shift registers 600 (SR SINHA1, SR SINHA0, SR SINHDO, SR SINHDI, SR SIW, SR SIC, SR SID, SR CMPEN and SR EXP).

<Operation>

Operations of the semiconductor memory testing device having the aforementioned structure are described. First, initial values of the shift registers are set. In this case, SINH-C and RUNBIST are set at 0, to make the shift registers shiftable. Initial value data are inputted from an input terminal SI. Then, the values of the shift registers are held. In this case, SINH-C is set at 1 to inhibit shift operations of the shift registers, thereby holding the data. Then, a test signal is generated. At this time, SINH-C and RUNBIST are set at 0 and 1 respectively. "1010 . . . " is generated as the DO signal when "10" is set in the shift registers, for example.

Reading of the RAM core 615 is carried out when REC="0". Data are written in the RAM core 615 when WEC="0". The data output scan path (DO-SCAN-1) compares a data output of the RAM core 615 with the expected value (EXP) when CMPEN="−1", so that its value becomes "0" when these values are different from each other.

Then, "111 . . . " is set in the data output scan path (DO-SCAN). In order to execute a test of the RAM core 615, it is necessary to set all data output scan paths (DO-SCAN) at "1". SR SINHDI and SR SINHDO are set at "00", and "000 . . . " are outputted as the shift inhibiting signals (SINHDI and SINHDO), so that the data input scan paths (DI-SCAN) and the data output scan paths (DO-SCAN) can make shift operations at a normal operation frequency. Further, SID is set at "1", and the data input scan path (DI-SCAN) is initialized at "1".

1. ALL-0 Write,/Read Operation

An ALL-0 write/read operation is described as an exemplary operation in test execution. The ALL-0 write/read test is a method of inputting "0" as all data, and thereafter reading such all "0" data.

First, all data input scan paths (DI-SCAN) are set at "0" (ALL-0). In this case, SR SINHDO is set at "11", to inhibit shift operations of the data output scan paths (DO-SCAN) and maintain the states of "1" (ALL-1) as to all data. At this time, SR SIW is set at "11" since no data are written in the RAM core 615. Further, SR SIC is set at "11" since no data are read from the RAM core 615. In addition, SR CMPEN is set at "00" since the data output of the RAM core 615 is not compared with the expected value (EXP).

Then, address initial values are set in the address input scan paths (A-SCAN-0 and A-SCAN-1). In this case, "00" are set in SR SINHA0 and SR SINHA1 respectively. The address pattern generation circuit 614 transmits the SIA signal, to set address initial values of the RAM core 615. At this time, SR SINHDI and SR SINHDO are set at "1" respectively, to inhibit shift operations of the data input scan paths (DI-SCAN) and the data output scan paths (DO-SCAN). SR SIW is set at "11", since no data are written in the RAM core 615. SR SIC is set at "11", since no data are read from the RAM core 615. SR CMPEN is set at "00", since the data output of the RAM core 615 is not compared with the expected value (EXP).

Then, ALL-0 writing is executed. In this case. "00" are set in SR SINHA0 and SR SINHA1 respectively The address pattern generation circuit 614 outputs the SIA signal for performing addressing. At this time, SR SINHDI and SR SINHDO are set at "11" respectively, to inhibit shift operations of the data input scan paths (DI-SCAN) and the data output scan paths (DO-SCAN). SR SIW is set at "00" to write data in the RAM core 615. SR SIC is set at "11" since no data are read from the RAM core 615. SR CMPEN is set at "00" since the data output of the RAM core 615 is not compared with the expected value (EXP).

Then, address initial values are set in the address input scan paths (A-SCAN-0 and A-SCAN-1). In this case, "00" are set in SR SINHA0 and SR SINHA1 respectively. Address initial values are set by the SIA signal from the address pattern generation circuit 614. At this time, SR SINHDI and SR SINHDO are set at "11" respectively, to inhibit shift operations of the data input scan paths (DI-SCAN) and the data output scan paths (DO-SCAN). At this time, SR SIW is set at "11" since no data are written in the RAM core 615. Further, SR SIC is set at "11" since no data are read from the RAM core 615. In addition, SR CMPEN is set at "00" since the data output of the RAM core 615 is not compared with the expected value (EXP).

Then, ALL-0 reading is executed. In this case, "00" are set in SR SINHA0 and SR SINHA1 respectively. Addressing is performed in a normal operation by the SIA signal from the address pattern generation circuit 614. At this time, SR SINHDI and SR SINHDO are set at "11" respectively, to inhibit shift operations of the data input scan paths (DI-SCAN) and the data output scan paths (DO-SCAN). The write signal SR SIW for the RAM core 615 is set at "11", to inhibit writing in the RAM core 615. The read signal SR SIC is set at “11”, to read data from the RAM core 615. SR CNPEN is set at “11” and SR EXP is set at “00”, to compare the data output of the RAM core 615 with the expected value (EXP). If the RAM core 615 is in failure. “0” are stored in corresponding bits of the data output scan paths (DO-SCAN).

2. March Test

Description is now made with reference to a march test. As described with reference to the second prior art, this test is adapted to update initially stored data (“0”, for example) to novel storage data (“1”) as to all addressing data for all RAMs.

Similarly to the ALL-0 write/read operation, the data input scan paths (DI-SCAN) are set at ALL-0. Then, address initial values are set in the address input scan paths (A-SCAN-0 and A-SCAN-1). ALL-0 writing is executed.

Then, address initial values are set in the address input scan paths (A-SCAN-0 and A-SCAN-1). “1” are set in the data input scan paths (DI-SCAN). “11” are set in SR SINHA0, SR SINHA1 and SR SINHDO respectively. SR SINHDI is set at “00” and SID is set at “1”, while ALL-1 are set in the data input scan paths (DI-SCAN). Address initial values are set in the address input scan paths (A-SCAN-0 and A-SCAN-1).

Thereafter “0” are read and “1” are written. In this case, “01” are set in SR SINHA0 and SR SINHA1 respectively. Addressing is performed at a frequency half that in the normal operation, by the SIA signal from the address pattern generation circuit 614. At this time, SR SINHDI and SR SINHDO are set at “11” respectively, to inhibit shift operations of the data input scan paths (DI-SCAN) and the data output scan paths (DO-SCAN). SR SIW and SR SIC of the RAM core 615 are set at “10” and “01” respectively, to alternately read “0” and write “1”. SR CMPEN is set at “01” and SR EXP is set at “00” respectively, to compare the data output of the RAM core 615 with the expected value (EXP). If the RAM core 615 is in failure at this time, “0” are stored in corresponding bits of the data output scan paths (DO-SCAN).

When the test result is outputted, “01” are set in the 2-bit cyclic shift registers 600 (SR SINHA1. SR SINHA0, SR SINHDO and SR SINHDI). At this time, shift operation signals SINHA0, SINHA1, SINHDI and SINHDO generate “010101 . . . ”. Therefore, the scan paths in the test circuit for the RAM core 615 perform shift-out operations at an operation frequency half that in the normal operation, whereby output pins corresponding to low frequencies can be allotted to test data output pins.

Thus, both of first and second selectors are switched to other input terminals so that output data are again inputted in the flip-flops of the respective register parts, whereby the data are circulated in the respective register parts to be again incorporated in the original flip-flops even if the respective register parts are shifted, so that a function which is substantially similar to that of stopping shift operations can be attained for correcting the aforementioned timing deviation. Thus, it is possible to reduce the number of test pins, while pins which cannot operate at the same frequency as the internal frequency can be applied to test result output pins.

Eighteenth Embodiment

<Structure>

FIG. 137 shows a semiconductor memory testing device (DFT-RAM) according to an eighteenth embodiment of the present invention. As shown in FIG. 137, the DFT-RAM according to this embodiment which is obtained by applying the 2-bit cyclic shift register 600 in expansion to another control signal generation circuit of a test circuit for the DFT-RAM, comprises a test pattern generation circuit 625 which is formed by combination of a control signal generation circuit 621, an address generation circuit 622, a burn-in pattern generation circuit 623 and a data input circuit 624, and circuit timing correction means (321, 322, 323, 325, 326, 327, 344 and 345) similar to that shown in FIG. 82. The control signal generation circuit 621, the address generation circuit 622, the burn-in pattern generation circuit 623 and the data input circuit 624 are connected in series with each other. The burn-in pattern generation circuit 623, which can be simply combined with the address generation circuit 622 or the control signal generation circuit 621 as shown in FIG. 50 or 52, is independent of other circuits.

FIGS. 138 and 139 illustrate the test pattern generation circuit 625 in more detail. FIGS. 138 and 139 are fragmented along the line L—L. For the purpose of simplification, MEMTST0 and MEMTST1 are integrated into MEMTST, and INSFFA0, INSFFA1, INSFFI0 and INSFFO1 are integrated into INSFF, while SELSIM and EXP are integrated into EXP. No bit write functional test is assumed in this embodiment. The control signal generation circuit 621, the address generation circuit 622, the burn-in pattern generation circuit 623 and the data input circuit 624 shown in FIGS. 138 and 139 correspond to the test pattern generation circuit 301 in the thirteenth embodiment shown in FIG. 82.

Functions of respective control signals appearing in FIGS. 138 and 139 are described. An SM signal is a switching signal for the shift mode of each shift register. Symbol SINHA1X denotes a shift inhibiting signal for a shift register of a read X address part. Symbol SINHA1Y denotes a shift inhibiting signal for a shift register of a read Y address part. Symbol SINHA0X denotes a shift inhibiting signal for a shift register of a write X address part. Symbol SINHA0Y denotes a shift inhibiting signal for a shift register of a write Y address part. Symbol SINHDO denotes a shift inhibiting signal for a shift register of a data input part. Symbol SINHDI denotes a shift inhibiting signal for a shift register of a data output part. The signals SINHA1X, SINHA1Y, SINHA0X, SINHA0Y, SINHDO and SINHDI inhibit shift operations of respective scan paths in a test circuit 631 shown in FIGS. 140 and 141 by outputting “1” respectively. FIGS. 140 and 141 illustrate a RAM core and the test circuit of the semiconductor memory testing device according to this embodiment. These figures are fragmented along the line M—M.

Respective scans (A-SCAN-0, A-SCAN-1, DI-SCAN-0 and DI-SCAN-1) in the test circuit 631 are made parallel when MEMTST=“1”, while respective scans (A-SCAN-0, A-SCAN-1, DI-SCAN-0 and DI-SCAN-1) in the test pattern generation circuit 613 are connected in series with each other when MEMTST=“0”.

Symbol SIWO denotes a write signal, and writing in the RAM is performed when SIW=“0”. Symbol SIC denotes a read signal, and reading from the RAM is performed when SIC=“0”.

Symbol SID denotes input data in the shift registers of the data input part and the data output part. Symbol CMPEN denotes a comparison enable signal, and symbol EXP denotes an expected value. The data output part shift register compares a data output of a RAM core 632 with the expected value (EXP) when CMPEN=“1”, so that the value of the shift register becomes “0” if the values are different from each other.

Symbol CHDIR denotes the direction of a shift operation of the address part shift register. The shift register is forwardly shifted when CHDIR=“0”, while the same is reversely shifted when CHDIR=“1”.

Symbol WINH denotes a control signal for a write pulse generator of the RAM, and writing in the RAM is inhibited when the WINH signal is "1".

In the test pattern generation circuit 625 shown in FIGS. 138 and 139, the control signal generation circuit 621 for generating control signals SINHAX1c, EXXYc, SINHAX0c, SINHDOc, SINHDIc, MEMTSTc, SIW0c, SICc, SIDc, CMPENc, EXPc, CHDIRc and SINH-LXc is formed by connecting all 2-bit cyclic shift registers 60 in series as shown in the control signal generation circuit 610 according to the seventeenth embodiment shown in FIG. 133. Symbol SINH-LXc denotes a shift register inhibiting signal for the address generation circuit 622.

<Operation>

1) In Normal Operation

In a normal operation of the RAM, BURNIN, RAMBIST, SMX, WINHX and INSFFX are set at 0. At this time, test buses excluding SID, SIC, SIW0 and SIA are set at "0" respectively, to bring the RAM test circuit into an inoperative (disabled) state. Respective signals SID, SIC, SIW0 and SIA exert no influence on the RAM when the MEMTST signal is "0", regardless-of values thereof. This is because shift registers A-SCAN-0, A-SCAN-1, DI-SCAN-0 and DO-SCAN-1 for the RAM test circuit are connected in series with each other so that the signals SID, SIC, SIW0 and SIA are not inputted in the respective shift registers, as understood from FIGS. 139 and 140.

2) In Scan Test

In a scan test for a logic part, BURNIN, RAMBIST, SMX, WINHX and INSFFX are set at 0, 0, 1/0, 0/1 and 1 respectively. It is assumed that the RAM and a scan path of the logic part are connected as shown in FIG. 62. At this time, the control signal generation circuit 610 is so structured as to integrate respective shift registers in the RMI into a single scan path and to generate the same SM signal as that employed for a logic test when MEMTEST is set at "0". This, it is possible to handle the scan path in the DFT-RAM equivalently to that in the logic part. Other test signals are zeroed to exert no influence on the scan test.

When the RAM is tested by the scan test, the WINHX signal is zeroed to allow writing in the RAM. When no test for the RAM is performed, on the other hand, the WINH signal is converted to "1" to inhibit writing in the RAM.

3) In Burn-In Test Execution

In burn-in test execution, BURNIN is set at "1". A dynamic burn-in pattern is generated only in the BURNIN signal. SIA, SID, SIC and SIW0 signals are generated in the burn-in pattern generation circuit 623, to be supplied to the test circuit 631. This embodiment is so structured that a selector selects the SIA, SID, SIC and SIW0 signals when the BURNIN signal is "1". SINHA1X, SINHA1Y, SINHA0X, SINH0Y, SINHDO and SINHDI are converted to "0" respectively, to perform shift operations of the respective scan paths. Since the BURNIN signal is converted to "1" in burn-in execution according to this embodiment, the outputs SINHAX1c, SINHASY1c, SINHDOc and SINHDIc and an inverted signal of the BURNIN signal are ANDed respectively to set "0", for performing shift operations of the respective scan paths.

MEMTST is converted to "1", to bring the respective scan paths into parallel states. According to this embodiment, the MEMTSTc signal and the BURNIN signal are ORed to generate "1", thereby bringing the respective scan paths into parallel states. The SM signal is converted to "1", to attain a shift mode. The SM signal and the BURNIN signal are ORed to convert the SM signal to "1". The comparison enable signal (CMPEN) and the EXP signal exert no influence on the operation of the RAM test circuit 631. The respective signals and the inverted signal of the BURNIN signal are ANDed so that the same are fixed at "0" in a burn-in operation. It is necessary to fix CHDIR and EXXY signals at "0" or "1" in the burn-in operation. According to this embodiment, the respective signals and the inverted signal of the BURNIN signal are ANDed to fix the CHDIR and EXXY signals at "0" in the burn-in operation. It is necessary to fix the WINH signal at "1" in the burn-in operation, since writing in the RAM is controlled by SIW. The WINH signal and the inverted signal of the BURNIN signal are ANDed to implement fixation at "1".

4) In RAM Test

When a RAM test mode is set, BURNIN, RAMBIST, SMX, WINHX and INSFFX are set at 0, 1, 1, 0 and 1 respectively. SINHAX1, SINHAX0, SINHDI and SINHDO generate "1" to inhibit shift operations of the respective shift registers of the test circuit 631 in the RAM, thereby holding values of the shift registers. The SIWO signal generates "1", to inhibit writing in the RAM core 632. The WINH signal generates "1", to inhibit writing in the RAM core 632. The comparison enable signal (CMPEN) generates "0", to inhibit comparison of the output from the RAM core 632 and the expected value (EXP).

When the control signal generation circuit 621 and the address generation circuit 622 actually generate test patterns (RUNBIST="1"), the address generation circuit 622 generates the SIA signal.

As to SM, INSFF and WINH signals, SMX, INSFFX and WINHX signals are supplied to the DFT-RAM as such.

SIW0 is obtained by ORing SIWc generated by a control signal and SIWOa generated from the address generation circuit 622.

The comparison enable signal (CMPEN) is obtained by ANDinG CMPENc generated as a control signal and CMPENa generated from the address generation circuit 622.

Other signals input data which are outputted from the control signal generation circuit 621 in the DFT-RAM.

5) Description of Test Pattern

The test patterns generated from the control signal generation circuit 621 are now described in more concrete terms.

(ALL "1"/"0" Test)

An ALL "1"/"0" test is executed in the following procedure:

1. DO-SCAN is set at "111 . . . 1".
2. DI-SCAN is set at "111 . . . 1".
3. A-SCAN-0 and A-SCAN-1 are initialized.
4. Data of DI-SCAN are written in the RAM in forward addressing. Since "1" are written in all shift registers of DI-SCAN, ALL "1" writing is performed as the result.
5. A-SCAN-0 and A-SCAN-1 are initialized.
6. The RAM data is compared with the read expected value. Namely, ALL "1" reading is carried out.
7. A reverse (inverted) pattern operation is carried out for the above 2. to 6. Namely, ALL "0" writing/ALL "0" reading is carried out.
8. A similar test is made with respect to 2. to 7. in reverse addressing.
9. The test result is outputted.

(March Test)

The march test is executed in the following procedure:

1. DO-SCAN is set at "111 . . . 1".
2. DI-SCAN is set at "111 . . . 1".
3. A-SCAN-0 and A-SCAN-1 are initialized.
4. DI data are written in the RAM in forward addressing.
5. A 1-read/0-write operation is carried out in forward addressing.

6. DI-SCAN is set at "000 . . . 0".
7. A-SCAN-o and A-SCAN-1 are initialized.
8. A 0-read/1-write operation is carried out in reverse addressing.
9. A reverse (inverted) pattern operation is carried out with respect to 2. to 8.
10. The test result is outputted.

(Row Bar/Column Bar/Checker Board Pattern Test)

1. DO-SCAN is set at "111 . . . 1".
2. DI-SCAN is set at "111 . . . 1".
3. A-SCAN-0 and A-SCAN-1 are initialized.
4. DI-SCAN data are written in the RAM as to only specific addresses while performing forward addressing by the address generation circuit 622.

(An ALL "1" write operation is carried out with respect to only specific addresses).

5. DI-SCAN is set at "000 . . . 0".
6. A-SCAN-0 and A-SCAN-1 are initialized.
7. DI-SCAN data are written in the RAM with respect to the addresses in which no data are written in 4, while performing forward addressing in the address generation circuit 622 (An ALL "0" write operation is carried out).
8. A-SCAN-0 and A-SCAN-1 are initialized.
9. A "1" read operation is performed with respect to the addresses in which "1" is written in 4, while performing forward addressing in the address generation circuit 622.
10. A-SCAN-0 and A-SCAN-1 are initialized.
11. A "0" read operation is performed with respect to the addresses in which "0" are written in 7, while performing forward addressing in the address generation circuit 622.
12. A reverse (inverted) pattern operation is carried out with respect to 2. to 11.
13. Reverse addressing is carried out with respect to 2. to 12.
14. The test result is outputted.

In order to execute the aforementioned test pattern, the control signal generation circuit 621 may be set as follows:

SM="1" (for bringing a DFT part into a scan mode)

MEMTST="1" (for bringing respective scans of the DFT into parallel states)

WINH="0" (for bringing the write pulse generator of the RAM into an enabled state)

(Setting of DO-SCAN at "111 . . . 1")

Before starting the test, "111 . . . 1" is previously set in the DO-SCAN as failure decision data. In test execution, the bit of failing data becomes "0" so that it is possible to recognize a failure bit. SID is converted to "1" as input data of DO-SCAN, and hence "11" is set in the cyclic shift register SID of the control signal generation circuit 621.

(Setting of DO-SCAN at "111 . . . 1")

Data to be written in the RAM are set from SID. A BIST controller according to this embodiment sets the DI-SCAN in the following pattern:

"111 . . . "

"000 . . . "

"0101 . . . "

"1010 . . . "

At this time, CMPEN and SINH-DO are converted to "0" and "1" respectively, so that data of DO-SCAN remain unchanged. Further, SINH-AX0 and SINH-AX1 are converted to "1", so that A-SCAN-0 and A-SCAN-1 remain unchanged.

(Initialization of A-SCAN-0 and A-SCAN-1)

Initial address values of the RAM are set.

At this time, CMPEN and SINIH-DO are converted to "0" and "1" respectively, so that the data of DO-SCAN remain unchanged. Further, SINH-DI is converted to "1" so that data of DI-SCAN remain unchanged.

(Addressing)

The RAM addresses are supplied by inputting the SIA signal generated by the address generation circuit 622 from the address scan registers.

In a RAM writing operation for carrying out the ALL "0"/"1" test and a row bar/column bar/checker board pattern test as to the write signal SIWOc and the comparison enable signal CMPENc generated from the control signal generation circuit 621, SIW and CMPEN are preferably converted to "0", and hence "00" are set in SIWO and CMPEN of the control signal generation circuit 621, while "11" are set in SIW and CMPEN in RAM reading.

In normal addressing, SINHA0X, SINHA0Y, SINHA1X and SINHA1Y are converted to "0" respectively, to attain a shift-operable state.

In the march test, each address is shifted once in two cycles. Thus, SINHLX is set at "01", so that the address generation circuit 622 generates each address in two cycles. SINHA0X, SINHA0Y, SINHA1X and SINHA1Y generate "010101 . . . " respectively since each of A-SCAN-0 and A-SCAN-1 is similarly shifted once in two cycles.

In the row bar/column bar/checker board pattern test, the address generation circuit 622 generates a write signal SIWOa and a comparison enable signal CMPENa for each pattern, as described with reference to the address generation circuit 622. If addresses of the RAM are not 2n, it generates the SIWOa signal and the comparison enable signal (CMPEN) for inhibiting writing and comparison when the shift register of the address part of the RAM is a non-existing address.

The comparison enable signal (CMPEN) generated from the test pattern generation circuit 625 ANDs the CMPENa signal from the address generation circuit 622 and the CMPENc signal from the control signal generation circuit 621. The SIW0 signal ORs the SIWa signal generated from the address generation circuit 622 and the SIWc signal from the control signal generation circuit 621.

It is possible to set SINH-A0 and SINH-A1 at "0" respectively for making addressing similarly to a single port RAM. or to set SINH-A0 and SINH-A1 at "0" and "1" respectively for making addressing only in a write port.

Reverse addressing is enabled when CHDIR is set at "1".

EXXY is set at "1" for performing addressing while exchanging lower and upper addresses.

(Writing Data in RAM)

A set value of DI-SCAN is written in the RAM. When DI-SCAN is set at "11 . . . 1", for example, an ALL "1" write operation is made in the RAM. SIW is set at "0". At this time, CMPEN and SINH-DO are set at "0" and "1" respectively, so that data of DO-SCAN remain unchanged. SINH-DI is set at "1", so that data of DI-SCAN remain unchanged.

(Reading Data from RAM)

Output data of the RAM is read to be compared with the expected value (EXP). When the output data is different from the expected value, the FF of the failure bit of the DO-SCAN is reset at "0". Similarly to a write command, addressing which is similar to that in the single port RAM or addressing of only a read port is possible. Reverse addressing is enabled by setting CHDIR at "1".

At this time, SINH-DO is set at "1" so that data of DO-SCAN is not shifted.

(Performing "1" Write/"0" Read Operation)

According to this instruction, a set value of DI-SCAN is written in the RAM, and output data of the RAM is read to be compared with the expected value (EXP). When "1111 . . . 1" is set in DI-SCAN and EXP is set at "0", for example, a "1" write/"0" read operation is attained. SIC="0", SIW="10" and CMPEN="10" are set in the cyclic shift register of the control signal generation circuit 621, so that:

SIC="010101 . . . "

SIW="101010 . . . "

CMPEN="101010 . . . "

SINH-A0/SINH-A1="010101 . . . "Reverse addressing is enabled by setting CHDIR at "1".

(Outputting Test Result) SINHA0X, SINHA1X, SINHA1X, SINHA1Y, SINHDI and SINHDO are set similarly to the seventeenth embodiment. As to other signals, "00" are set in the respective cyclic shift registers 600, to exert no influence on the test circuit 631.

As hereinabove described, it is possible to generate a test signal which is suitable for the DFT-RAM by a simple circuit which is formed by the 2-bit cyclic shift registers 600.

Further, it is possible to readily expand/reduce functions with respect to RAM test pins since the same circuits are connected in series with each other.

Further, the circuits for generating shift inhibiting signals are formed by the cyclic shift registers 600, thereby freely changing shift operation speeds. In particular, a normal operation test is made in test execution and the frequency is reduced as compared with that in the normal operation for outputting the test result, so that the test result can also be outputted from an output pin not corresponding to a high speed operation.

Nineteenth Embodiment

<Structure>

FIG. 142 is a block diagram schematically showing a self-correcting semiconductor memory testing device according to a nineteenth preferred embodiment of the present invention. The self-correcting semiconductor memory testing device, owing to a redundancy circuit incorporated therein, ensures an operation of the system even when a RAM malfunctions. The memory testing device includes a known power on reset circuit 701 for detecting turning on of power and outputting a reset signal, a self test circuit 702 for testing the RAM in accordance with the reset signal from the power on reset circuit 701, a RAM with test circuit 703, a redundancy circuit 704 for compensating for an error in data, a logic circuit 705 having a predetermined logic structure, and register circuit 706 (means for designating a failure data digit: means for holding binary data) for displaying the presence or the absence of data in the form of binary data. The self-correcting semiconductor memory testing device may be formed on an 1-chip LSI or may be formed by a plurality of chips and discrete parts. When the self-correcting semiconductor memory testing device is constructed so that the RAM 703 has a register function (For instance, when a plurality of flip-flops including data feedback loop wires are formed as in FIG. 1, 6, 11, 17, 18, 19, 20 or 21), the register circuit 706 may be omitted.

The self test circuit 702 includes a microcomputer 702*a* as shown in FIG. 143. A program stored in a ROM or a RAM (not shown) of the microcomputer 702*a* controls a self test operation. Since it is possible to supply a test result to the microcomputer 702*a* and transmit to the entire system (e.g., a system of upper hierarchy) through an input/output port of the microcomputer 702*a*, it is possible that the upper hierarchy system recognizes a failure, and hence, it is possible to maintain the upper hierarchy system in an easy manner. For example, when there are too many failures for the redundancy circuit 704 to compensate, the upper hierarchy system can recognize this and stop the system operation. In FIG. 143, the reset signal from the power on reset circuit 701 is indicated as "Reset Signal," a test pattern signal supplied to the RAM with test circuit 703 is indicated as "Test Pattern" and a register control signal supplied to the register circuit 706 is indicated as "Register Control."

Figure 69:
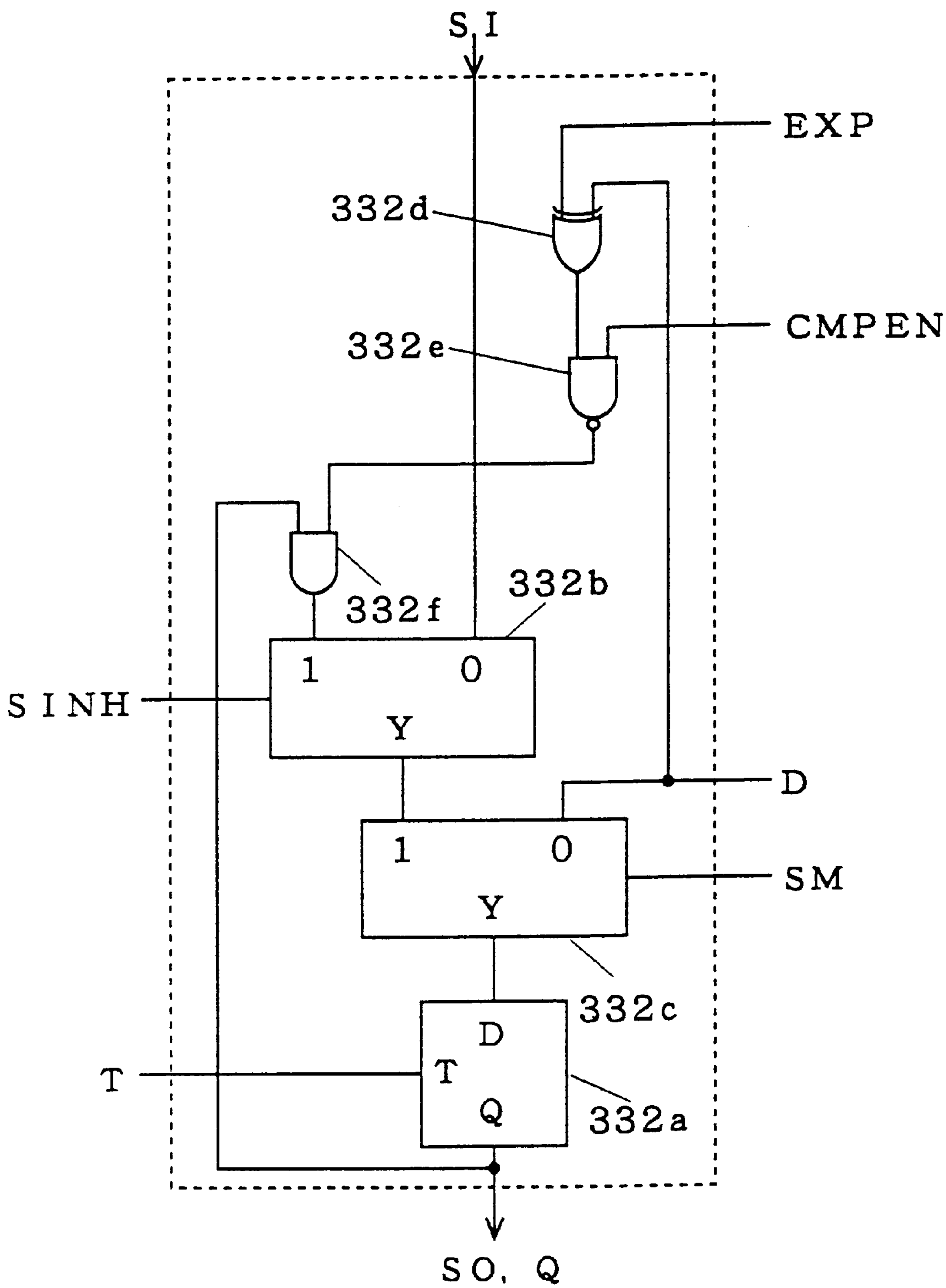
FIG. 69 is a block diagram showing the internal circuit of the data input scan path according to the twelfth embodiment of the present invention.

First, the redundancy circuit 704 as it is structured to be able to compensate only 1 bit will be described in reference to FIG. 144 which shows connection between the RAM with test circuit 703 of FIG. 142 and the redundancy circuit 704 in detail. The RAM with test circuit 703 may be the RAM shown in FIG. 64 or 65. In FIG. 144, the symbols SO<0> to SO<5> (hereinafter "SO<>" when referred to collectively) indicate a test result signal, e.g., the serial output signal SO outputted from each one of the scan FFs (FIG. 69, for instance) which form the structure of FIG. 95. With respect to the RAM with test circuit 703, in FIG. 144, address signals are indicated at A(0> to A<3> (hereinafter "A<>" when referred to collectively), data input terminals are indicated at DI<0> to DI<5> (hereinafter "DI<>" when referred to collectively), a write enable signal is indicated at WE, data output terminals are indicated at DO<0> to DO<5> (hereinafter "DO<>" when referred to collectively), and bit write control terminals are indicated at BWC<0> to BWC<5> (hereinafter "BWC<>" when referred to collectively). The RAM of this example includes four address signals and the bit data number is six. The symbols BWC<> indicate those signals which control writing for every data bit. For example, when BWC<3>="1," BWC<0>="0," BWC<1>="0," BWC<2>="0," BWC<4>="0," BWC<5>="0" and the signal WE is active, writing data of DI<3> is prohibited.

Figure 146:
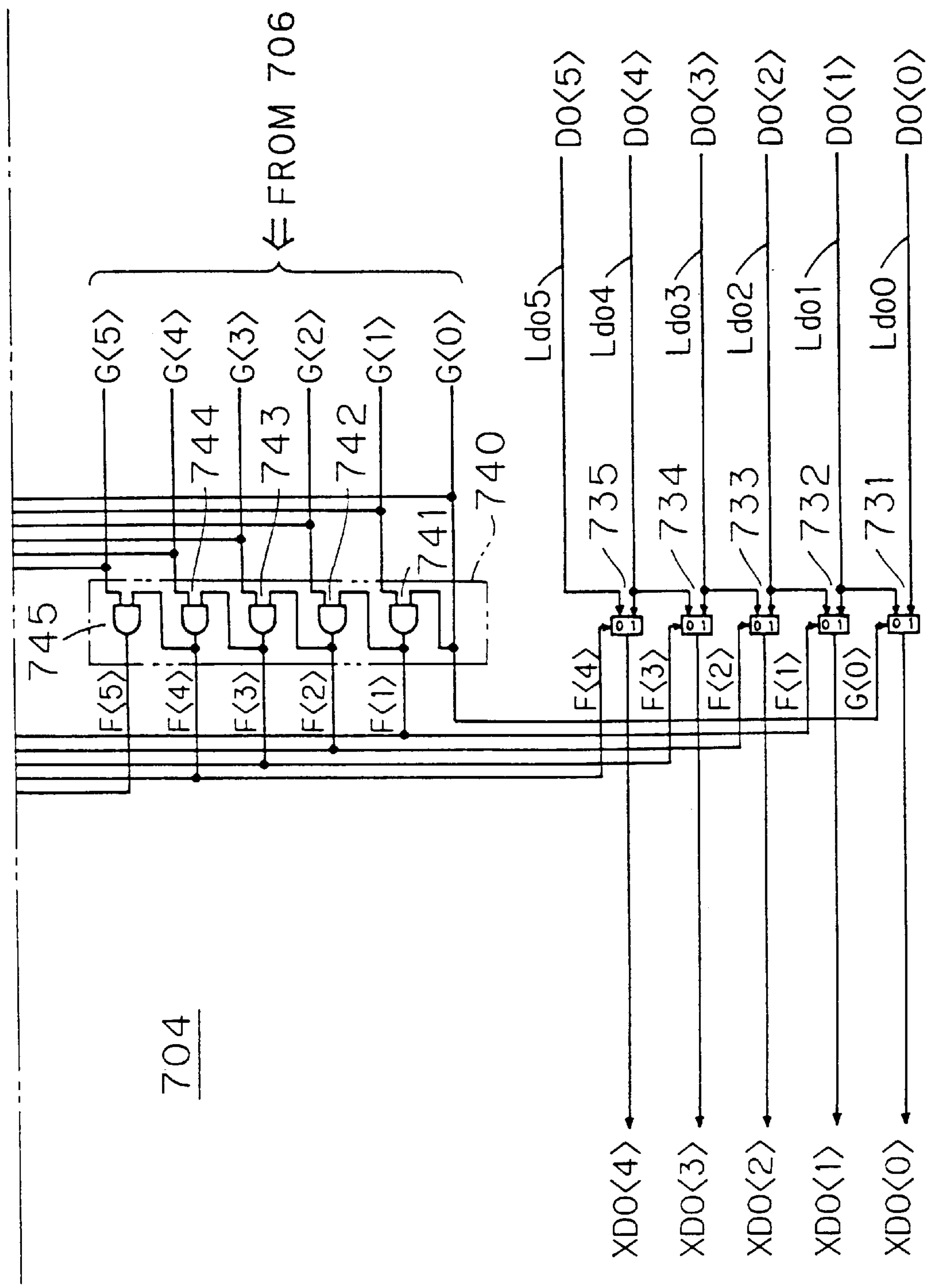

The redundancy circuit 704 has such a structure-as that shown in FIG. 145 or 146. In FIGS. 145 and 146, indicated generally at DI<0> to DI<4> (hereinafter "DI<>" when referred to collectively) are data input signal output terminals, indicated generally at DO<0> to DO<4> (hereinafter "DO<>" when referred to collectively) are data output signal output terminals, indicated generally at G<0> to G<5> (hereinafter "G<>" when referred to collectively) are test result input terminals, indicated generally at BWC<0> to BWC<5> (hereinafter "BWC<>" when referred to collectively) are bit write control signal output terminals, indicated generally at XDI<0> to XDI<4> (hereinafter "XDI<>" when referred to collectively) are data input terminals, indicated generally at XDO<0> to XDO<4> (hereinafter "XDO<>" when referred to collectively) are data output terminals, and indicated generally at XBWC<0> to XBWC<4> (hereinafter "XBWC<>" when referred to collectively) are bit write control terminals.

Indicated in the redundancy circuit 704 generally at 711 to 715 are selectors which are disposed in signal lines Ldi0 to Ldi4 which connect the terminals DI<> and XDI<>. When any one of these signal lines receives failure bit data, the selectors 711 to 715 disconnect that signal line receiving the failure bit data ("1" side) and connect the terminals respectively to the next signal lines ("0" side of the failure signal line). Indicated generally at 721 to 725 are selectors which are disposed in signal lines Lbw0 to Lbw4 which connect the terminals BWC<> and XBWC<>. When any one of the signal lines Lbw0 to Lbw4 receives a failure bit, the selectors 721 to 725 disconnects that signal line receiving the failure bit ("1" side) and connects the terminals respectively to the next signal lines ("0" side of the failure signal line). Indicated generally at 731 to 735 are selectors which are disposed in signal lines Ldo0 to Ldo5 which connect the terminals DI<> and XDI<>. When any one of the signal lines Ldo0 to Ldo3 receives a failure bit, the selectors 731 to 735 disconnects that signal line receiving the failure bit ("1" side) and connects the terminals respectively to the next signal lines ("0" side of the failure signal line).

A binary signal designating part is indicated at 740 which switches the selectors 711 to 715 and 721 to 725. Among the signal lines Ldi0 to Ldi4, Lbw0 to Lbw4 and Ldo0 to Ldo5, the binary signal designating part 740 supplies "1" to the selectors which are connected to the signal lines on one side (i.e., LSB side) to the signal line receiving a failure bit and supplies "0" to the selectors which are connected to the signal lines on the other side (i.e., MSB side).

More particularly, the binary signal designating part 740 is formed by five AND circuits 741 to 745. The first AND circuit 741 on the far end to the LSB side has one input terminal connected to the terminal G<0> of the register circuit 706 and the other input terminal connected to the terminal G<1> of the register circuit 706. The second AND circuit 742 next to the AND circuit 741 has one input terminal connected to an output terminal of the first AND circuit 741 and the other input terminal connected to the terminal G<2> of the register circuit 706. The third AND circuit 743 next to the AND circuit 742 has one input terminal connected to an output terminal of the second AND circuit 742 and the other input terminal connected to the terminal G<3> of the register circuit 706. The fourth AND circuit 744 next to the AND circuit 743 has one input terminal connected to an output terminal of the third AND circuit 743 and the other input terminal connected to the terminal G<4> of the register circuit 706. The fifth AND circuit 745 next to the AND circuit 744 has one input terminal connected to an output terminal of the fourth AND circuit 744 and the other input terminal connected to the terminal G<5> of the register circuit 706.

The output terminal of the first AND circuit 741 is also connected to switch control terminals of the selectors 711, 721 and 732. The output terminal of the second AND circuit 742 is also connected to switch control terminals of the selectors 712, 722 and 733. The output terminal of the third AND circuit 743 is also connected to switch control terminals of the selectors 713, 723 and 734. The output terminal of the fourth AND circuit 744 is also connected to switch control terminals of the selectors 714, 724 and 735. The output terminal of the fifth AND circuit 745 is also connected to switch control terminals of the selectors 715 and 725. A switch control terminal of the selector 731 is connected to the terminal G<0> of the register circuit 706.

Indicated at 750 in FIG. 145 are control elements for sending a write inhibiting signal ("1") to the terminals BWC<> in response to signals G<> from the register circuit 706. The control elements 750 are each formed by an inverter circuit 751 for inverting a signal in the signal lines associated with the terminals G<> and an OR circuit 752 for receiving a signal at its terminal from the inverter circuit 751 and at its other terminal signals from the selectors 721 to 725. The control elements 750 may be omitted if the RAM is constructed without terminals BWC<>.

<Operation>

Now, an operation of the semiconductor memory testing device will be described. First, the power on reset circuit 701 detects turning on of power and supplies the reset signal to the self test circuit 702, whereby the self test circuit 702 automatically starts a test on the RAM. The self test circuit 702 tests a RAM core of the RAM with test circuit 703, and the RAM with test circuit 703 outputs a test result.

Under the control of the self test circuit 702, the register circuit 706 receives the test result upon the RAM test by the self test circuit 702. The register circuit 706 may be a parallel register or serial shift register. In accordance with the test result, the redundancy circuit 704 switches connections between RAM input/output data and the bit write control signals and the logic circuit 705. The connections are switched so that the failure bit in the RAM is avoided, thereby maintaining a normal function of the system.

The address signals and the control signals are supplied from the logic circuit 705 to the RAM with test circuit 703.

The terminals XDI<>, XBWC<> and XDO<> are connected to other logic circuit 705 which is disposed on the LSI, whereby the LSI performs a desired operation.

Description will be continued assuming that the terminals G<> are set at "0" if there is a failure bit and at "1" if there is no failure bit in accordance with the RAM test result.

When there is no failure in the RAM, the terminals G<5> to G<0> are all at "1" so that signals F<5> to F<1> are all at "1."

In this situation, a signal path as below is created.

(1) Signals from XDI<4> to XDI<0> are supplied to DI<4> to DI<0> (signal lines) while a fixed value "0" or "1" is supplied to DI<5> (extra line).

(2) Signals from SBWC<4> to XBWC<0> are supplied to BWC<4> to BWC<0> (signal line) while a fixed value "0" or "1" is supplied to BWC<5> (extra line). (The value "1" invokes the write inhibiting state so that writing is not performed to the bit number 5.)

(3) Signals from DO<4> to DO<0> (signal lines) are supplied to XDO<4> to XDO<0>. That is, the bit number 5 becomes unused and the data input/output functions as a 5-bit RAM. DO<5> is an extra line.

If there is a failure in the bit number 3, for instance, G<5>, G<4>, G<2>, G<1> and G<0> are at "1" but G<3> is at "0." As a result, F<5>, F<4> and F<3> become "0" and F<2> and F<1> become "1," thereby creating a signal path as below.

(1) A signal from XDI<4> is supplied to DI<5>;
a signal from XDI<3> is supplied to DI<4>;
a signal from XDI<2> is supplied to DI<3>;
a signal from XDI<2> is supplied to DI<2>;
a signal from XDI<1> is supplied to DJ<1>; and
a signal from XDI<0> is supplied to DI<0>.

(2) A signal from XBWC<4> is supplied to BWC<5>;
a signal from XBWC<3> is supplied to BWC<4>;
"1" is supplied to BWC<3> from the inverter circuit 751 and the OR circuit 752;
a signal from XBWC<2> is supplied to BWC<2>;
a signal from XBWC<1> is supplied to BWC<1>; and
a signal from XBWC<0> is supplied to BWC<0>. (The value "1" invokes the write inhibiting state so that writing is not performed to the failure bit number 3.)

(3) A signal from DO<5> is supplied to XDO<4>;
a signal from DO<4> is supplied to XDO<3>;
a signal from DO<2> is supplied to XDO<2>;
a signal from DO<2> is supplied to XDO<2>; and
a signal from DO<1> is supplied to XDO<1>.

That is, the bit number 3 becomes unused and the data input/output functions as a 5-bit RAM.

In this manner, the data input/output functions as a desired RAM (5-bit RAM) even if including a 1-bit failure.

Twentieth Embodiment

FIG. 147 shows a self test circuit 702 according to a twentieth preferred embodiment of the present invention. Except for a special test pattern generator 702*b*, the circuit of FIG. 147 is equivalent to the circuit of the nineteenth preferred embodiment as it is modified to be able to function similarly to the circuit of FIG. 143. Including the test pattern generator 702*b*, the circuit of FIG. 147 is suitable where the operation speed of the microcomputer is slower than that of the RAM. The special test pattern generator generates a test pattern at a high speed, which makes it possible to detect an access failure by the RAM and the like. The circuit of FIG. 138 or FIG. 139 may be used as the test pattern generator. Since self test circuit of the twentieth preferred embodiment is otherwise the same as shown in FIGS. 142 to 146, a redundant description will be simply omitted. The other structure of the self test circuit 702 other than the test pattern generator 702*b* creates a similar effect to that of the nineteenth preferred embodiment.

Twenty-First Embodiment

<Structure>

FIGS. 148 and 149 show a redundancy circuit 704*a* (704) of a semiconductor memory testing device according to a twenty-first preferred embodiment of the present invention. In FIGS. 148 and 149, as a manner of supplying fixed values to the most significant bits (MSB), gate circuits (OR circuits) 761 and 762 supply the fixed values to the terminals DI<> to XDI<> and BWC<> to XBWC<> instead of supplying the fixed values by selectors (the selectors 715, 725 of the nineteenth preferred embodiment). Further, noting the input data and the bit write control signal to be supplied to a failure bit may be the value of any one of adjacent bits, the control signals from the binary signal designating part 740 are changed from F<1>–F<5> to G<0> and F<1>–F<4>. As a result, an AND circuit (the AND circuit 745 of the nineteenth preferred embodiment) for generating the signal F<5> is not necessary.

<Operation>

Now, an operation of the semiconductor memory testing device having such a structure above will be described. First, if there is no failure in the RAM, the terminals G<5> to G<0> are all at "1" so that F<4> to F<1> are all at "1."

In this situation, a signal path as below is created.

(1) Signals from XDI<4> to XDI<0> are supplied to DI<4> to DI<0> while fixed "1" is supplied to DI<5>.

(2) Signals from XBWC<4> to XBWC<4> are supplied to BWC<4> to BWC<0> while fixed "1" is supplied to BWC<5>. (The value "1" invokes the write inhibiting state so that writing is not performed to the failure bit number 5.)

(3) Signals from DO<4> to DO<0> are supplied to XDO<4> to XDO<0>. That is, the bit number 5 becomes unused and the data input/output functions as a 5-bit RAM.

If the bit number 3 is a failure bit, for instance, G<5>, G<4>, G<2>, G<1> and G<0> are at "1" but G<3> is at "0." As a result, F<4> and F<3> become "0" and F<2> and F<1> become "1."

Hence, a signal path as below is created.

(1) A signal from XDI<4> is supplied to DI<5>;
a signal from XDI<3> is supplied to DI<4>;
a signal from XDI<3> is supplied to DI<3>;
a signal from XDI<2> is supplied to DI<2>;
a signal from XDI<1> is supplied to DI<1>; and
a signal from XDI<0> is supplied to DI<0>.

(2) A signal from XBWC<4> is supplied to BWC<5>;
a signal from XBWC<3> is supplied to BWC<4>;
"1" is supplied to BWC<3> from the inverter circuit 751 and the OR circuit 752;
a signal from XBWC<2> is supplied to BWC<2>;
a signal from XBWC<1> is supplied to BWC<1>; and
a signal from XBWC<0> is supplied to BWC<0>. (The value "1" invokes the write inhibiting state so that writing is not performed to the failure bit number 3.)

(3) A signal from DO<5> is supplied to XDO<4>;
a signal from DO<4> is supplied to XDO<3>;
a signal from DO<2> is supplied to XDO<2>;
a signal from DO<1> is supplied to XDO<1>; and
a signal from DO<0> is supplied to XDO<0>.

That is, the bit number 3 becomes unused and the data input/output functions as a 5-bit RAM.

In this manner, the data input/output functions as a desired RAM (5-bit RAM) even if including a 1-bit failure.

Between the circuit of FIGS. 145 and 146 and the circuit of FIGS. 148 and 149, a signal coupled to the terminal DI<> associated with a failure bit is different. For example, if the bit number 3 is a failure bit, the signal XDI<2> is supplied to the terminal DI<3> in the circuit of FIGS. 145 and 146, whereas the signal XDI<3> is supplied to the terminal DI<3> in the circuit of FIGS. 148 and 149. Since use of the bit number 3 is avoided, this does not affect the system operation.

Twenty-Second Embodiment

<Structure>

FIG. 150 shows a twenty-second preferred embodiment of the present invention, or other example of detailed connection between the RAM with test circuit 703 and a redundancy circuit 704*b* of FIG. 142. In FIG. 150, the redundancy circuit 704*b* compensates for 2 failure bits.

FIGS. 151 and 152 are circuitry diagrams of the redundancy circuit 704*b* of FIG. 150 which compensates for 2 failure bits. The redundancy circuit 704*b* performs a desired RAM operation even when there are 2 failure bits in the data input/output. That is, in the twenty-second preferred embodiment, a failure bit is detected in one direction and a further failure bit is detected in an opposite direction, to thereby compensate for 2 failure bits in total. The redundancy circuit 704*b* of FIGS. 151 and 152 formed as 6-bit data input/output RAM and used as a 4-bit data input/output RAM. In FIGS. 151 and 152, indicated at YDI<> are data input terminals, indicated at YBWC<> are bit write control terminals and indicated at YDO<> are data output terminals.

More specifically, in addition to a structure similar to that of the twenty-first preferred embodiment shown in FIGS. 148 and 149, the redundancy circuit 704*b* includes selectors 771 to 773 for switching signals from the terminals YDI<>, a gate circuit (OR circuit) 774, selectors 781 to 783 for switching signals from the terminals YBWC<>, a gate circuit (OR circuit) 784, and selectors 791 to 794 for switching signals to the terminals YDI<>.

The selectors 771 to 773 are disposed in signal lines Lydi0 to Lydi3 which connect the selectors 711 to 714 (primary selector parts) and the terminals YDI<>. When failure bit data is supplied to any one of the signal lines Lydi0 to Lydi3, the selectors 771 to 773 (secondary selector parts) disconnect that signal line receiving the failure bit data ("1" side) and connect the terminals respectively to the next signal lines ("0" side of the failure signal line). The gate circuit (OR circuit) 774 supplies fixed values to the least significant (LSB) bits (i.e., DI<0>). One terminal of the gate circuit 774 is connected to the terminal YDI<0> and the other terminal of the gate circuit 774 is connected to an output terminal of an AND circuit 803 of a second binary signal designating part 800 (described later).

Further, the selectors 781 to 783 are disposed in signal lines Lydw0 to Lydw3 which connect the selectors 721 to 724 primary selector parts) and the terminals YBWC<>. When a failure bit is supplied to any one of the signal lines Lydw0 to Lydw3, the selectors 781 to 783 (secondary selector parts) disconnect that signal line receiving the failure bit data ("1" side) and connect the terminals respectively to the next signal lines ("0" side of the failure signal line). The selectors 791 to 793 are disposed in signal lines Lxdo0 to Lxdo3 which connect the selectors 731 to 735 (primary selector parts) and the terminals YDO<>. When a failure bit is supplied to any one of the signal lines Lxdo0 to Lxdo3, the selectors 791 to 793 (secondary selector parts) disconnect that signal line receiving the failure bit data ("1"

side) and connect the terminals respectively to the next signal lines ("0" side of the failure signal line). The gate circuit (OR circuit) 784 supplies fixed values to the least significant (LSB) bits (i.e., the OR circuit 752 connected to BWC<0> of the control elements 750). One terminal of the gate circuit 784 is connected to the terminal YBWC<0> and the other terminal of the gate circuit 784 is connected to the output terminal of the AND circuit 803 of the second binary signal designating part 800 (described later).

The element 800 switches the selectors 771 to 773 and 781 to 783. Among the signal lines Lydi0 to Lydi3, Lybw0 to Lybw3 and Lxdo0 to Lxdo4, the binary signal designating part 800 (secondary control circuit) supplies "0" to the selectors 771, 772 781, 782 and 791 to 793 and the OR circuits 774 and 784 which are connected to the signal lines on one side (i.e., LSB side) to the signal line receiving a failure bit and supplies "1" to the selectors 771, 772 781, 782 and 791 to 793 and the OR circuits 774 and 784 which are connected to the signal lines on the other side (i.e., MSB side). The binary signal designating part 800 detects a failure bit from one of the LSB side or the MSB side while the first binary signal designating part 740 (primary control circuit) detects a failure bit from the other one of the LSB side or the MSB side. Thus, the binary signal designating parts 740 and 800 detect failure bits from both the LSB side and the MSB side, whereby 2 failure bits are detected.

More precisely, the binary signal designating part 800 is formed by three AND circuits (secondary AND circuits) 801 to 803. The four AND circuits 741 to 744 of the first binary signal designating part 740 function as primary AND circuits with respect to the AND circuits 801 to 803. The fifth AND circuit 801 on the far end to the MSB side has one input terminal connected to the terminal G<5> of the register circuit 706 and the other input terminal connected to the terminal G<4> of the register circuit 706. The sixth AND circuit 802 next to the AND circuit 801 has one input terminal connected to an output terminal of the fifth AND circuit 801 and the other input terminal connected to the terminal G<3> of the register circuit 706. The seventh AND circuit 803 next to the AND circuit 802 has one input terminal connected to an output terminal of the sixth AND circuit 802 and the other input terminal connected to the terminal G<2> of the register circuit 706.

The output terminal H<4> of the fifth AND circuit 801 is connected to switch control terminals of the selectors 772, 782 and 793. The output terminal H<3> of the sixth AND circuit 802 is connected to switch control terminals of the selectors 771, 781 and 792. An output terminal of the seventh AND circuit 803 is connected to switch control terminals of the selectors 774, 784 and 791.

Being similar to that of the twenty-first preferred embodiment, the other structure will not be described.

<Operation>

Now, an operation of the circuit of FIGS. 151 and 152 will be described. If there is no failure in the RAM, the terminals G<5> to G<0> of the register circuit 706 are all at "1" so that the output terminals F<4> to F<1> of the first binary signal designating part 740 are all at "1" and the output terminals H<2> to H<4> of the second binary signal designating part 800 are all at "1." In this situation, a signal path as below is created.

(1) Signals from YDI<3> to YDI<0:> are supplied to DI<4> to DI<1> while fixed "1" is supplied to DI<5> an dDI<0>.

(2) Signals from YBWC<3> to YBWC<0> are supplied to the OR circuits 752 (control elements 750) associated with BWC<4> to BWC<1> while fixed "1" is supplied to the OR circuits 752 (control elements 750) associated with BWC<5> and BWC<0> (The value "1" invokes the write inhibiting state so that writing is not performed to the failure bit number 5). Hence, "1" is supplied to all BWC<>.

(3) Signals from DO<4> to DO<1> are supplied to YDO<3> to YDO<0>. That is, the bit numbers 5 and 0 become unused and the data input/output functions as a 4-bit RAM.

If the bit numbers 2 and 4 are failure bits, for instance, G<5>, G<3>, G<1> and G<0> of the register circuit 706 are at "1" but G<4> and G<2> are at "0." As a result, the output terminals F<4>, F<3> and F<2> of the first binary signal designating part 740 become "0" and F<2> and the output terminal F<1> of the first binary signal designating part 740 becomes "1." The output terminals H<4>, H<3> and H<2> of the second binary signal designating part 800 are at "0."

Hence, a signal path as below is created.

(1) A signal from YDI<3> is supplied to DI<5>;

a signal from YDI<3> is supplied to DI<4>;

a signal from YDI<2> is supplied to DI<3>;

a signal from YDI<2> is supplied to DI<2>;

a signal from YDI<1> is supplied to DI<1>; and a signal from YDI<0> is supplied to DI<0>.

(2) A signal from YBWC<3> is supplied to BWC<5>;

"1" is supplied to BWC<4> from the inverter circuit 751 and the OR circuit 752;

a signal from YBWC<2> is supplied to BWC<3>;

"1" is supplied to BWC<2> from the inverter circuit 751 and the OR circuit 752;

a signal from YBWC<1> is supplied to BWC<1>; and a signal from YBWC<0> is supplied to BWC<0>. (The value "1" invokes the write inhibiting state so that writing is not performed to the failure bit numbers 4 and 2.) Further, a signal from DO<5> is supplied to YDO<3>;

a signal from DO<3> is supplied to YDO<2>;

a signal from DO<1> is supplied to YDO<1>; and a signal from DO<0> is supplied to YDO<0>.

That is, the bit numbers 4 and 2 become unused and the data input/output functions as a 4-bit RAM.

Thus, in the circuit structure of FIGS. 151 and 152, (1) a failure bit is searched from the LSB side by operations of the AND circuits which generate the signals F<>;

(2) a failure bit is searched from the MSB side by operations of the AND circuits which generate the signals H<>; and (3) the selectors 711 to 714, 721 to 724 731 to 735, 771 to 773, 781 to 783 and 791 to 794 are switched in accordance with the results of the searches (1) and (2) to avoid use of the failure bits.

As described above. even if there are 2 failure bits in the data input/output, the circuit of FIGS. 151 and 152 performs a desired (4-bit) RAM operation owing to searches in the two directions. Hence, up to 2 failure bits are compensated.

Twenty-third Embodiment

<Structure>

FIGS. 153 and 154 show redundancy circuits of a semiconductor memory testing device according to a twenty-third preferred embodiment of the present invention. In FIGS. 153 and 154, elements which function similar to those previously described in the precedent embodiments are denoted with similar symbols.

The redundancy circuits 704*a* and 704*c* of the semiconductor memory testing device of the twenty-third preferred embodiment compensate 1-bit failure data in the first hierarchy, removes the failure information and compensates 1-bit failure data in the second hierarchy. The redundancy circuits 704*a* and 704*c* is used instead of the circuit of the twenty-second preferred embodiment shown in FIGS. 151 and 152. The redundancy circuit 704*a*, in particular, is similar to the circuit of FIGS. 148 and 149. The redundancy circuit 704*c* (portion enclosed by dotted line: hereinafter "second-stage redundancy circuit") adds a second-stage redundancy circuit to the redundancy circuit 704*a* (i.e., to form a hierarchy).

The second-stage redundancy circuit 704*c* includes selectors 811 to 813 which are disposed in signal lines Lydi0 to Lydi3 which connect the selectors 711 to 714 (first-layer selector parts) and the terminals YDI<>. When a failure bit is supplied to any one of the signal lines Lydi0 to Lydi3, the selectors 811 to 813 (second-layer selector parts) disconnect that signal line receiving the failure bit data ("1" side) and connect the terminals respectively to the next signal lines ("0" side of the failure signal line). Selectors 821 to 823 are disposed in signal lines Lybw0 to Lybw3 which connect the selectors 721 to 724 (first-layer selector parts) and the terminals YBWC<>. When a failure bit is supplied to any one of the signal lines Lybw0 to Lybw3, the selectors 821 to 823 (second-layer selector parts) disconnect that signal line receiving the failure bit data ("1" side) and connect the terminals respectively to the next signal lines ("0" side of the failure signal line). Selectors 831 to 833 are disposed in sinal lines which connect the first binary signal designating part 740 (primary control circuit) and a second binary signal designating part 840 which will be described later. When a failure bit is supplied to any one of the associated signal lines, the selectors 831 to 833, as control selectors, disconnect that signal line receiving the failure bit data ("1" side) and connect the terminals respectively to the next signal lines ("0" side of the failure signal line). The control selectors 831 to 833 and the second binary signal designating part 840 form a secondary control circuit which switches the selectors 811 to 813, 821 to 823, 791 to 794 (second-layer selector parts). The selectors 731 to 735 (first-layer selector parts) and 791 to 794 (second-layer selector parts) for switching signals to the terminals YDI<> are similar to those of the twenty-second preferred embodiment shown in FIGS. 151 and 152.

The gate circuits (OR circuits) 861 and 862 supply fixed values to the most significant bits (MSB) of the signal lines which connect the terminals DI<> and YDI<> and the signal lines which connect the terminals BWC<> and YBWC<> in FIGS. 153 and 154. Indicated generally at 863 is an OR circuit for generating a logical OR of G<0> and G<1> supplied from the register circuit 706.

The second binary signal designating part 840 switches the selectors 811 to 813, 821 to 823 and 791 to 794. The second binary signal designating part 840 supplies "1" to the selectors which are connected to the signal lines on one side (i.e., LSB side) to the signal line receiving a failure bit and supplies "0" to the selectors which are connected to the signal lines on the other side (i.e., MSB side).

More particularly, the second binary signal designating part 840 is formed by four AND circuits (secondary AND circuits) 841 to 843. The fifth AND circuit 841 on the far end to the MSB side has one input terminal connected to the output terminal of the OR circuit 863 and the other input terminal connected to the output terminal of the selector 831. The sixth AND circuit 842 next to the AND circuit 841 has one input terminal connected to an output terminal of the fifth AND circuit 841 and the other input terminal connected to the output terminal of the selector 832. The seventh AND circuit 843 next to the AND circuit 842 has one input terminal connected to an output terminal of the sixth AND circuit 842 and the other input terminal connected to the output terminal of the selector 833.

The output terminal XF<1> of the fifth AND circuit 841 is connected to switch control terminals of the selectors 812, 822 and 792. The output terminal of the sixth AND circuit 842 is connected to switch control terminals of the selectors 813, 823 and 793. An output terminal of the seventh AND circuit 843 is connected to the OR circuits 861 and 862 and a switch control terminal of the selector 794. The output terminal of the OR circuit 863 is connected to switch control terminals of the selectors 811, 821 and 791.

In the twenty-third preferred embodiment, the signal G<> from the register circuit 706 is used as first-stave failure information and signals XG<> from the OR circuit 863 and the selectors 831 to 833 are used as second-stage failure information.

<Operation>

In the circuit of such a structure above, due to operations of the AND circuits 741 to 744 of the first binary signal designating part 740 generating the signals F<>, a failure bit is searched in the signals G<> serially from the LSB side to the MSB side. The fifth bit of the six-bit data is selected and supplied to the second-stage redundancy circuit 704*c*.

Next, of the signals G<>, the second-stage redundancy circuit 704*c* processes those from which a failure bit detected by the first-stage redundancy circuit 704*a* is removed as the signals XG<>. Further, due to operations of the AND circuits 841 to 844 of the second binary signal designating part 840 generating the signals XF, a failure bit is searched in the signals XG<> serially from the LSB side to the MSB side. The fourth bit of the five-bit data is selected to selectively connect the terminals YDI<>, YBWC<> and XDO<>. In this manner, an operation associated with the data of the failure two bits is compensated easily.

Twenty-fourth Embodiment

<Structure>

An example of a redundancy circuit for a multi-port RAM such as a three-port RAM will be described. FIG. 155 is a circuitry diagram showing connection between the redundancy circuit 704 and a three-port RAM with a test circuit 703*d* according to a twenty-fourth preferred embodiment of the present invention. The three-port RAM with a test circuit 703*d* may be the RAM shown in FIGS. 113 and 114, for example.

In FIG. 155, signals SO1<0> to SO1<5> (hereinafter simply "SI<>") and SO2<0> to SO2<5> (hereinafter simply "SI2<>") are signals which express results of tests performed on a port 1 and a port 2, respectively. For instance, the signals SI1<> and SI2<> are serial output signals SO from the respective scan FFs (FIG. 69, for instance) which form the structure of FIG. 95.

The three-port RAM with a test circuit is assumed to have the following functions:

(1) When the terminal WE is active, the three-port RAM writes data of the terminals DI<> only in those bits in which BWC<> are active at addresses which are designated by the terminals A<>;

(2) The three-port RAM reads data from addresses which are designated by the terminals A1<0> to A1<3> (hereinafter simply "A1<>") and outputs the data to the terminals DO1<>; and (3) The three-port RAM reads data from addresses which are designated by the terminals A-<0> to A2<3> (hereinafter simply "A2<>") and outputs the data to the terminals DO2<>.

These three-port RAM can perform three operations (1) to (3) at the same time. When the three-port RAM is formed without the terminals BWC<>, the circuit regarding the terminals BWC<> may be omitted. In FIG. 155, indicated at 706*a* is an AND circuit which is necessary for a RAM which includes a plurality of read ports like a three-port RAM. The AND circuit 706*a* performs AND computation on failure information between the ports (SO1<>, SO2<>) to generate failure information for the entire RAM.

FIG. 156 is a partial circuitry diagram of the redundancy circuit 704d showing only a portion which is related to the terminals XDO1<0> to SCO1<4> (hereinafter simply "XDO1<>"), the terminals DO1<0> to DO1<5> (hereinafter simply "DO1<>"), the terminals XDO2<0> to XDO2<4> (hereinafter simply "XDO2<>") and the terminals DO2<0> to DO2<5> (hereinafter simply "DO2<>"). FIG. 156 omits the terminals DI<>, BWC<>, XBC<> and XDI<> of the redundancy circuit 704*d* since the structure associated with these terminals may be the same as that shown in FIGS. 148 and 149.

In FIG. 156, selectors 871 to 875 are disposed in signals lines which connect the terminals DO1<> and XDO1<>. When a failure bit is supplied to any one of the associated signal lines, the selectors 871 to 875 disconnect that signal line receiving the failure bit data ("1" side) and connect the terminals respectively to the next signal lines ("0" side of the failure signal line). Selectors 881 and 885 are disposed in signals lines which connect the terminals DO2<> and XDO2<>. When a failure bit is supplied to any one of the associated signal lines, the selectors 881 to 885 disconnect that signal line receiving the failure bit data ("1" side) and connect the terminals respectively to the next signal lines ("0" side of the failure signal line).

Indicated generally at 890 is a binary signal designating part which switches the selectors 871 to 875 and 881 to 885. The binary signal designating part 890 supplies "1" to the selectors which are connected to the signal lines on one side (i.e. LSB side) to the signal line receiving a failure bit and supplies "0" to the selectors which are connected to the signal lines on the other side (i.e., MSB side).

More specifically, the binary signal desianating part 890 is formed by four AND circuits (secondary AND circuits) 891 to 894. The fifth AND circuit 891 on the far end to the MSB side has one input terminal connected to the terminal G<0> of the register circuit 706 and the other input terminal connected to the terminal G<1> of the register circuit 706. The second AND circuit 892 next to the AND circuit 891 has one input terminal connected to an output terminal of the first AND circuit 891 and the other input terminal connected to the terminal G<2> of the register circuit 706. The third AND circuit 893 next to the AND circuit 892 has one input terminal connected to an output terminal of the second AND circuit 892 and the other input terminal connected to the terminal G<3> of the register circuit 706. The fourth AND circuit 894 next to the AND circuit 893 has one input terminal connected to an output terminal of the third AND circuit 893 and the other input terminal connected to the terminal G<14> of the register circuit 706.

The output terminal of the first AND circuit 891 is connected to switch control terminals of the selectors 872 and 882. The output terminal of the second AND circuit 892 is connected to switch control terminals of the selectors 873 and 883. The output terminal of the third AND circuit 893 is connected to switch control terminals of the selectors 874 and 884. The output terminal of the fourth AND circuit 894 is connected to switch control terminals of the selectors 875 and 885. Switch control terminals of the selectors 871 and 881 are connected to the terminal G<0> of the register circuit 706.

<Operation>

In the circuit of such a structure above like in the circuit of FIGS. 156, the selectors 871 to 875 and 881 to 885 associated with the output terminals of the two read ports DO1<> and DO2<> are controlled by the same control signals, i.e., the signal G<0> from the register circuit 706 and the signals F<1> to F<4> from the binary signal designating part 890.

In FIG. 155, it is assumed that a failure bit is set at "0" and a correct bit is set at "1" in the signals which express test results regarding the ports SO1<> and SO2<>. Since the present embodiment uses a plurality of read ports (three ports), the AND circuit 706*a* performs an AND computation on failure information between the ports (SO1<>, SO2<>) to generate failure information for the entire RAM. For instance, if there is a failure SI1<2>="0" at the port 1 and there is no failure at the port 2, the bit number 2 is a failure bit in the entire RAM. Therefore, switching of the selectors of the redundancy circuit 704*d* is necessary with respect to the port 2 as well. Since G<2>="0," G<0>=G<1>=G<3>=G<4>=G<5>="1" owing to an operation of the AND circuit 706*a*, the selectors are switched so that use of the bit number 2 is avoided. The selectors are switched in a similar manner if there is a failure at the port 2.

When the circuit of FIG. 155 is configured to include the hierarchy structure such as the multi-bit redundancy circuits 704*a* to 704*c* of FIGS. 151 and 152 or FIGS. 153 and 154, it is naturally possible to compensate a failure of multiple bits in a multi-port RAM.

{Modifications}

(1) FIGS. 16, 17, 18 and 19 are logic circuit diagrams showing first, second, third and fourth modifications. These modifications are adapted to pass through data input signals (D) at need. Referring to each of FIGS. 16 to 19, symbol Q denotes a data output terminal, and numeral 271 denotes a selector circuit. The selector circuit 271 has a signal input terminal "0" receiving a data input signal (D) from a RAM (not shown), another signal input terminal "1" which is connected to a data output terminal O1 of a flip-flop circuit 234, and a single control input terminal receiving an external control signal (INSFF). When the control signal (INSFF) is at a high level, data from the data output terminal O1 of the flip-flop circuit 234 which is connected to the signal input terminal "1" is outputted at the data output terminal Q. In this case, it is possible to attain an effect which is similar to those of the first to third embodiments, as a matter of course. When the control signal (INSFF) is at a low level, on the other hand, the data input signal (D) received in the signal input terminal "0" is outputted at the data output terminal Q as such. Referring to the fourth modification shown in FIG. 19, numerals 272 and 273 denote NOT and OR circuits, which are adapted to stop a shift operation of the flip-flop circuit 234 while the data input signal (D) is passed through. Namely, the data input signal (D) is outputted at the data output terminal Q through the selector circuit 271 when the control signal (INSFF) is at a low level, while the output of the NOT circuit 272 goes high and hence the output of the OR circuit 273 regularly goes high to disable detection of a leading edge of a clock signal (T). Thus, the flip-flop circuit 234 is reliably inhibited from shifting, whereby consumption power can be reduced.

Figure 20:
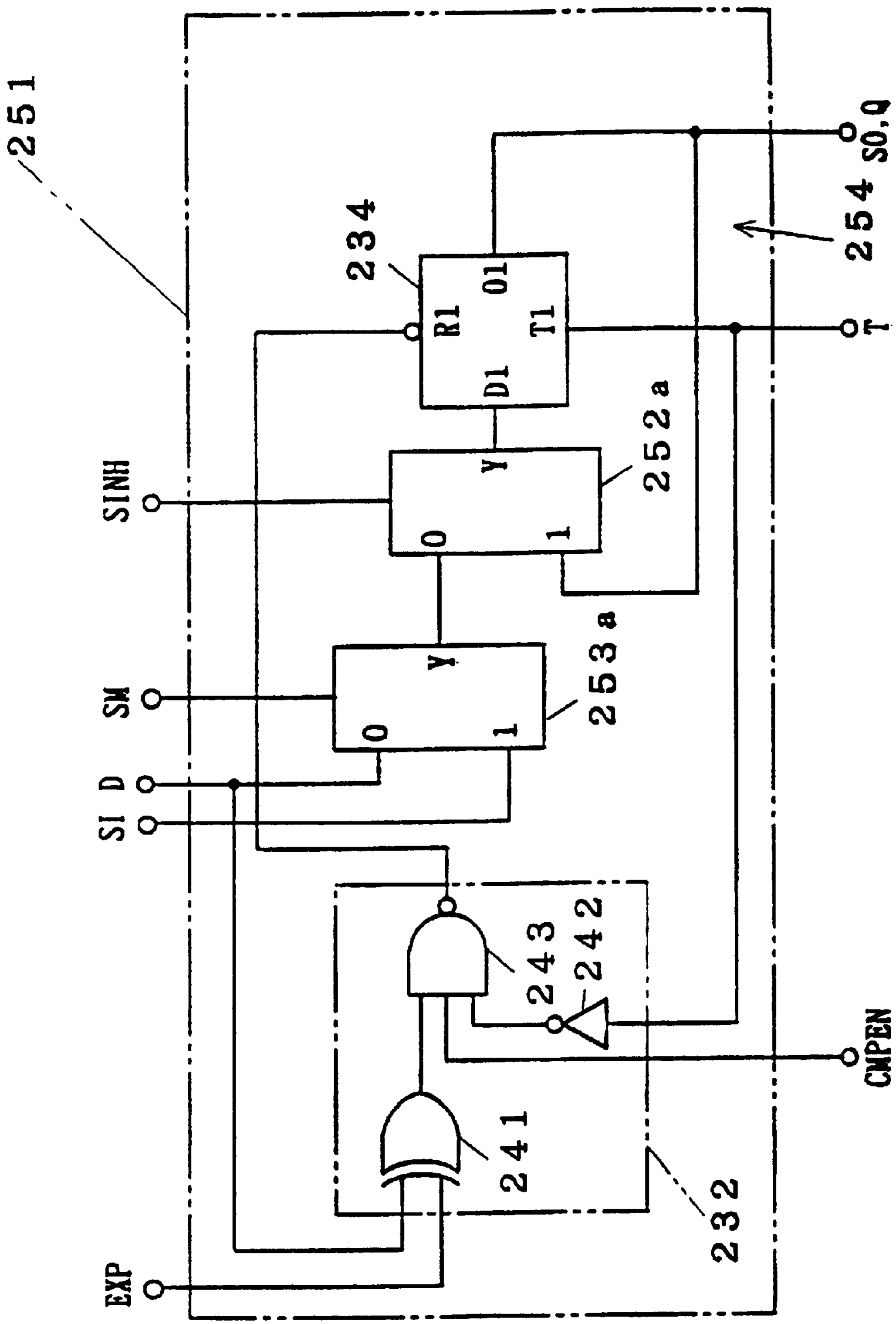
FIG. 20 is a logic circuit diagram showing a fifth modification of the present invention.
Figure 21:
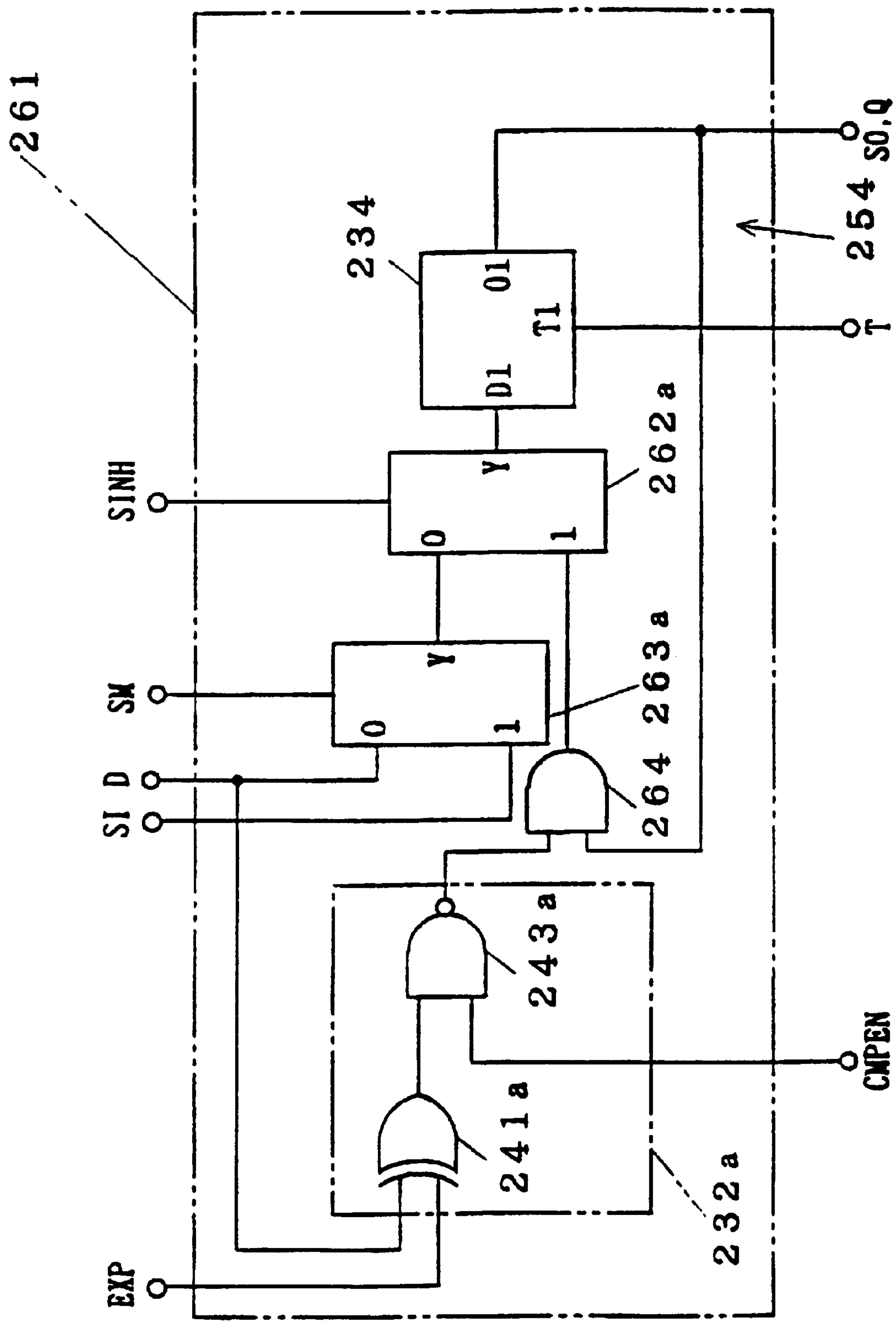
FIG. 21 is a logic circuit diagram showing a sixth modification of the present invention.
Figure 22:
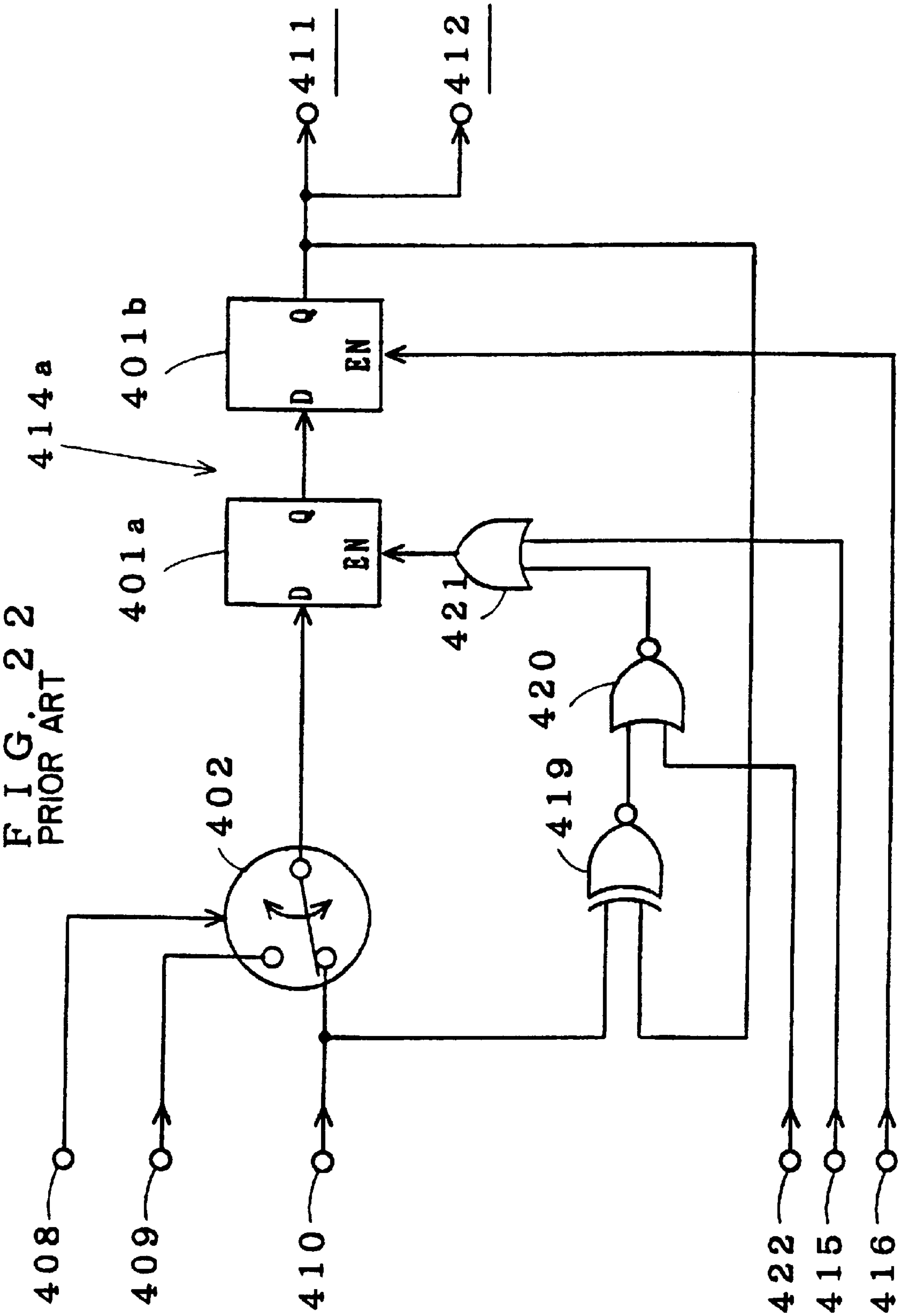
FIG. 22 is a circuit diagram showing a scan register in a semiconductor memory testing device according to first prior art.

(2) FIGS. 20 and 21 are logic circuit diagrams showing fifth and sixth modifications of the present invention respectively. Referring to FIGS. 20 and 21, numerals 253*a* and 263*a* denote selector circuits (selector means) selecting and outputting serial input signals (SI) and data input signals (D)

on the basis of external shift mode control signals (SM), and numerals 254*a* and 264*a* denote selector circuits (data holding means) for feeding back output data of flip-flop circuits 234 and data-holding the same when external shift inhibiting signals (SINH) are received. It is possible to attain an effect which is similar to that of the second embodiment by the fifth embodiment, while it is possible to attain an effect which is similar to that of the third embodiment by the sixth embodiment.

Figure 17:
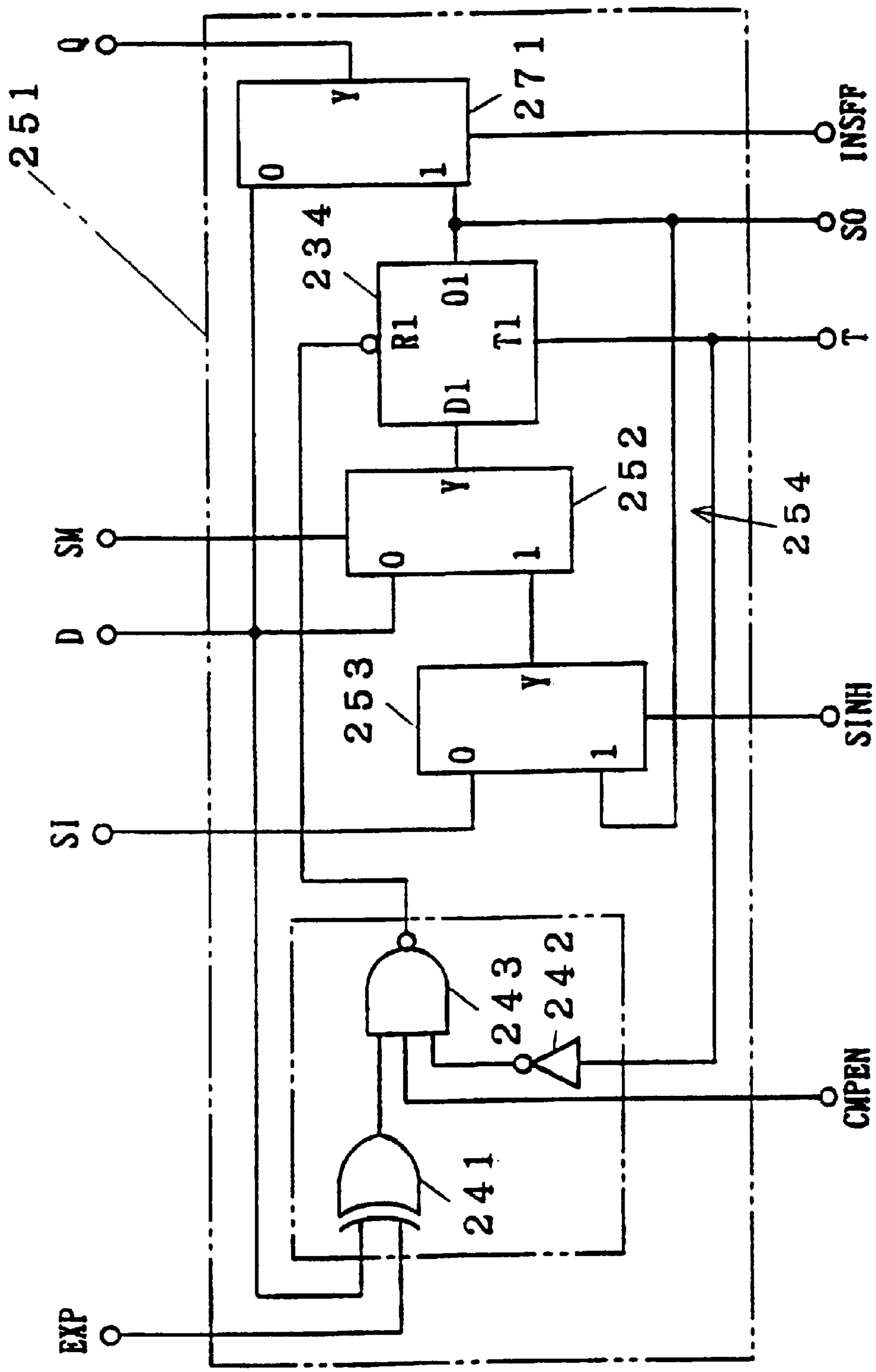
FIG. 17 is a logic circuit diagram showing a second modification of the present invention.
Figure 18:
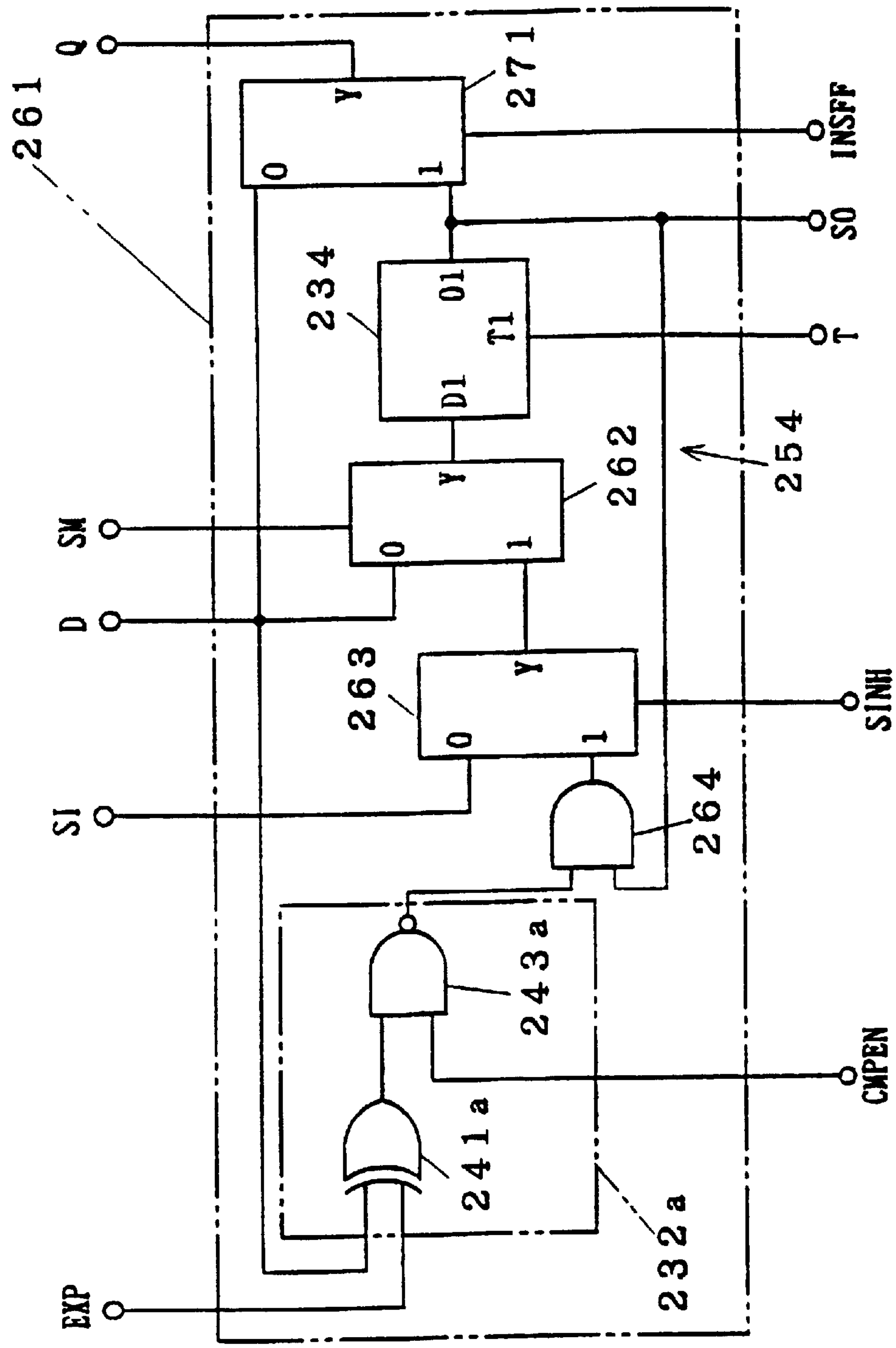
FIG. 18 is a logic circuit diagram showing a third modification of the present invention.
Figure 19:
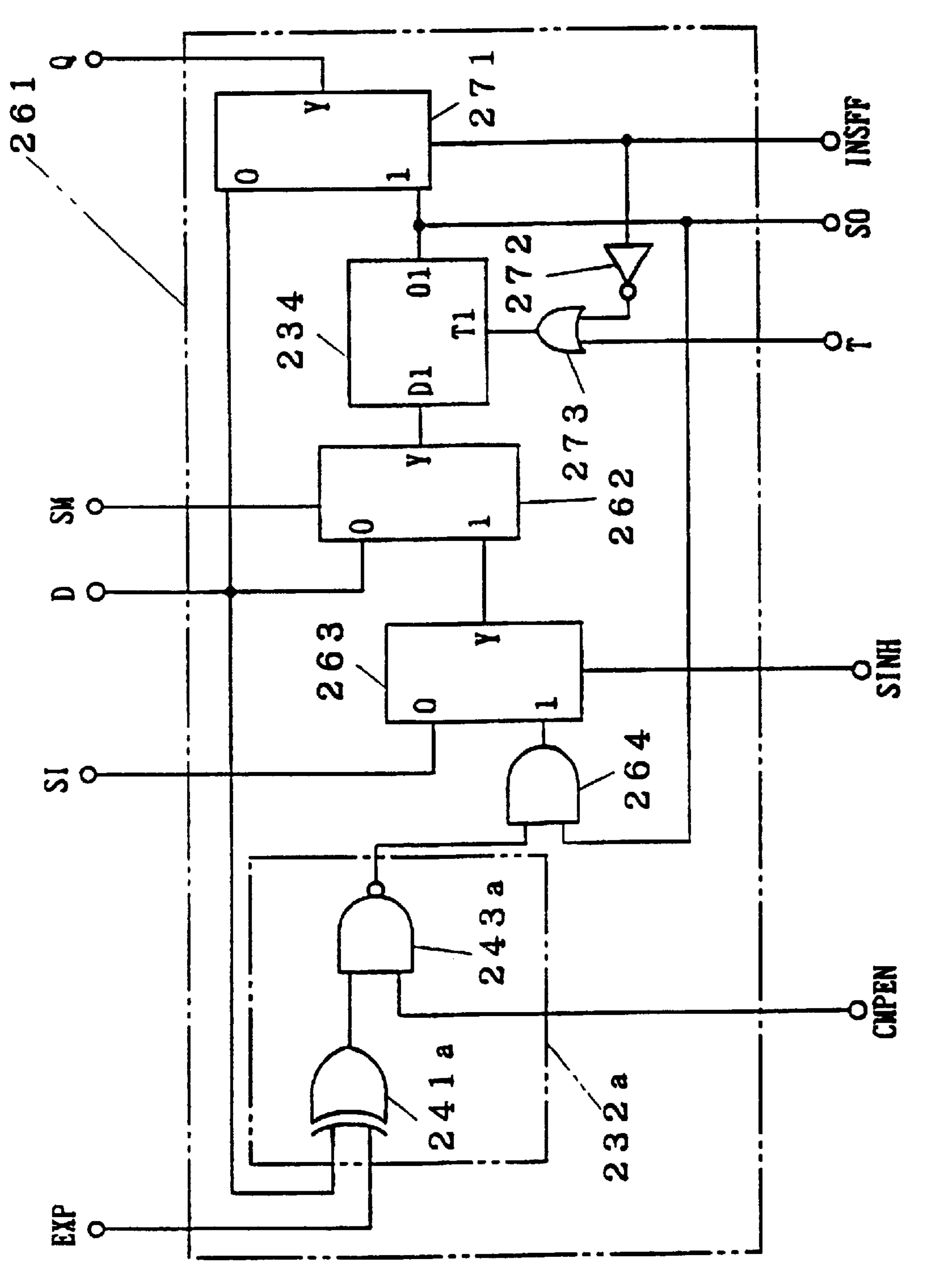
FIG. 19 is a logic circuit diagram showing a fourth modification of the present invention.

(3) While the data input signal (D) is inputted in the signal input terminal of the first selector circuit 252 or 262 and the serial input signal (SI) is inputted in the signal input terminal of the second selector circuit 253 in each of the second embodiment shown in FIG. 6, the third embodiment shown in FIG. 11, the second modification shown in FIG. 17, the third modification shown in FIG. 18 and the fourth modification shown in FIG. 19, the serial input signal (SI) and the data input signal (D) may alternatively be inputted in the signal input terminal of the first selector circuit 252 or 262 and that of the second selector circuit 253 respectively. It is possible to attain an effect which is similar to those of the aforementioned embodiments and modifications also in this case, as a matter of course.

Figure 55:
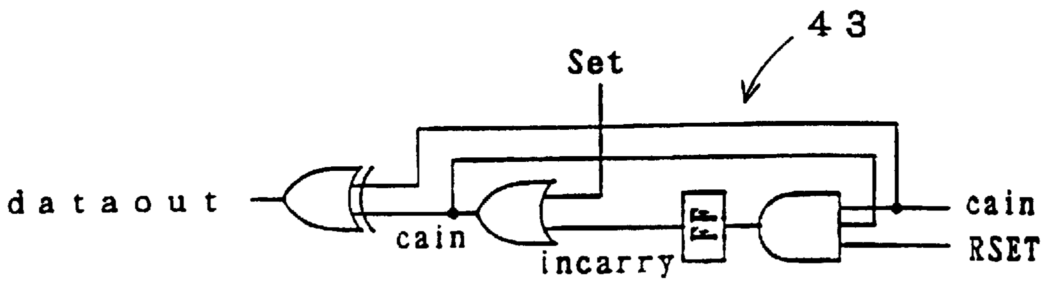
FIG. 55 is a circuit diagram showing the internal structure of a half-adder provided in a semiconductor memory testing device according to a seventh modification of the present invention.
Figure 56:
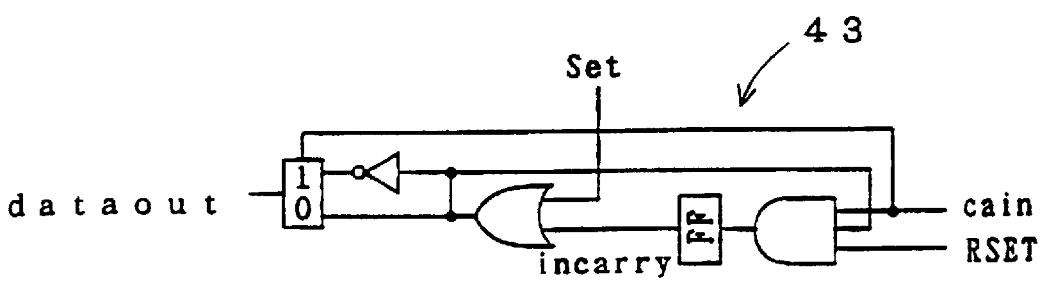
FIG. 56 is a circuit diagram showing the internal structure of a half-adder provided in a semiconductor memory testing device according to an eighth modification of the present invention.
Figure 57:
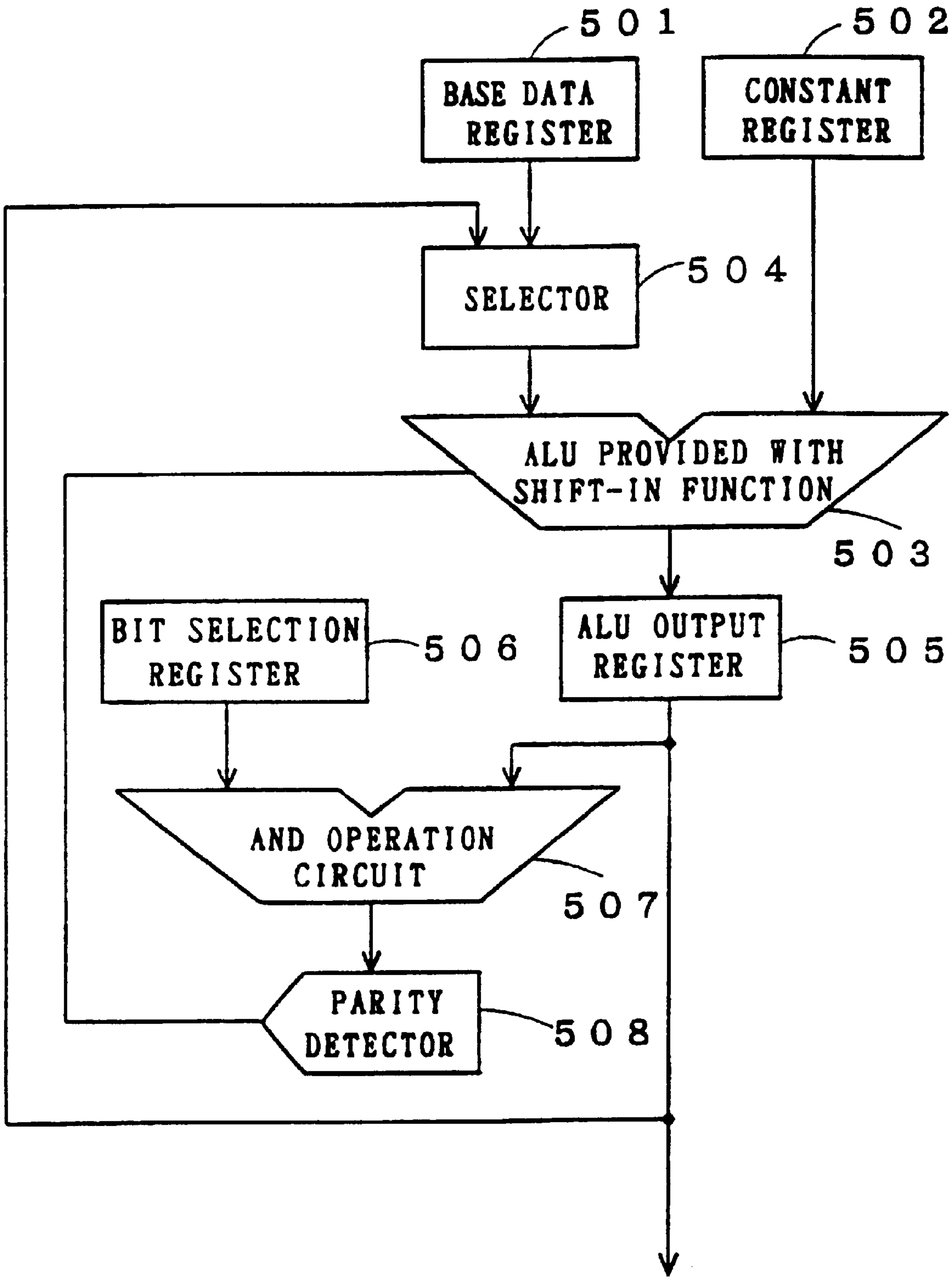
FIG. 57 is a circuit block diagram showing a semiconductor memory testing device according to second prior art.
Figure 58:
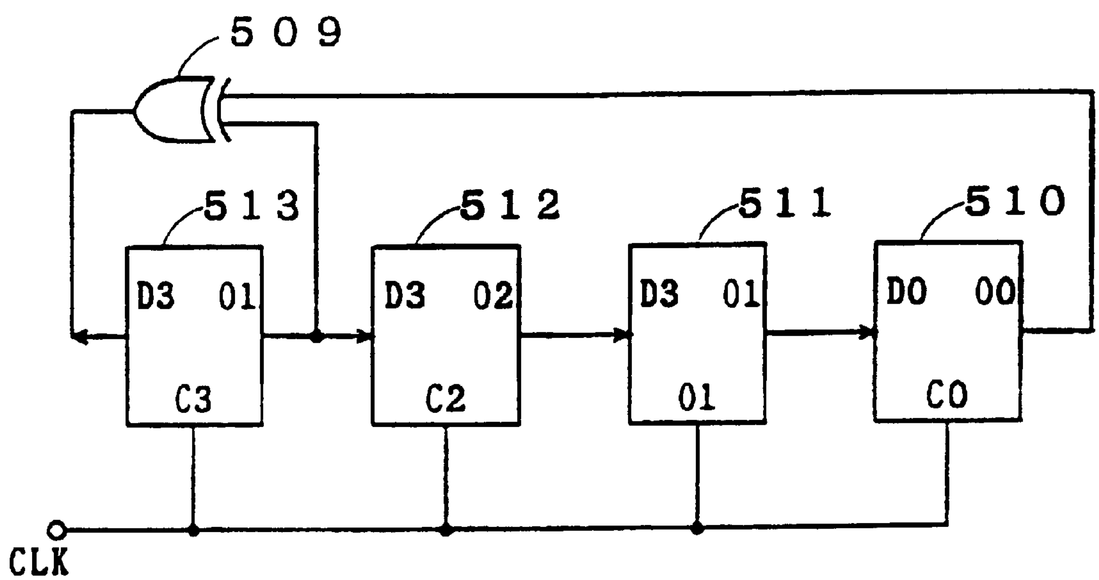
FIG. 58 is a circuit block diagram showing a part of the semiconductor memory testing device according to the second prior art.

(4) The counter 43 of the fourth embodiment, which is formed as shown in FIG. 26, may alternatively be structured as shown in FIG. 55 (seventh modification) or FIG. 56 (eighth modification), for example. Referring to each of FIGS. 55 and 56, the counter comprises an OR circuit (adder element) for detecting whether this is immediately after addresses are incremented or decremented and adding 1 at this point of time, an AND circuit receiving a signal from the OR circuit and a flip-flop $\alpha$-1 of an address generation shift register (ADDR) 35, and an FF (storage element) for storing an address content immediately ahead of incrementation or decrementation of the addresses on the basis of a signal from the AND circuit and inputting the same in the OR circuit.

Figure 93:
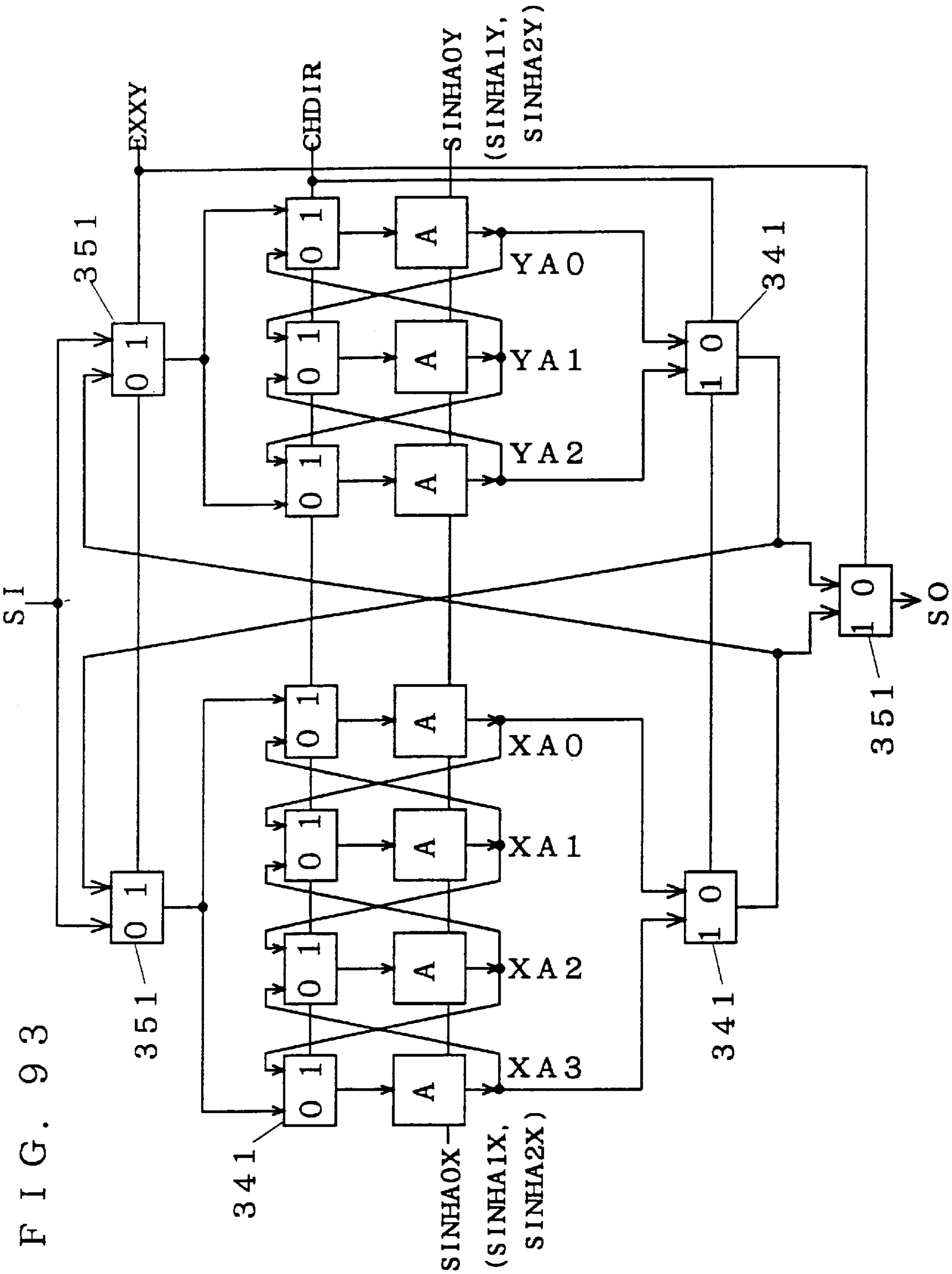
FIG. 93 is a block diagram showing a semiconductor memory testing device according to a ninth modification of the present invention, which is coupled with a plurality of addresses.
Figure 94:
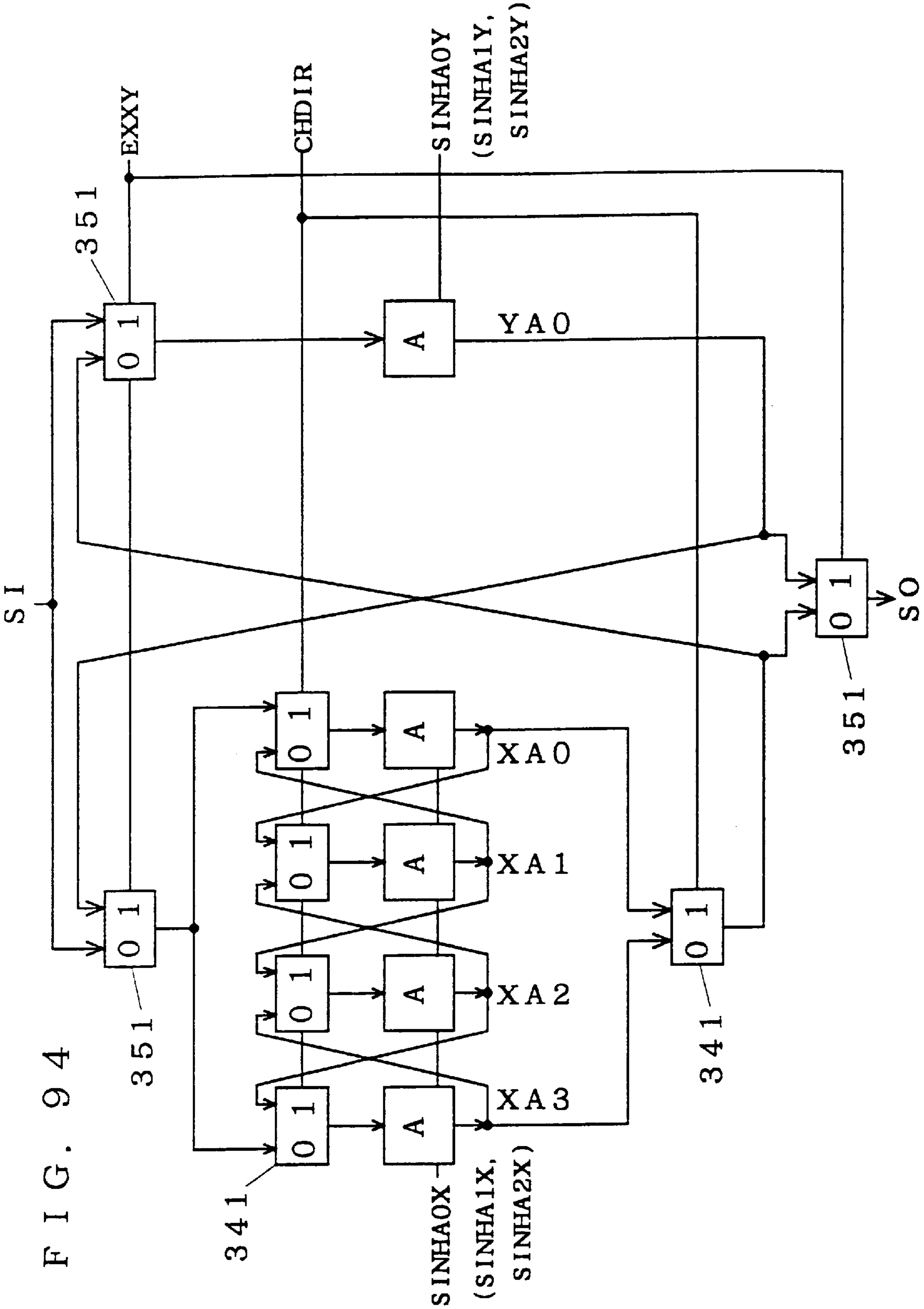
FIG. 94 is a block diagram showing a semiconductor memory testing device according to a tenth modification of the present invention, which is coupled with a plurality of addresses.

(5) While a connection system in a case of including no Y addresses is applied in the twelfth embodiment as shown in FIG. 70, this embodiment may alternatively be so structured (ninth modification) that it is possible to select whether data of X addresses or that of a Y address is regarded as a head when four X addresses and one Y address are set by switching a selector 351 by an XY switching signal (EXXY), as shown in FIG. 93. When four X addresses and 3 Y addresses are set, on the other hand, connection of the selector 351 may be set as shown in FIG. 94 (tenth modification).

Figure 95:
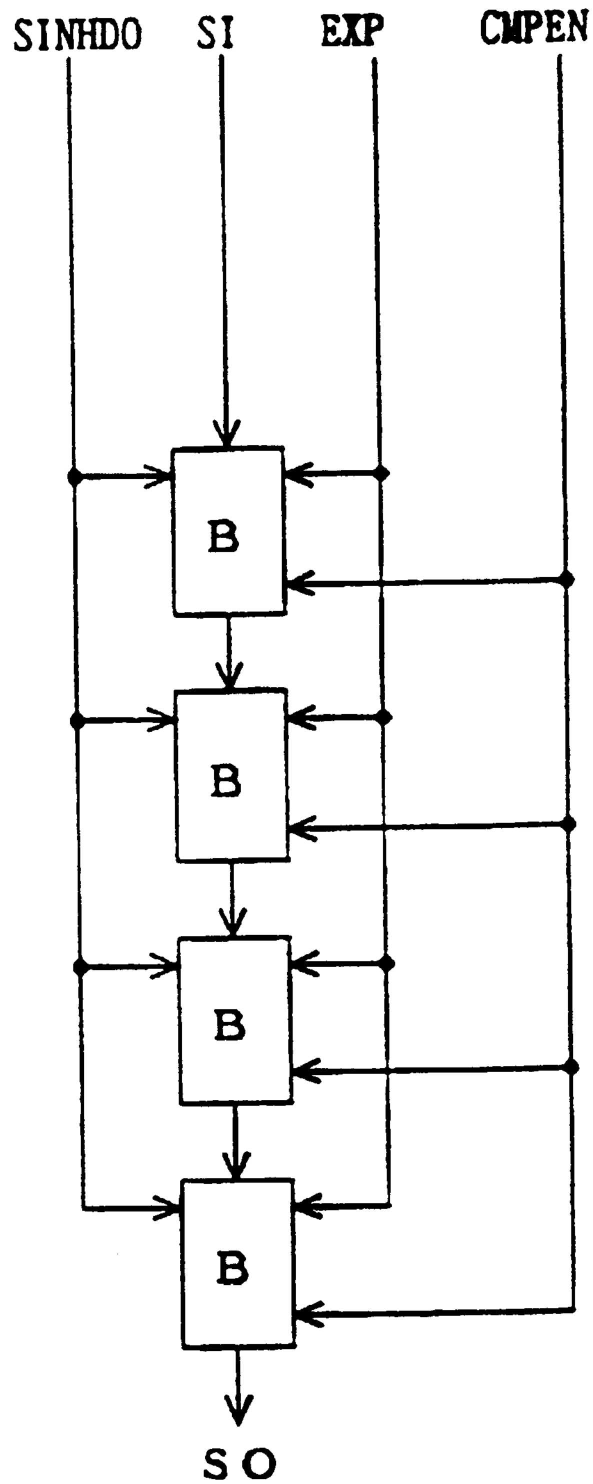
FIG. 95 is a block diagram showing a data output scan path of a semiconductor memory testing device according to an eleventh modification of the present invention.

(6) While the structure shown in FIG. 68 is employed for the data output scan path 332 (DO-SCAN) in the twelfth embodiment to be capable of readily coping with test data of "0101" or "1010", a structure (eleventh modification) shown in FIG. 95 may alternatively be employed when test data is limited to "0000" or "1111".

Figure 96:
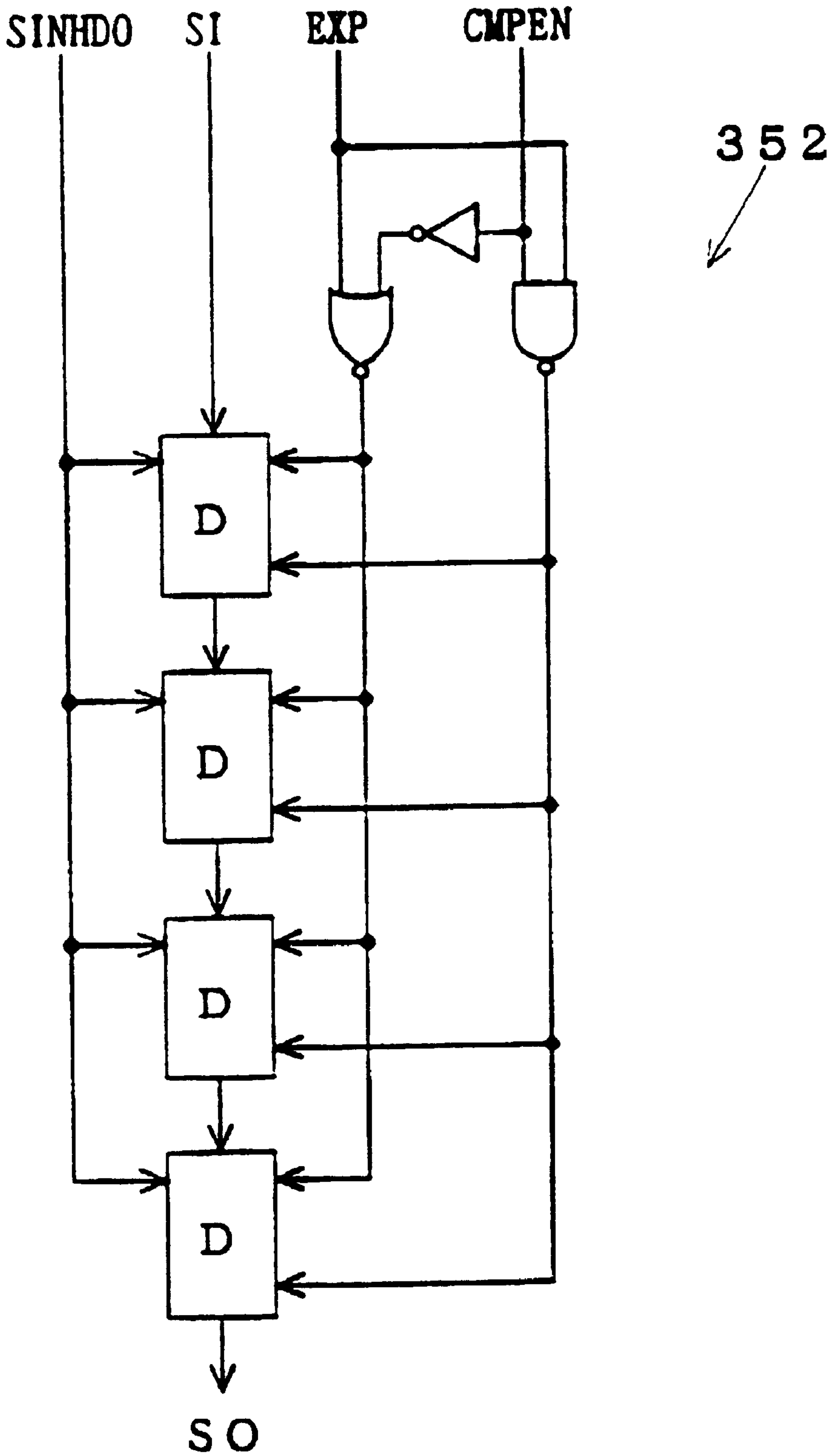
FIG. 96 is a block diagram showing a data output scan path of a semiconductor memory testing device according to a twelfth modification of the present invention.

When the test data is limited to "0000" or "1111", further, a structure (twelfth modification) shown in FIG. 96 may alternatively be employed. In this case, an expected data (EXP) signal and a comparison enable signal (CMPEN) are not directly inputted in each scan FF ("D"), but converted to conversion expected data (EXP0 and EXP1C) through a logic circuit part 352 having a NOT circuit, a NAND circuit and a NOR circuit, for supplying test data.

Figure 97:
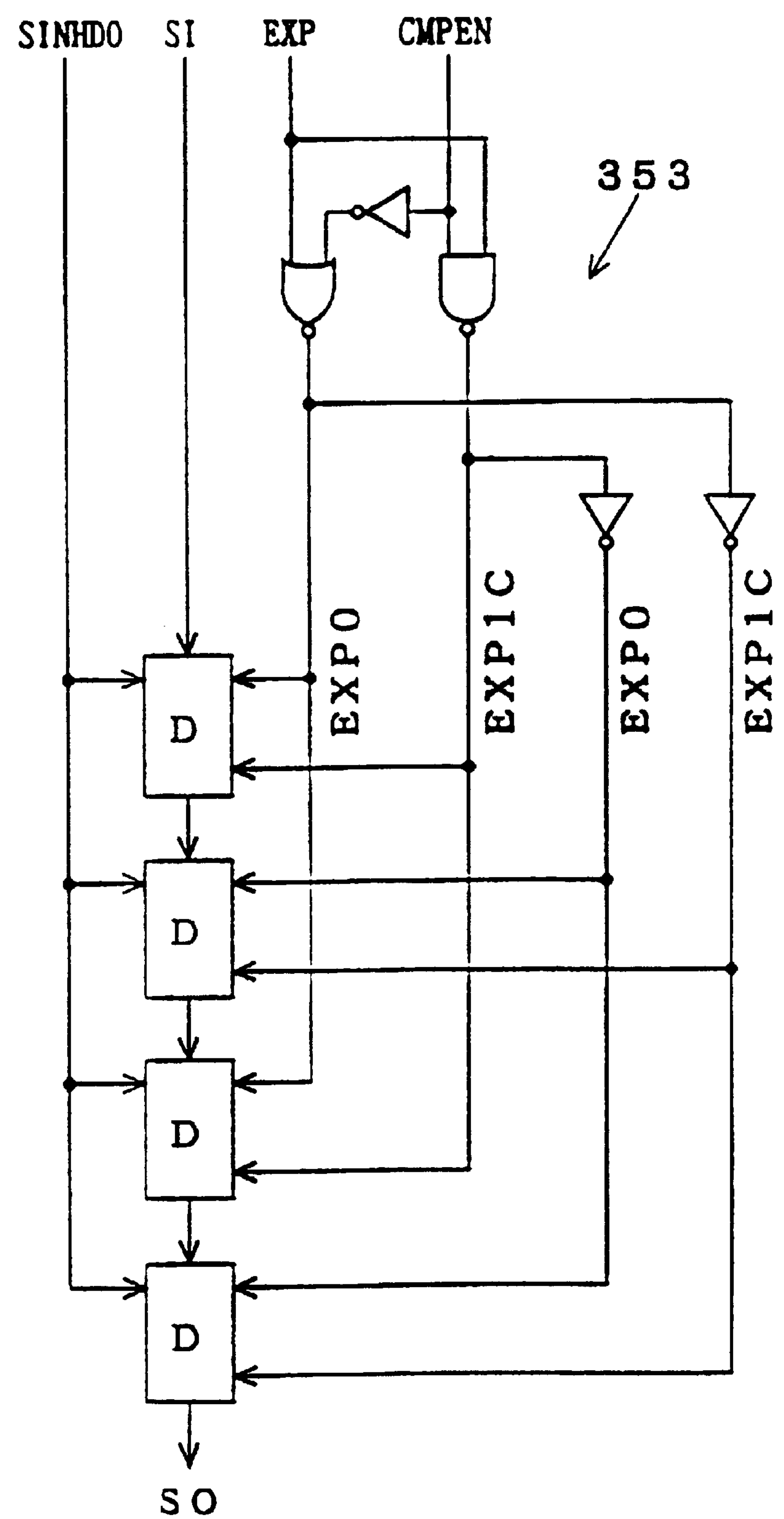
FIG. 97 is a block diagram showing a data output scan path of a semiconductor memory testing device according to a thirteenth modification of the present invention.
Figure 98:
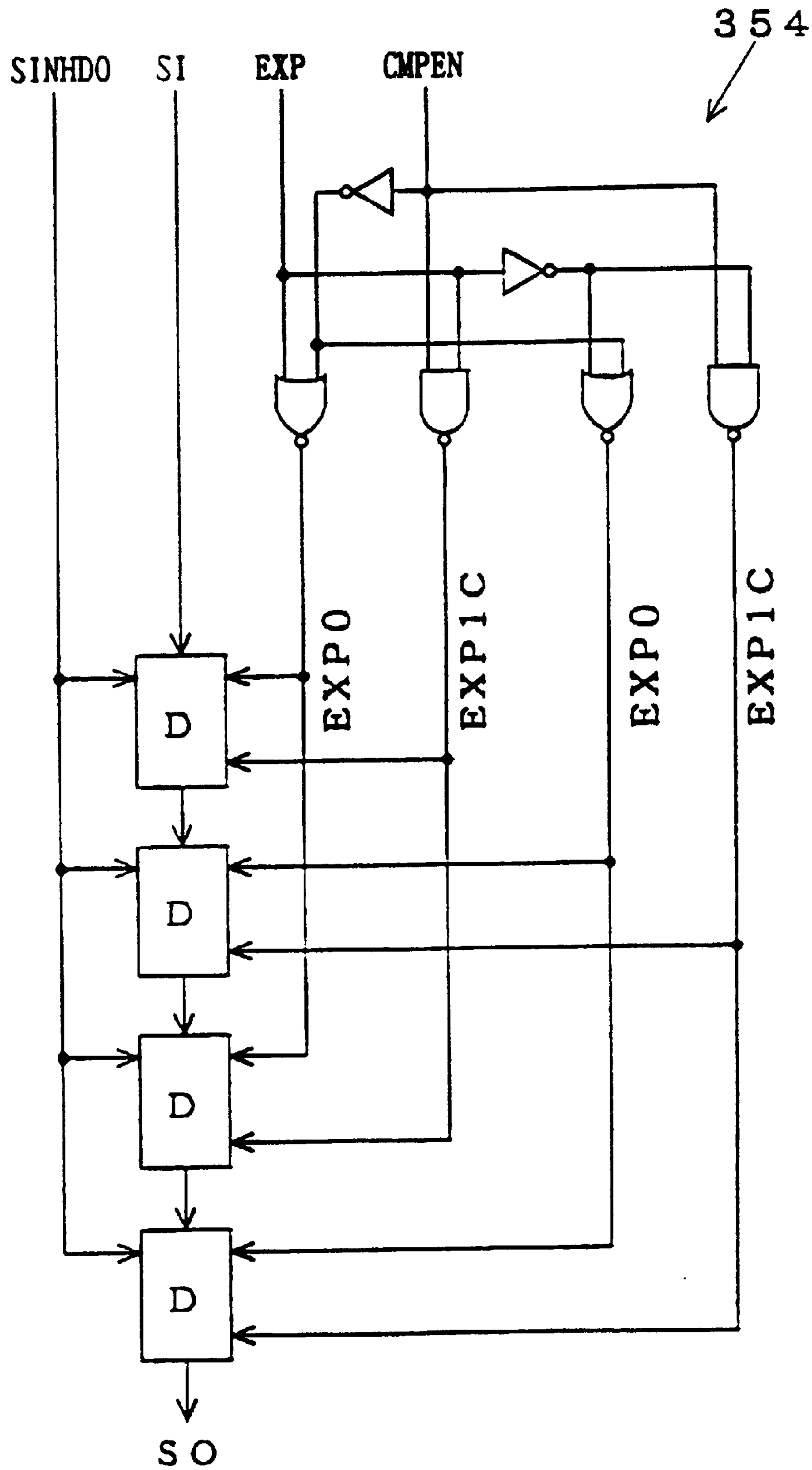
FIG. 98 is a block diagram showing a data output scan path of a semiconductor memory testing device according to a fourteenth modification of the present invention.

When the test data is converted to "0101" or "1010" similarly to the twelfth embodiment, on the other hand, a structure (thirteenth modification) shown in FIG. 97 or a structure (fourteenth modification) shown in FIG. 98 may be employed. In this case, an expected data (EXP0) signal and a comparison enable signal (CMPEN) are converted to conversion expected data (EXP0 and EXP1C) signals through logic circuit parts 353 and 354 having NOT circuits, NAND circuits and NOR circuits, for supplying test data. Thus, it is possible to readily cope with test data of "0101" or "1010", similarly to FIG. 68.

Figure 99:
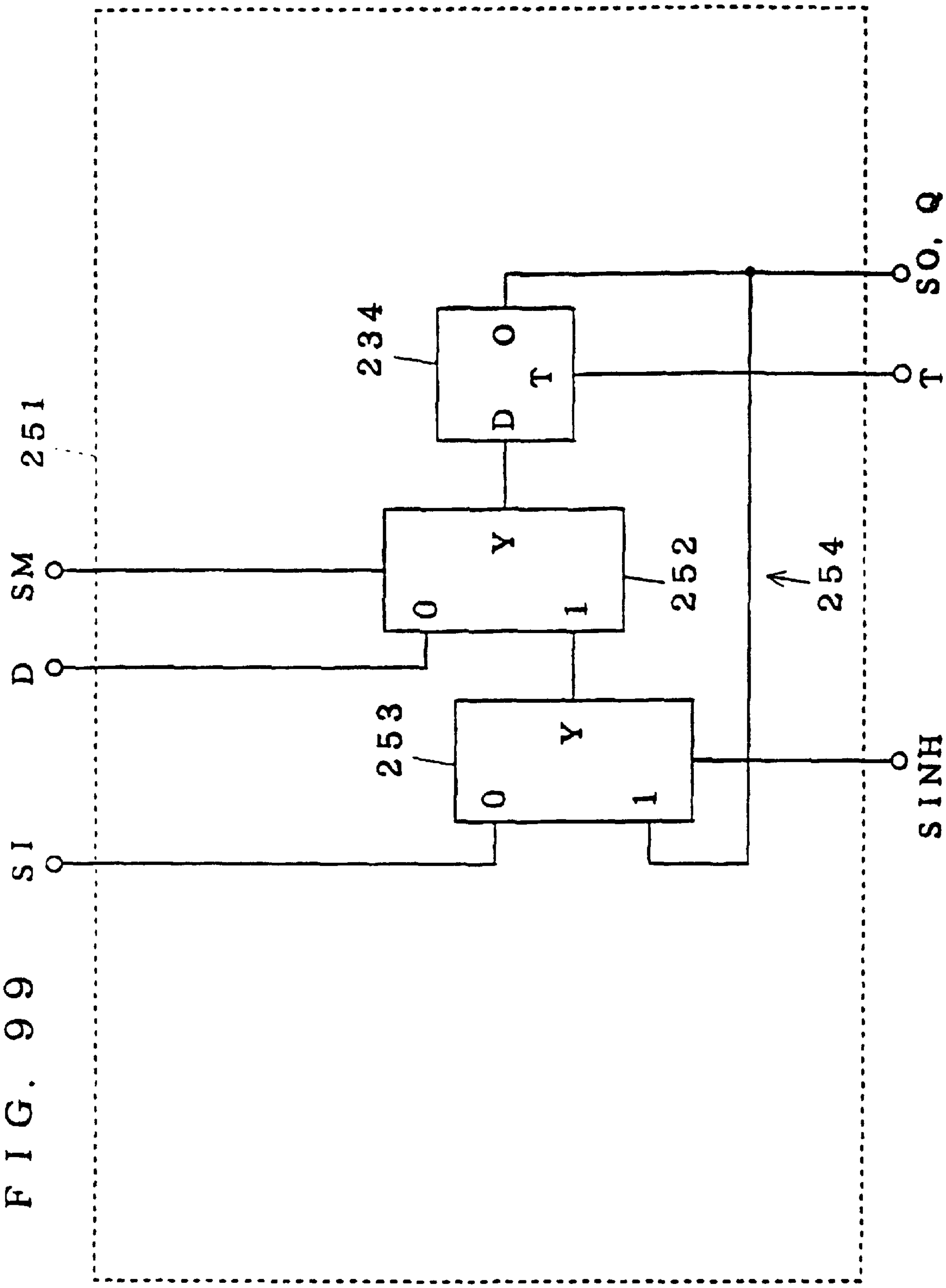
FIG. 99 illustrates a scan FF according to a fifteenth modification of the present invention.
Figure 100:
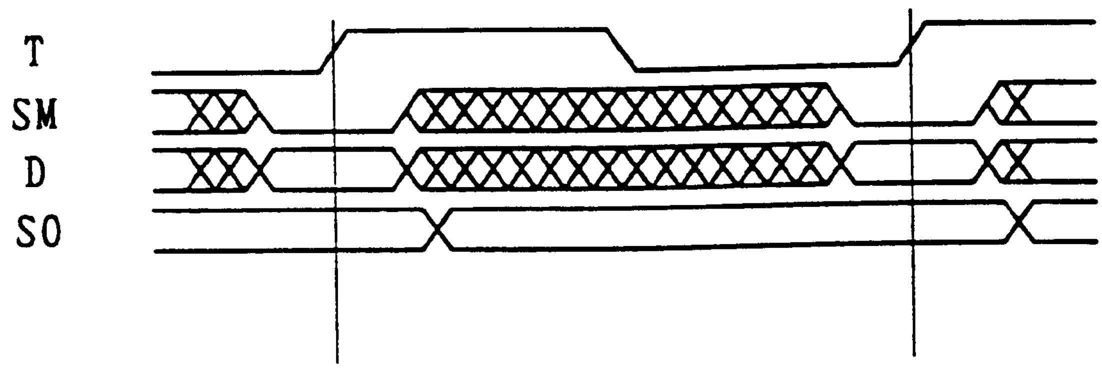
FIG. 100 is a timing chart showing a data incorporating operation of the scan FF according to the fifteenth modification of the present invention.
Figure 101:
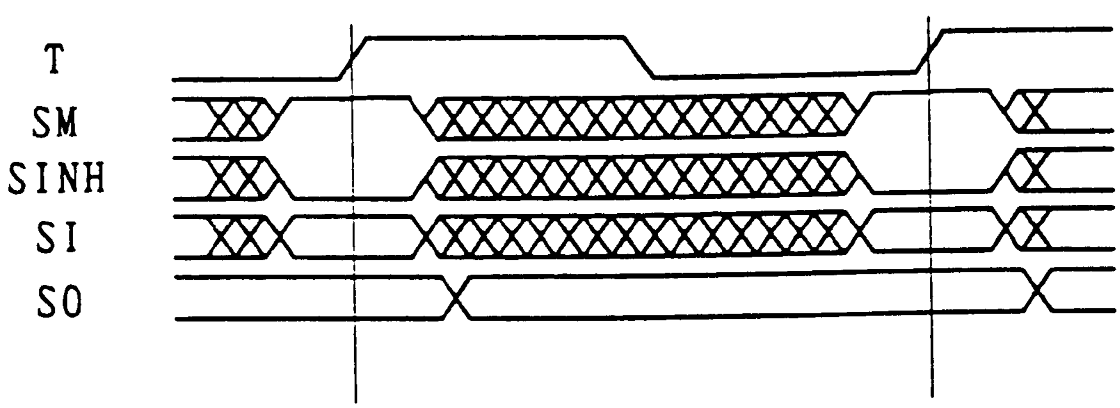
FIG. 101 is a timing chart showing a shift operation of the scan FF according to the fifteenth modification of the present invention.
Figure 102:
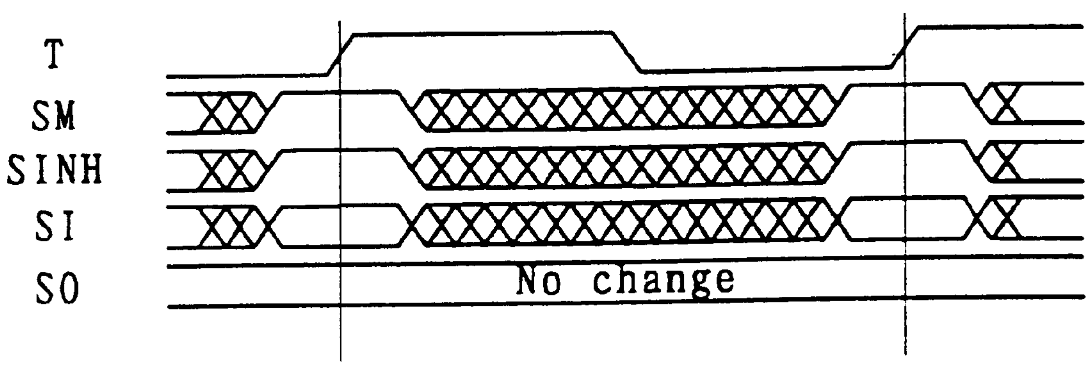
FIG. 102 is a timing chart showing a shift inhibiting operation of the scan FF according to the fifteenth modification of the present invention.

(7) While the circuit according to any of the first to third embodiments and the first to sixth modifications is applied as a scan FF in the twelfth embodiment, a structure (fifteenth modification) shown in FIG. 99, for example, may be applied if it is not necessary to make comparison with the expected data signal. In this case, operation timing charts showing data, incorporation, a shift operation and a shift inhibiting operation are as shown in FIGS. 100, 101 and 102 respectively.

Figure 103:
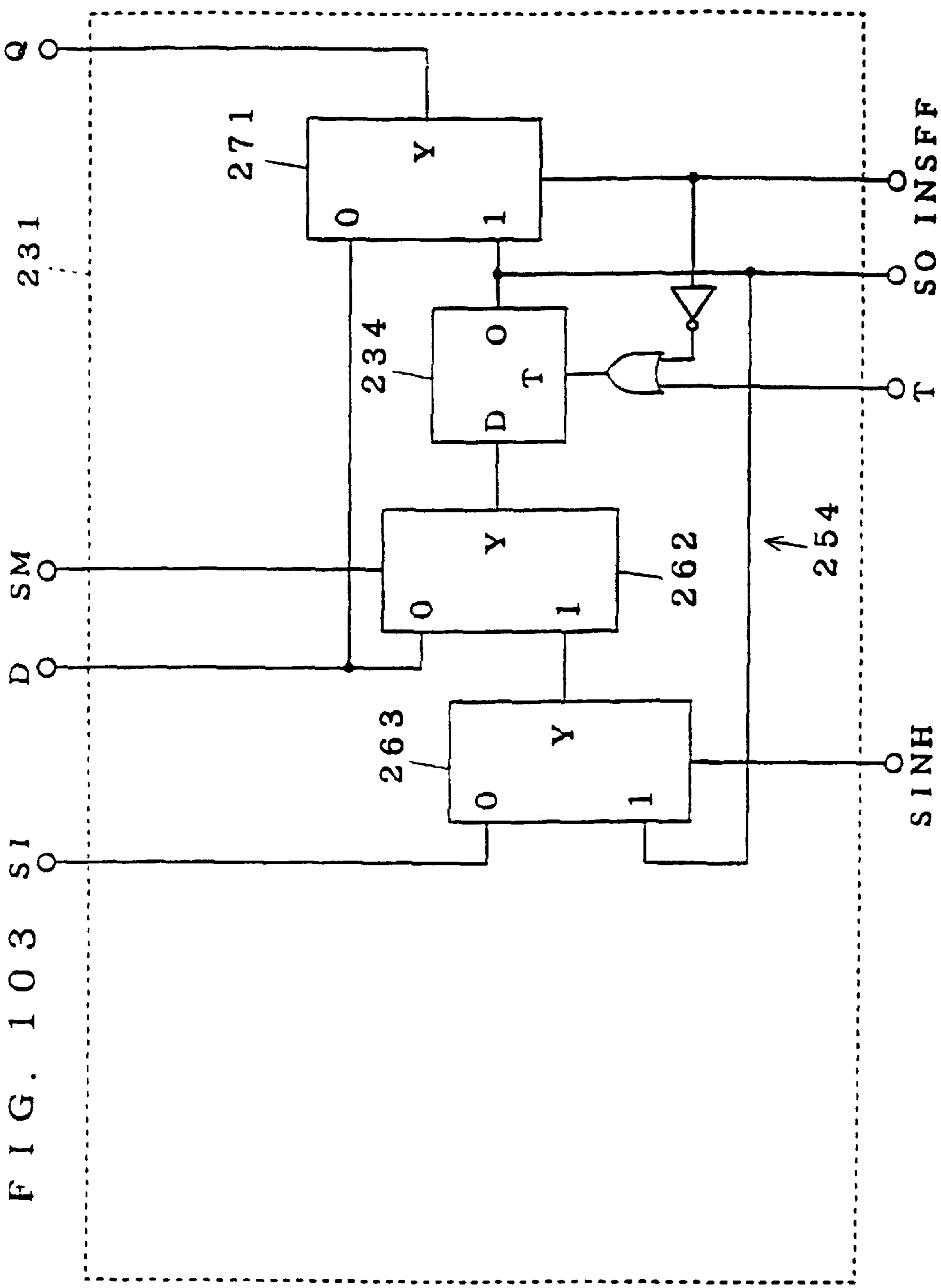
FIG. 103 illustrates a scan FF according to a sixteenth modification of the present invention.
Figure 104:
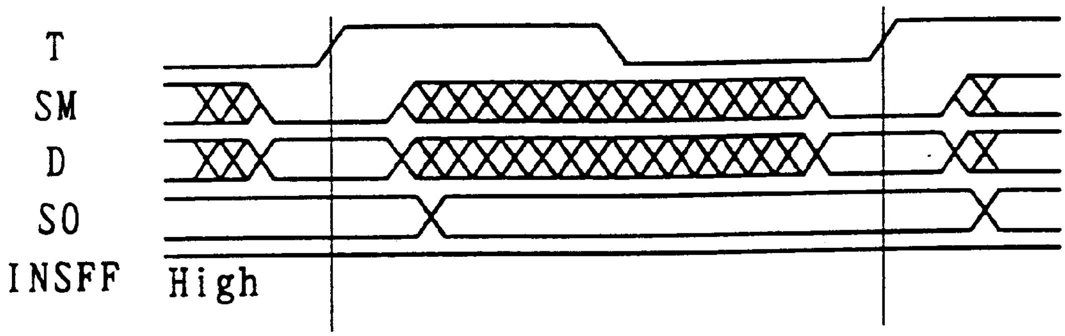
FIG. 104 is a timing chart showing a data incorporating operation of the scan FF according to the sixteenth modification of the present invention.
Figure 105:
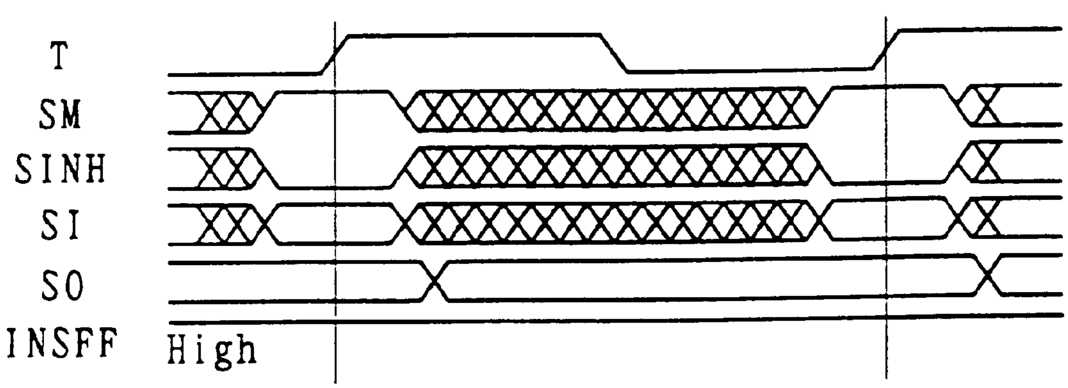
FIG. 105 is a timing chart showing a shift operation of the scan FF according to the sixteenth modification of the present invention.
Figure 106:
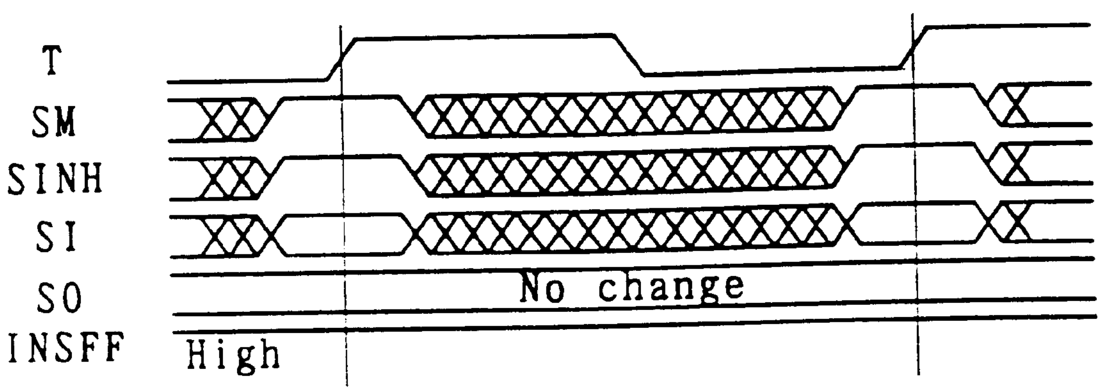
FIG. 106 is a timing chart showing a shift inhibiting operation of the scan FF according to the sixteenth modification of the present invention.

Or, a structure (sixteenth modification) shown in FIG. 103 may be employed. In this case, operation timing charts showing data incorporation, a shift operation and a shift inhibiting operation are as shown in FIGS. 104, 105 and 106 respectively.

Figure 107:
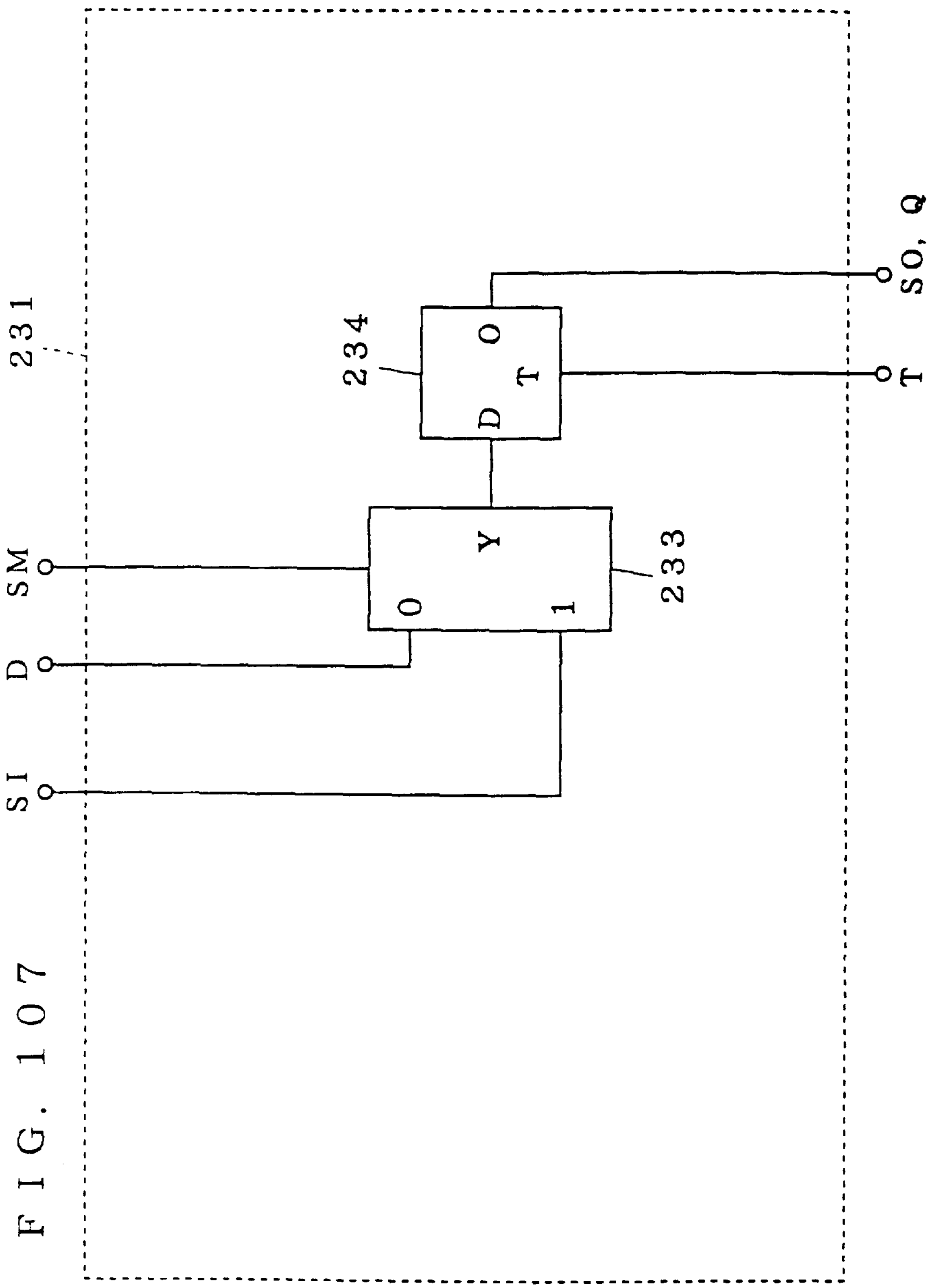
FIG. 107 illustrates a scan FF according to a seventeenth modification of the present invention.
Figure 108:
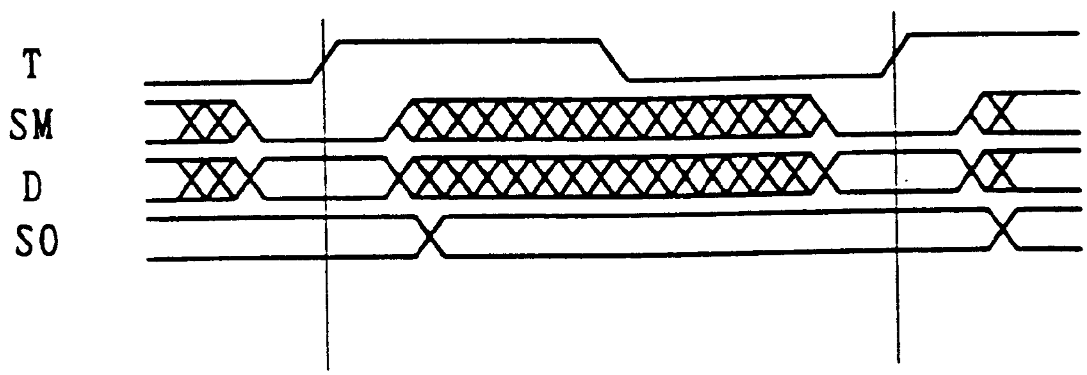
FIG. 108 is a timing chart showing a data incorporating operation of the scan FF according to the seventeenth modification of the present invention.
Figure 109:
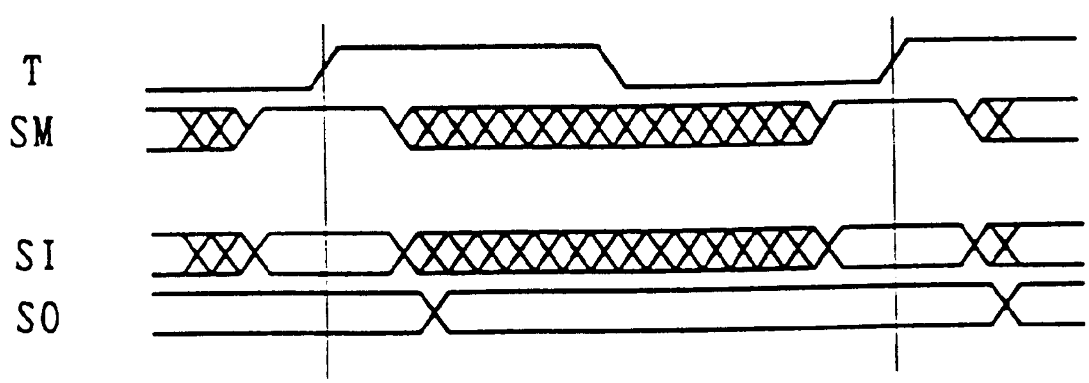
FIG. 109 is a timing chart showing a shift operation of the scan FF according to the seventeenth modification of the present invention.

When the control signal (SINH) can be omitted, a structure (seventeenth modification) shown in FIG. 107 can be employed. In this case, operation timing charts showing data incorporation and a shift operation are as shown in FIGS. 108 and 109 respectively.

Figure 110:
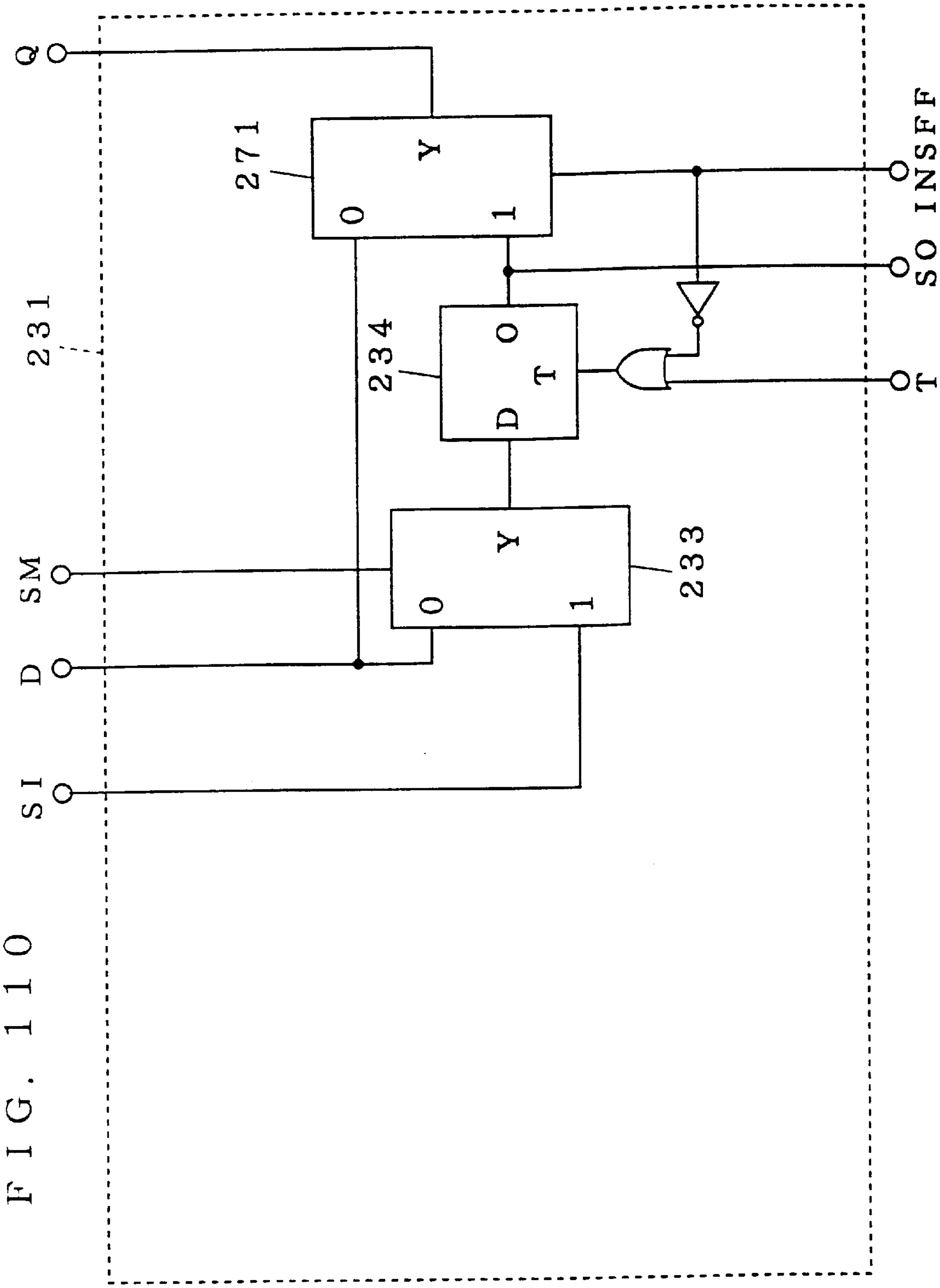
FIG. 110 illustrates a scan FF according to an eighteenth modification of the present invention.
Figure 111:
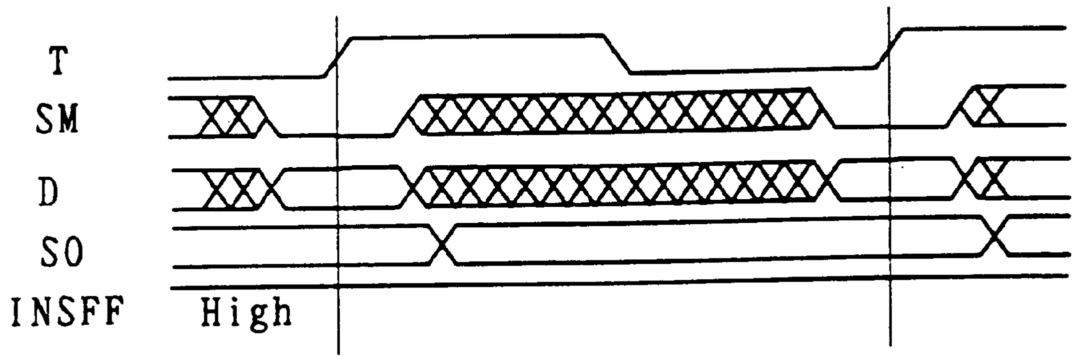
FIG. 111 is a timing chart showing a data incorporating operation of the scan FF according to the eighteenth modification of the present invention.
Figure 112:
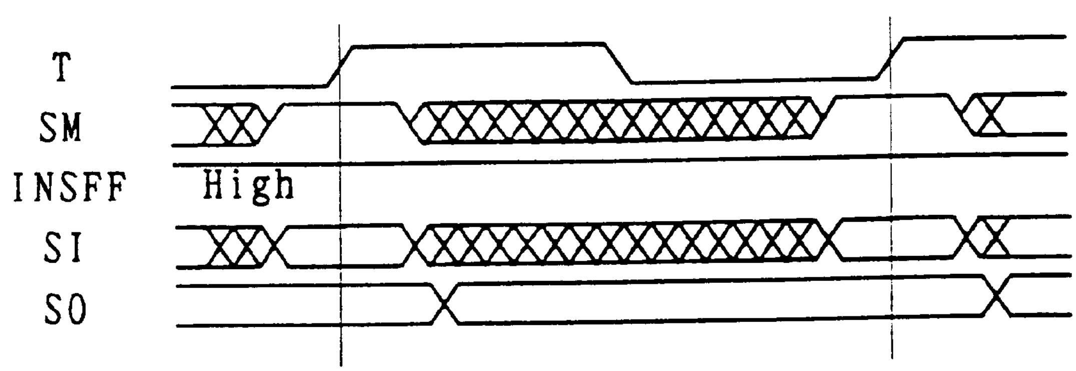
FIG. 112 is a timing chart showing a shift operation of the scan FF according to the eighteenth modification of the present invention.

When the control signal (SINH) can be omitted, further, a structure (eighteenth modification) shown in FIG. 110 can be employed. In this case, operation timing charts showing data incorporation and a shift operation are as show in FIGS. 111 and 112 respectively.

Figure 113:
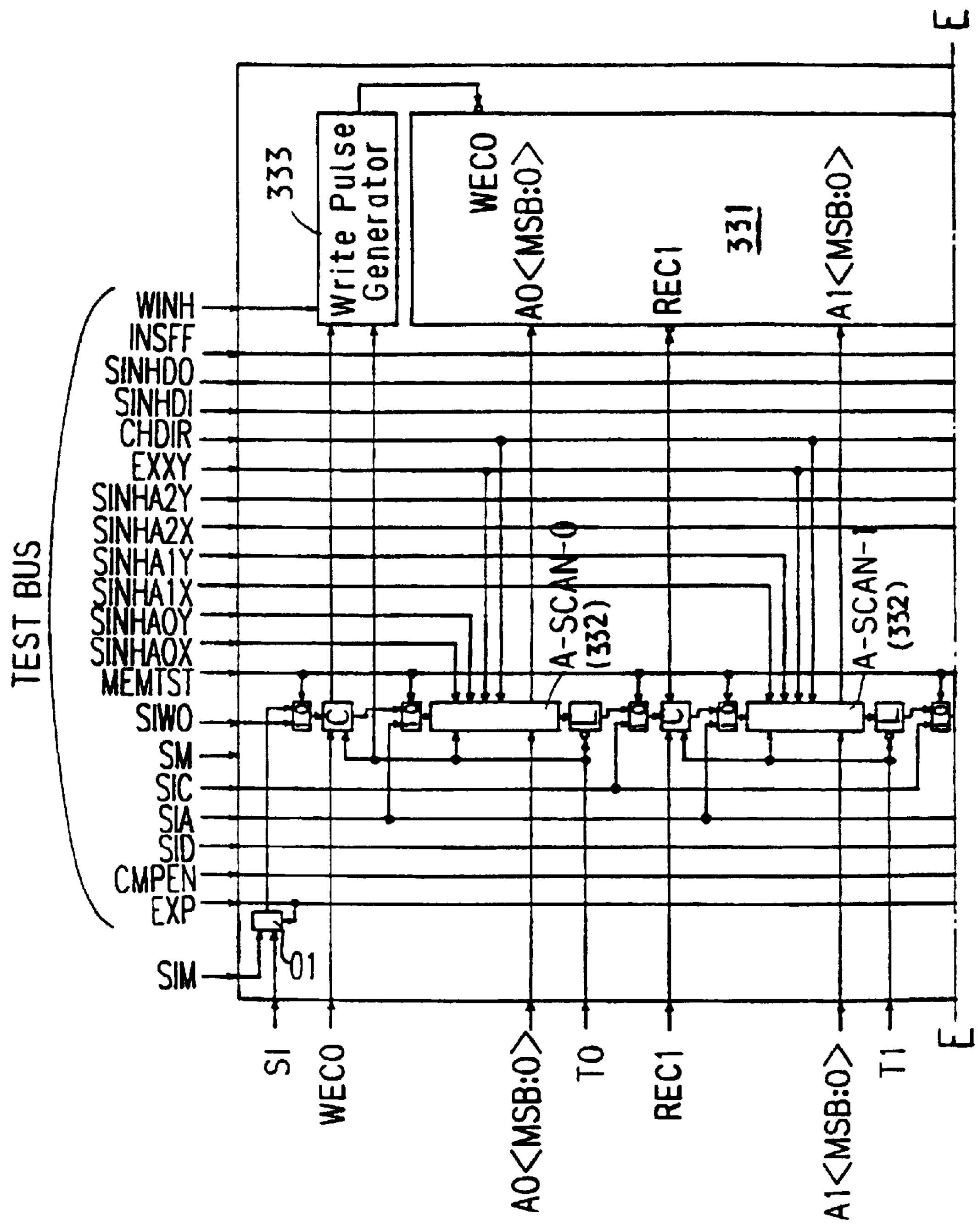
FIG. 113 is a block diagram showing a RAM core and a test circuit in a semiconductor memory testing device according to a nineteenth modification of the present invention.
Figure 114:
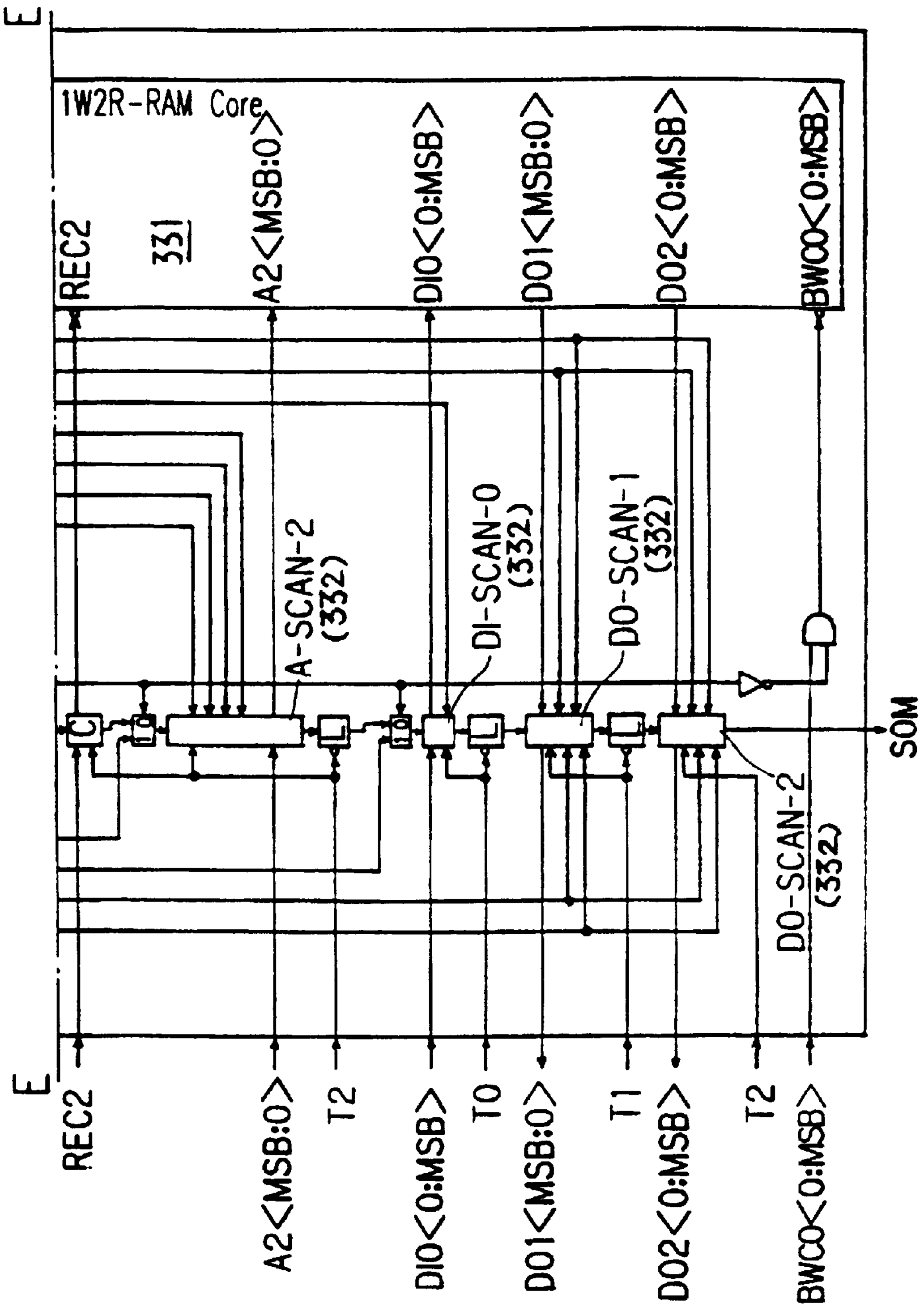
FIG. 114 is a block diagram showing the RAM core and the test circuit in the semiconductor memory testing device according to the nineteenth modification of the present invention.
Figure 115:
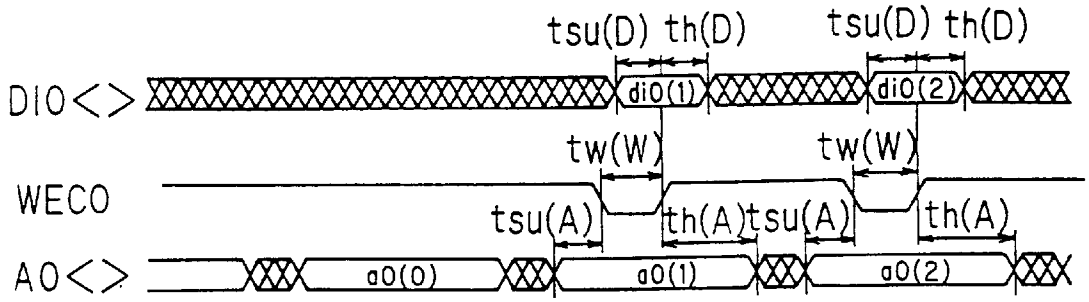
FIG. 115 is a timing chart showing a state of a write port in the semiconductor memory testing device according to the nineteenth modification of the present invention.
Figure 116:
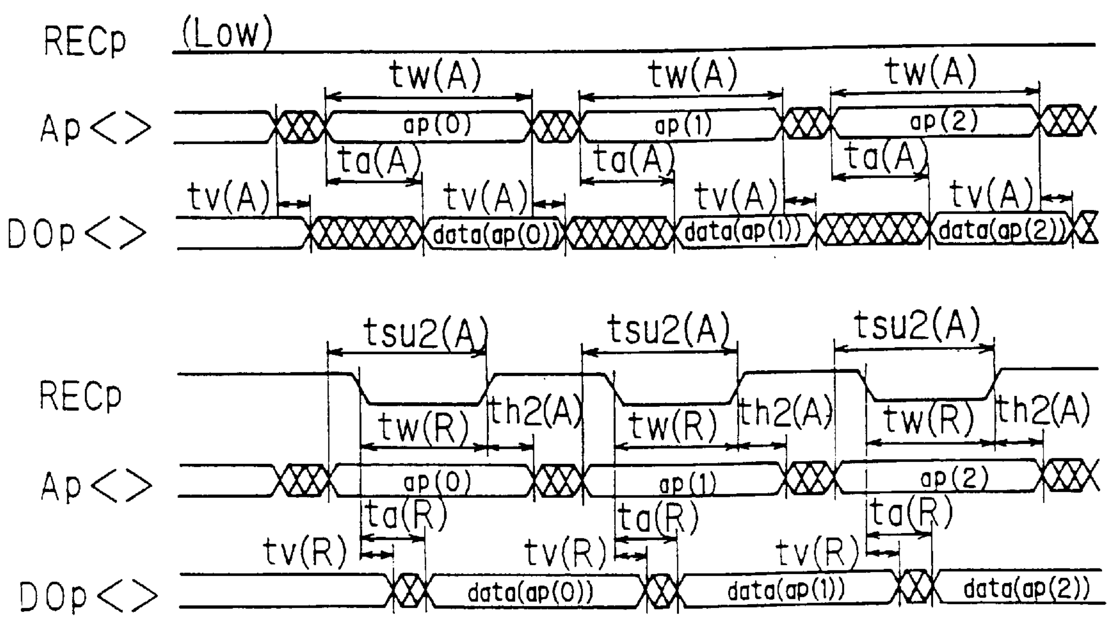
FIG. 116 is a timing chart showing a state of a read port in the semiconductor memory testing device according to the nineteenth modification of the present invention.
Figure 117:
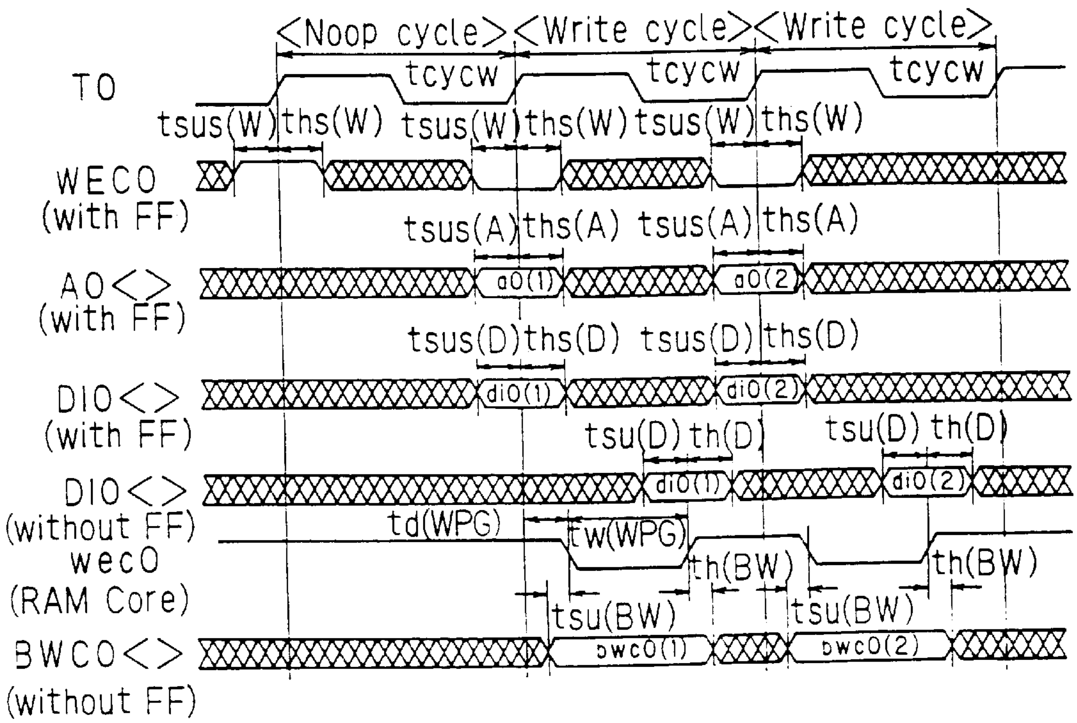
FIG. 117 is a timing chart showing a state of the write port in the semiconductor memory testing device according to the nineteenth modification of the present invention.
Figure 118:
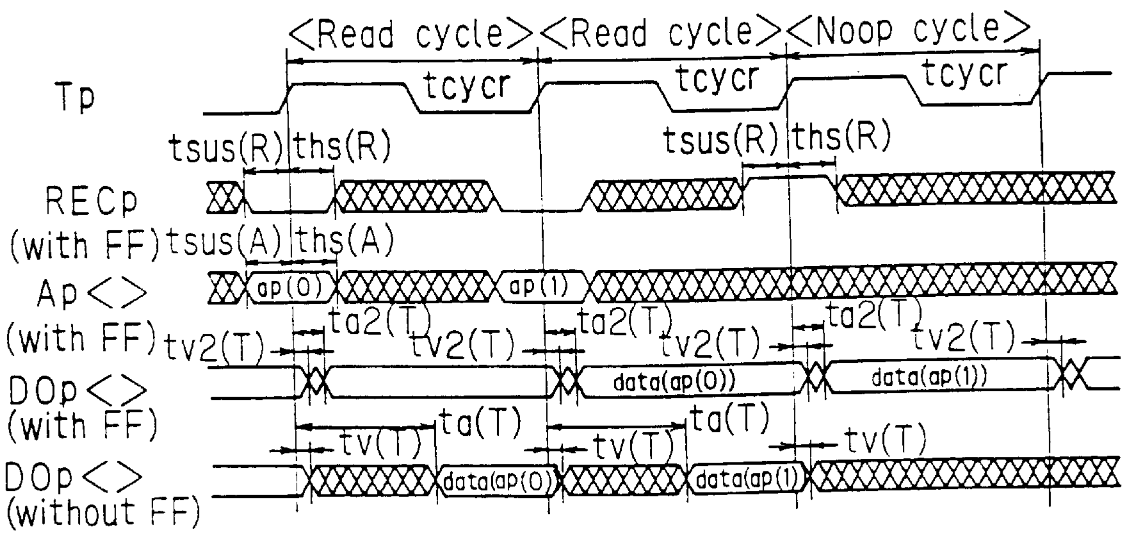
FIG. 118 is a timing chart showing a state of the read port in the semiconductor memory testing device according to the nineteenth modification of the present invention.

(8) Circuits (nineteenth modification) shown in FIGS. 113 and 114 may be employed in place of the circuits shown in FIGS. 64, 65, 87, 88, 91 and 92 in the twelfth, fourteenth and fifteenth embodiments respectively. FIGS. 113 and 114 are fragmented along the line E—E. While the fifteenth embodiment shown in FIGS. 91 and 92 is directed to a 2 port RAM having single write and read ports, the nineteenth modification shown in FIGS. 113 and 114 is directed to a 3 port RAM having one write port and two read ports. Symbol A0<MSB:0> denotes a multiplexer system write address, and symbols A1<MSB:0> and A2<MSB:0> denote multiplexer system read addresses. FIGS. 115, 116, 117 and 118 are timing charts showing states of a write port of a RAM core 331 of a semiconductor memory testing device according to the nineteenth modification, a read port of the RAM core 331, the write ports of the overall 3 port RAM and the read ports of the overall 3 port RAM respectively. Referring to FIGS. 113 and 114, symbols T0, T1 and T2 denote clock signals, which can be set at different frequencies.

Figure 119:
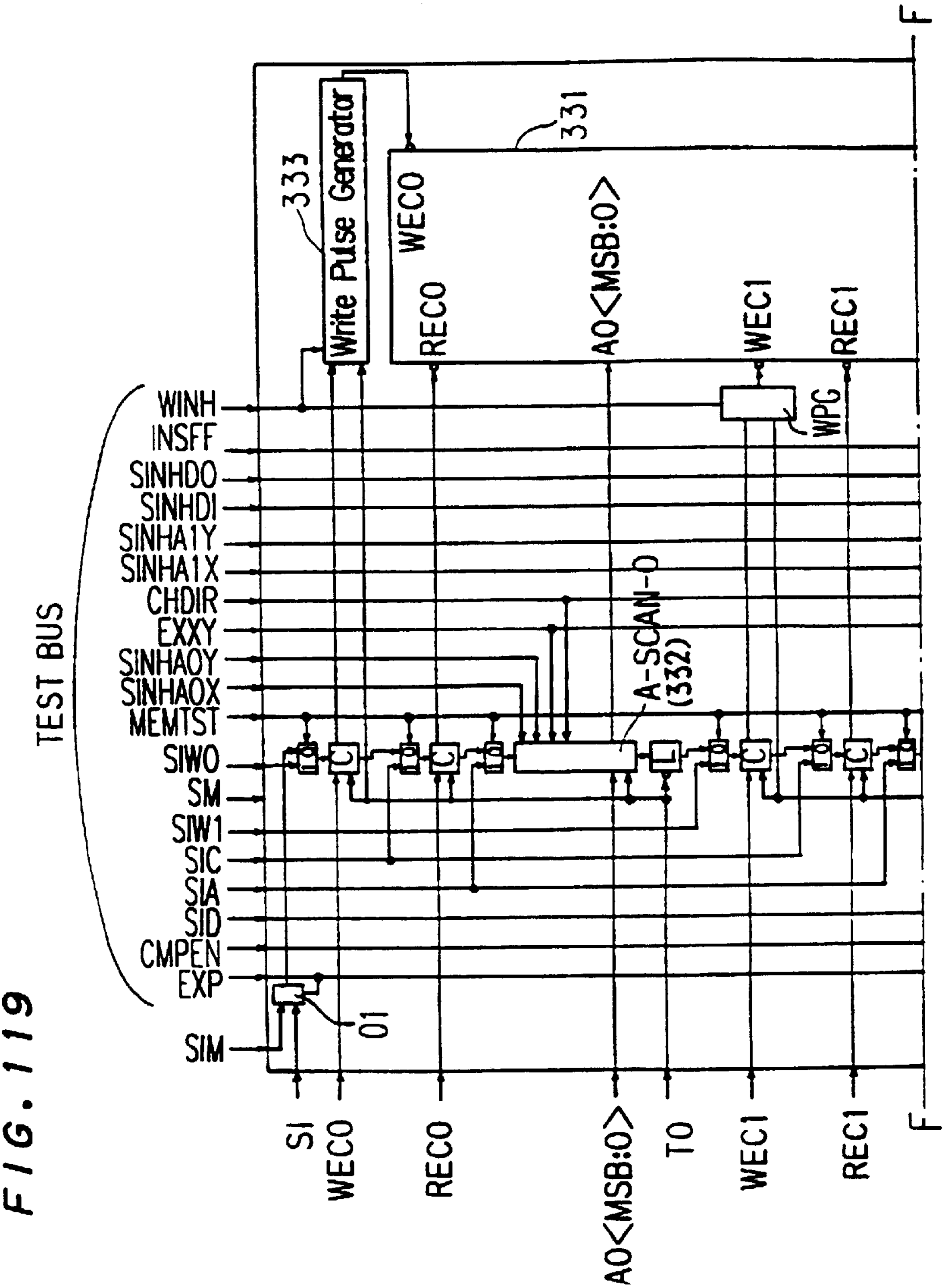
FIG. 119 is a block diagram showing a RAM core and a test circuit in a semiconductor memory testing device according to a twentieth modification of the present invention.
Figure 120:
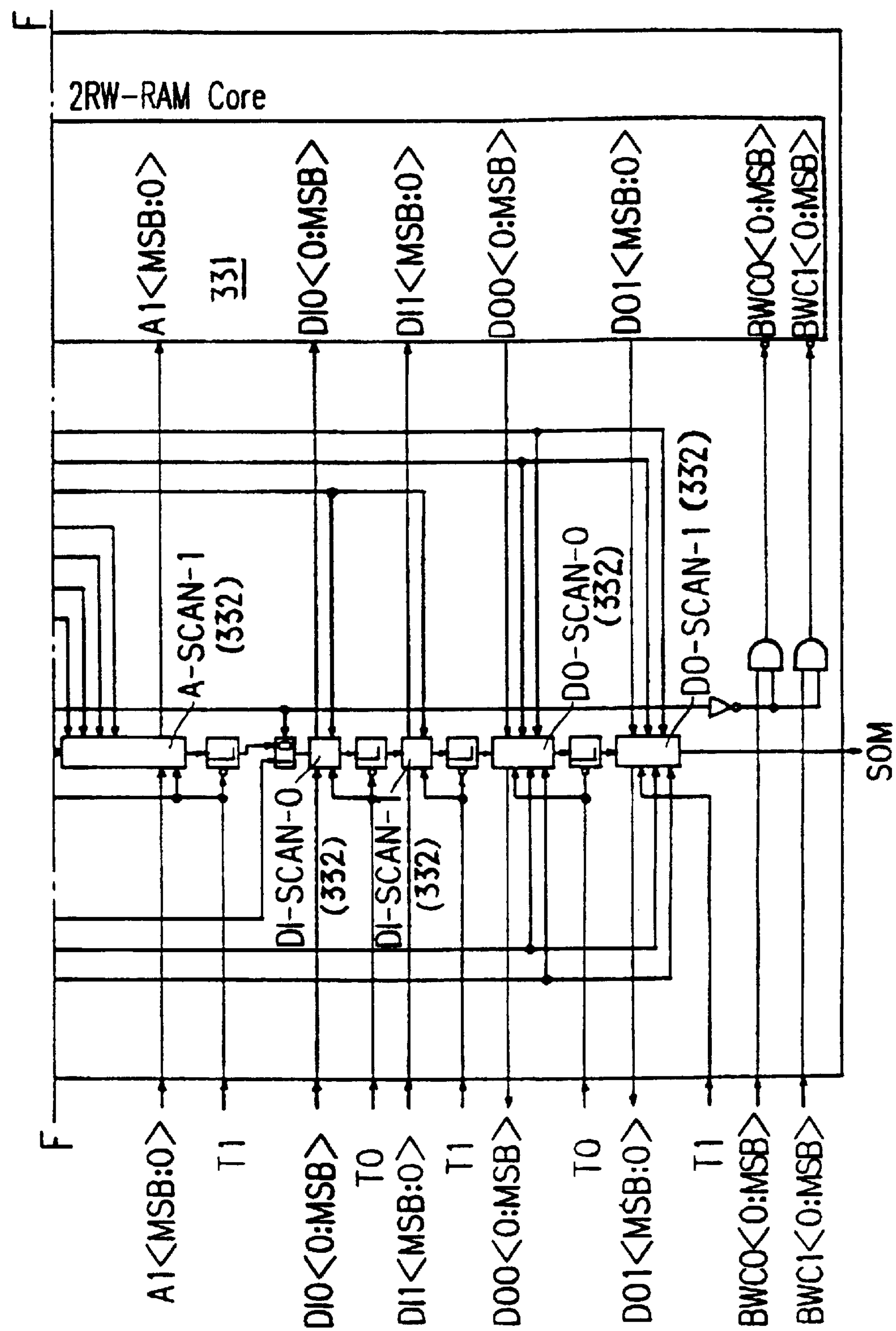

(9) In place of the circuit according to the nineteenth modification shown in FIGS. 113 and 114, a circuit (twentieth modification) shown in FIGS. 119 and 120 may be employed. FIGS. 119 and 120 are fragmented along the line F—F. In the circuit according to the twentieth modification, two ports are applied to both of writing and reading (2 port RAM).

Figure 124:
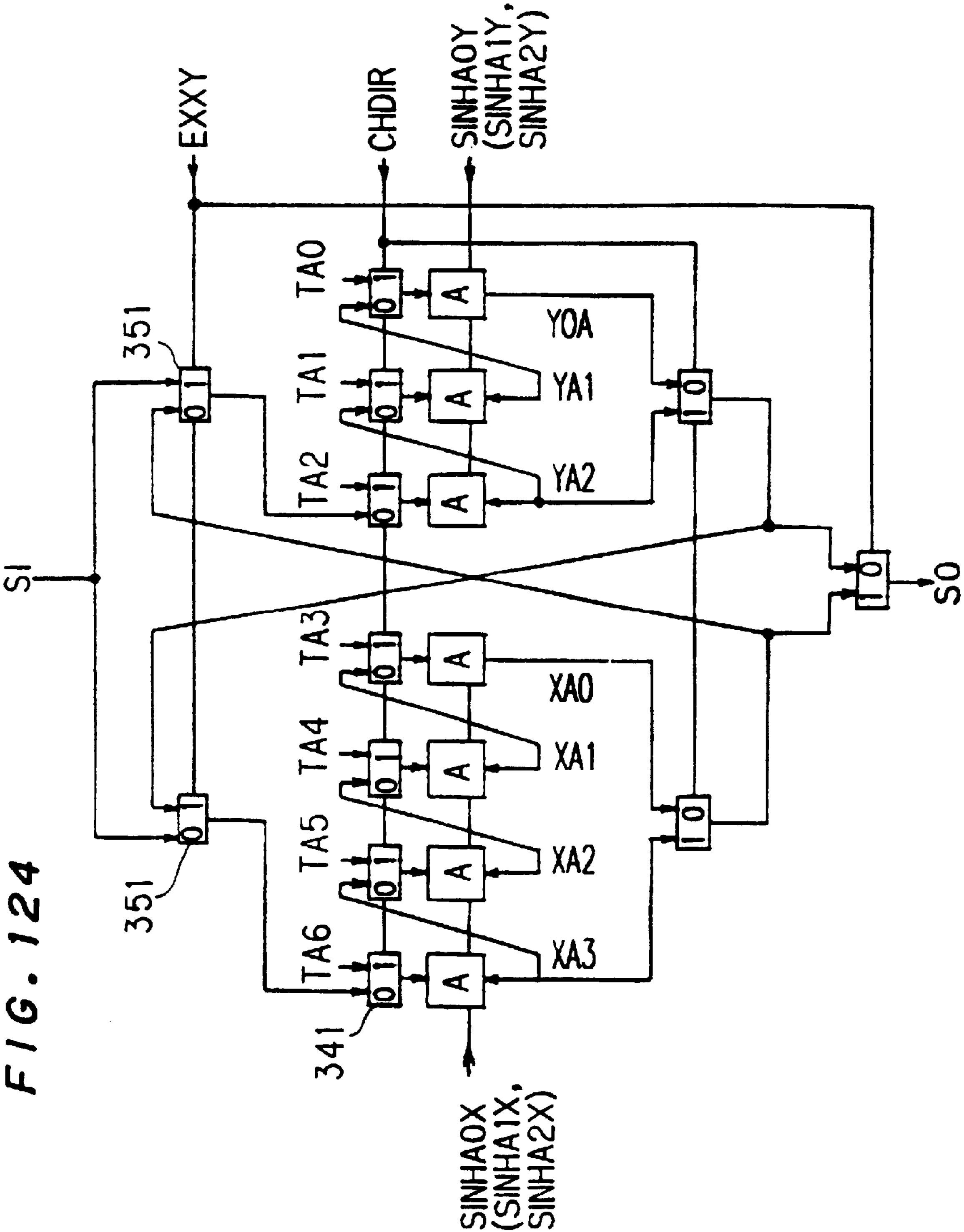
Figure 125:
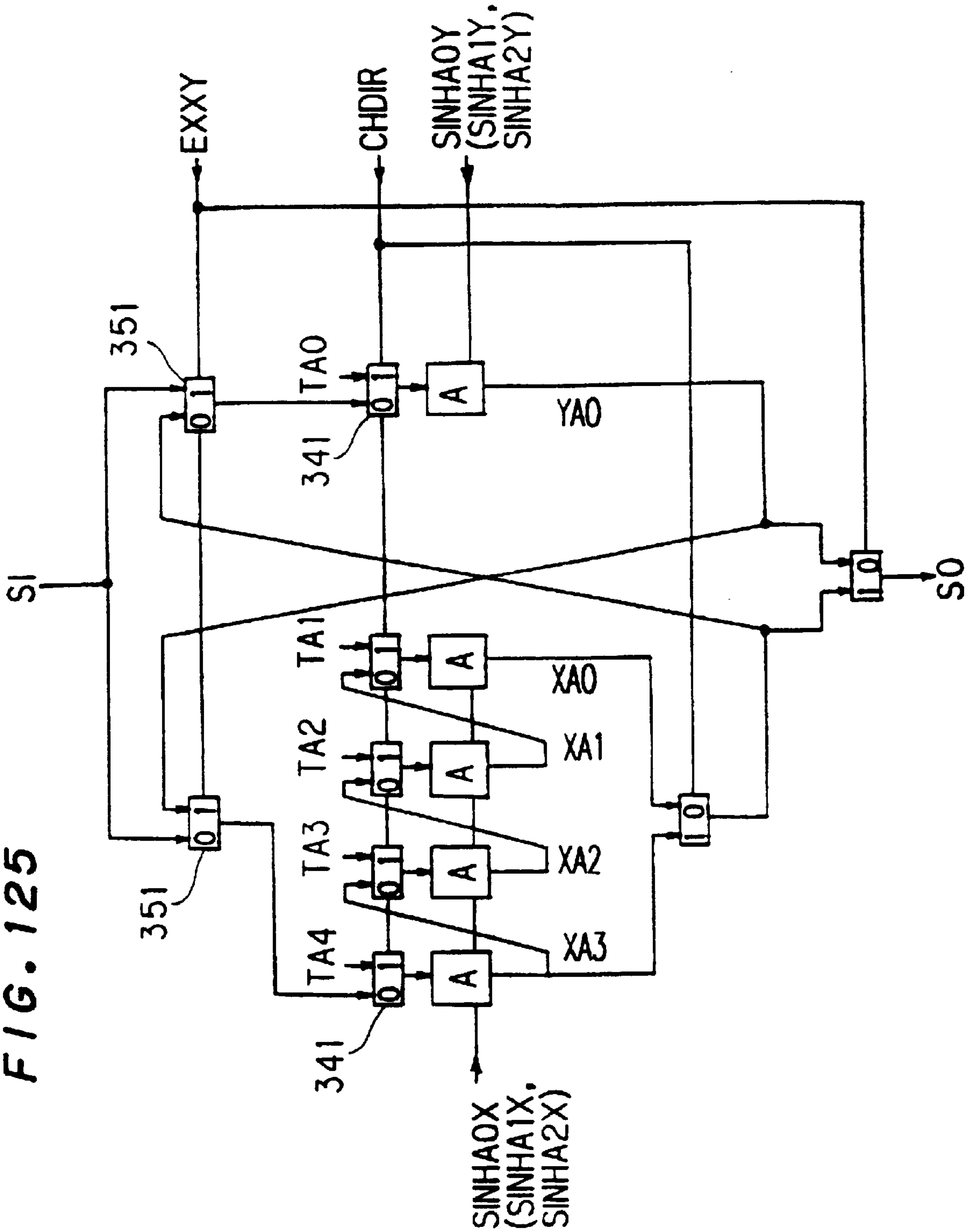

(10) While the structure shown in FIG. 123 is applied to B-SCAN in the sixteenth embodiment, either one of those shown in FIGS. 124 and 125 (twenty-first and twenty-second modifications) may be employed. The circuit shown in FIG. 124 is formed to be capable of selecting whether X address data or Y address data is regarded as the head when four X addresses and one Y address are set by switching a selector 351 by an XY switching signal (EXXY) in place of the circuit shown in FIG. 123, in a structure similar to the ninth modification (FIG. 93). On the other hand, the circuit shown in FIG. 125 is employed in place of the circuit shown in FIG. 123 or 124 when four X addresses and three Y addresses are set, in a structure similar to that of the tenth modification (FIG. 94).

In the circuit shown in FIG. 124 or 125, however, test address terminals TA (TA0, TA1, TA2, . . . ) are selected when a CHDIR signal is set at "1", dissimilarly to that shown in FIG. 93 or 94. As shown in FIG. 121, the test address terminal TA is provided as a RAMK pin. Therefore, it is possible to set addresses in arbitrary order to make a test. Namely, B-SCAN can set addresses by a serial shift operation when the CHDIR signal is "0". When the CHDIR signal is "1", on the other hand, it is possible to set addresses in a parallel manner by the test address terminal TA. An address signal for the test address terminal TA may be supplied from an external pin of an LSI, or by a test address generation circuit (corresponding to 301 in FIG. 60) which is built in the interior of the LSI. This test address generation circuit may be prepared from an algorithmic pattern generator which is provided in a memory LSI test device.

Figure 126:
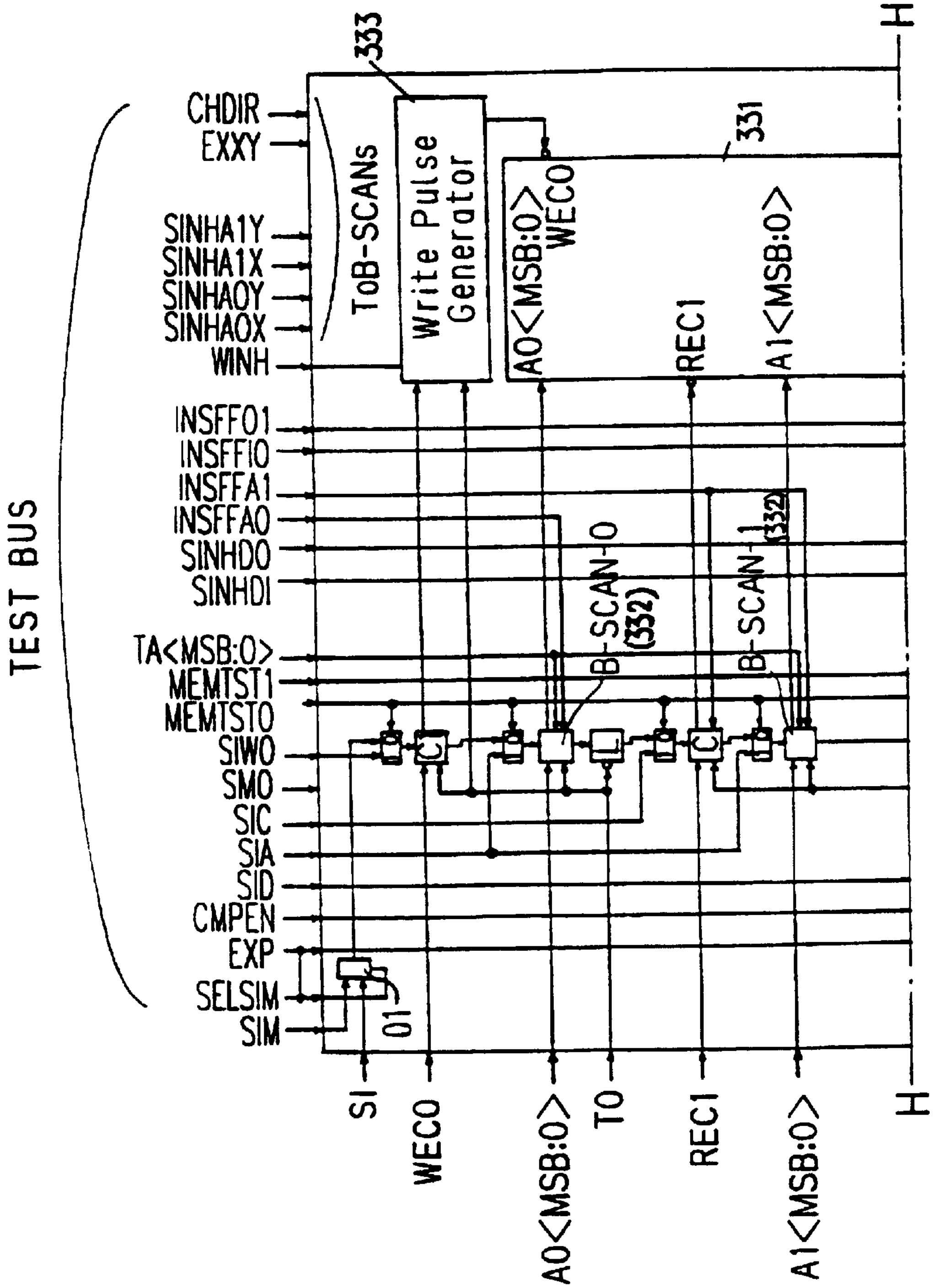
Figure 127:
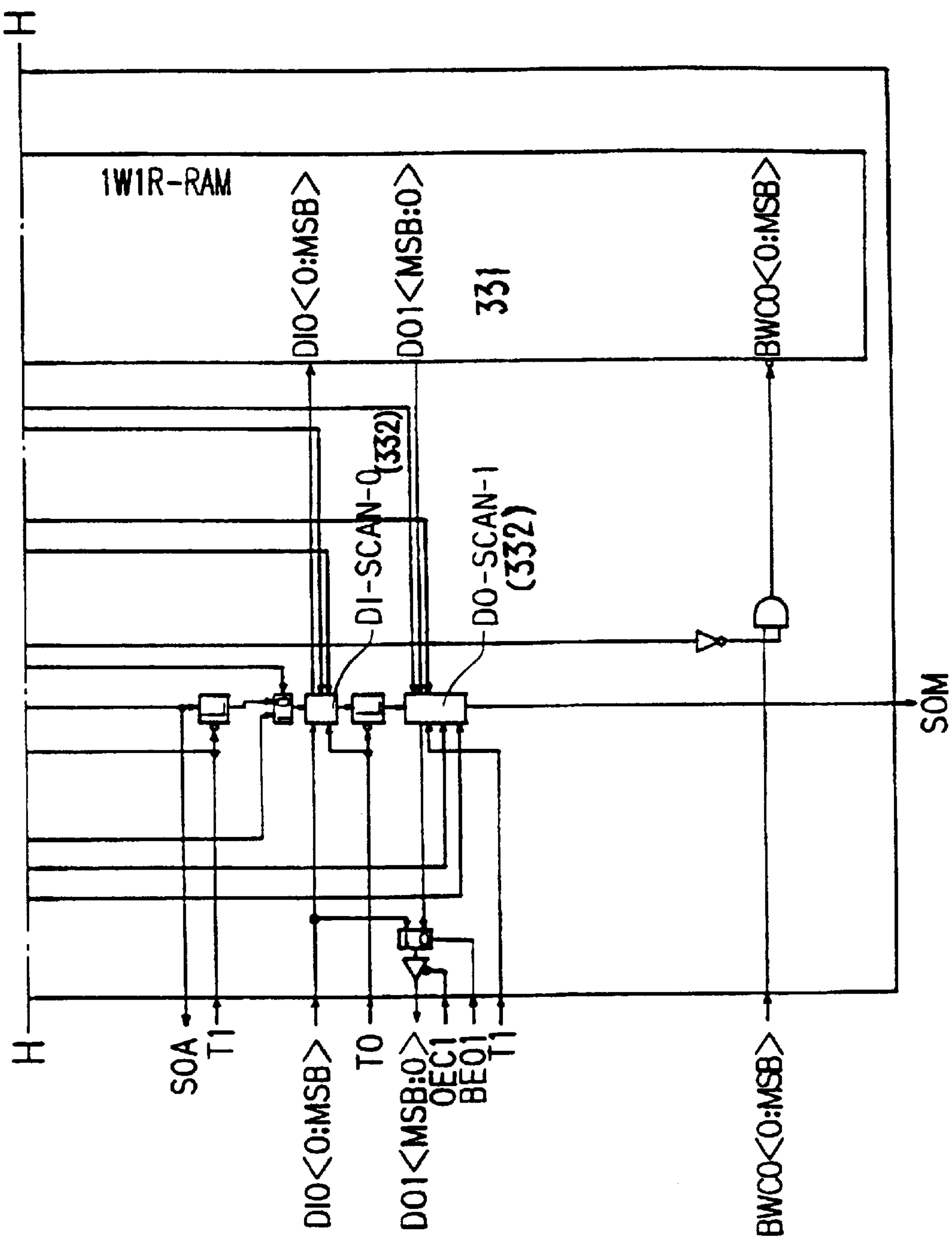

(11) A circuit shown in FIGS. 126 and 127 is a modification (twenty-third modification) of the fifteenth embodiment (2 port RAM having single write and read ports) shown in FIGS. 91 and 92. FIGS. 126 and 127 are fragmented along the line H—H. In the twenty-third modification, a test address terminal A for B-SCAN-0 and B-SCAN-1 is connected in common and provided as a pin of a RAM. When it is necessary to make a test of supplying separate addresses, two independent systems of test address terminals TA may be provided for B-SCAN-0 and B-SCAN-1 as RAM pins.

Figure 128:
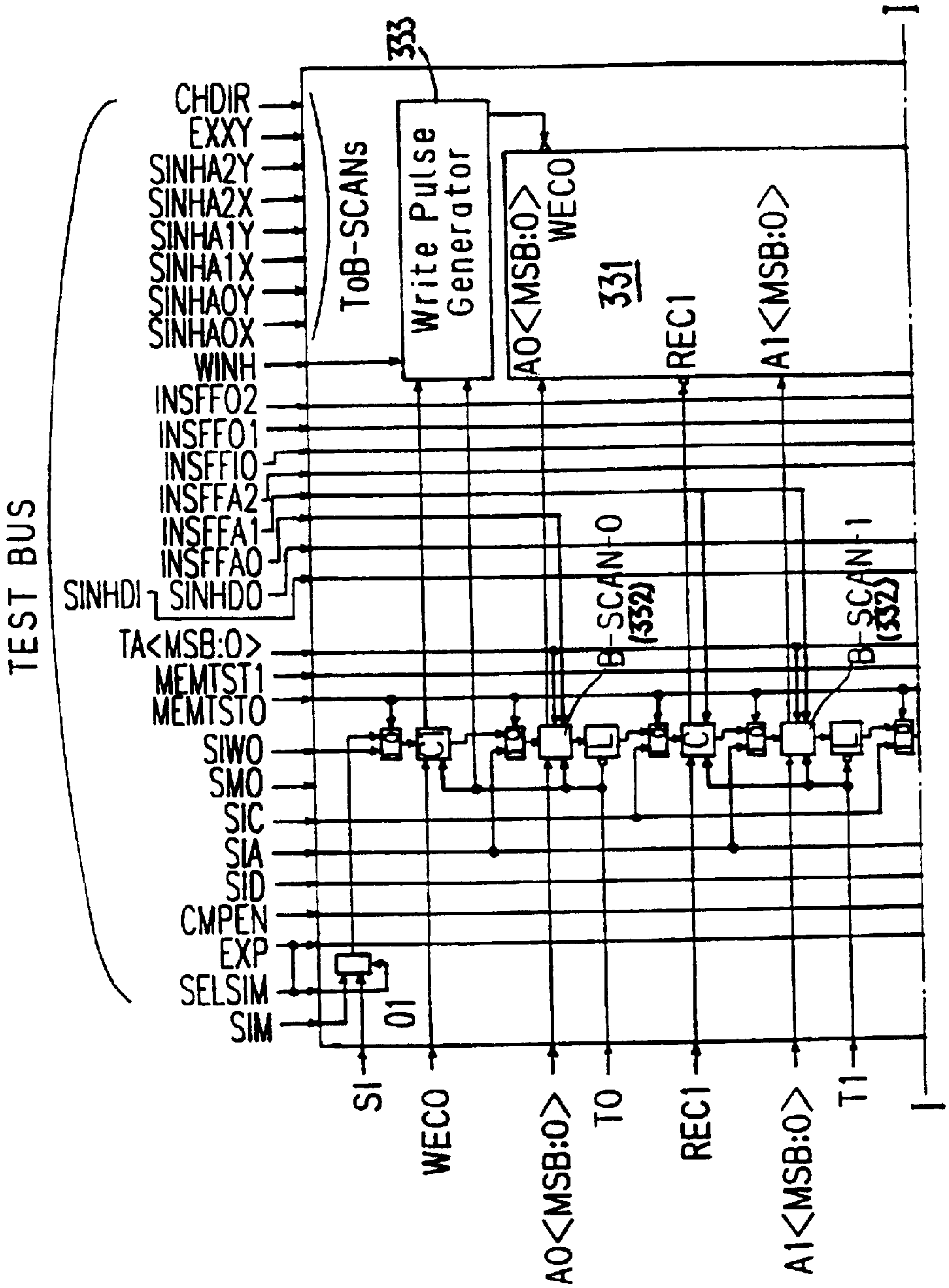
Figure 129:
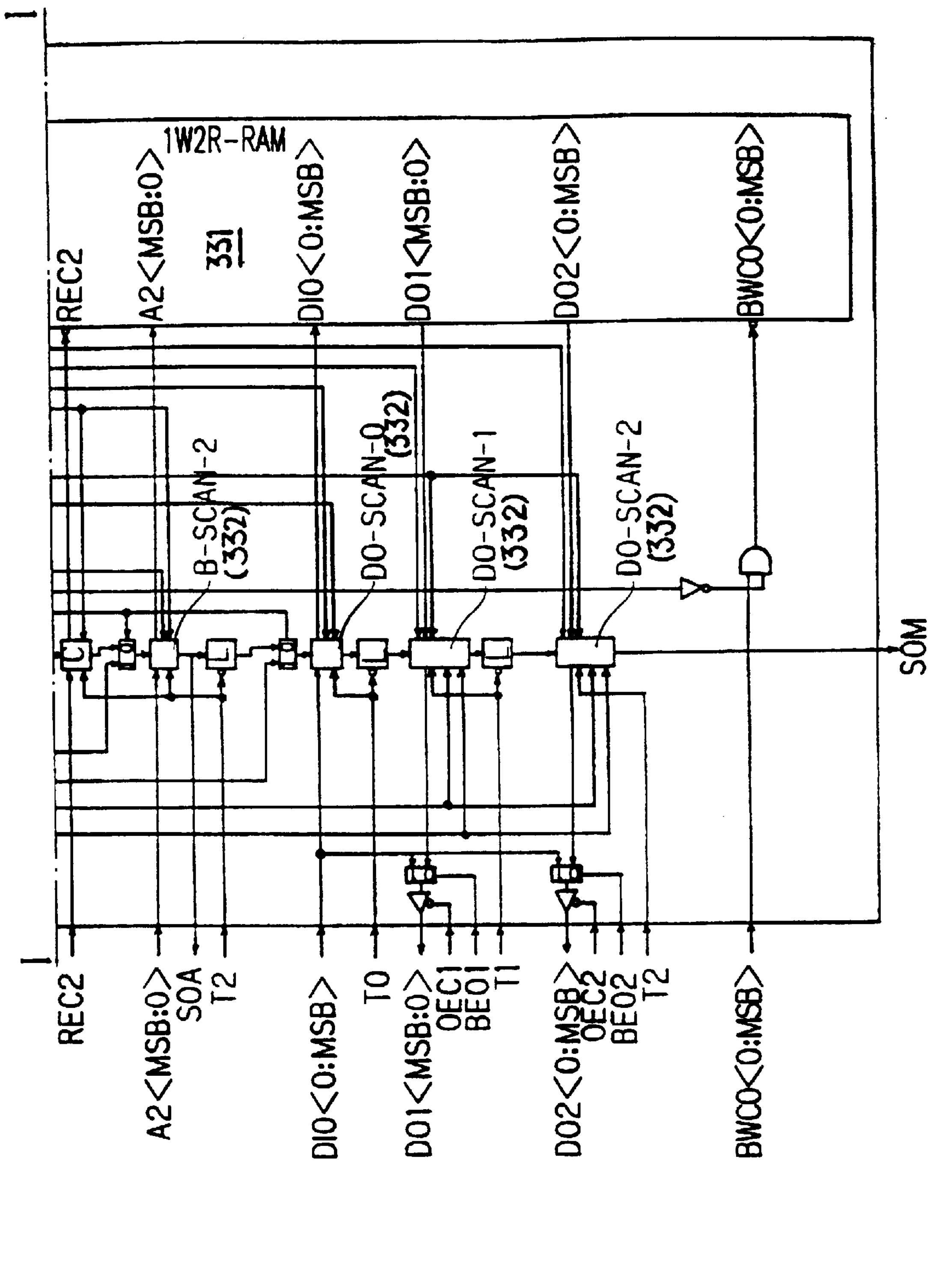

(12) A circuit shown in FIGS. 128 and 129 is a further modification (twenty-fourth modification) of the circuit according to the nineteenth modification shown in FIGS. 113 and 114. FIGS. 128 and 129 are fragmented along the line I—I. In the twenty-fourth modification, B-SCAN is employed in place of the address input scan path 332 (A-SCAN) of the nineteenth modification (FIGS. 113 and 114). Referring to FIGS. 128 and 129, a test address terminal TA for B-SCAN-0, B-SCAN-1 and B-SCAN-2 is connected in common and provided as a pin of a RAM. When a test of supplying separate addresses is made, independent test address terminals TA may be provided as RAM pins.

Figure 130:
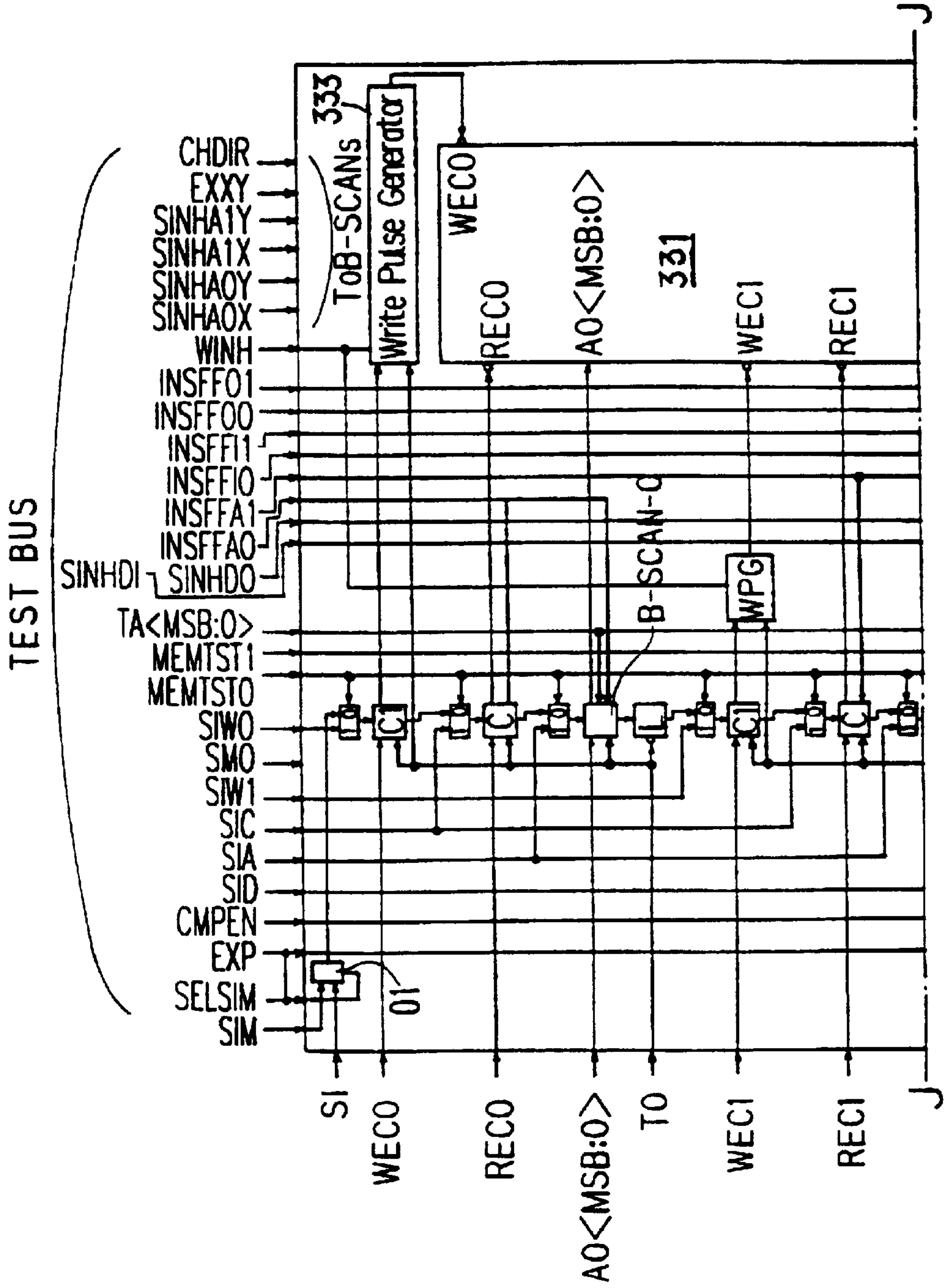
Figure 131:
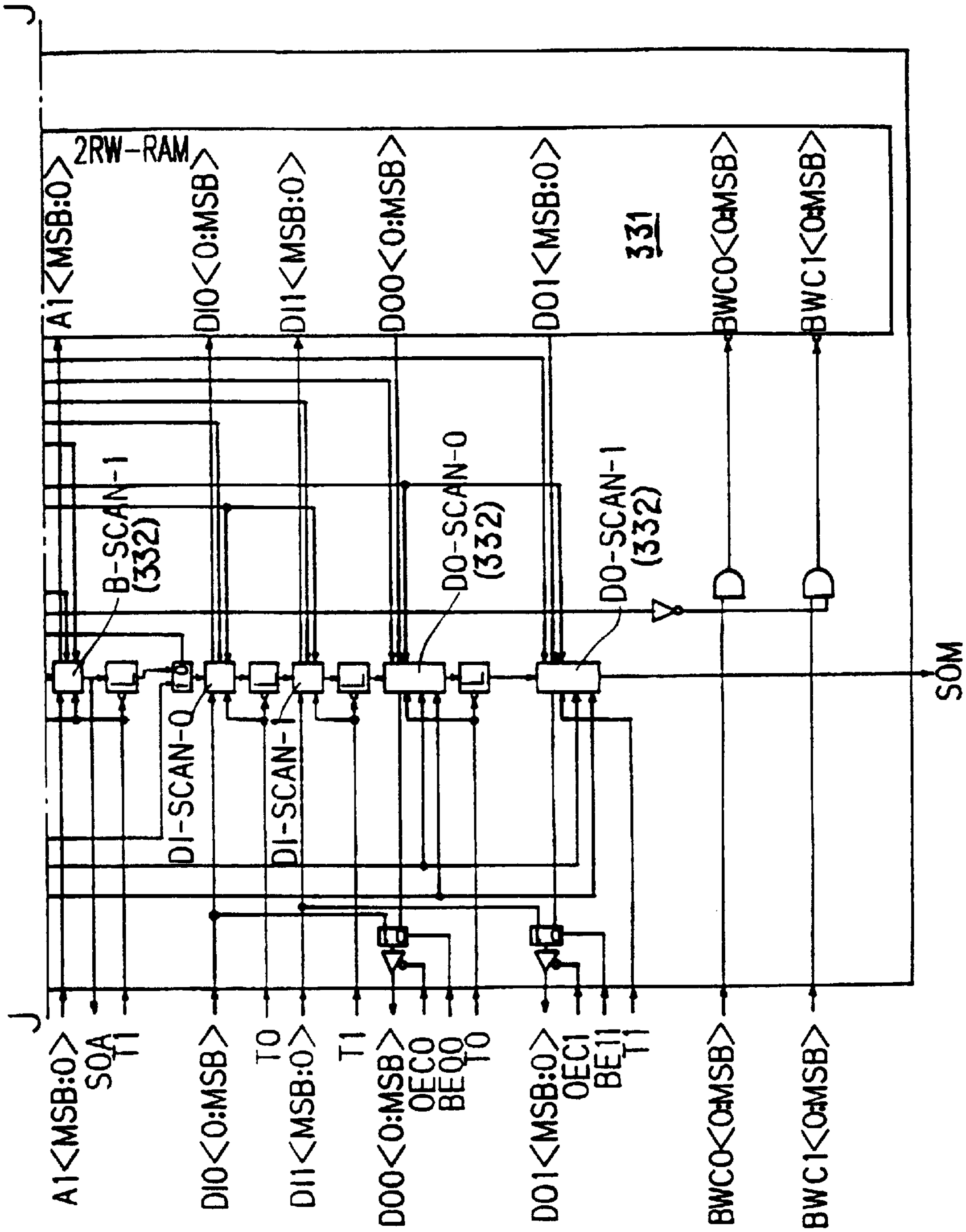

(13) A circuit shown in FIGS. 130 and 131 is a further modification (twenty-fifth modification) of the twentieth modification shown in FIG. 120. FIGS. 130 and 131 are fragmented along the line J—J. In the twenty-fifth modification, B-SCAN is employed in place of the address input scan path 332 (A-SCAN) in the twentieth modification (FIGS. 119 and 120). Referring to FIGS. 130 and 131, a test address terminal TA of B-SCAN-0 and B-SCAN-1 is connected in common and provided as a pin of a RAM. When it is necessary to make a test of supplying separate addresses, two independent systems of test address terminals TA may be provided for B-SCAN-0 and B-SCAN-1 as RAM pins.

(14) The self test circuit 702 of the nineteenth and the twentieth preferred embodiments is not limited to the structure shown in FIGS. 143 and 147. A regular random logic circuit may be used as the self test circuit 702, for instance.

(15) In the preferred embodiments above, the register circuit 706 is used as in FIGS. 142, 144, 150 and 155 to store and hold data since the test results from the RAM with test circuit 703 change during a regular operation of the system. However, if the test results from the RAM with test circuit 703 do not change during a regular operation of the system (e.g., when there are a plurality of flip-flops disposed which are connected to the data feedback loop wires as in FIG. 1, FIG. 6, FIG. 11, FIG. 17, FIG. 18, FIG. 19, FIG. 20 or FIG. 21), the register circuit 706 may be omitted.

(16) Although the circuit of the twenty-third preferred embodiment shown in FIGS. 153 and 154 forms a redundancy circuit of a two-stage hierarchy, the hierarchy circuit structure may include more stages so that a failure of more bits can be compensated. For example, to compensate three failure bits, the circuit enclosed by the dotted line as it is modified to lessen one bit may be further added. Unlike in FIGS. 153 and 154 where a failure bit is searched restrictedly from the LSB (least significant bit) side, the order of search may be optional (The search may be performed from the MSB (most significant bit) side or in a random order.).

(17) A failure bit may be detected from the significant bit side although a failure bit is detected from the least significant bit side in the first binary signal designating part 740 in the preferred embodiments above. In this case, the second binary signal designating part 800 of the twenty-second preferred embodiment may detect a failure bit from the least significant bit side. Further, the second binary signal designating part 840 of the twenty-third preferred embodiment may detect a failure bit either from the most significant bit side or the least significant bit side.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory testing device comprising:

a redundancy circuit for compensating incorrect data created when there is a failure in a semiconductor memory; and failure data digit destination means for designating a digit of a failure data related to said failure in said semiconductor memory, wherein said redundancy circuit includes:

a plurality of signal lines connected in correspondence to data of a plurality of digits of said semiconductor memory;

an extra line disposed adjacent to said signal lines;

a binary signal designating part for supplying first and second values, said binary signal designating part supplying said first value to signal lines on a first side to a signal line which is associated with a digit which is designated as a failure bit by said failure data digit designating means and supplying the second value to signal lines on a second side to said signal line which is associated with said digit which is designated as said failure bit; and a selector group for receiving a binary signal from said binary signal designating part, in response to said binary signal, said selector group disconnecting said signal line associated with said digit designated as said failure bit by said failure data digit designating means and for connecting an outer most signal line to said extra line and remaining signal lines to respective next signal lines.

2. A semiconductor memory testing device in accordance with claim 1, wherein said failure data digit designating means includes a binary data holding means for holding one of said first and second values in correspondence to said digit of said failure data and holding another of said first and second values in correspondence to other digits, wherein said binary signal designating part includes a plurality of AND circuits which correspond to data of said plurality of digits of said semiconductor memory, wherein first input terminals of said plurality of AND circuits are connected respectively to digits which correspond to said binary data holding means, and wherein second input terminals of said plurality of AND circuits are each connected to an output terminal of an adjacent AND circuit.

3. A semiconductor memory testing device in accordance with claim 2, wherein said binary data holding means includes a register whose digit number corresponds to a data digit number of said semiconductor memory.

4. A semiconductor memory testing device in accordance with claim 2, wherein said binary data holding means includes a plurality of flip-flops connected to data feedback loop wires.

5. A semiconductor memory testing device in accordance with claim 1, wherein said failure data digit designating means includes a binary data holding means for holding one of said first and second values in correspondence to said digit of said failure data and holding another of said first and second values in correspondence to other digits, said selector group includes:

a plurality of primary selector parts for selecting mutually adjacent signal lines; and a plurality of secondary selector part for selecting output terminals of said plurality of primary selector parts, said binary signal designating part includes:

a primary control circuit for switching said plurality of primary selector parts of said selector group; and a secondary control circuit for switching said plurality of secondary selector parts of said selector group, said primary control circuit includes a plurality of primary AND circuits which correspond to at least a portion of said plurality of digits of said semiconductor memory, wherein first input terminals of said plurality of primary AND circuits are connected to digits which correspond to said binary data holding means, wherein second input terminals of said plurality of primary AND circuits are each connected to an output terminal of an adjacent primary AND circuit, wherein said secondary control circuit includes a plurality of secondary AND circuits which correspond to at least a portion of said plurality of primary AND circuits, wherein first input terminals of said plurality of secondary AND circuits are connected to said plurality of primary AND circuits, respectively, and wherein second input terminals of said plurality of secondary AND circuits are each connected to an output terminal of an adjacent secondary AND circuit.

6. A semiconductor memory testing device in accordance with claim 5, further including a plurality of ports disposed to correspond to said data digit number of said semiconductor memory, and said semiconductor memory testing device further comprising an AND circuit for calculating a logical product for each port and supplying said logical product to said binary data holding means.

7. A semiconductor memory testing device in accordance with claim 1, wherein said failure data digit designating means includes a binary data holding means for holding one of said first and second values in correspondence to said digit of said failure data and holding another of said first and second values in correspondence to other digits, said selector group includes:

a plurality of first-layer selector parts for selecting mutually adjacent signal lines; and a second- to N-th layer selector parts for selecting output terminals of said plurality of first-layer selector parts (where N is an integer not smaller than 2), said binary signal designating part includes a first- to N-th layer control circuits for switching said first- to N-th layer selector parts of said selector group, said first-layer control circuit includes a plurality of first-layer AND circuits which correspond to at least a portion of said plurality of digits of said semiconductor memory, wherein first input terminals of said plurality of first-layer AND circuits are respectively connected to digits which correspond to said binary data holding means, wherein second input terminals of said plurality of first-layer AND circuits are each connected to an output terminal of an adjacent first-layer AND circuit, said second- to N-th layer control circuits each include at least:

a plurality of control selectors for receiving signals from said first- to (N−1)-th layer AND circuits of said first-to (N−1)-th layer control circuits and disconnecting said binary data holding means adjacent to said failure data digit designating means; and a plurality of a second- to N-th layer AND circuits which correspond to said control selectors, wherein first input terminals of said second to N-th layer AND circuits are connected to corresponding ones of said control selectors, and wherein second terminals of said second to N-th layer AND circuits are each connected to an output terminal of an adjacent-layer AND circuit.

8. A semiconductor memory testing device in accordance with claim 7, further including a plurality of ports disposed to correspond to said data digit number of said semiconductor memory, and said semiconductor memory testing device further comprising an AND circuit for calculating a logical product for each port and supplying said logical product to said binary data holding means.

* * * * *

UNITED STATES PATENT AND TRADEMARK OFFICE

CERTIFICATE OF CORRECTION

PATENT NO. : 5,946,247

DATED : AUGUST 31, 1999

INVENTOR(S) : TOKUYA OSAWA ET AL

It is certified that error appears in the above-identified patent and that said Letters Patent is hereby corrected as shown below:

In column 90, line 36, change "destination means" to --designating means--.

Signed and Sealed this

Eighth Day of August, 2000

Attest:

Q. TODD DICKINSON

Attesting Officer

*Director of Patents and Trademarks*